(12) United States Patent
Ahn et al.

(10) Patent No.: US 12,193,320 B2
(45) Date of Patent: Jan. 7, 2025

(54) HETEROCYCLIC COMPOUND, LIGHT-EMITTING DEVICE INCLUDING HETEROCYCLIC COMPOUND, AND ELECTRONIC APPARATUS INCLUDING LIGHT-EMITTING DEVICE

(71) Applicant: Samsung Display Co., Ltd., Yongin-si (KR)

(72) Inventors: Heechoon Ahn, Yongin-si (KR); Soobyung Ko, Yongin-si (KR); Hyeongmin Kim, Yongin-si (KR); Hyunah Um, Yongin-si (KR); Yeseul Lee, Yongin-si (KR); Yirang Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 797 days.

(21) Appl. No.: 17/323,817

(22) Filed: May 18, 2021

(65) Prior Publication Data
US 2021/0376262 A1    Dec. 2, 2021

(30) Foreign Application Priority Data
May 19, 2020 (KR) .................. 10-2020-0059923

(51) Int. Cl.
*H01L 51/50* (2006.01)
*C07F 7/08* (2006.01)
(Continued)

(52) U.S. Cl.
CPC ........... *H10K 85/40* (2023.02); *C07F 7/0812* (2013.01); *C09K 11/06* (2013.01);
(Continued)

(58) Field of Classification Search
None
See application file for complete search history.

(56) References Cited

U.S. PATENT DOCUMENTS

| 7,413,817 B2 | 8/2008 | Lee et al. |
| 8,652,656 B2 | 2/2014 | Zeng et al. |

(Continued)

FOREIGN PATENT DOCUMENTS

| CN | 11194329 A | * 11/2010 | ............ H01L 51/50 |
| CN | 102775432 | 11/2012 | |

(Continued)

OTHER PUBLICATIONS

H. Bock et al., "d-Orbital Effects" in Silicon-Substituted TT-Electron Systems. XI.1 Synthesis and Properties of the Isomeric Bis (trimethylsilyl)-1, 3-butadienes, Journal of the American Chemical Society, vol. 90:21, pp. 5694-5700, Oct. 9, 1968.

*Primary Examiner* — Gregory D Clark
(74) *Attorney, Agent, or Firm* — Lewis Roca Rothgerber Christie LLP

(57) ABSTRACT

A heterocyclic compound represented by Formula 1:

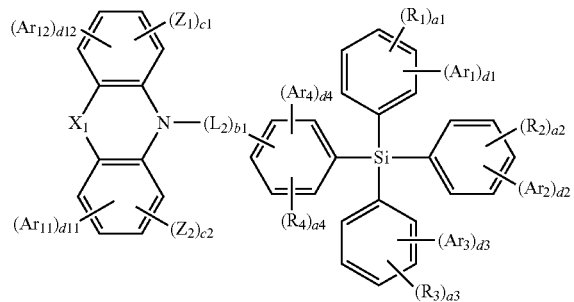

Formula 1 wherein, in Formula 1, $Ar_1$ to $Ar_4$, $Ar_{11}$, and $Ar_{12}$ are each, independently from one another, as defined herein.

16 Claims, 3 Drawing Sheets

(51) Int. Cl.
  *C09K 11/06* (2006.01)
  *H10K 85/40* (2023.01)
  *H10K 50/11* (2023.01)
  *H10K 85/60* (2023.01)
  *H10K 101/10* (2023.01)

(52) U.S. Cl.
  CPC .................. *C07B 2200/05* (2013.01); *C09K 2211/1018* (2013.01); *H10K 50/11* (2023.02); *H10K 85/6572* (2023.02); *H10K 2101/10* (2023.02)

(56) References Cited

U.S. PATENT DOCUMENTS

| | | | |
|---|---|---|---|
| 8,748,012 B2 | 6/2014 | Zeng et al. | |
| 9,093,650 B2 | 7/2015 | Kim et al. | |
| 9,263,682 B2 | 2/2016 | Harada et al. | |
| 9,379,361 B2 | 6/2016 | Tsurutani et al. | |
| 10,135,002 B2 | 11/2018 | Ono et al. | |
| 10,326,111 B2 | 6/2019 | Yoo et al. | |
| 10,790,464 B2 | 9/2020 | Lee et al. | |
| 11,393,991 B2 | 7/2022 | Shin et al. | |
| 2007/0173657 A1 | 7/2007 | Chen et al. | |
| 2012/0032115 A1 | 2/2012 | Harada et al. | |
| 2016/0087227 A1 | 3/2016 | Kim et al. | |
| 2017/0018600 A1 | 1/2017 | Ito et al. | |
| 2017/0170408 A1* | 6/2017 | Park ................... | H10K 85/40 |
| 2017/0200899 A1 | 7/2017 | Kim et al. | |

FOREIGN PATENT DOCUMENTS

| | | |
|---|---|---|
| JP | 5760779 | 8/2015 |
| KR | 10-2005-0029769 | 3/2005 |
| KR | 10-2010-0118700 | 11/2010 |
| KR | 10-2014-0029473 | 3/2014 |
| KR | 10-2016-0034528 | 3/2016 |
| KR | 10-2018-0126655 | 11/2018 |
| KR | 10-2019-0014300 | 2/2019 |

\* cited by examiner

HETEROCYCLIC COMPOUND, LIGHT-EMITTING DEVICE INCLUDING HETEROCYCLIC COMPOUND, AND ELECTRONIC APPARATUS INCLUDING LIGHT-EMITTING DEVICE

CROSS-REFERENCE TO RELATED APPLICATION

This application claims priority from and the benefit of Korean Patent Application No. 10-2020-0059923, filed on May 19, 2020, which is hereby incorporated by reference for all purposes as if fully set forth herein.

BACKGROUND

Field

Exemplary implementations of the invention relate generally to a heterocyclic compound, and more particularly, a light-emitting device including the heterocyclic compound, and an electronic apparatus including the light-emitting device.

Discussion of the Background

Organic light-emitting devices (OLEDs) are self-emission devices that, as compared with other light-emitting devices in the art, have wide viewing angles, high contrast ratios, short response times, and excellent characteristics in terms of brightness, driving voltage, and response speed.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state to thereby generate light.

The above information disclosed in this Background section is only for understanding of the background of the inventive concepts, and, therefore, it may contain information that does not constitute prior art.

SUMMARY

Heterocyclic compounds, light-emitting devices including heterocyclic compounds, and electronic apparatuses including such light-emitting devices constructed according to the principles and exemplary implementations of the invention simultaneously have a low driving voltage and high emission efficiency.

Additional features of the inventive concepts will be set forth in the description which follows, and in part will be apparent from the description, or may be learned by practice of the inventive concepts.

According to one aspect of the invention, a heterocyclic compound represented by Formula 1:

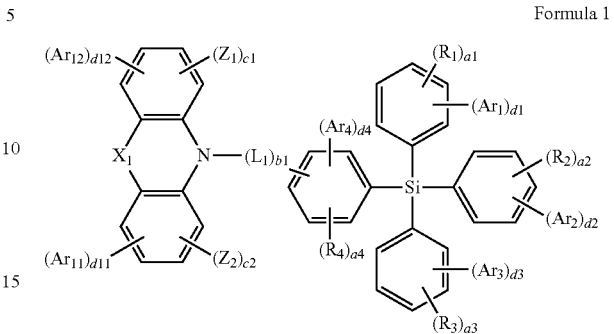

Formula 1 wherein, in Formula 1, $Ar_1$ to $Ar_4$, $Ar_{11}$, and $Ar_{12}$ are each, independently from one another, a group represented by Formula 2 or a group represented by Formula 3,

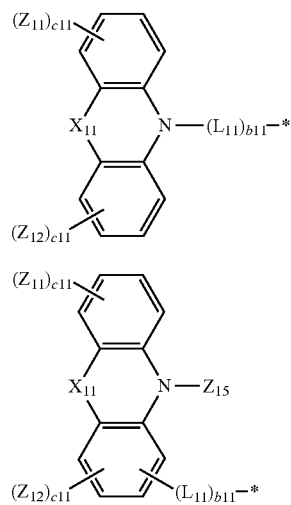

d1, d2, and d3 in Formula 1 are each, independently from one another, an integer from 0 to 5;
d11 in Formula 1 is an integer from 1 to 4;
d4 and d12 in Formula 1 are each, independently from one another, an integer from 0 to 4;
$L_1$ in Formula 1 is a single bond or a group represented by Formula 4;
$L_{11}$ in Formulae 2 and 3 is a single bond, a group represented by Formula 4, or a group represented by Formula 5;

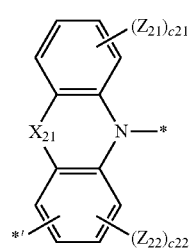

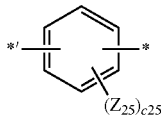

b1 and b11 in Formulae 1 to 3 are each, independently from one another, an integer from 1 to 5;

$X_1$ in Formula 1 is a single bond, O, S, $C(Z_3)(Z_4)$, or $Si(Z_3)(Z_4)$;

$X_{11}$ in Formulae 2 and 3 is a single bond, O, S, $C(Z_{13})(Z_{14})$, or $Si(Z_{13})(Z_{14})$;

$X_{21}$ in Formula 4 is a single bond, O, S, $C(Z_{23})(Z_{24})$, or $Si(Z_{23})(Z_{24})$;

$R_1$ to $R_4$, $Z_1$ to $Z_4$, $Z_{11}$ to $Z_{15}$, and $Z_{21}$ to $Z_{25}$ in Formulae 1 to 5 are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$;

a1 to a3 in Formula 1 are each, independently from one another, an integer from 0 to 5;

a4, c1, c11, c13, c21, and c25 in Formulae 1 to 5 are each, independently from one another, an integer from 0 to 4;

c2, c12, and c22 in Formulae 1, 3, and 4 are each, independently from one another, an integer from 0 to 3;

* in Formulae 2 and 4 indicates a binding site to an adjacent carbon atom, and * and *' in Formulae 3 to 5 each indicate a binding site to an adjacent atom; and $R_{10a}$ is:

-D, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_2)$, —$S(=O)_2(Q_{21})$, —$P(=O)(Q_{21})(Q_{22})$, or any combination thereof, or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each, independently from one another, hydrogen; deuterium; —F; —Cl; —Br; —I; a hydroxyl group; a cyano group; a nitro group; or a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The variables d1, d2, and d3 in Formula 1 may each be 0.

The variables d1, d2, and d3 in Formula 1 may each be, independently from one another, 0 or 1, and the sum of d1, d2, and d3 may be 1 or 2.

The variable d4 in Formula 1 may be 0.

The variable d4 in Formula 1 may be 1 or 2.

The variable d11 in Formula 1 may be 1, and d12 may be 0 or 1.

The variables $R_1$ to $R_4$, $Z_1$ to $Z_4$, $Z_{11}$ to $Z_{15}$, and $Z_{21}$ to $Z_{25}$ in Formulae 1 to 5 may each be, independently from one another as defined herein.

A group represented by

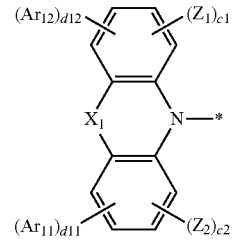

in Formula 1 may be a group represented by one of Formulae 6-1 to 6-14, as defined herein.

A group represented by

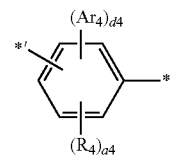

in Formula 1 may be a group represented by one of Formulae 7-1 to 7-13, as defined herein.

A group represented by

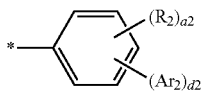

in Formula 1 may be a group represented by one of Formulae 8-1 to 8-4, as defined herein.

A group represented by Formula 4 may include one or more groups represented by Formulae 4-1 to 4-4, as defined herein.

A group represented by Formula 5 may include one or more groups represented by Formulae 5-1 to 5-3, as defined herein.

The heterocyclic compound may be one of Compounds 1 to 62, as defined herein.

The heterocyclic compound represented by Formula 1 may be used for a light-emitting device. Therefore, the heterocyclic compound for a light-emitting device represented by Formula 1 may be provided.

A light-emitting device may include: a first electrode; a second electrode facing the first electrode; an interlayer disposed between the first electrode and the second electrode and including an emission layer; and the heterocyclic compound as defined above.

The emission layer in the interlayer may include the heterocyclic compound.

The emission layer may include a dopant and a host, and the host may include the heterocyclic compound.

The dopant may be configured to emit a blue light.

The dopant may include a transition metal and a ligand(s) in a number represented by m; m may be an integer from 1 to 6; the ligands in number of m may be identical to or different from one another; at least one of the ligands may be bound to the transition metal via a carbon-transition metal bond; and the carbon-transition metal bond may be a coordinate bond.

An electronic apparatus may include the light-emitting device, as defined above.

A thin-film transistor may include a source electrode and a drain electrode, and the first electrode of the light-emitting device may be electrically connected to at least one of the source electrode and the drain electrode of the thin-film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
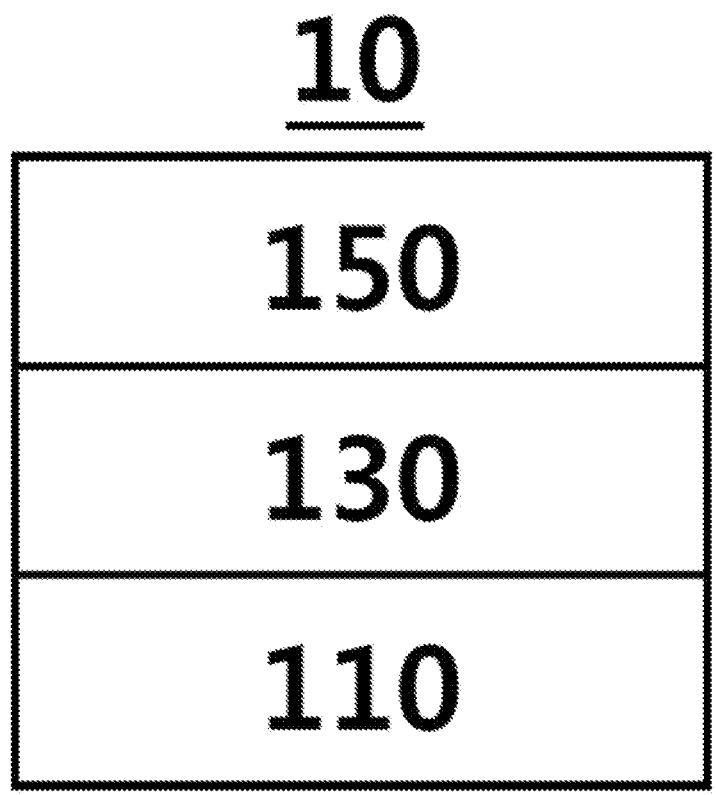
FIG. 1 is a schematic cross-sectional diagram of an exemplary embodiment of a light-emitting device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A heterocyclic compound may be represented by Formula 1:

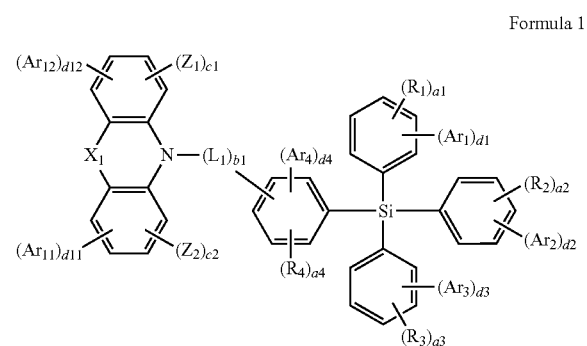

Formula 1 wherein, in Formula 1, $Ar_1$ to $Ar_4$, $Ar_{11}$, and $Ar_{12}$ may each independently be a group represented by Formula 2 or a group represented by Formula 3.

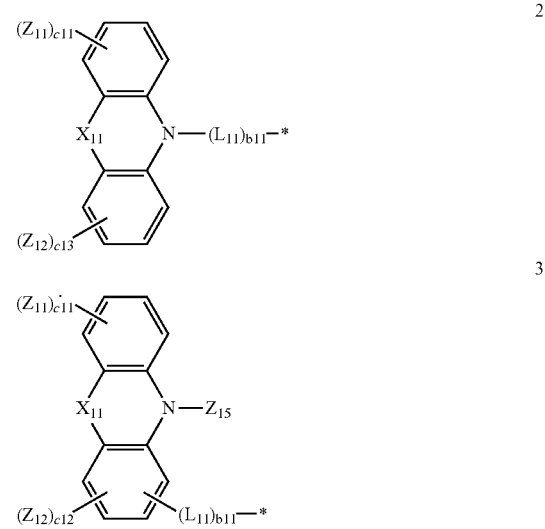

Formulae 2 and 3 may respectively be understood by referring to the descriptions Formulae 2 and 3 provided herein.

In some exemplary embodiments, in Formula 1, $Ar_1$ to $Ar_4$, $Ar_{11}$, and $Ar_{12}$ may each independently be a group represented by Formula 2.

In Formula 1, d1, d2, and d3 may respectively indicate the number of $A_1$ to $Ar_3$, and d1, d2, and d3 may each independently an integer from 0 to 5. When d1 is 2 or greater, at least two $Ar_1$(s) may be identical to or different from each other, when d2 is 2 or greater, at least two $Ar_2$(s) may be identical to or different from each other, and when d3 is 2 or greater, at least two $Ar_3$(s) may be identical to or different from each other.

In some exemplary embodiments, in Formula 1, d1, d2, and d3 may each be 0.

In one or more exemplary embodiments, in Formula 1, d1, d2, and d3 may each independently be 0 or 1, and the sum of d1, d2, and d3 may be 1, 2, or 3 (or, 1 or 2).

In one or more exemplary embodiments, in Formula 1, d1 and d3 may each be 0, and d2 may be 1.

In Formula 1, d11 indicates the number of $Ar_{11}(s)$, and d11 may be an integer from 1 to 4. That is, Formula 1 may essentially include at least one $Ar_{11}$. When d11 is 2 or greater, at least two $Ar_{11}(s)$ may be identical to or different from each other.

In some exemplary embodiments, d11 may be 1 or 2.

In some exemplary embodiments, d11 may be 1.

In Formula 1, d4 and d12 may respectively indicate the number of $Ar_4(s)$ and $Ar_{12}(s)$, and d4 and d12 may each independently be an integer from 0 to 4. When d4 is 2 or greater, at least two $Ar_4(s)$ may be identical to or different from each other, and when d12 is 2 or greater, at least two $Ar_{12}(s)$ may be identical to or different from each other.

In some exemplary embodiments, in Formula 1, d4 may be 0.

In one or more exemplary embodiments, in Formula 1, d4 may be 1 or 2.

According to another exemplary embodiment, in Formula 1, d12 may be 0 or 1.

According to another exemplary embodiment, in Formula 1, d11 may be 1, and d12 may be 0 or 1.

$L_1$ in Formula 1 may be a single bond or a group represented by Formula 4. $L_{11}$ in Formulae 2 and 3 may be a single bond, a group represented by Formula 4, or a group represented by Formula 5:

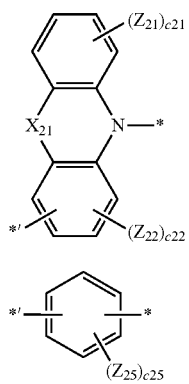

4

5

Formulae 4 and 5 may respectively be understood by referring to the descriptions Formulae 4 and 5 provided herein.

In Formulae 1 to 3, b1 and b11 may respectively indicate the number of $L_1(s)$ and $L_{11}(s)$, and b1 and b11 may each independently be an integer from 1 to 5. When b1 is 2 or greater, at least two $L_1(s)$ may be identical to or different from each other. When b11 is 2 or greater, at least two $L_2(s)$ may be identical to or different from each other.

In some exemplary embodiments, in Formulae 1 to 3, b1 and b11 may each be 1.

$X_1$ in Formula 1 may be a single bond, O, S, $C(Z_3)(Z_4)$, or $Si(Z_3)(Z_4)$, $X_{11}$ in Formulae 2 and 3 may be a single bond, O, S, $C(Z_{13})(Z_{14})$, or $Si(Z_{13})(Z_{14})$, and $X_{21}$ in Formula 4 may be a single bond, O, S, $C(Z_{23})(Z_{24})$, or $Si(Z_{23})(Z_{24})$.

In some exemplary embodiments, $X_1$ in Formula 1 may be a single bond, $C(Z_3)(Z_4)$, or $Si(Z_3)(Z_4)$.

In one or more exemplary embodiments, $X_{11}$ in Formula 2 and 3 may be a single bond, $C(Z_{13})(Z_{14})$, or $Si(Z_{13})(Z_{14})$.

In one or more exemplary embodiments, $X_{21}$ in in Formula 4 may be a single bond, $C(Z_{23})(Z_{24})$, or $Si(Z_{23})(Z_{24})$.

$R_1$ to $R_4$, $Z_1$ to $Z_4$, $Z_{11}$ to $Z_{15}$, and $Z_{21}$ to $Z_{25}$ in Formulae 1 to 5 may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$. $Q_1$ to $Q_3$ may respectively be understood by referring to the descriptions of $Q_1$ to $Q_3$ provided herein.

In some exemplary embodiments, in Formulae 1 to 5, $R_1$ to $R_4$, $Z_1$ to $Z_4$, $Z_{11}$ to $Z_{15}$, and $Z_{21}$ to $Z_{25}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or any combination thereof; or —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$) or —P(=O)(Q$_1$)(Q$_2$), wherein Q$_1$ to Q$_3$ and Q$_{31}$ to Q$_{33}$ may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a C$_1$-C$_{10}$ alkyl group, a phenyl group, a biphenyl group, a pyridinyl group, a pyrimidinyl group, a pyridazinyl group, a pyrazinyl group, a triazinyl group, or any combination thereof.

In one or more exemplary embodiments, in Formulae 1 to 5, R$_1$ to R$_4$, Z$_1$ to Z$_4$, Z$_{11}$ to Z$_{15}$, and Z$_{21}$ to Z$_{25}$ may each independently be:

hydrogen, deuterium, —F, —Cl, —Br, —I, a hydroxyl group, a cyano group, a nitro group, a C$_1$-C$_{20}$ alkyl group, or a C$_1$-C$_{20}$ alkoxy group;

a C$_1$-C$_{20}$ alkyl group or a C$_1$-C$_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{10}$ alkylphenyl group, a fluorenyl group, a carbazolyl group, a dibenzofuranyl group, a dibenzothiophenyl group, or a dibenzosilolyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{10}$ alkylphenyl group, a fluorenyl group, a carbazolyl group, a dibenzofuranyl group, a dibenzothiophenyl group, a dibenzosilolyl group, or any combination thereof, or —Si(Q$_1$)(Q$_2$)(Q$_3$).

In one or more exemplary embodiments, in Formulae 1 to 5, R$_1$ to R$_4$, Z$_1$ to Z$_4$, Z$_{11}$ to Z$_{15}$, and Z$_{21}$ to Z$_{25}$ may each independently be:

hydrogen, deuterium, —F, a cyano group, or a C$_1$-C$_{20}$ alkyl group;

a C$_1$-C$_{20}$ alkyl group substituted with deuterium, —F, —CD$_3$, —CD$_2$H, —CDH$_2$, —CF$_3$, —CF$_2$H, —CFH$_2$, a cyano group, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, or a C$_1$-C$_{10}$ alkylphenyl group, each unsubstituted or substituted with deuterium, —F, —CD$_3$, —CD$_2$H, —CDH$_2$, —CF$_3$, —CF$_2$H, —CFH$_2$, a cyano group, a C$_1$-C$_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{10}$ alkylphenyl group, or any combination thereof, or —Si(Q$_1$)(Q$_2$)(Q$_3$).

a1 to a3 in Formula 1 may respectively indicate the number of R$_1$(s) to R$_3$(s), and a1 to a3 may each independently be an integer from 0 to 5. When a1 is 2 or greater, at least two R$_1$(s) may be identical to or different from each other, when a2 is 2 or greater, at least two R$_2$(s) may be identical to or different from each other, and when a3 is 2 or greater, at least two R$_3$(s) may be identical to or different from each other. In some exemplary embodiments, a1, a2, and a3 may each independently be 0 or 1.

In Formulae 1 to 5, a4, c1, c11, c13, c21, and c25 may respectively indicate the number of R$_4$(s), Z$_1$(s), Z$_{11}$(s), Z$_{12}$(s), Z$_{21}$(s), and Z$_{25}$(s), and a4, c1, c11, c13, c21, and c25 may each independently be an integer from 0 to 4. When a4 is 2 or greater, at least two R$_4$(s) may be identical to or different from each other, when c1 is 2 or greater, at least two $Z_1(s)$ may be identical to or different from each other, when c11 is 2 or greater, at least two $Z_{11}(s)$ may be identical to or different from each other, when c13 is 2 or greater, at least two $Z_{12}(s)$ may be identical to or different from each other, when c21 is 2 or greater, at least two $Z_{21}(s)$ may be identical to or different from each other, and when c25 is 2 or greater, at least two $Z_{25}(s)$ may be identical to or different from each other. In some exemplary embodiments, when a4, c1, c11, c13, c21, and c25 may each independently be 0 or 1.

In Formulae 1, 3, and 4, c2, c12, and c22 may each indicate the number of $Z_2(s)$, $Z_{12}(s)$, and $Z_{22}(s)$, and c2, c12, and c22 may each independently be an integer from 0 to 3. When c2 is 2 or greater, at least two $Z_2(s)$ may be identical to or different from each other, when c12 is 2 or greater, at least two $Z_{12}(s)$ may be identical to or different from each other, and when c22 is 2 or greater, at least two $Z_{22}(s)$ may be identical to or different from each other. In some exemplary embodiments, c2, c12, and c22 may each independently be 0 or 1.

* in Formulae 2 and 4 may indicate a binding site to an adjacent carbon atom, and * and *' in Formulae 3 to 5 may each indicate a binding site to an adjacent atom.

In some exemplary embodiments, in Formula 1, a group represented by

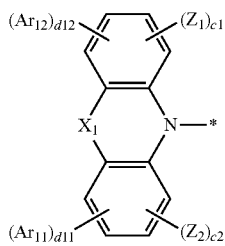

may be a group represented by one of Formulae 6-1 to 6-14:

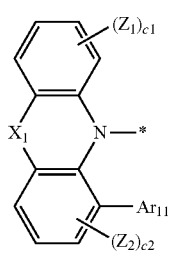
6-1

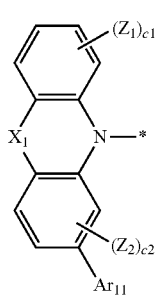
6-2

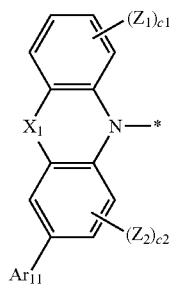
6-3

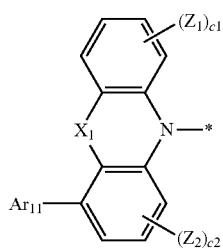
6-4

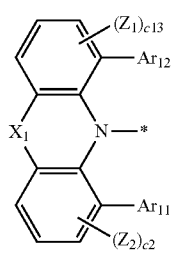
6-5

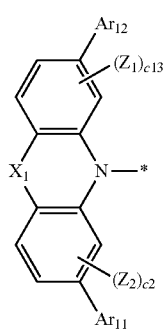
6-6

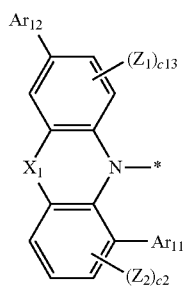
6-7

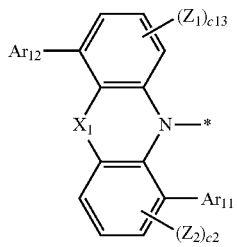
6-8
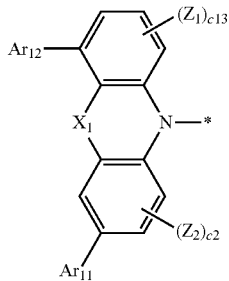
6-13
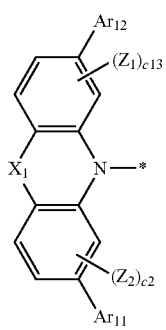
6-9
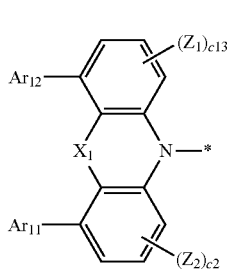
6-14
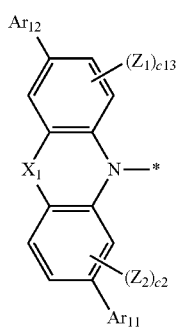
6-10
wherein, in Formulae 6-1 to 6-14, $Ar_{11}$, $Ar_{12}$, $Z_1$, $Z_2$, c1, and c2 may each be the same as described herein, c13 may be an integer from 0 to 3, and * indicates a binding site to $L_1$ in Formula 1.
In one or more exemplary embodiments, in Formula 1, a group represented by
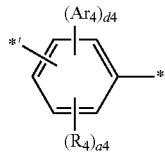
may be a group represented by one of Formulae 7-1 to 7-13:
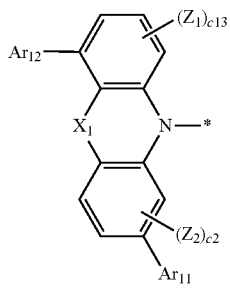
6-11
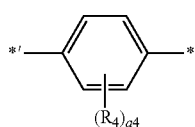
7-1
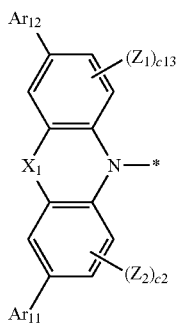
6-12
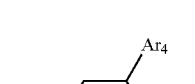
7-2
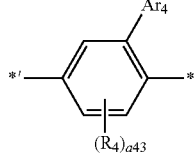
7-3

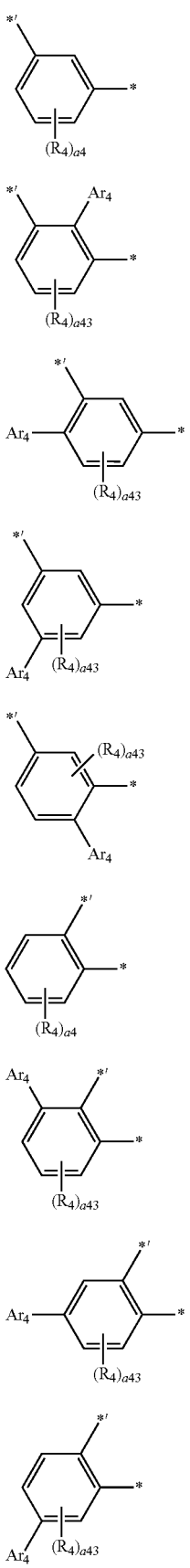

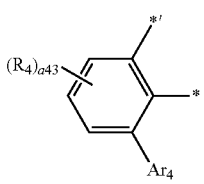

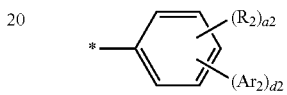

wherein, in Formulae 7-1 to 7-13, $Ar_4$, $R_4$, and a4 may each be the same as described herein, a43 may be an integer from 0 to 3, * indicates a binding site to an adjacent silicon atom in Formula 1, and *' indicates a binding site to $L_1$ in Formula 1.

In one or more exemplary embodiments, in Formula 1, a group represented by

may be a group represented by one of Formulae 8-1 to 8-4:

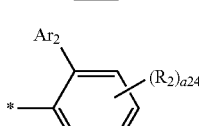

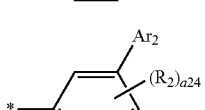

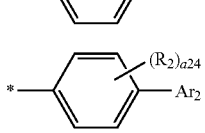

wherein, in Formulae 8-1 to 8-4, $Ar_2$, $R_2$, and a2 may each be the same as described herein, a24 may be an integer from 0 to 4, and * indicates a binding site to an adjacent silicon atom in Formula 1.

In one or more exemplary embodiments, a group represented by Formula 4 may include groups represented by Formulae 4-1 to 4-4:

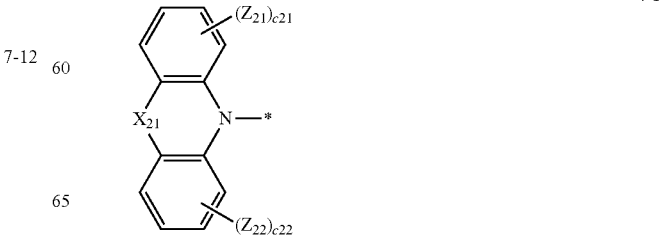

4-2

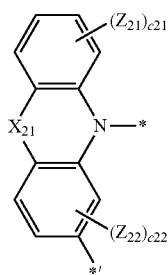

4-3

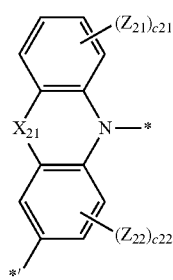

4-4

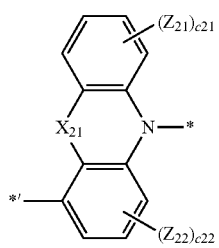

wherein, in Formulae 4-1 to 4-4, $X_{21}$, $Z_{21}$, $Z_{22}$, c21, and c22 may each be the same as described herein, * indicates a binding site to an adjacent carbon atom, and *' indicates a binding site to an adjacent atom.

In one or more exemplary embodiments, a group represented by Formula 5 may include groups represented by Formulae 5-1 to 5-3:

5-1

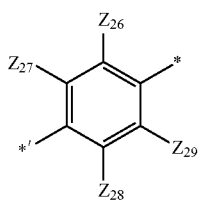

5-2

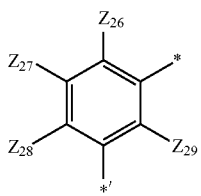

5-3

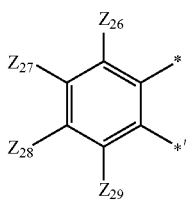

wherein in Formulae 5-1 to 5-3, $Z_{26}$ to $Z_{29}$ may each be the same as described in connection with $Z_{25}$ provided herein, and * and *' may each indicate a binding site to an adjacent atom.

In one or more exemplary embodiments, the heterocyclic compound represented by Formula 1 may be any one of Compounds 1 to 62:

1

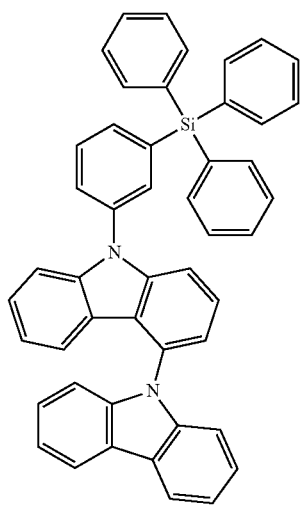

2

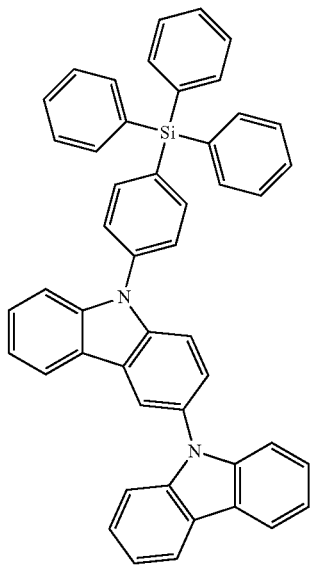

3
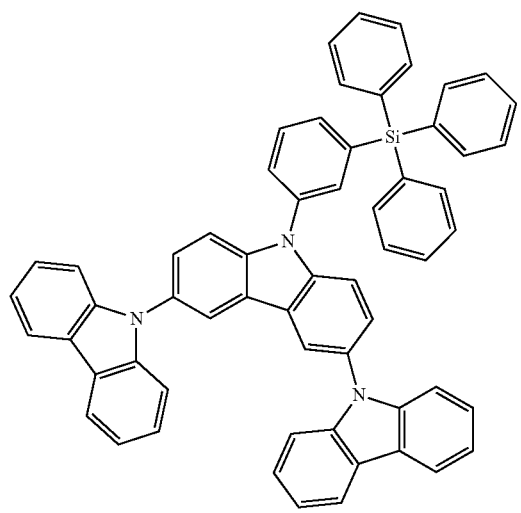
6
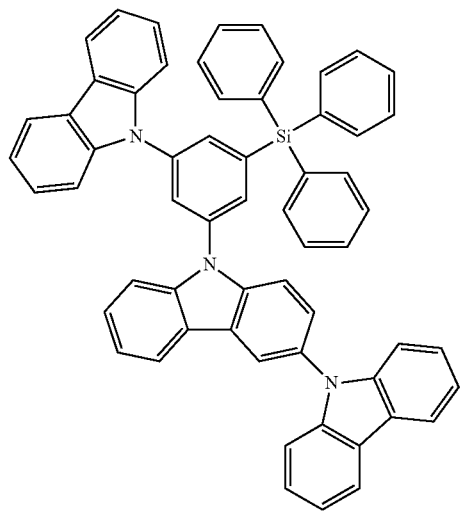
4
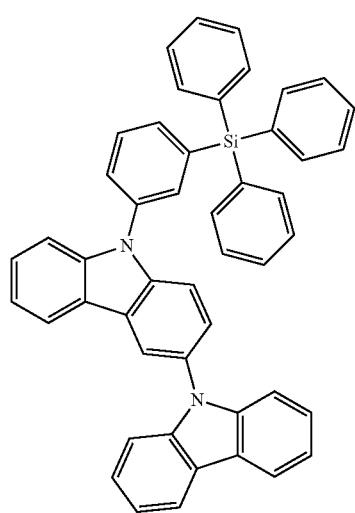
7
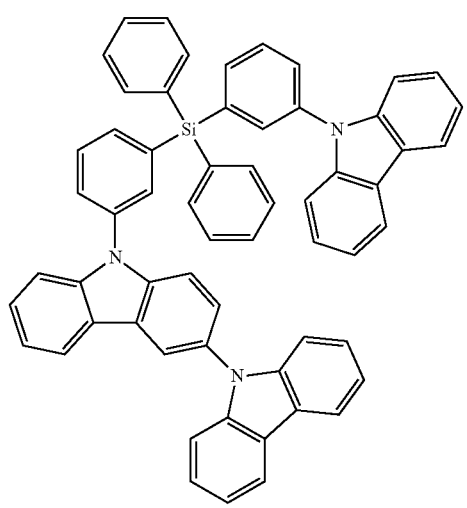
5
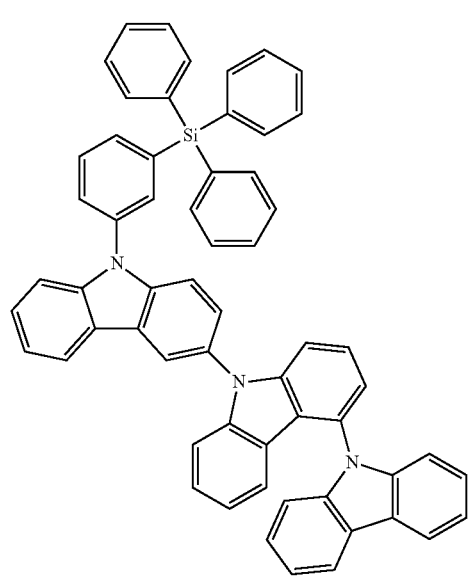
8
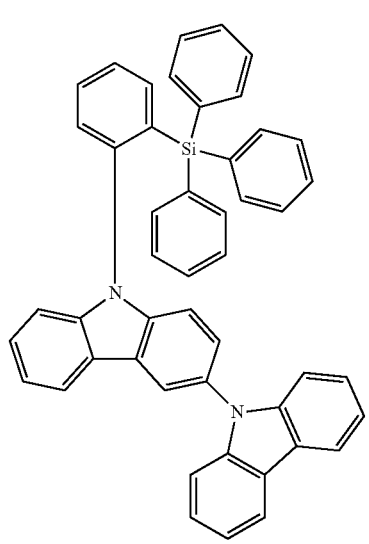

9
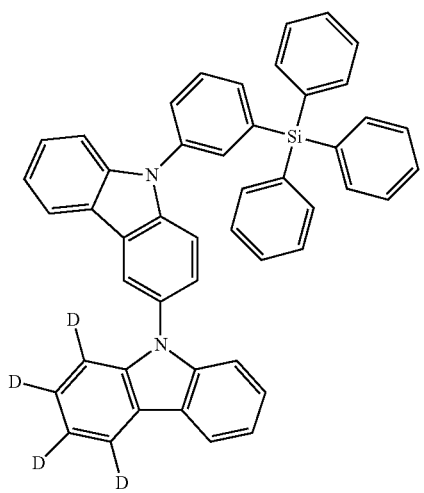
10
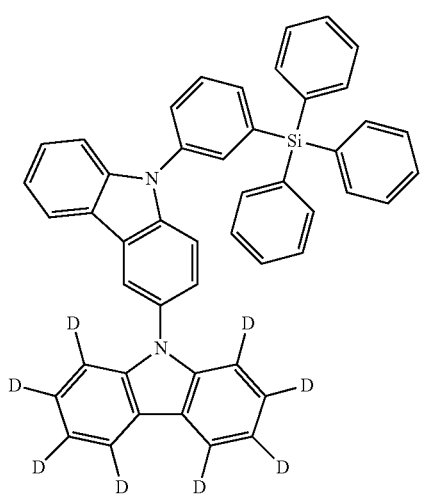
11
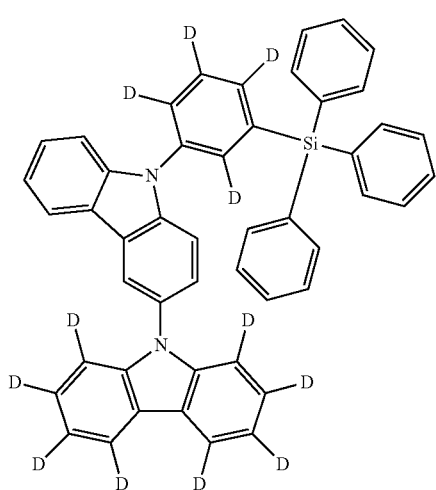
12
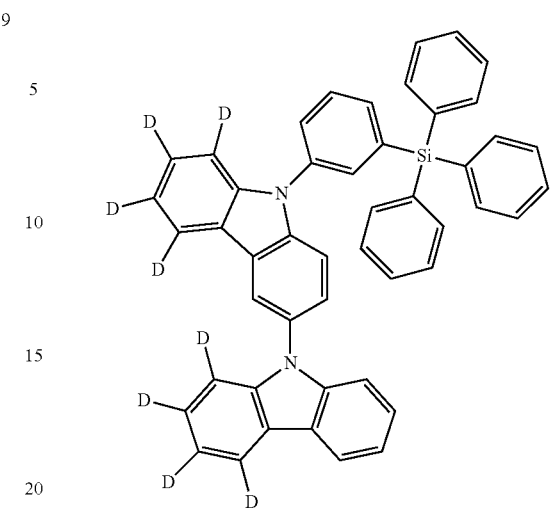
13
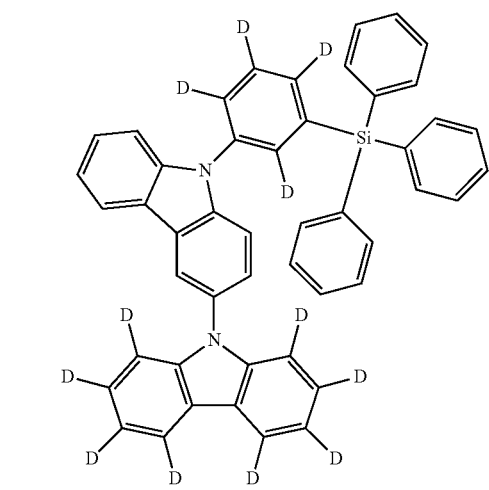
14
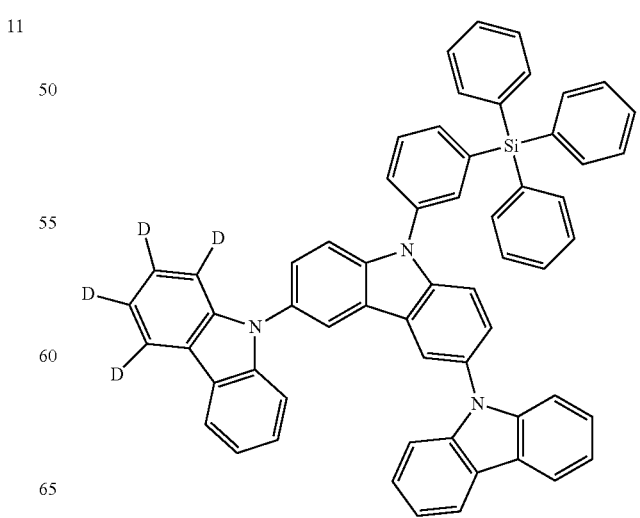

15
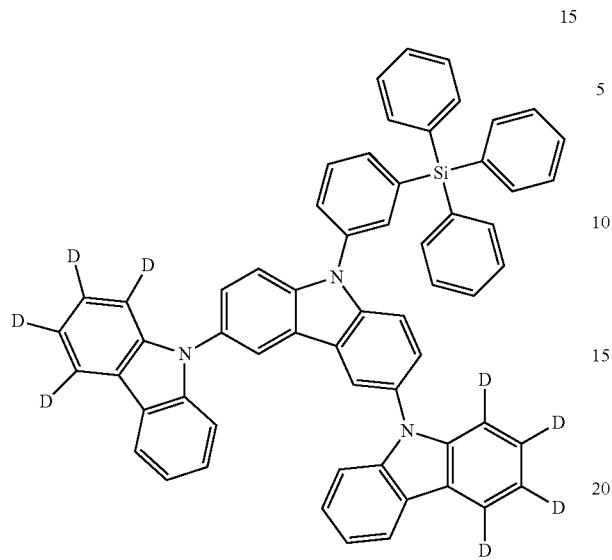
16
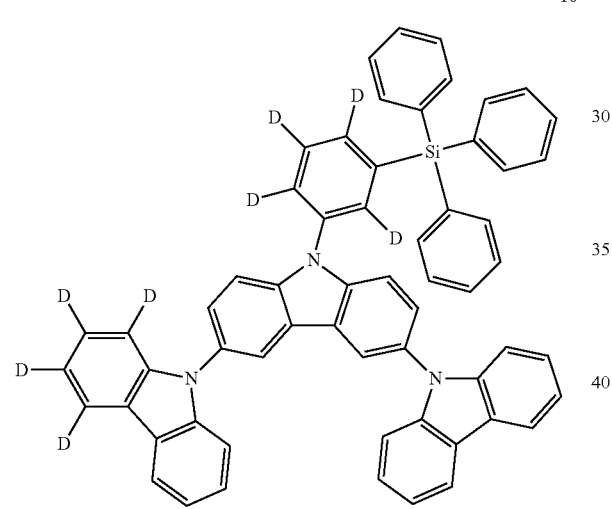
17
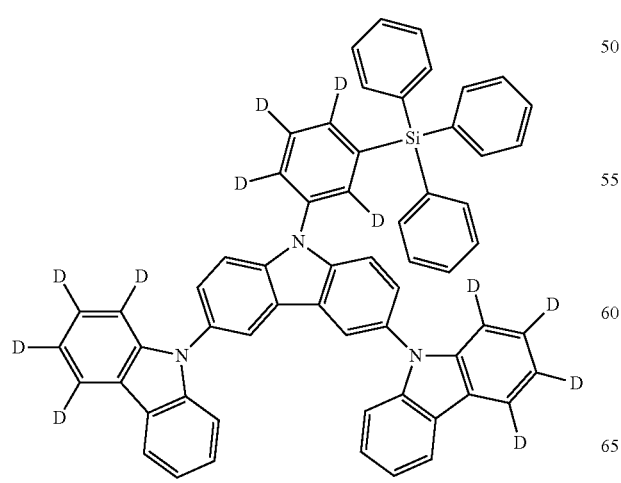
18
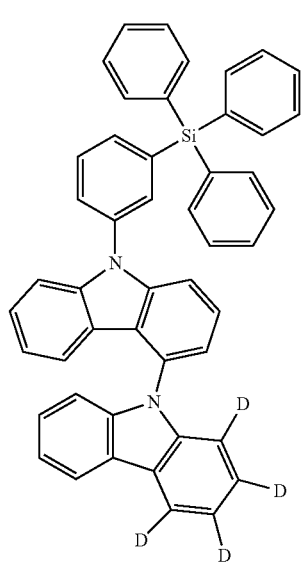
19
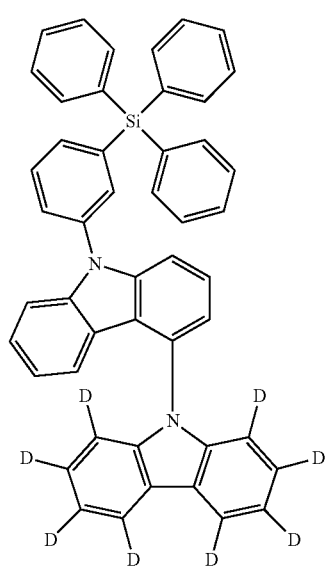
20
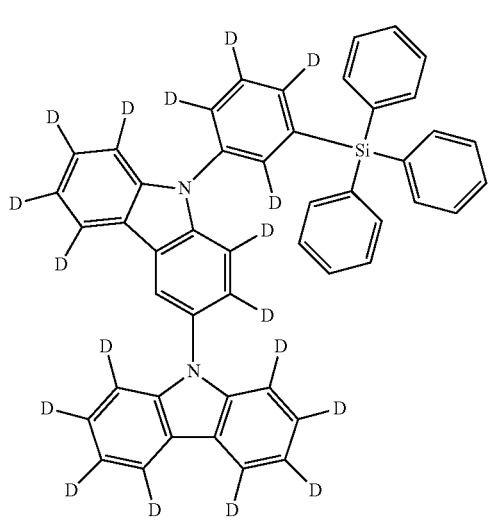

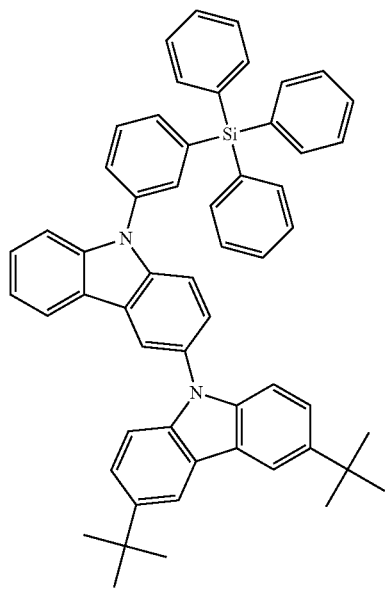
21
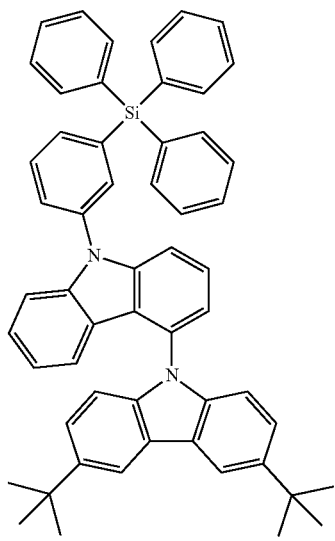
23
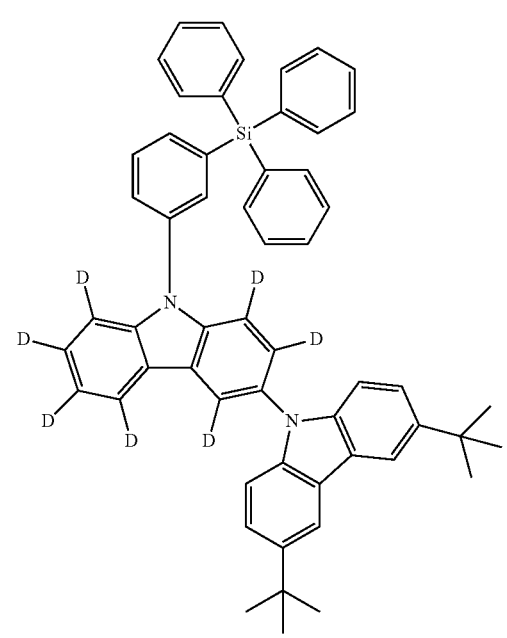
24
22

25
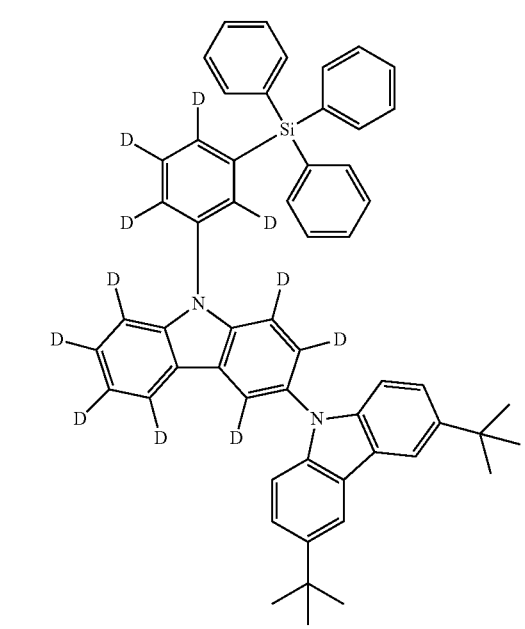
26
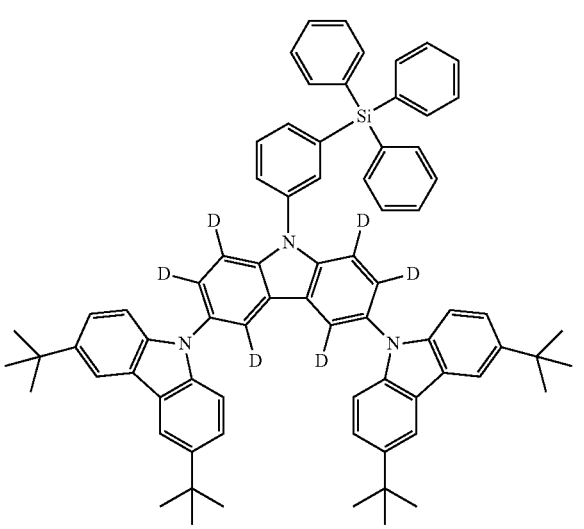
27
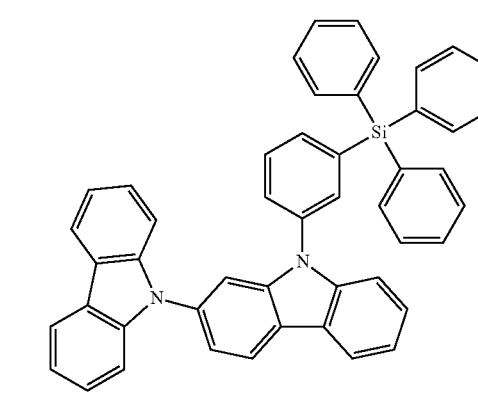
28
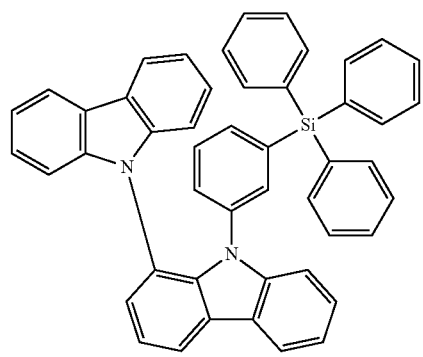
29
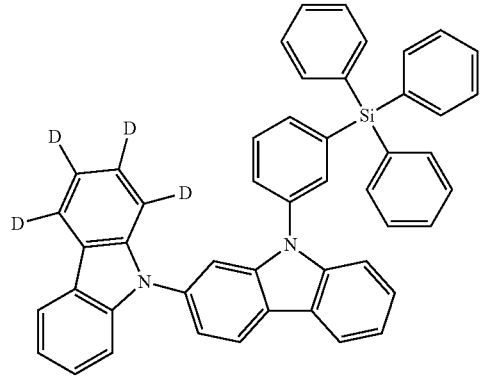
30
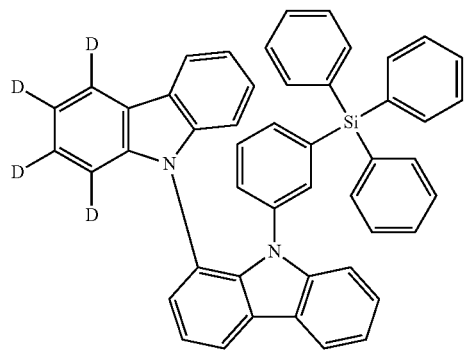
31
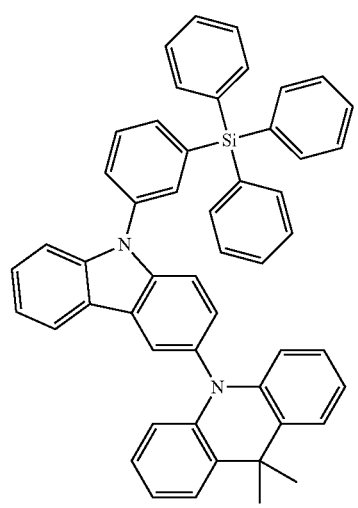

31
-continued
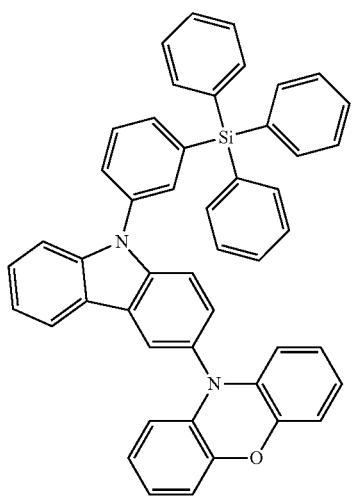
32
32
-continued
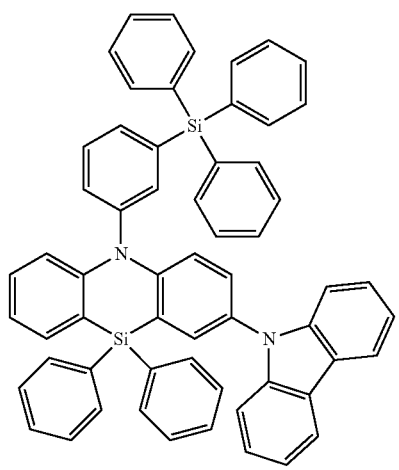
35
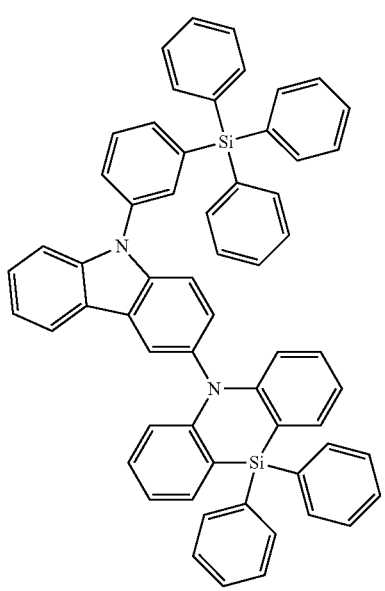
33
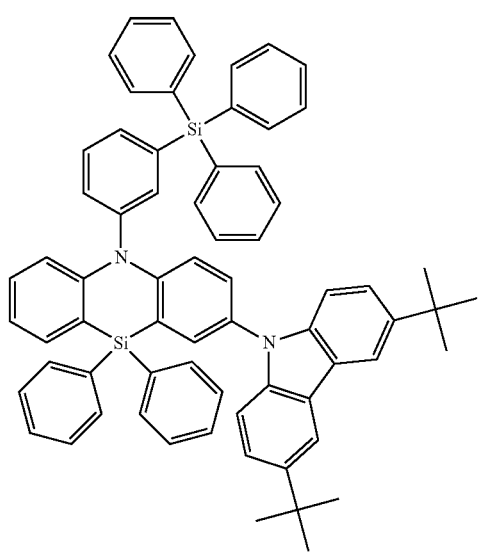
36
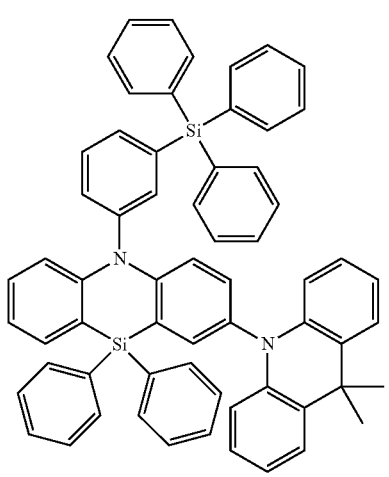
34
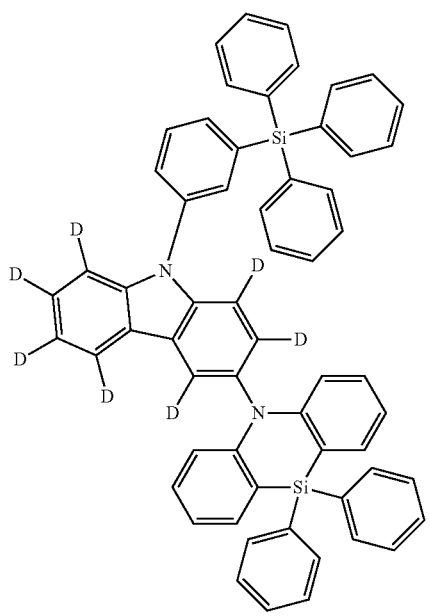
37

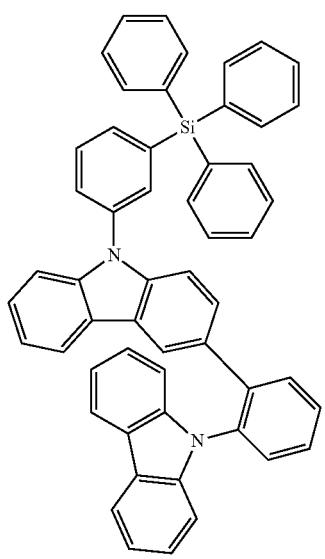
38
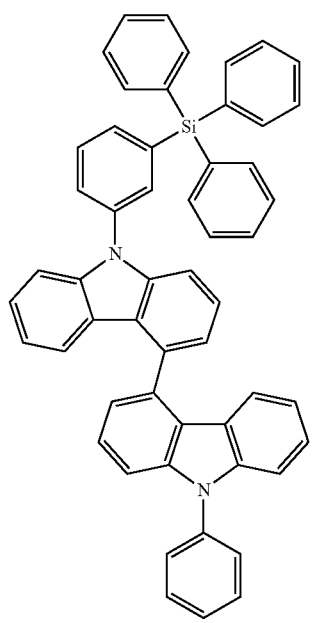
40
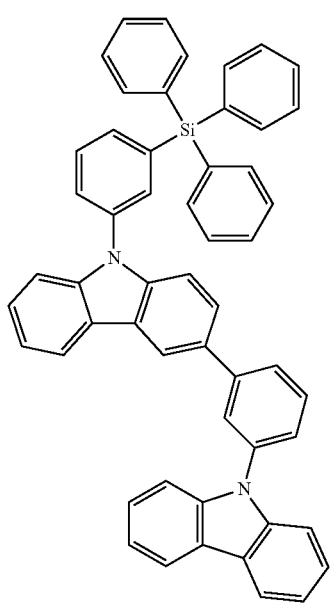
39
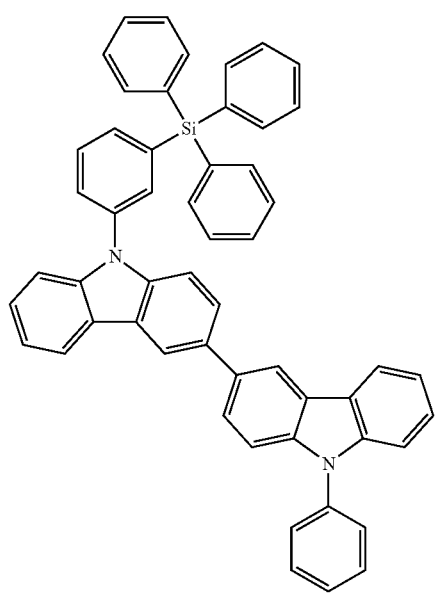
41

42
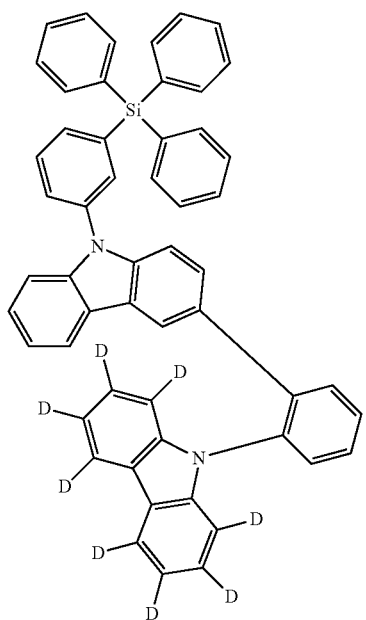
44
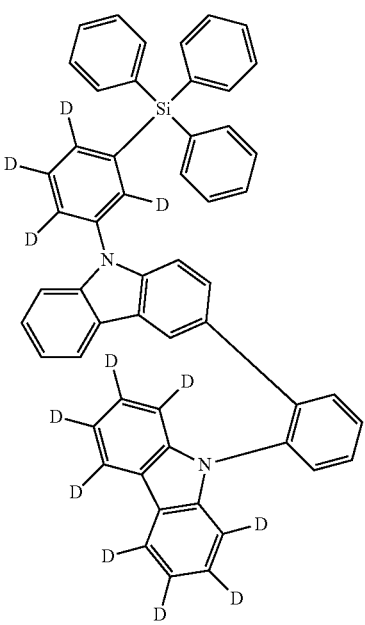
43
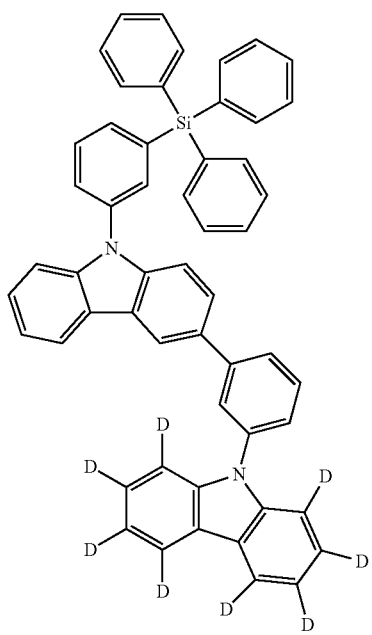
45
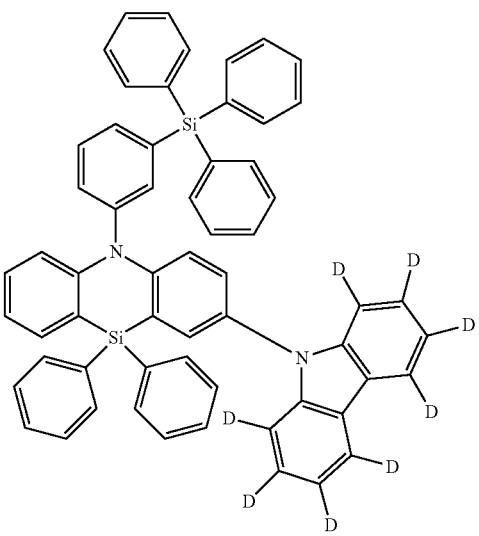

46
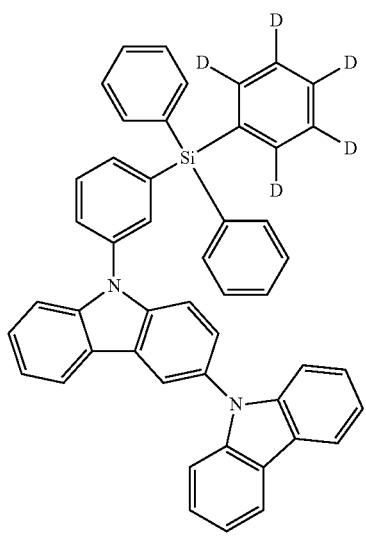
47
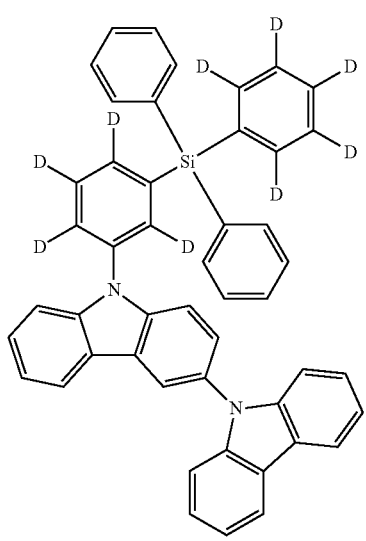
48
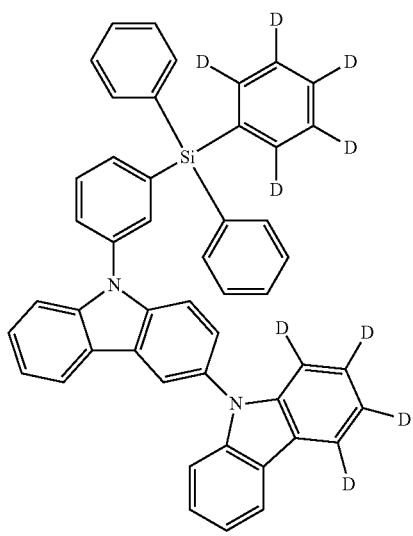
49
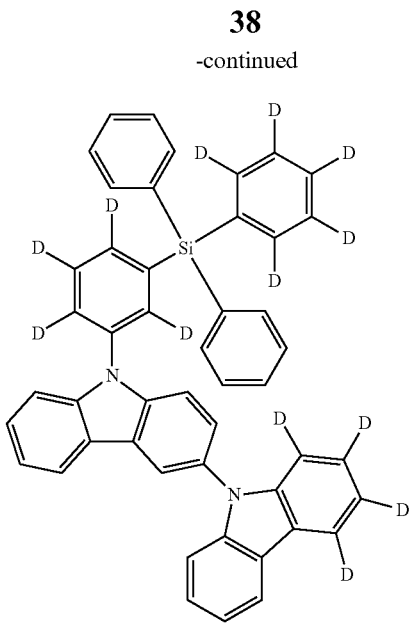
50
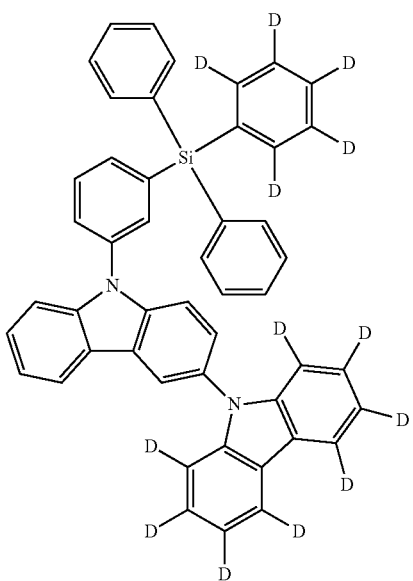

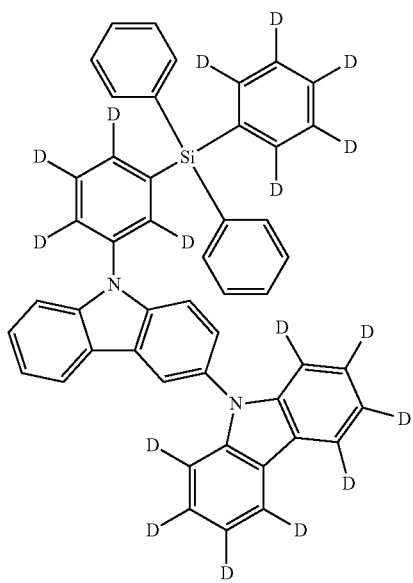
51
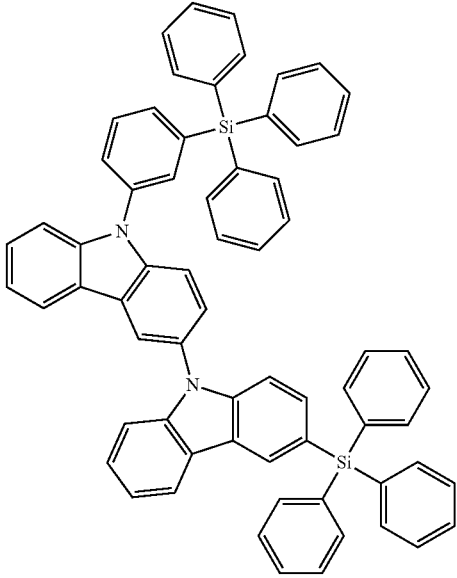
53
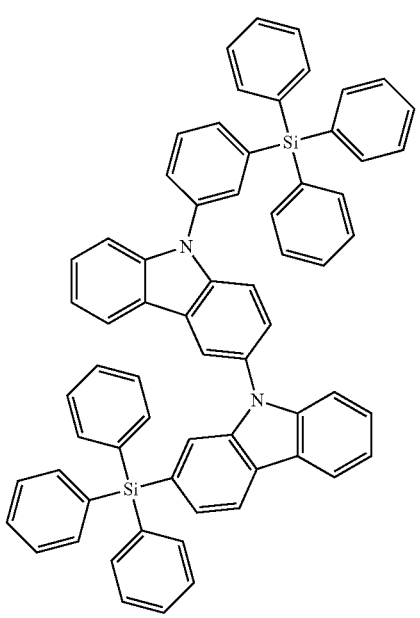
54

55
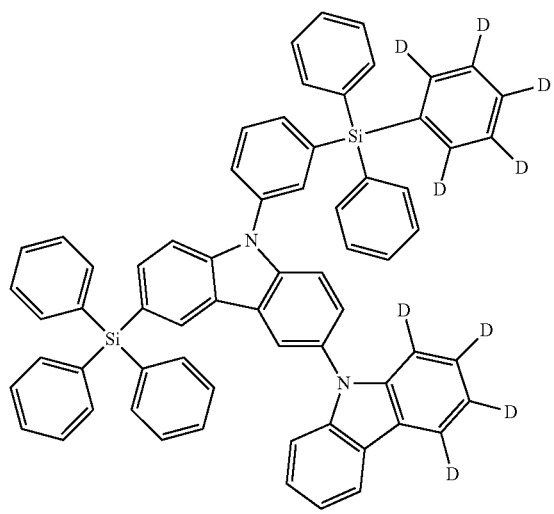
57
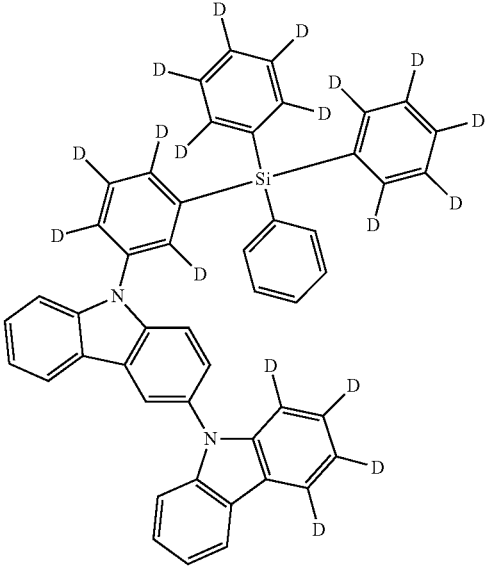
56
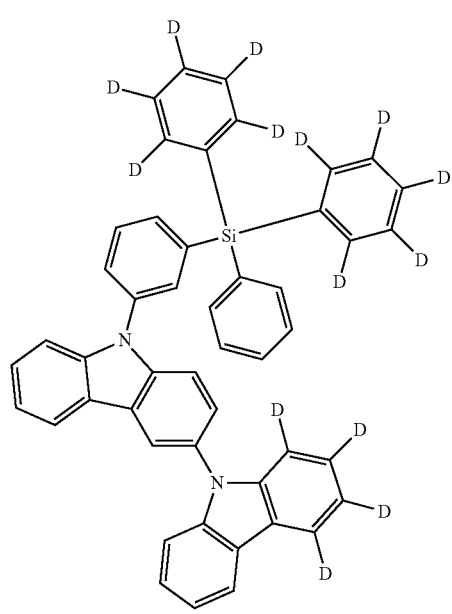
58
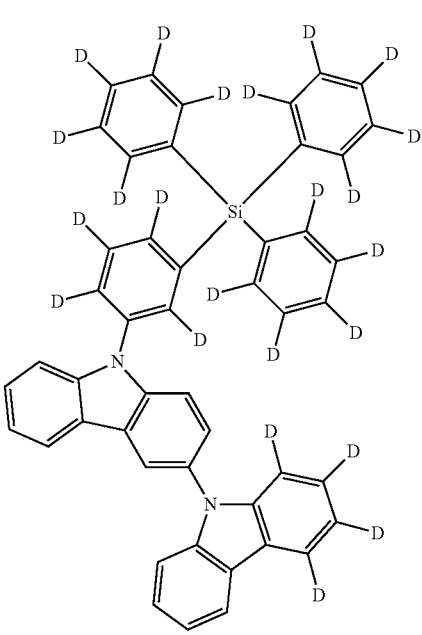

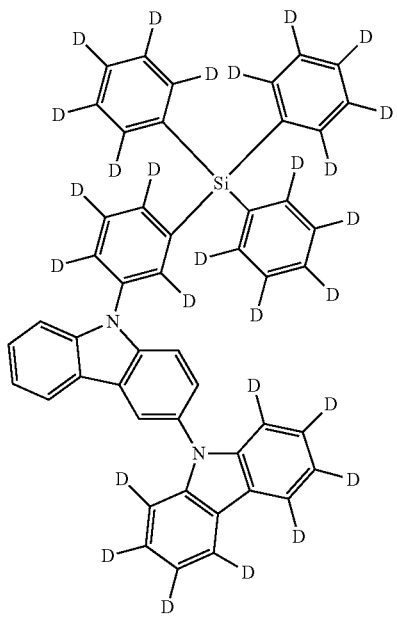
59
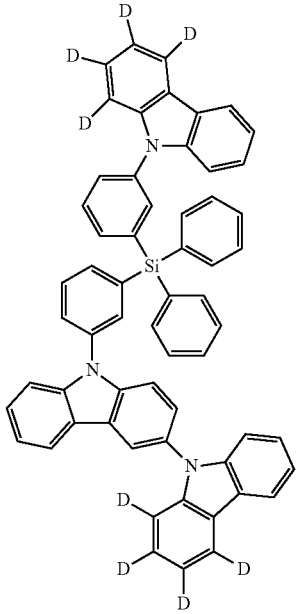
61
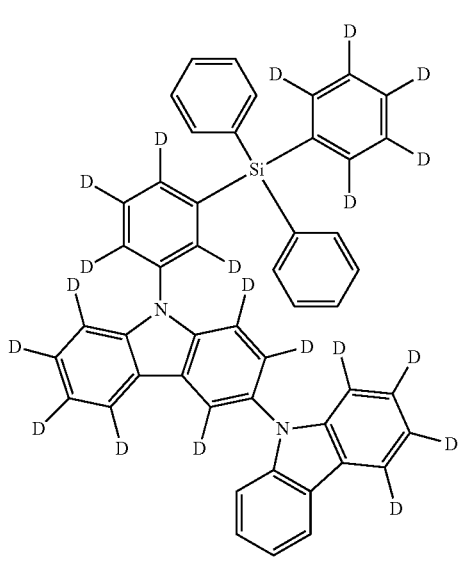
60
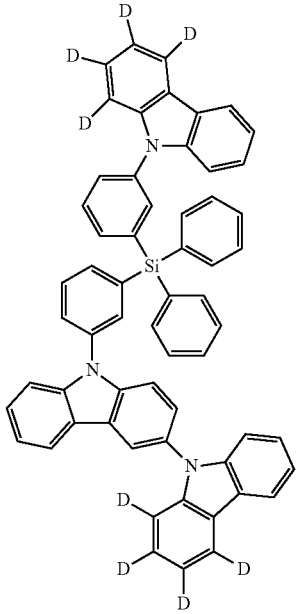
62
The heterocyclic compound represented by Formula 1 may include: 1) $L_1$ being a single bond or a group represented by Formula 4; 2) a "first ring" (see Formula 1'); and 3) a "silicon atom" bound to "four benzene rings" (see Formula 1'). Thus, the heterocyclic compound may have a relatively high triplet ($T_1$) energy level.

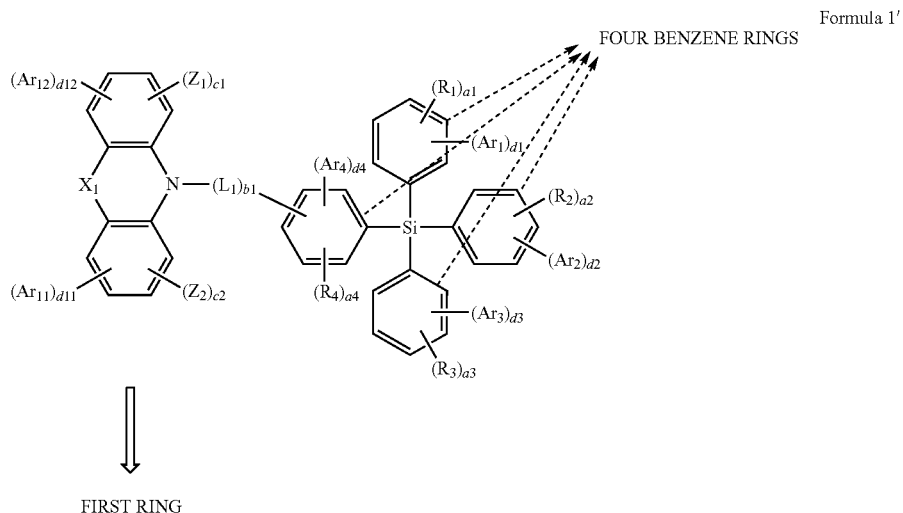

Formula 1'

FIRST RING

In some exemplary embodiments, the heterocyclic compound represented by Formula 1 may have a triplet energy level in a range of about 2.85 electron volts (eV) to about 3.20 eV, about 2.95 eV to about 3.15 eV, about 3.00 eV to about 3.15 eV, or about 3.05 eV to about 3.13 eV. In some exemplary embodiments, the triplet energy level may be calculated according to the density functional theory (DFT).

In addition, in Formula 1, $Ar_{11}$ may be a group represented by Formula 4 or a group represented by Formula 5, and d11, which indicates the number of $Ar_{11}(s)$, may be an integer from 1 to 4. That is, the "first ring" in Formula 1 may essentially include at least one $Ar_{11}$. Accordingly, the heterocyclic compound represented by Formula 1 may have a relatively high (or shallow) highest occupied molecular orbital (HOMO) energy level (i.e., a relatively small absolute value of HOMO energy level), thus having excellent hole transport characteristics.

In some exemplary embodiments, the heterocyclic compound represented by Formula 1 may have a HOMO energy level in a range of about −4.95 eV to about −5.25 eV or about −5.00 eV to about −5.25 eV. In some exemplary embodiments, the HOMO energy level may be calculated according to the density functional theory (DFT).

Accordingly, an electronic device, e.g., a light-emitting device, including the heterocyclic compound represented by Formula 1 may have excellent driving voltage and luminescence efficiency.

Methods of synthesizing the heterocyclic compound represented by Formula 1 may be easily understood to those of ordinary skill in the art by referring to Synthesis Examples and Examples described herein.

At least one of the heterocyclic compounds represented by Formula 1 may be used in a light-emitting device (e.g., an organic light-emitting device). Accordingly, a light-emitting device may include: a first electrode; a second electrode facing the first electrode; an interlayer located between the first electrode and the second electrode and including an emission layer; and a heterocyclic compound represented by Formula 1 as described herein.

In some exemplary embodiments,
the first electrode of the light-emitting device may be an anode,
the second electrode of the light-emitting device may be a cathode,
the interlayer may further include a hole transport region located between the first electrode and the emission layer and an electron transport region located between the emission layer and the second electrode,
wherein the hole transport region may include a hole injection layer, a hole transport layer, an emission auxiliary layer, an electron blocking layer, or any combination thereof, and
the electron transport region may include a hole blocking layer, an electron transport layer, an electron injection layer, or a combination thereof.

In some exemplary embodiments, the heterocyclic compound may be included in a pair of electrodes of the light-emitting device. Accordingly, the heterocyclic compound may be included in the interlayer of the light-emitting device, for example, in the emission layer in the interlayer.

In one or more exemplary embodiments, the emission layer in the interlayer of the light-emitting device may include a dopant and a host, and the host may include the heterocyclic compound. That is, the heterocyclic compound may serve as a host. The emission layer may emit red light, green light, blue light, and/or white light. In some exemplary embodiments, the emission layer may emit blue light. The blue light may have a maximum emission wavelength in a range of about 400 nanometers (nm) to about 490 nm.

In one or more exemplary embodiments, the emission layer in the interlayer of the light-emitting device may include a dopant and a host, the host may include the heterocyclic compound, and the dopant may emit blue light. In some exemplary embodiments, the dopant may include a transition metal and a ligand(s) in number of m, m may be an integer from 1 to 6, the ligands in number of m may be identical to or different from each other, at least one of the ligands in number of m may be bound to the transition metal via a carbon-transition metal bond, and the carbon-transition metal bond may be a coordinate bond. That is, at least one of the ligands in number of m may be a carbene ligand (e.g., $Ir(pmp)_3$ or the like). The transition metal may be, for example, iridium, platinum, osmium, palladium, rhodium, or gold. The emission layer and the dopant may respectively be understood by referring to the descriptions of the emission layer and the dopant provided herein.

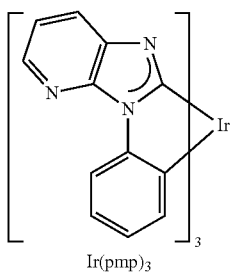

Ir(pmp)₃

In one or more exemplary embodiments, the light-emitting device may further include at least one of a first capping layer located outside a first electrode and a second capping layer located outside a second electrode, and at least one of the first capping layer and the second capping layer may include the heterocyclic compound represented by Formula 1. The first capping layer and the second capping layer may respectively be understood by referring to the descriptions of the first capping layer and the second capping layer provided herein.

In some exemplary embodiments, the light-emitting device may include:
- a first capping layer located outside the first electrode and including the heterocyclic compound represented by Formula 1;
- a second capping layer located outside the second electrode and including the heterocyclic compound represented by Formula 1; or
- the first capping layer and the second capping layer.

The expression that an "(interlayer and/or a capping layer) includes at least one heterocyclic compound" as used herein may be construed as meaning that the "(interlayer and/or the capping layer) may include one heterocyclic compound of Formula 1 or two different heterocyclic compounds of Formula 1".

For example, the interlayer and/or the capping layer may include Compound 1 only as the heterocyclic compound. In this exemplary embodiment, Compound 1 may be included in the emission layer of the light-emitting device. In some exemplary embodiments, the interlayer may include Compounds 1 and 2 as the heterocyclic compounds. In this exemplary embodiment, Compounds 1 and 2 may be included in the same layer (for example, both Compounds 1 and 2 may be included in an emission layer) or in different layers (for example, Compound 1 may be included in an emission layer, and Compound 2 may be included in an electron transport region).

According to one or more exemplary embodiments, an electronic apparatus may include the light-emitting device. The electronic apparatus may further include a thin-film transistor. In some exemplary embodiments, the electronic apparatus may further include a thin-film transistor including a source electrode and drain electrode, and a first electrode of the light-emitting device may be electrically connected to the source electrode or the drain electrode. The electronic apparatus may further include a color filter, a color-conversion layer, a touchscreen layer, a polarization layer, or any combination thereof. The electronic apparatus may be understood by referring to the description of the electronic apparatus provided herein.

Description of FIG. 1

FIG. 1 is a schematic cross-sectional diagram of an exemplary embodiment of a light-emitting device constructed according to principles of the invention. The light-emitting device 10 may include a first electrode 110, an interlayer 130, and a second electrode 150.

Hereinafter, the structure of the light-emitting device 10 according to an exemplary embodiment and a method will be described in connection with FIG. 1.

First Electrode 110

In FIG. 1, a substrate may be additionally located under the first electrode 110 or above the second electrode 150. The substrate may be a glass substrate or a plastic substrate. The substrate may be a flexible substrate including a plastic having excellent heat resistance and durability, for example, a polyimide, a polyethylene terephthalate (PET), a polycarbonate, a polyethylene naphthalate, a polyarylate (PAR), a polyetherimide, or any combination thereof.

The first electrode 110 may be formed by depositing or sputtering, onto the substrate, a material for forming the first electrode 110. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may be an indium tin oxide (ITO), an indium zinc oxide (IZO), a tin oxide ($SnO_2$), a zinc oxide (ZnO), or any combinations thereof. In some exemplary embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure consisting of a single layer or a multi-layered structure including two or more layers. In some exemplary embodiments, the first electrode 110 may have a triple-layered structure of ITO/Ag/ITO.

Interlayer 130

The interlayer 130 may be on the first electrode 110. The interlayer 130 may include an emission layer. The interlayer 130 may further include a hole transport region between the first electrode 110 and the emission layer and an electron transport region between the emission layer and the second electrode 150. The interlayer 130 may further include metal-containing compounds such as organometallic compounds, inorganic materials such as quantum dots, and the like, in addition to various organic materials.

The interlayer 130 may include: i) at least two emitting units sequentially stacked between the first electrode 110 and the second electrode 150; and ii) a charge-generation layer located between the at least two emitting units. When the interlayer 130 includes the at least two emitting units and the charge-generation layer, the light-emitting device 10 may be a tandem light-emitting device.

Hole Transport Region in the Interlayer 130

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials. The hole transport region may include a hole injection layer (HIL), a hole transport layer (HTL), an emission auxiliary layer, an electron blocking layer (EBL), or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order. The hole transport region may include the compound represented by Formula 201, the compound represented by Formula 202, or any combination thereof:

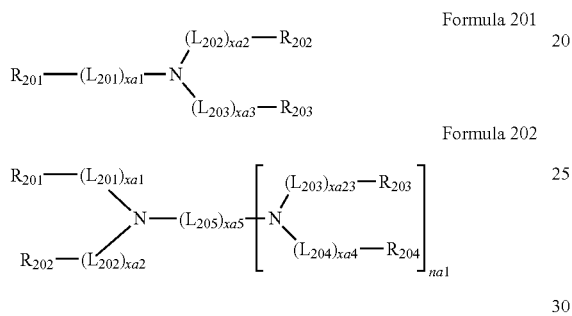

Formula 201

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In some exemplary embodiments, Formulae 201 and 202 may each include at least one of groups represented by Formulae CY201 to CY217:

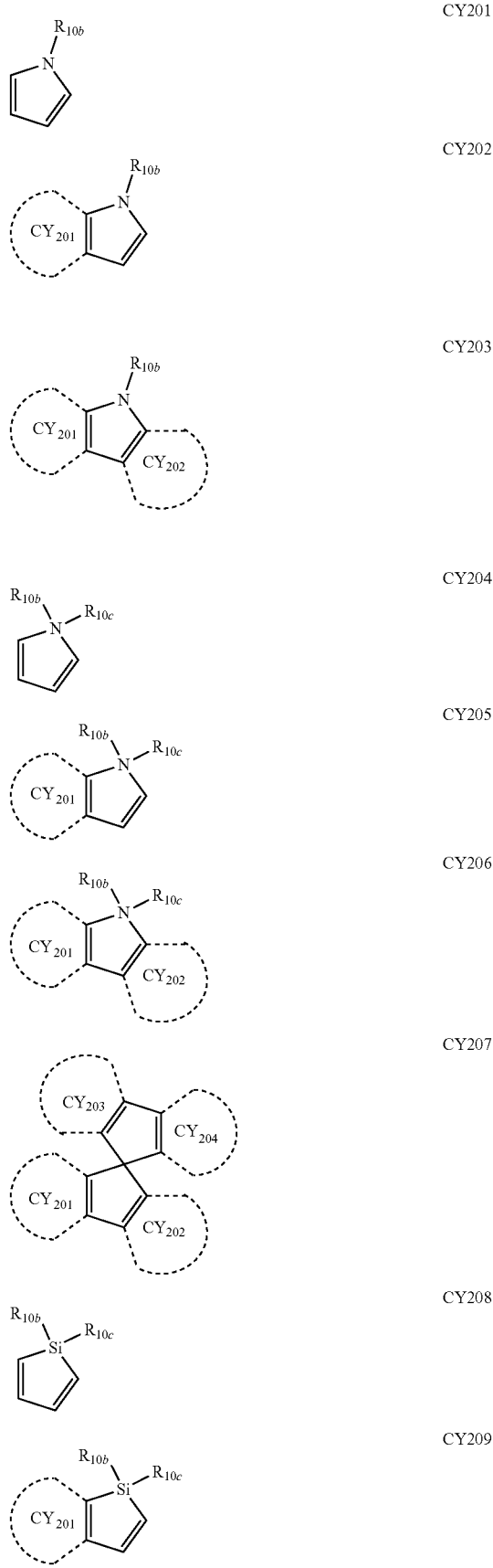

-continued

CY210
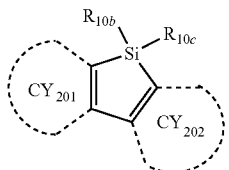

CY211
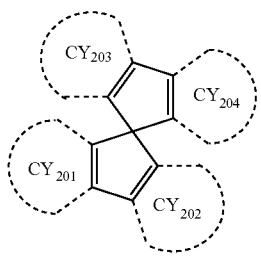

CY212

CY213
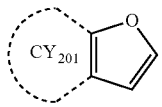

CY214
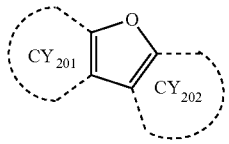

CY215

CY216
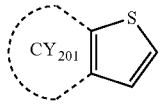

CY217
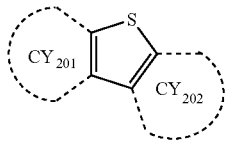

wherein, in Formulae CY201 to CY217, $R_{10b}$ and $R_{10c}$, may each be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In some exemplary embodiments, in Formulae CY201 to CY217, ring $CY_{201}$ to ring $CY_{204}$ may each independently be a benzene group, a naphthalene group, a phenanthrene group, or an anthracene group.

In one or more exemplary embodiments, Formulae 201 and 202 may each include at least one of groups represented by Formula CY201 to CY203.

In one or more exemplary embodiments, Formula 201 may include at least one of groups represented by Formulae CY201 to CY203 and at least one of groups represented by Formulae CY204 to CY217.

In one or more exemplary embodiments, in Formula 201, xa1 may be 1, $R_{201}$ may be a group represented by any one of Formulae CY201 to CY203, xa2 may be 0, and $R_{202}$ may be a group represented by Formulae CY204 to CY207. In one or more exemplary embodiments, Formula 201 and 202 may each not include groups represented by Formulae CY201 to CY203.

In one or more exemplary embodiments, Formula 201 and 202 may each not include groups represented by Formulae CY201 to CY203, and include at least one of groups represented by Formulae CY204 to CY217. In one or more exemplary embodiments, Formula 201 and 202 may each not include groups represented by Formulae CY201 to CY217.

In some exemplary embodiments, the hole transport region may include one of Compounds HT1 to HT44 and 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), N,N'-di(1-naphthyl)-N,N'-diphenyl-(1,1'-biphenyl)-4,4'-diamine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (spiro-TPD), N2,N7-di-1-naphthalenyl-N2,N7-diphenyl-9,9'-spirobi[9H-fluorene]-2,7-diamine (spiro-NPB), N, N,N'-di(1-naphthyl)-N,N'-2,2'dimethyldiphenyl-(1,1'-biphenyl)-4,4'-diamine (methylated-NPB), 4,4'-cyclohexylidenebis[N,N-bis(4-methylphenyl)benzenamine](TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), or any combination thereof:

HT1
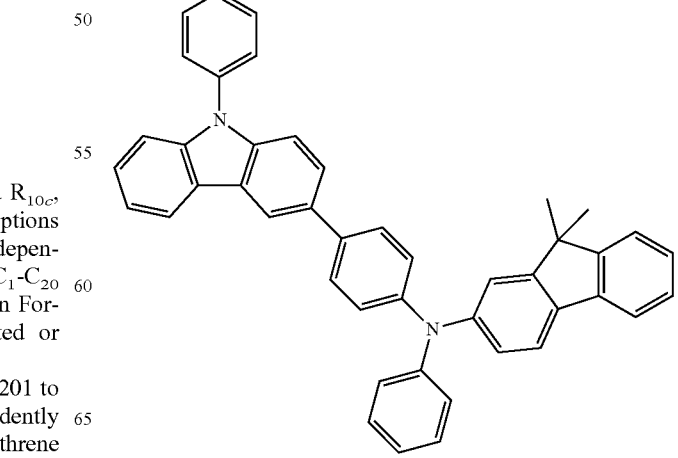

HT2
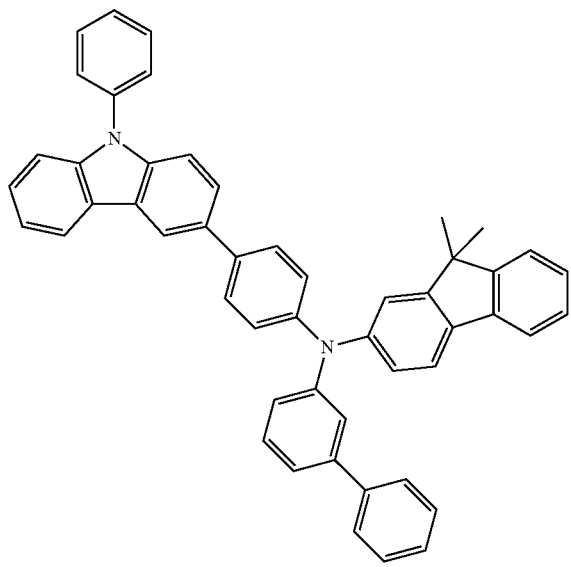
HT4
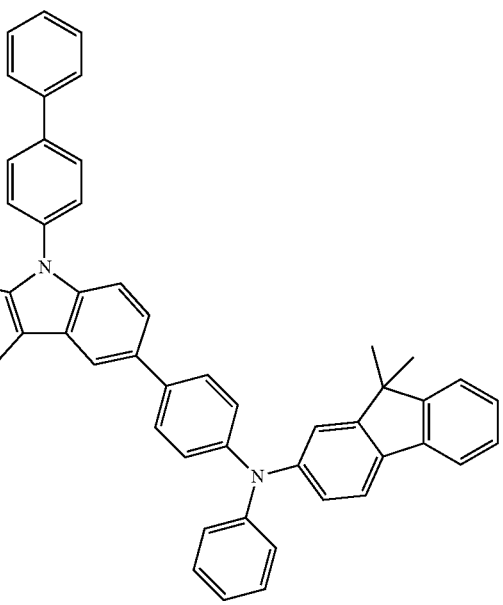
HT3
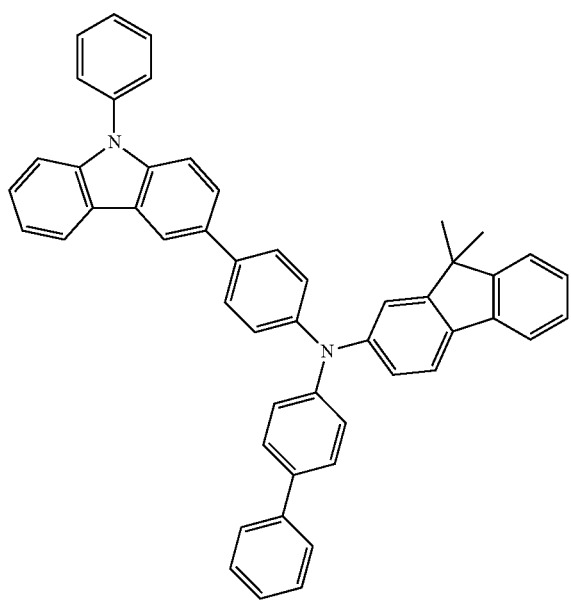
HT5
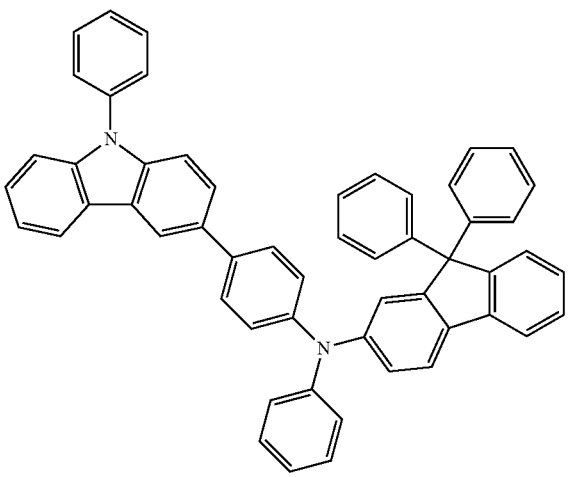

HT6
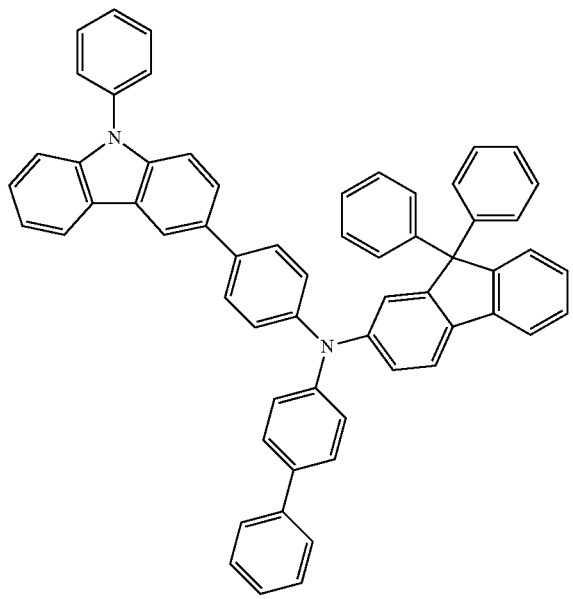
HT8
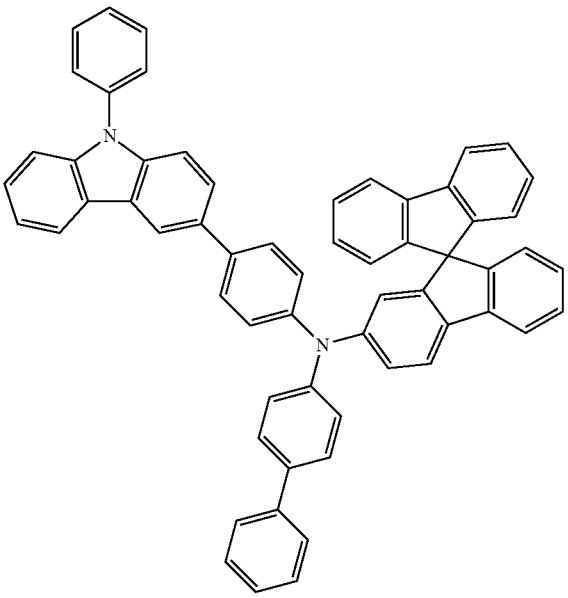
HT7
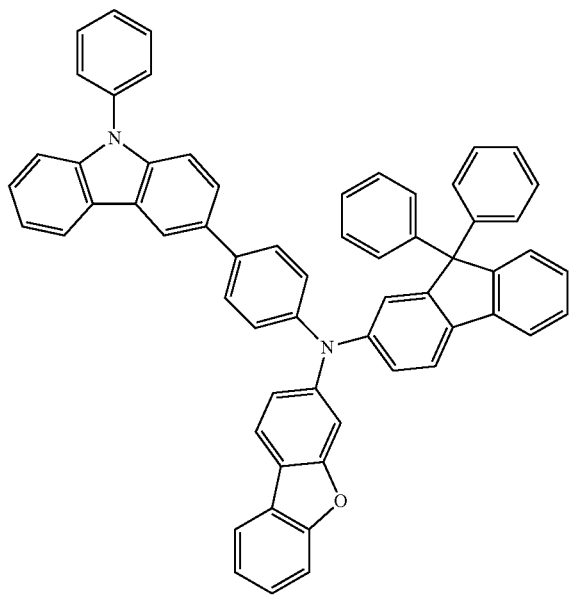
HT9
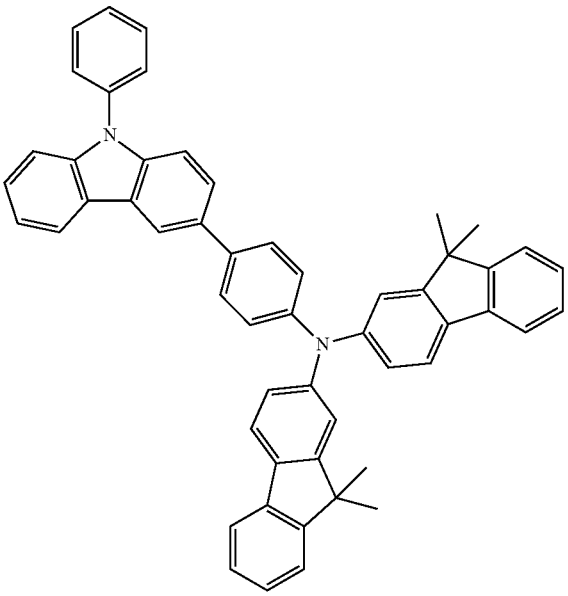

HT10
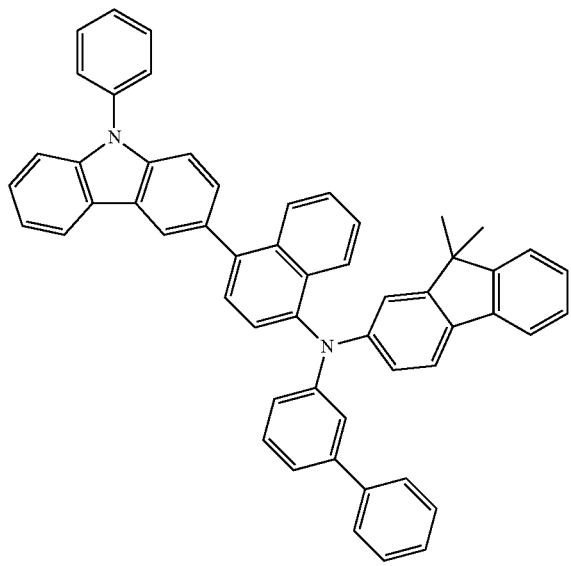
HT11
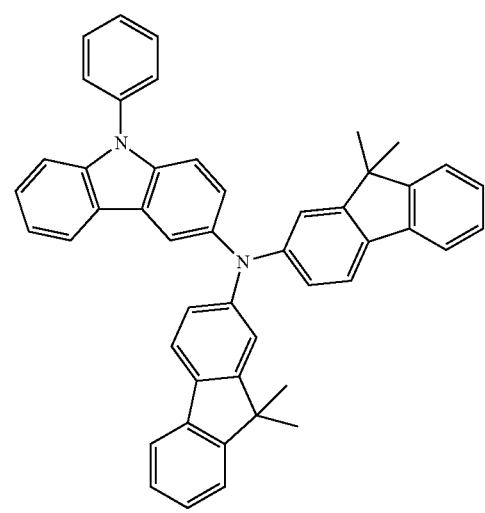
HT12
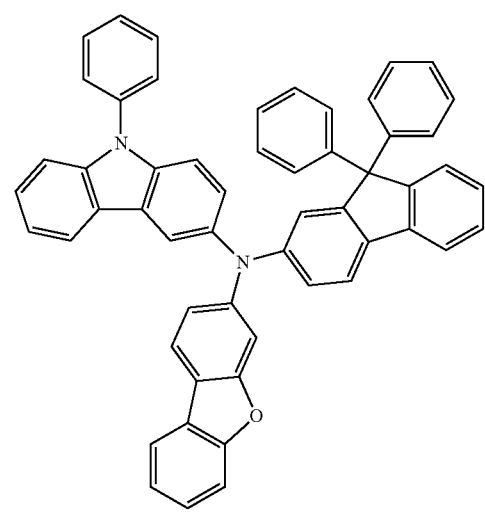
HT13
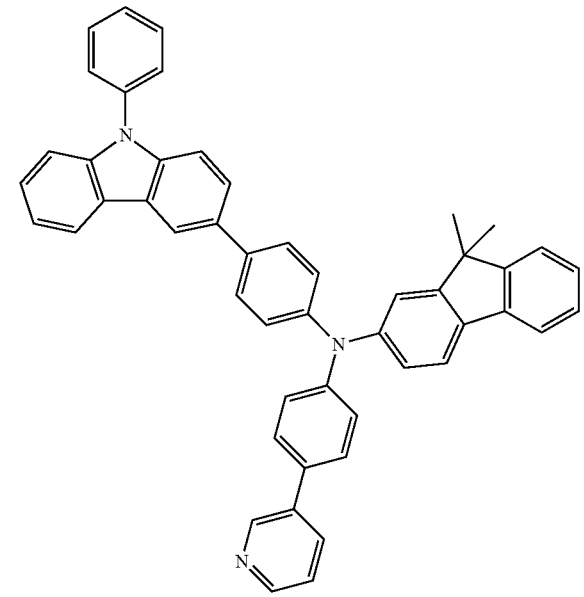
HT14
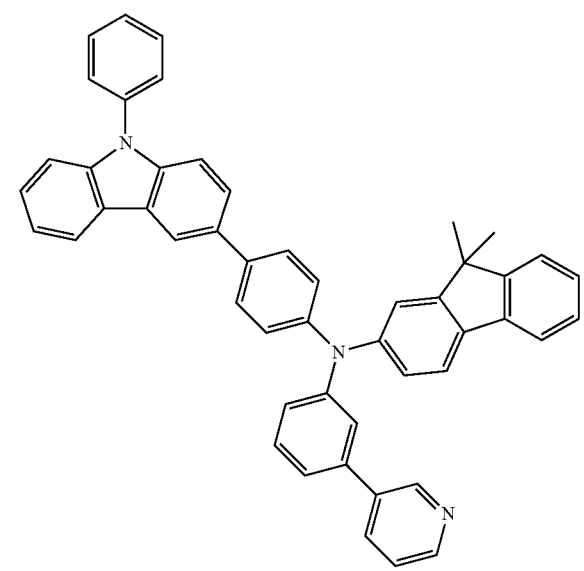

HT15
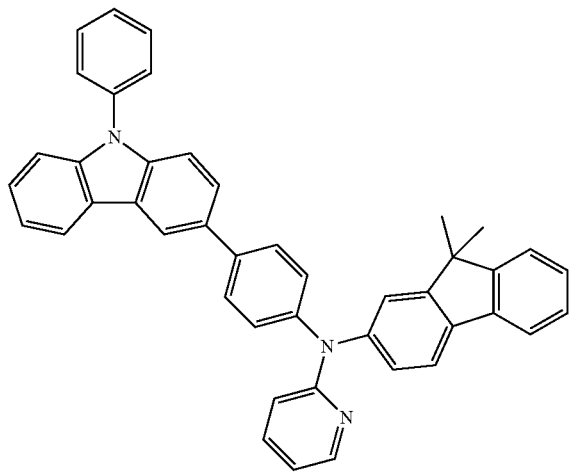
HT19
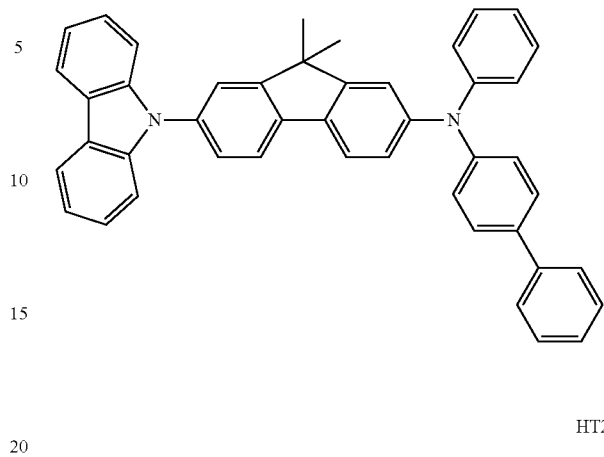
HT16
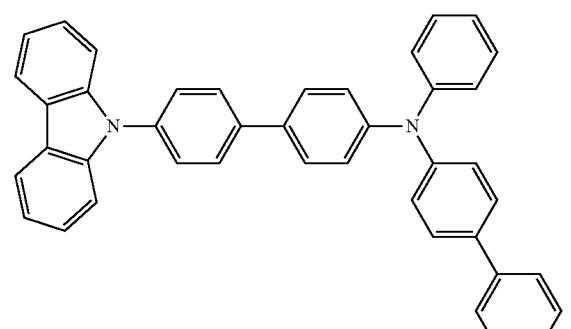
HT20
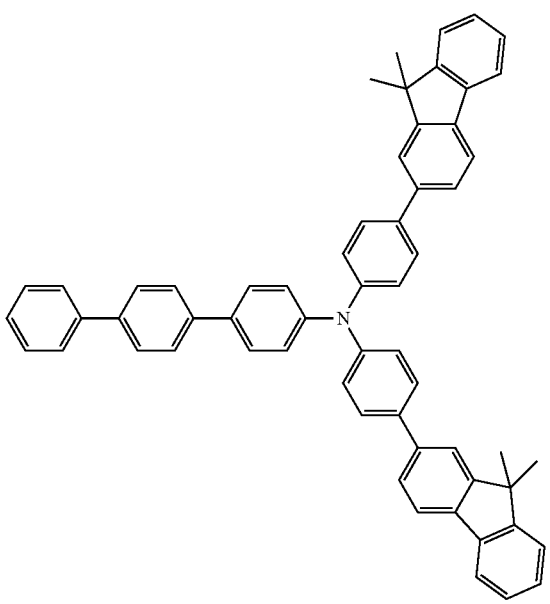
HT17
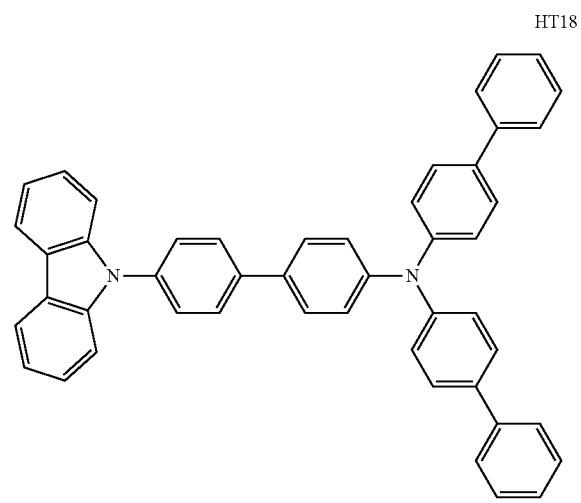
HT21
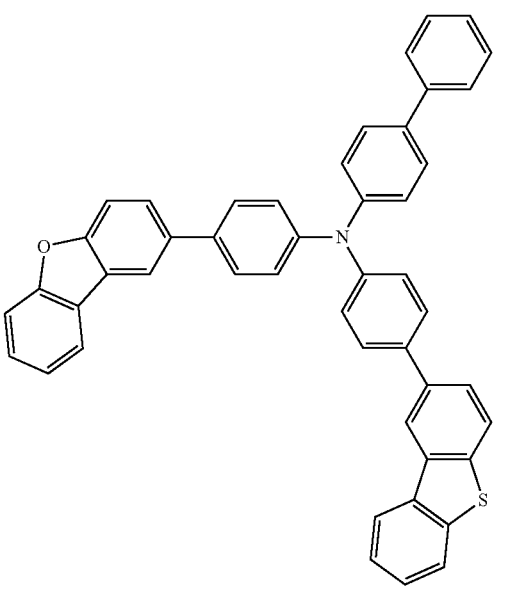
HT18

HT22
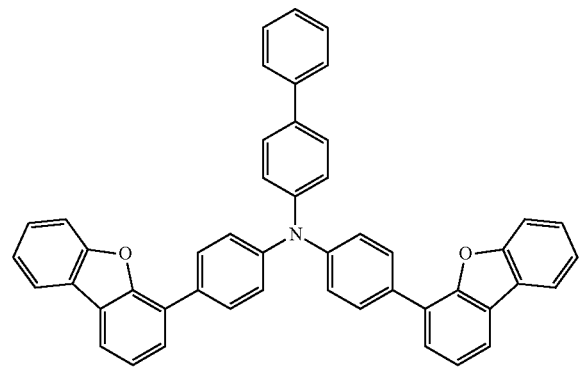
HT23
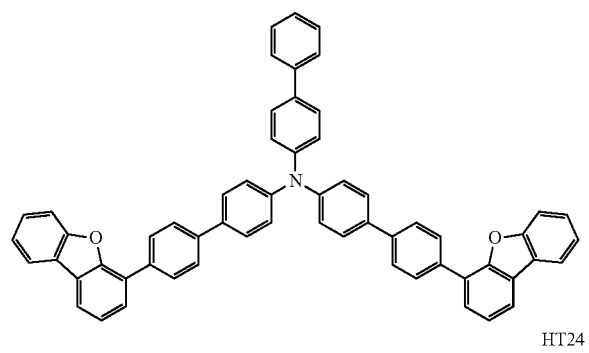
HT24
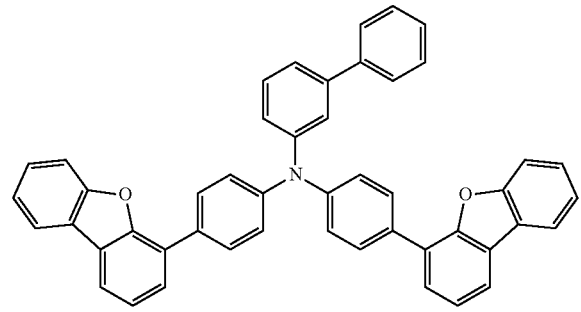
HT25
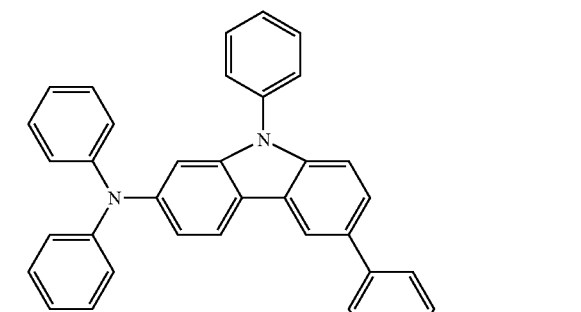
HT26
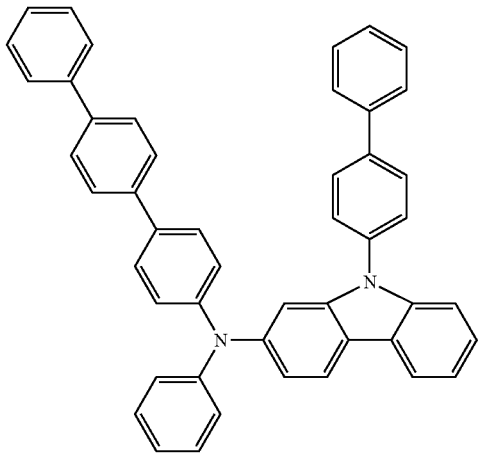
HT27
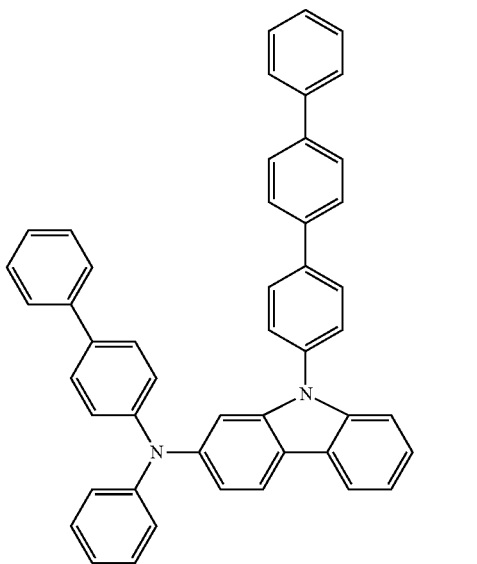
HT28
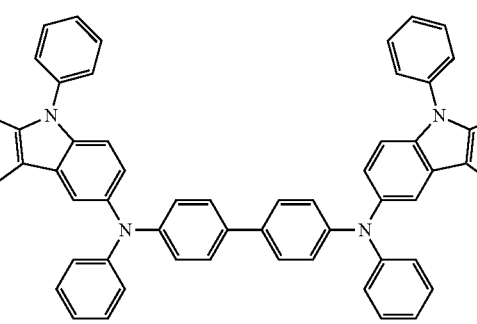

HT29
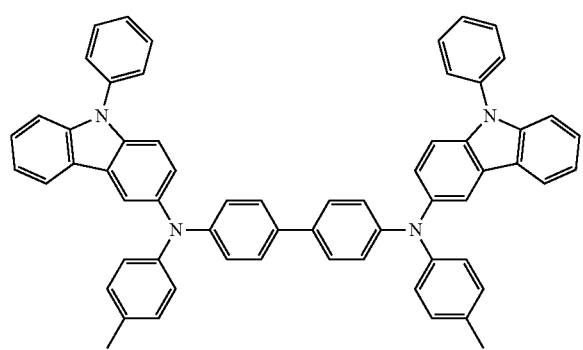
HT33
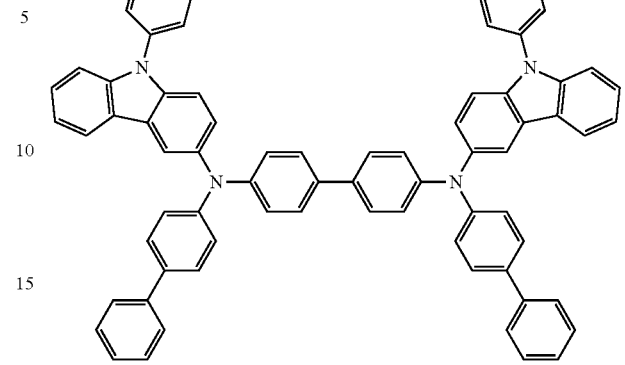
HT30
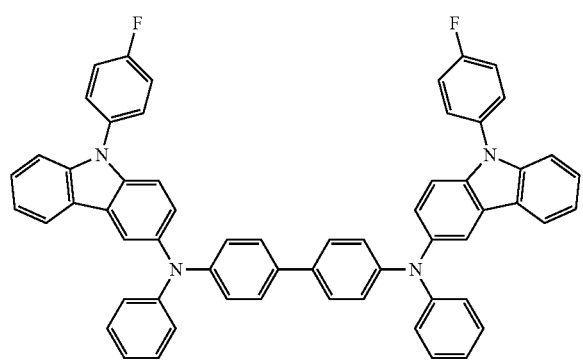
HT34
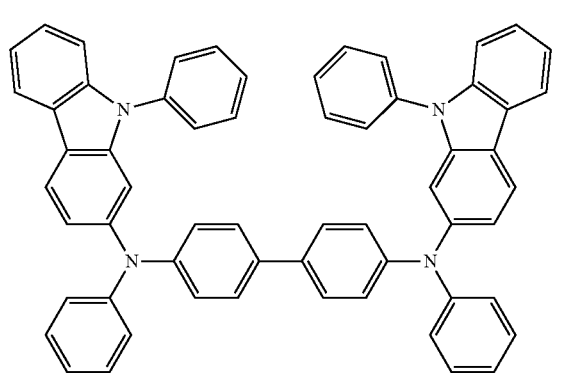
HT31
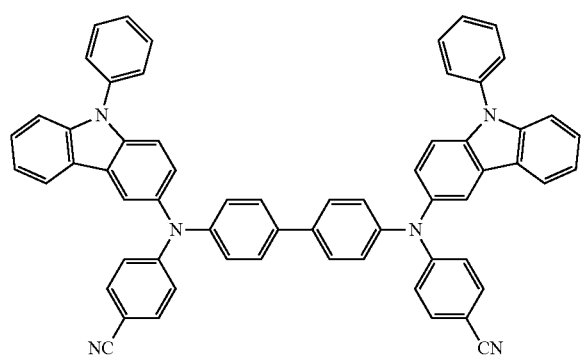
HT35
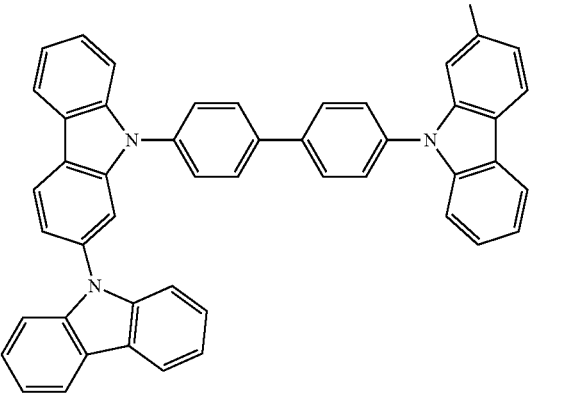
HT32
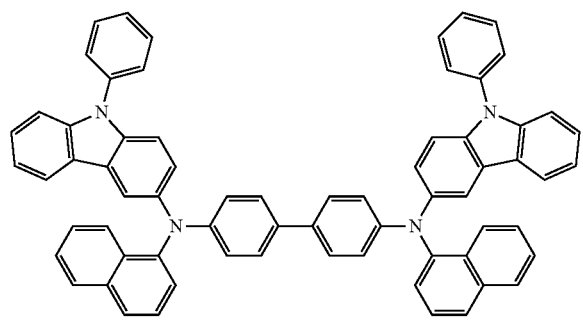

HT36
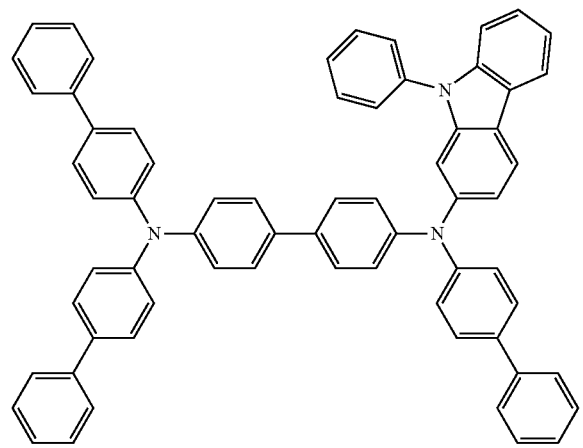
HT39
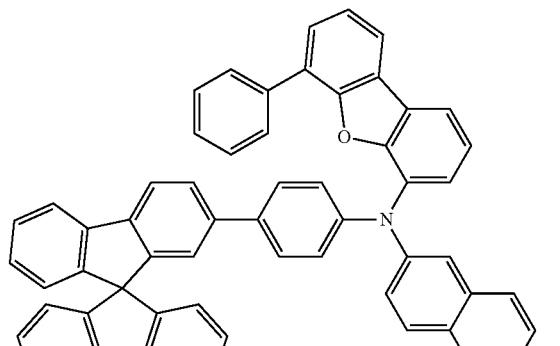
HT37
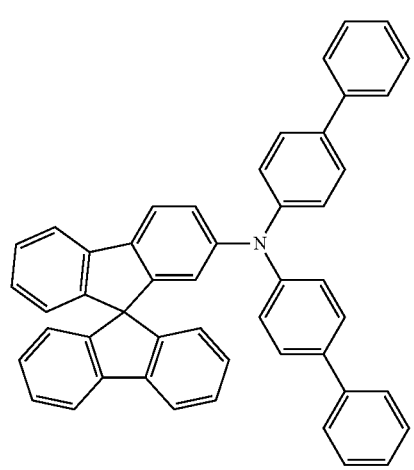
HT40
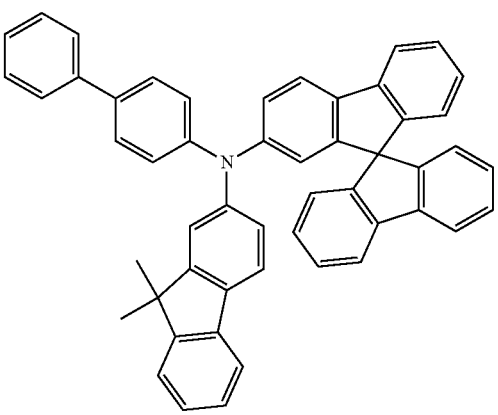
HT41
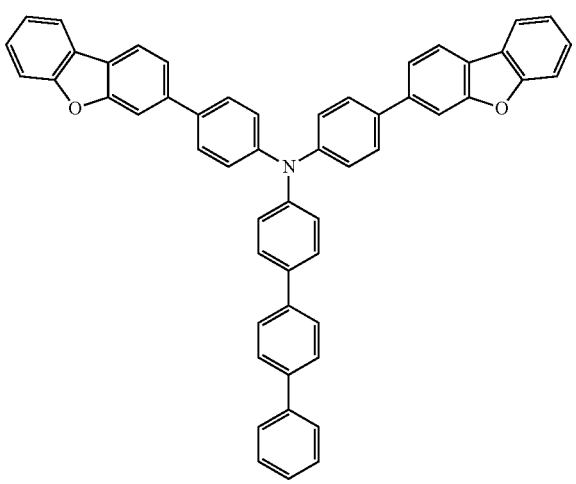
HT38
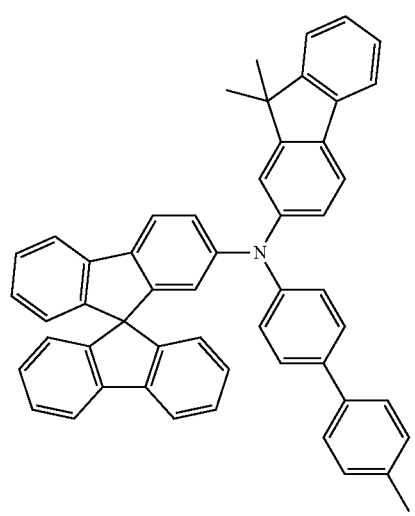
HT42
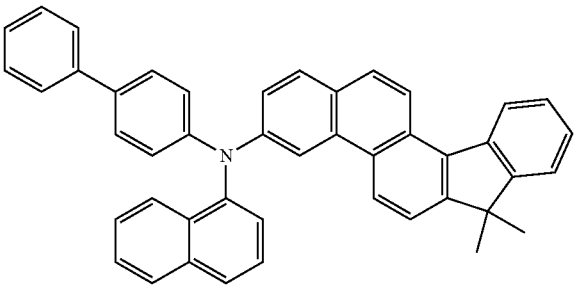

HT43
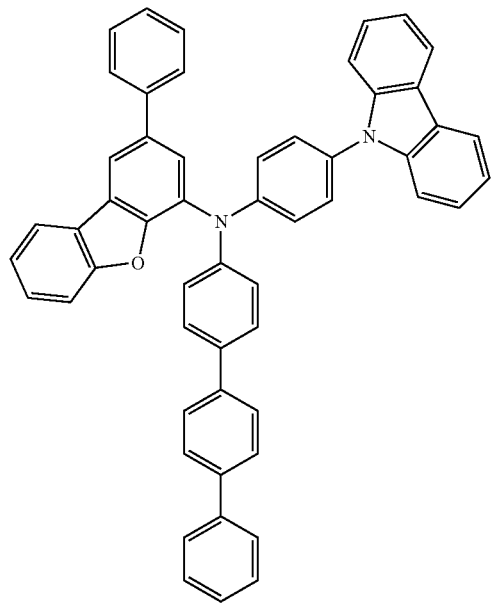
HT44
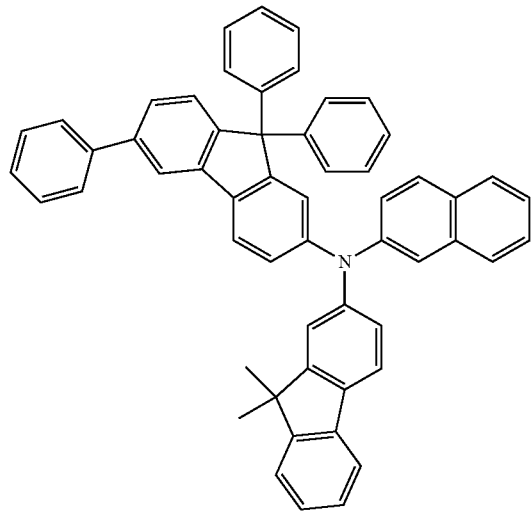
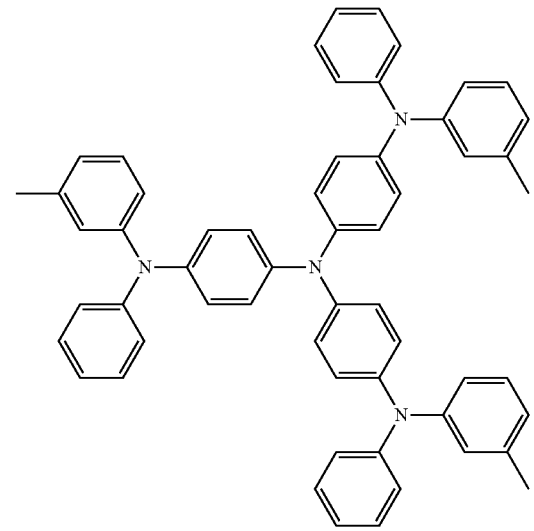
m-MTDATA
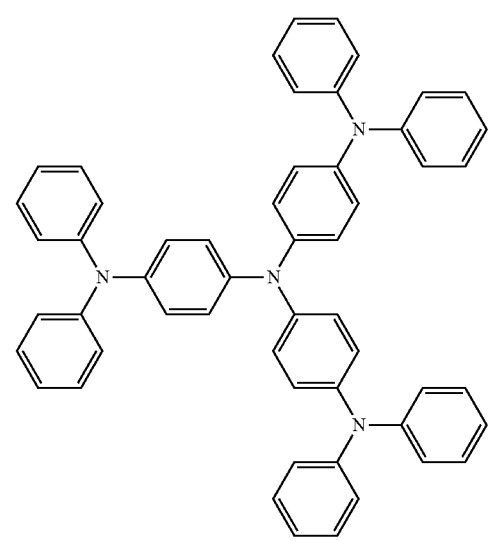
TDATA
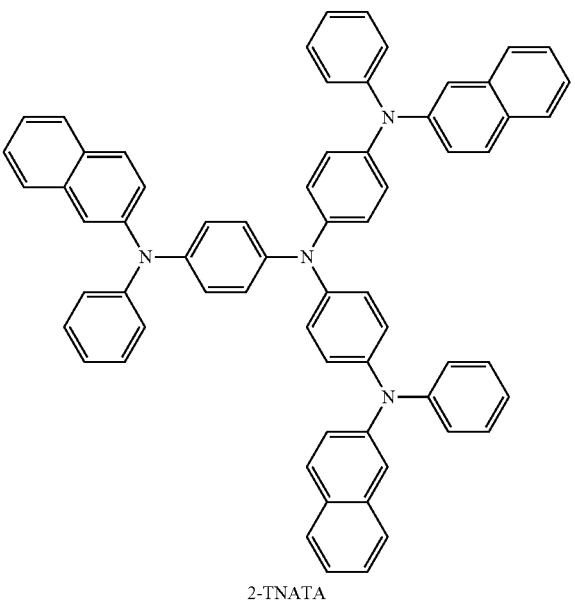
2-TNATA

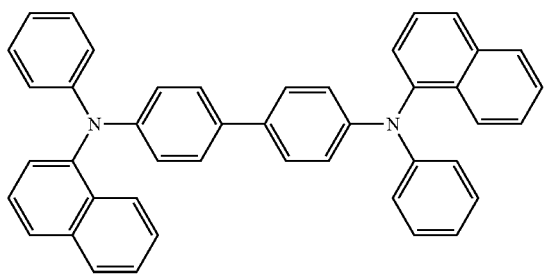

NPB

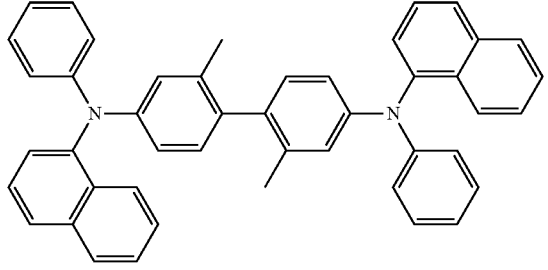

methylated-NPB

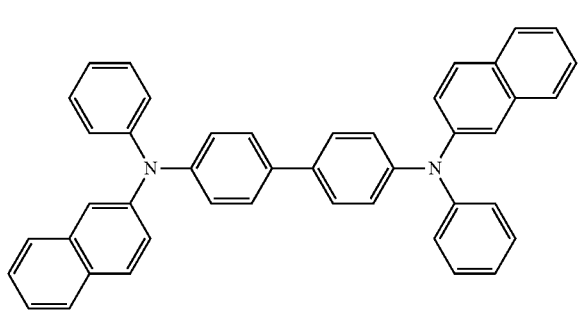

β-NPB

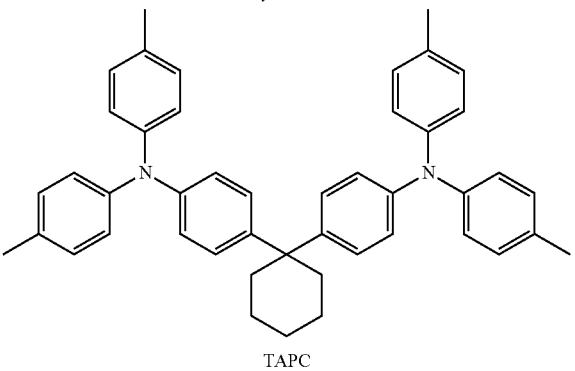

TAPC

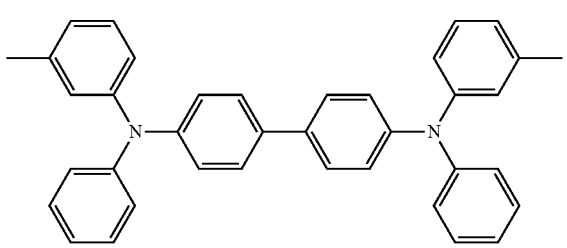

TPD

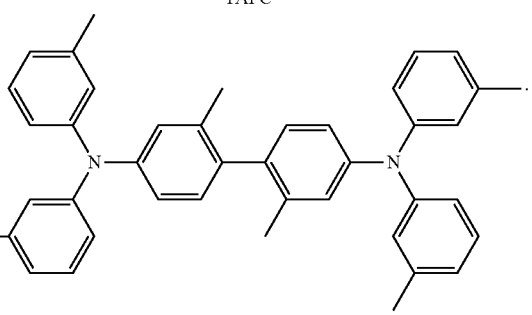

HMTPD

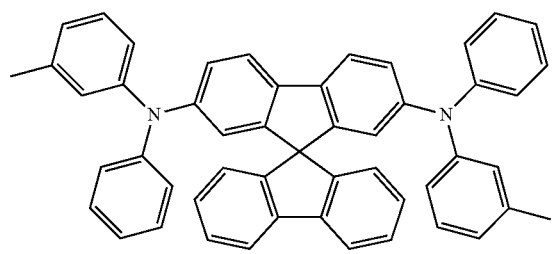

Spiro-TPD

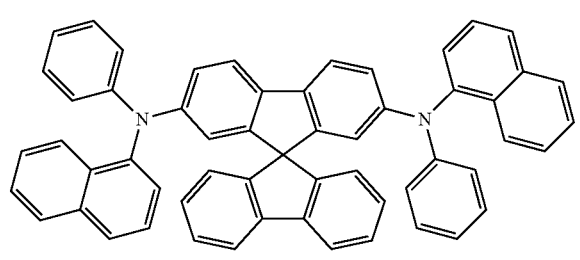

Spiro-NPB

The thickness of the hole transport region may be in a range of about 50 (Angstroms) Å to about 10,000 Å, and in some exemplary embodiments, about 100 Å to about 4,000 Å. When the hole transport region includes a hole injection layer, a hole transport layer, or any combination thereof, the thickness of the hole injection layer may be in a range of about 100 Å to about 9,000 Å, and in some exemplary embodiments, about 100 Å to about 1,000 Å, and the thickness of the hole transport layer may be in a range of about 50 Å to about 2,000 Å, and in some exemplary embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

P-Dopant

The hole transport region may include a charge generating material as well as the aforementioned materials to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant. In some exemplary embodiments, a lowest unoccupied molecular orbital (LUMO) energy level of the p-dopant may be about −3.5 eV or less.

In some exemplary embodiments, the p-dopant may include a quinone derivative, a cyano group-containing compound, elements EL1 and EL2-containing compound, or any combination thereof.

Examples of the quinone derivative may include tetracyanoquinodimethane (TCNQ), 2,3,5,6-tetrafluoro-7,7,8,8-tetracyanoquinodimethane (F4-TCNQ), and the like. Examples of the cyano group-containing compound include 1,4,5,8,9,12-hexaazatriphenylene-hexacarbonitrile (HAT-CN), a compound represented by Formula 221, and the like:

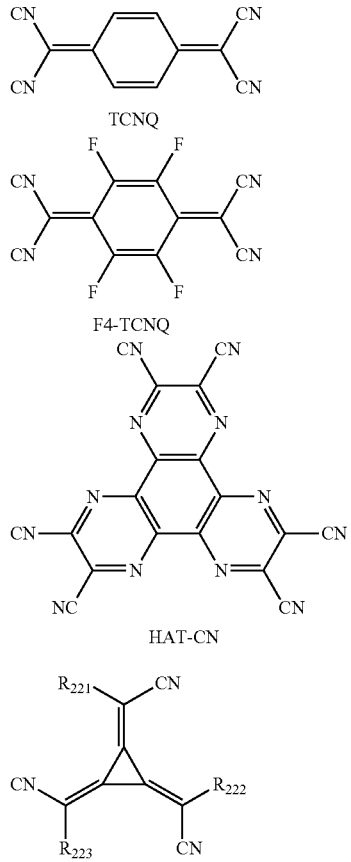

wherein, in Formula 221,
$R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and
at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof, or any combination thereof.

In the elements EL1 and EL2-containing compound, element EL1 may be metal, metalloid, or a combination thereof, and element EL2 may be non-metal, metalloid, or a combination thereof.

Examples of the metal may include: an alkali metal (e.g., lithium (Li), sodium (Na), potassium (K), rubidium (Rb), cesium (Cs), or the like); an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), ruthenium (Lu), or the like); and the like.

Examples of the metalloid may include silicon (Si), antimony (Sb), tellurium (Te), and the like. Examples of the non-metal may include oxygen (O), halogen (e.g., F, Cl, Br, I, and the like), and the like.

For example, the elements EL1 and EL2-containing compound may include a metal oxide, a metal halide (e.g., metal fluoride, metal chloride, metal bromide, metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include tungsten oxide (e.g., $WO$, $W_2O_3$, $WO_2$, $WO_3$, $W_2O_5$, and the like), vanadium oxide (e.g., $VO$, $V_2O_3$, $VO_2$, $V_2O_5$, and the like), molybdenum oxide ($MoO$, $Mo_2O_3$, $MoO_2$, $MoO_3$, $Mo_2O_5$, and the like), rhenium oxide (e.g., $ReO_3$, and the like), and the like.

Examples of the metal halide may include alkali metal halide, alkaline earth metal halide, transition metal halide, post-transition metal halide, lanthanide metal halide, and the like. Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like. Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgJ_2$, $CaI_2$, $SrI_2$, $BaI_2$, and the like.

Examples of the transition metal halide may include titanium halide (e.g., $TiF_4$, $TiCl_4$, $TiBr_4$, $TiI_4$, and the like), zirconium halide (e.g., $ZrF_4$, $ZrCl_4$, $ZrBr_4$, $ZrI_4$, and the like), hafnium halide (e.g., $HfF_4$, $HfCl_4$, $HfBr_4$, $HfI_4$, and the like), vanadium halide (e.g., $VF_3$, $VCl_3$, $VBr_3$, $VI_3$, and the like), niobium halide (e.g., $NbF_3$, $NbCl_3$, $NbBr_3$, $NbI_3$, and the like), tantalum halide (e.g., $TaF_3$, $TaCl_3$, $TaBr_3$, $TaI_3$, and the like), chromium halide (e.g., $CrF_3$, $CrCl_3$, $CrBr_3$, $CrI_3$, and the like), molybdenum halide (e.g., $MoF_3$, $MoCl_3$, $MoBr_3$, $MoI_3$, and the like), tungsten halide (e.g., $WF_3$, $WCl_3$, $WBr_3$, $WI_3$, and the like), manganese halide (e.g., $MnF_2$, $MnCl_2$, $MnBr_2$, $MnI_2$, and the like), technetium halide (e.g., $TcF_2$, $TcCl_2$, $TcBr_2$, $TcI_2$, and the like), rhenium halide (e.g., $ReF_2$, $ReCl_2$, $ReBr_2$, $ReI_2$, and the like), iron halide (e.g., $FeF_2$, $FeCl_2$, $FeBr_2$, $FeI_2$, and the like), ruthenium halide (e.g., $RuF_2$, $RuCl_2$, $RuBr_2$, $RuI_2$, and the like), osmium halide (e.g., $OsF_2$, $OsCl_2$, $OsBr_2$, $OsI_2$, and the like), cobalt halide (e.g., $CoF_2$, $CoCl_2$, $CoBr_2$, $CoI_2$, and the like), rhodium halide (e.g., $RhF_2$, $RhCl_2$, $RhBr_2$, $RhI_2$, and the like), iridium halide (e.g., $IrF_2$, $IrCl_2$, $IrBr_2$, $IrI_2$, and the like), nickel halide (e.g., $NiF_2$, $NiCl_2$, $NiBr_2$, $NiI_2$, and the like), palladium halide (e.g., $PdF_2$, $PdCl_2$, $PdBr_2$, $PdI_2$, and the like), platinum halide (e.g., $PtF_2$, $PtCl_2$, $PtBr_2$, $PtI_2$, and the like), copper halide (e.g., CuF, CuCl, CuBr, CuI, and the like), silver halide (e.g., AgF, AgCl, AgBr, AgI, and the like), gold halide (e.g., AuF, AuCl, AuBr, AuI, and the like), and the like.

Examples of the post-transition metal halide may include zinc halide (e.g., $ZnF_2$, $ZnCl_2$, $ZnBr_2$, $ZnI_2$, and the like), indium halide (e.g., $InI_3$ and the like), tin halide (e.g., $SnI_2$ and the like), and the like. Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like. Examples of the metalloid halide may include antimony halide (e.g., $SbCl_5$ and the like) and the like.

Examples of the metal telluride may include alkali metal telluride (e.g., $Li_2Te$, $Na_2Te$, $K_2Te$, $Rb_2Te$, $Cs_2Te$, and the like), alkaline earth metal telluride (e.g., BeTe, MgTe, CaTe, SrTe, BaTe, and the like), transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), post-transition metal telluride (e.g., ZnTe and the like), lanthanide metal telluride (e.g., LaTe, CeTe, PrTe, NdTe, PmTe, EuTe, GdTe, TbTe, DyTe, HoTe, ErTe, TmTe, YbTe, LuTe, and the like), and the like.

Emission Layer in Interlayer 130

When the light-emitting device 10 is a full color light-emitting device, the emission layer may be patterned into a red emission layer, a green emission layer, and/or a blue emission layer, according to a sub-pixel. In one or more exemplary embodiments, the emission layer may have a stacked structure. The stacked structure may include two or more layers selected from a red emission layer, a green emission layer, and a blue emission layer. The two or more layers may be in direct contact with each other. In some exemplary embodiments, the two or more layers may be separated from each other. In one or more exemplary embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include a host and a dopant. The dopant may be a phosphorescent dopant, a fluorescent dopant, or any combination thereof. The amount of the dopant in the emission layer may be in a range of about 0.01 parts to about 15 parts by weight based on 100 parts by weight of the host. In some exemplary embodiments, the emission layer may include a quantum dot. The emission layer may include a delayed fluorescent material. The delayed fluorescent material may serve as a host or a dopant in the emission layer.

The thickness of the emission layer may be in a range of about 100 Å to about 1,000 Å, and in some exemplary embodiments, about 200 Å to about 600 Å. When the thickness of the emission layer is within any of these ranges, improved luminescence characteristics may be obtained without a substantial increase in driving voltage. In some exemplary embodiments, the emission layer may include the heterocyclic compound represented by Formula 1.

Host

In some exemplary embodiments, the host may include the heterocyclic compound represented by Formula 1 described herein. In some exemplary embodiments, the host may further include a compound represented by Formula 301:

$$[Ar_{301}]_{xb11}\text{-}[(L_{301})_{xb1}\text{-}R_{301}]_{xb21} \qquad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each be understood by referring to the description of $Q_1$ provided herein.

In some exemplary embodiments, when xb11 in Formula 301 is 2 or greater, at least two $Ar_{301}$(s) may be bound via a single bond.

In some exemplary embodiments, the host may include a compound represented by Formula 301-1, a compound represented by Formula 301-2, or any combination thereof:

Formula 301-1

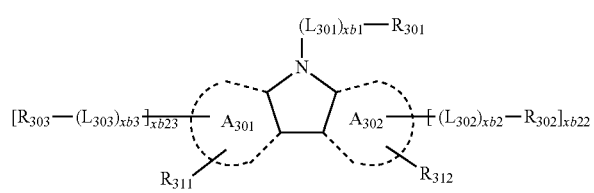

Formula 301-2

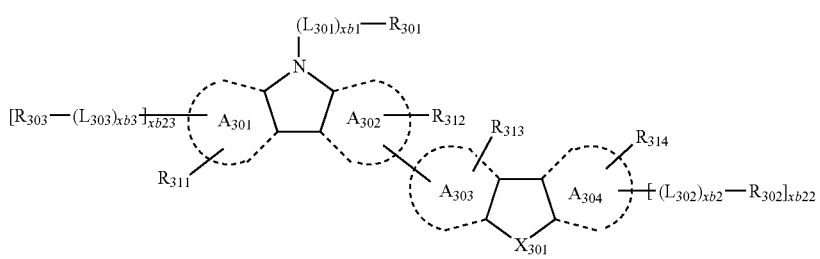

wherein, in Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N—[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ may respectively be understood by referring to the descriptions of $L_{301}$, xb1, and $R_{301}$ provided herein, $L_{302}$ to $L_{304}$ may each be understood by referring to the description of $L_{301}$ provided herein, xb2 to xb4 may each be understood by referring to the descriptions of xb1 provided herein, and $R_{302}$ to $R_{305}$ and $R_{311}$ to $R_{314}$ may each be understood by referring to the descriptions of $R_{301}$ provided herein.

In some exemplary embodiments, the host may include an alkaline earth metal complex. For example, the host may include a Be complex (e.g., Compound H55), a Mg complex, a Zn complex, or any combination thereof.

In some exemplary embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof.

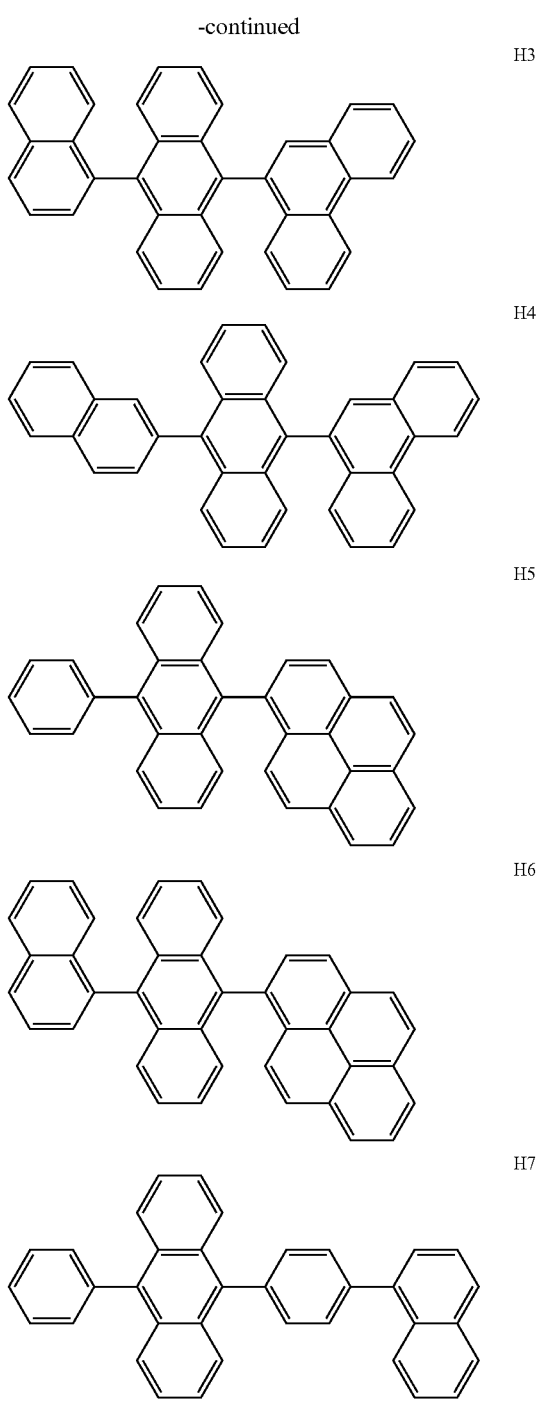

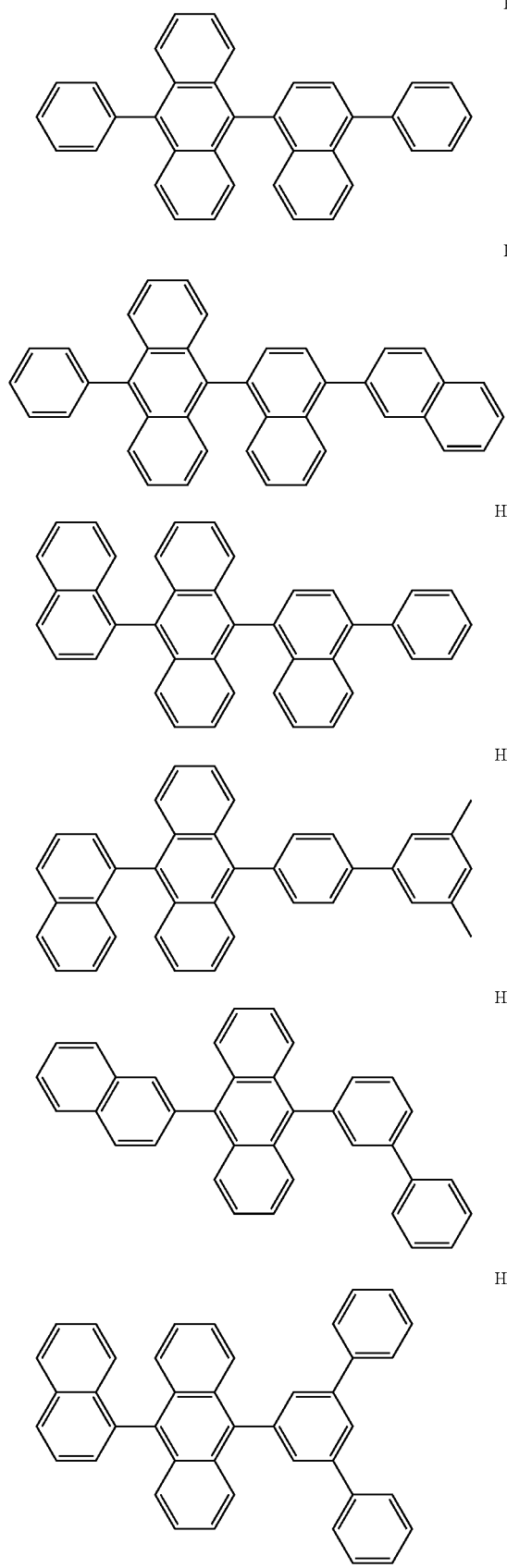
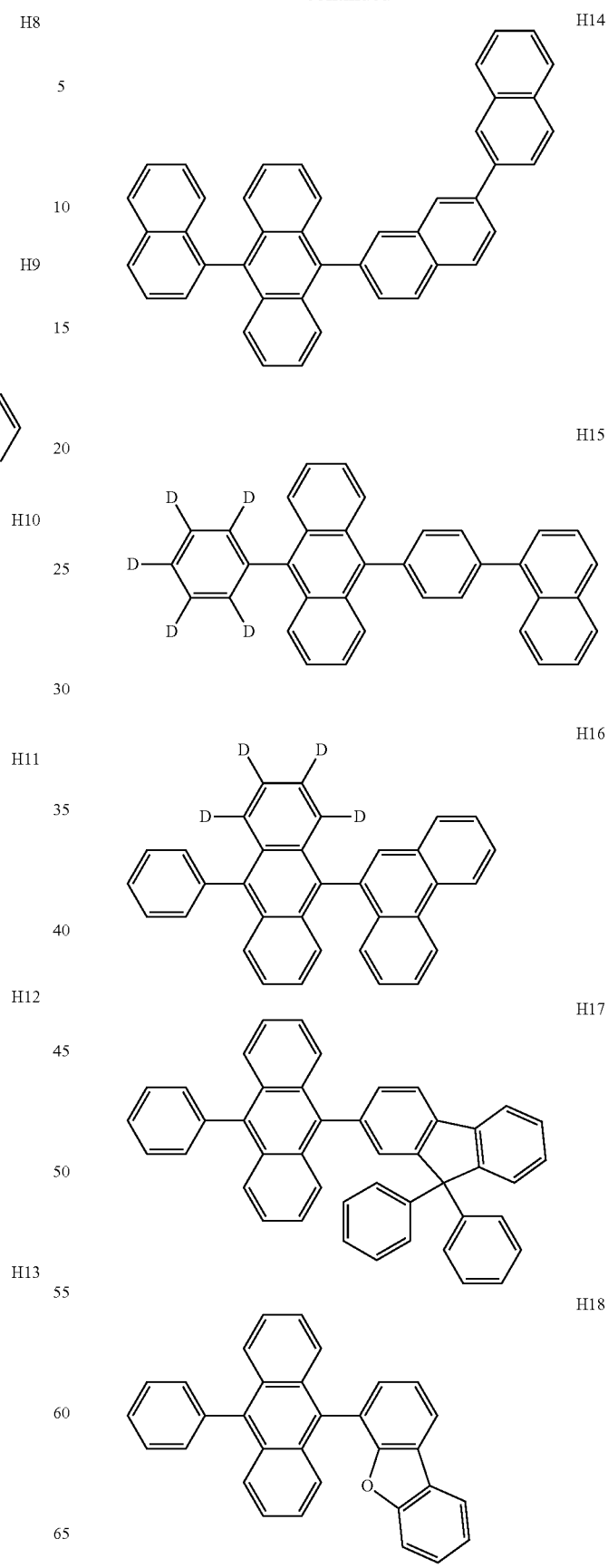

H19
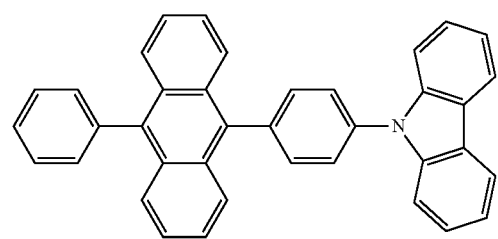
H20
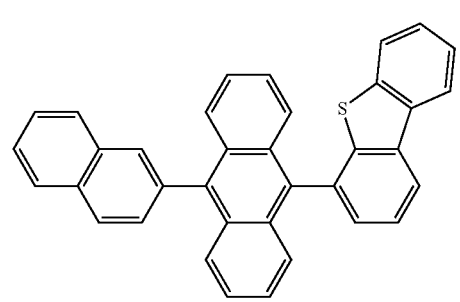
H21
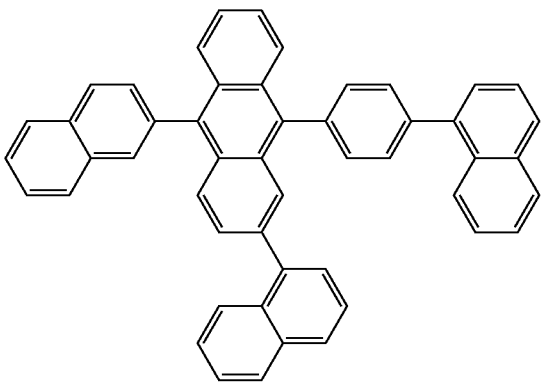
H22
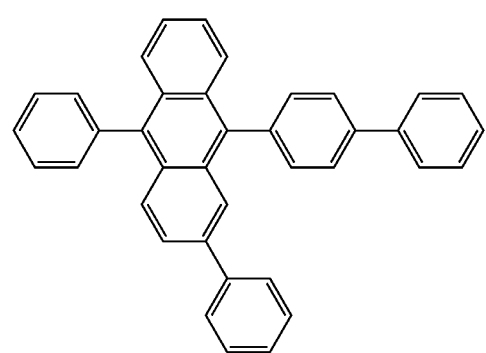
H23
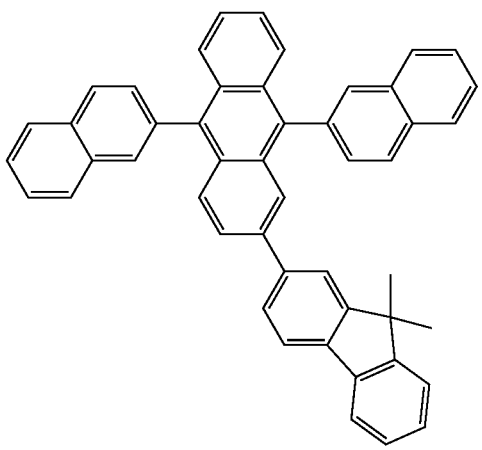
H24
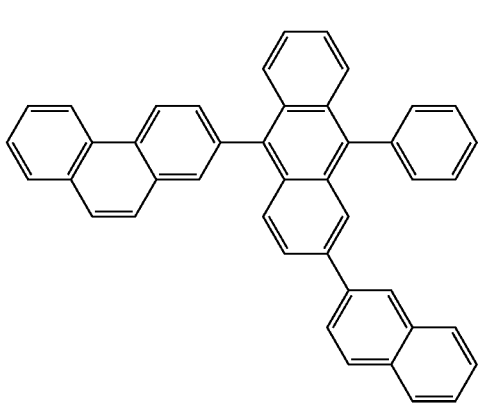
H25
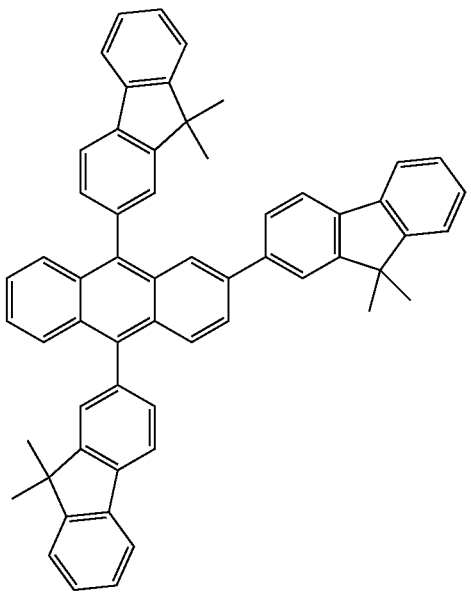

81
-continued
H26
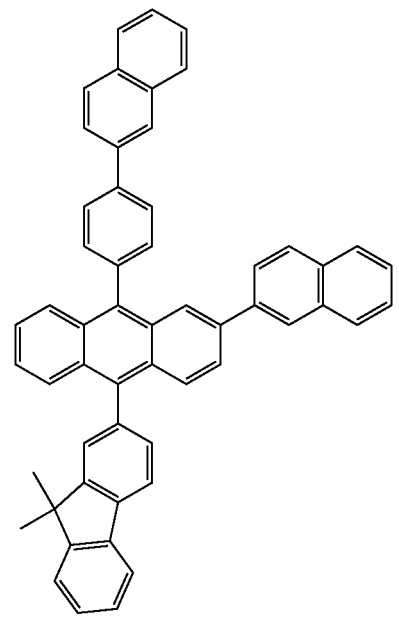
H27
H28
82
-continued
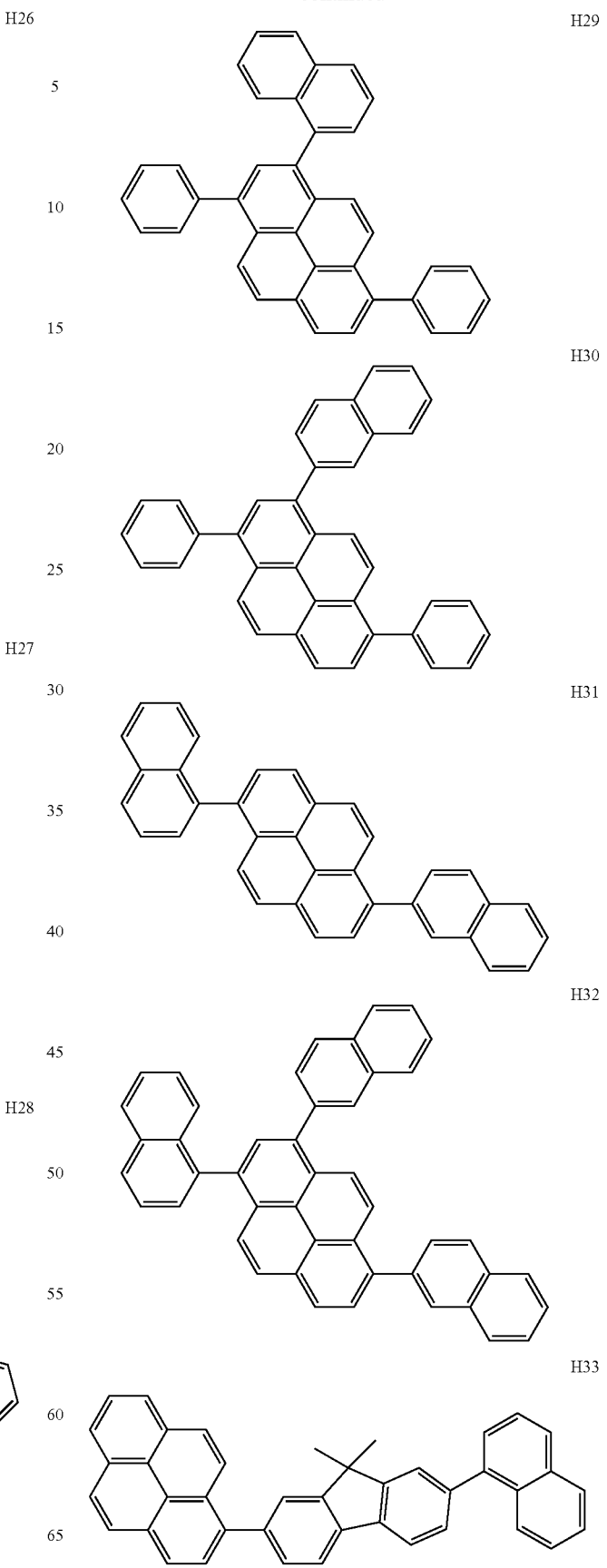
H29
H30
H31
H32
H33

H34
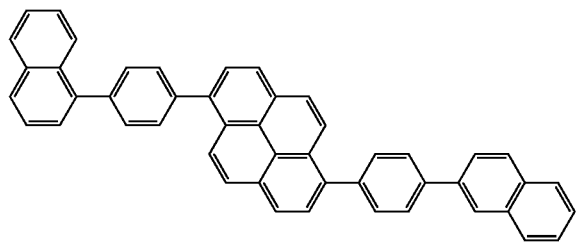
H35
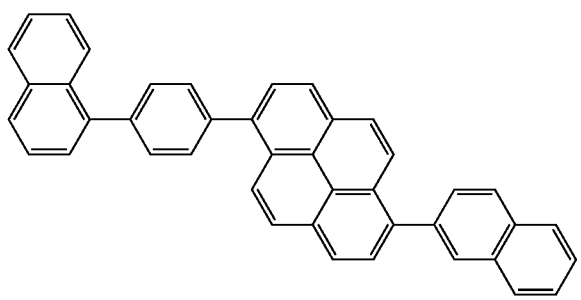
H36
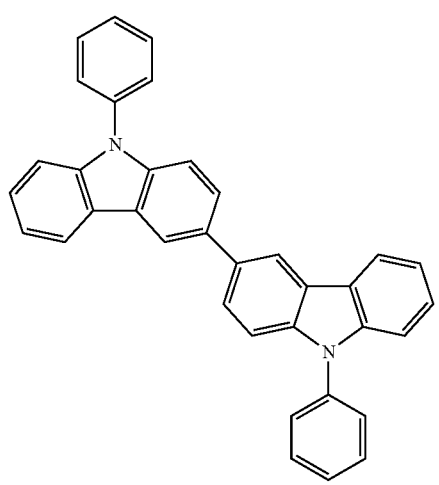
H37
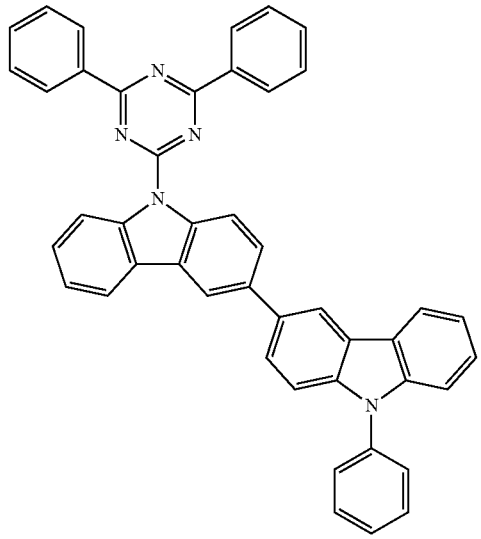
H38
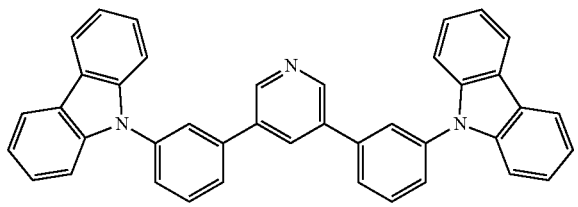
H39
H40

85
-continued
H41
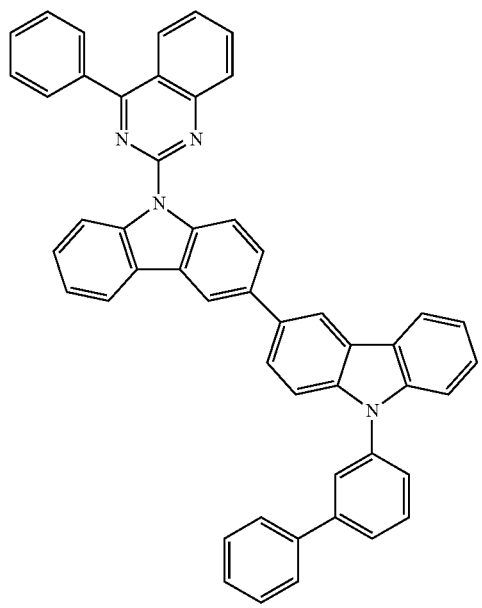
H42
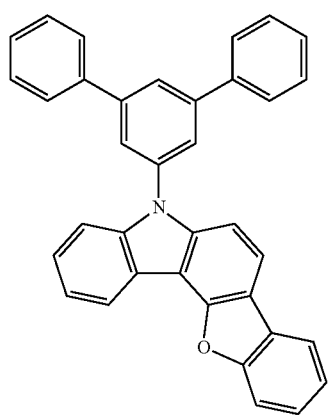
H43
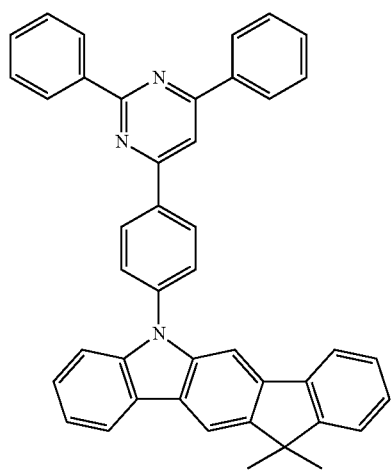
86
-continued
H44
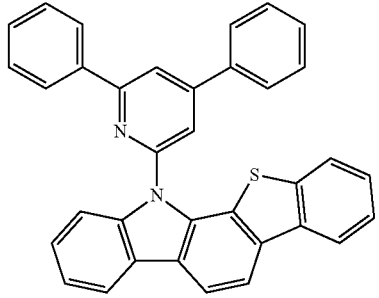
H45
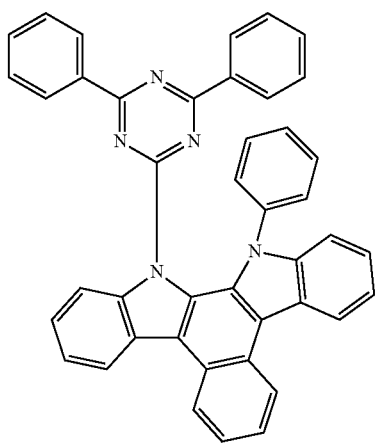
H46
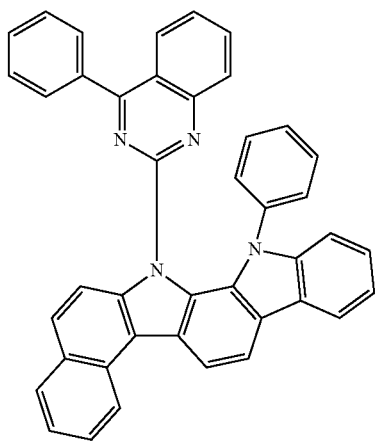
H47
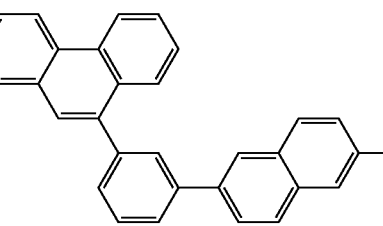

H48
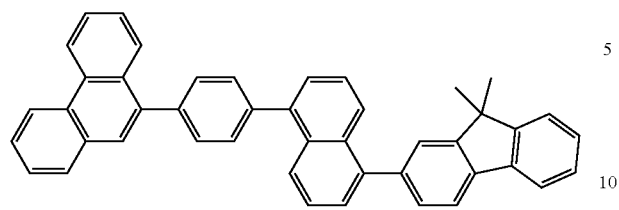
H49
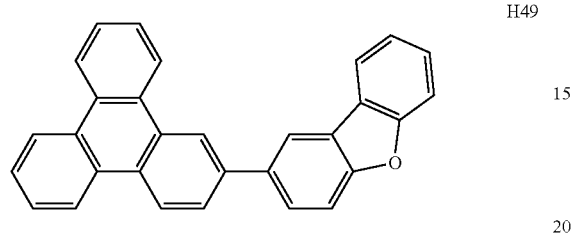
H50
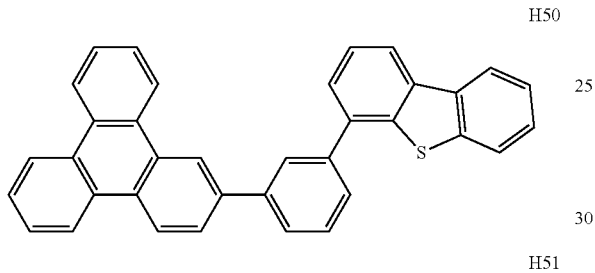
H51
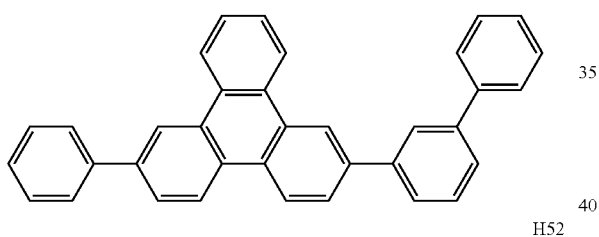
H52
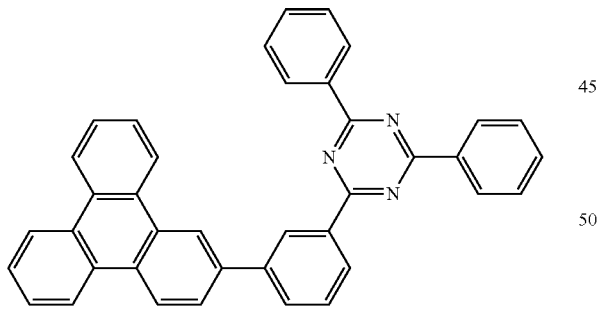
H53
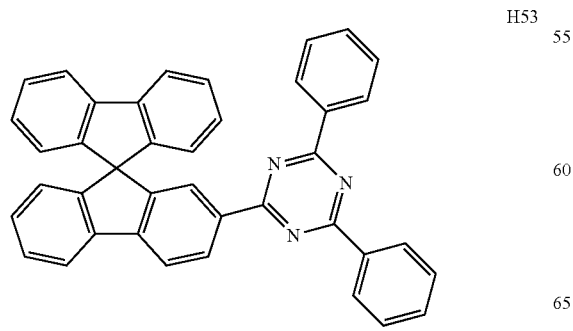
H54
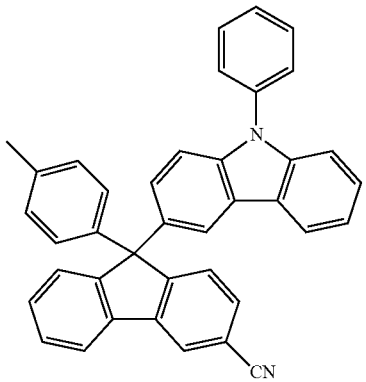
H55
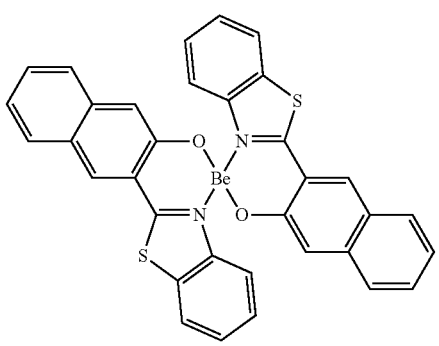
H56
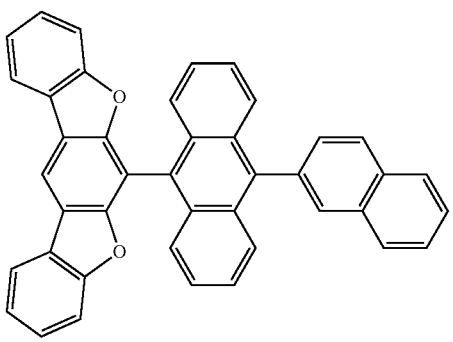
H57
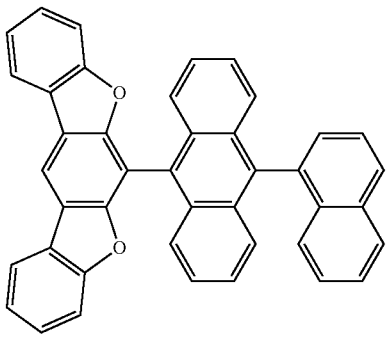

H58
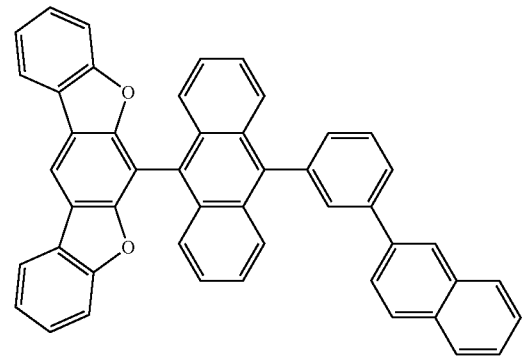
H59
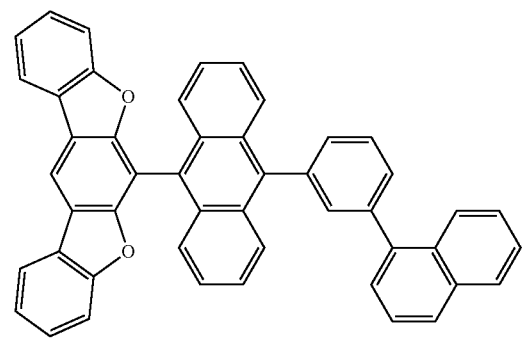
H60
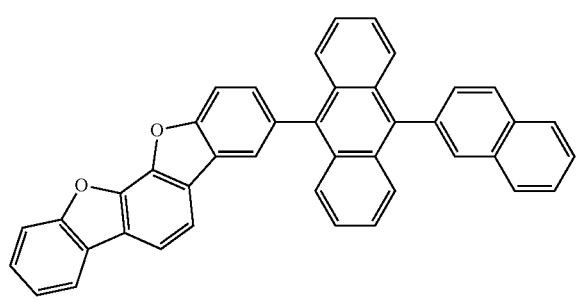
H61
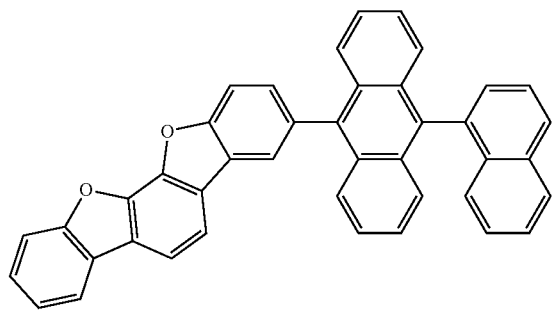
H62
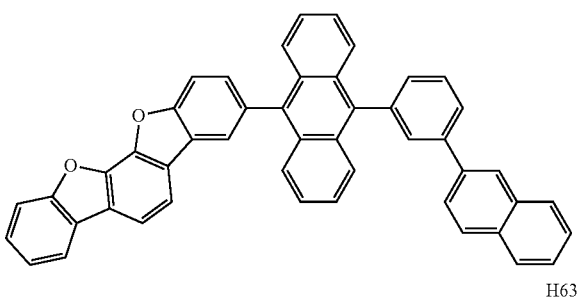
H63
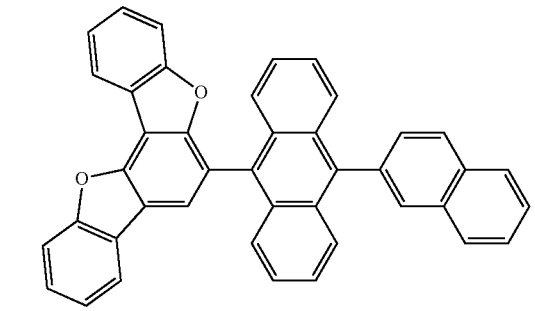
H64
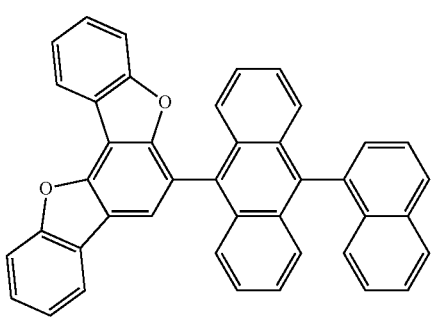
H65
H66
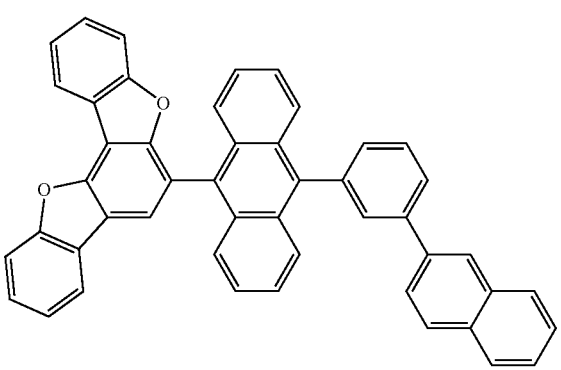

H67
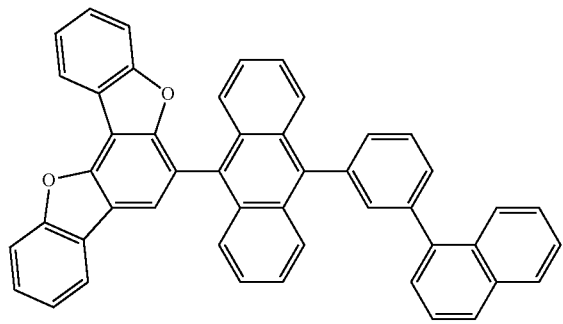
H68
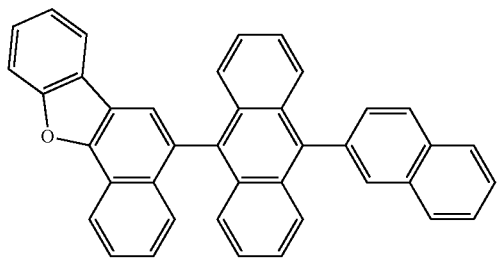
H69
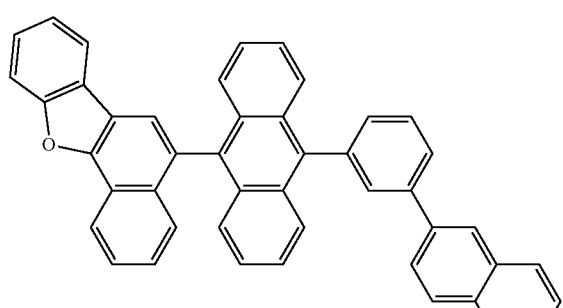
H70
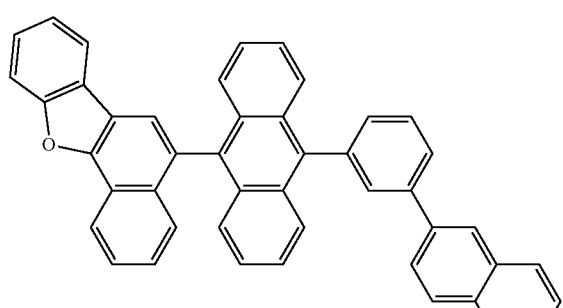
H71
H72
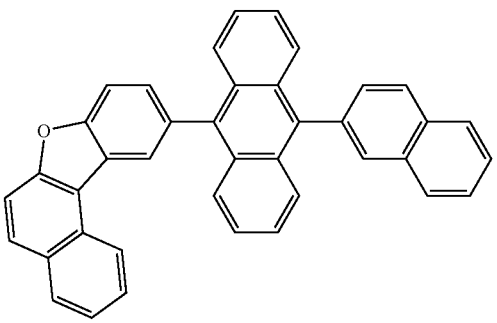
H73
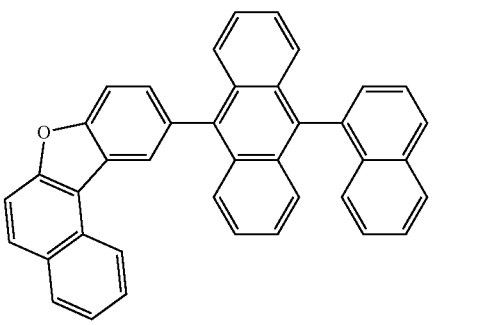
H74
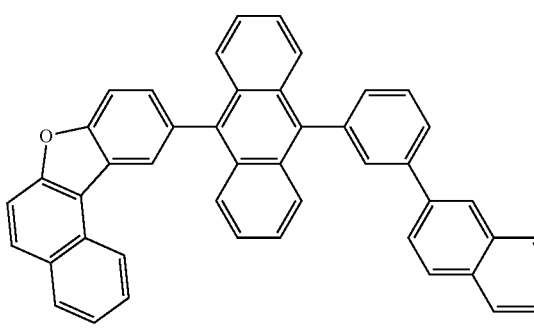
H75
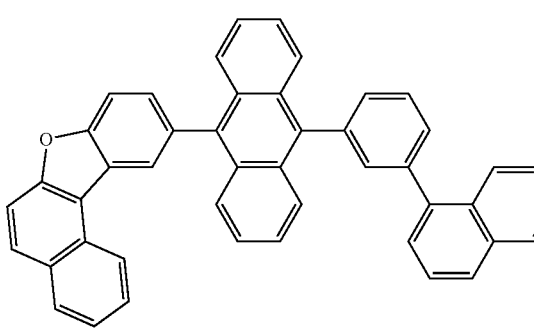
H76
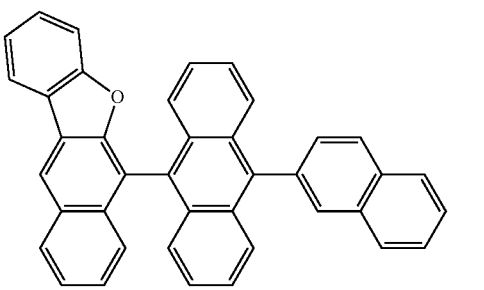

H77
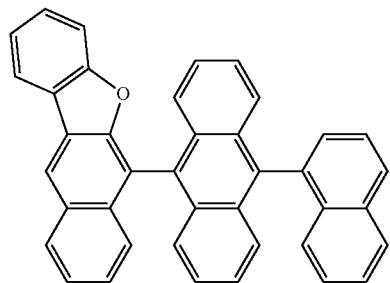
H78
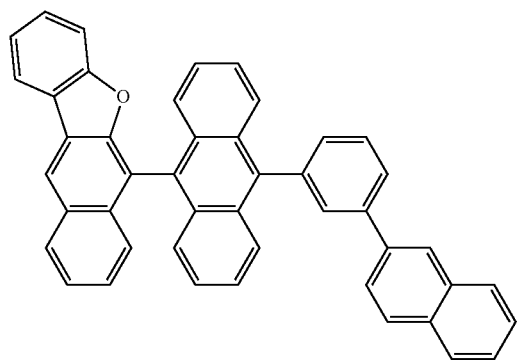
H79
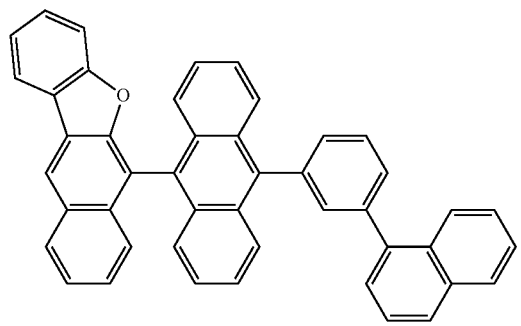
H80
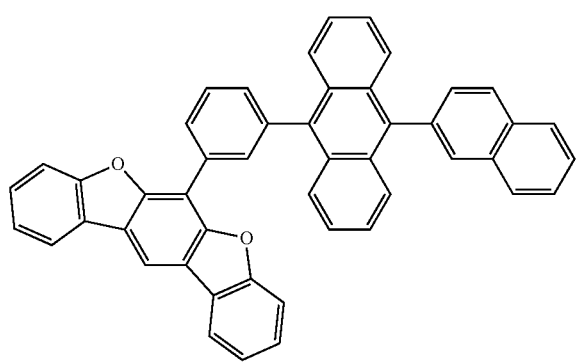
H81
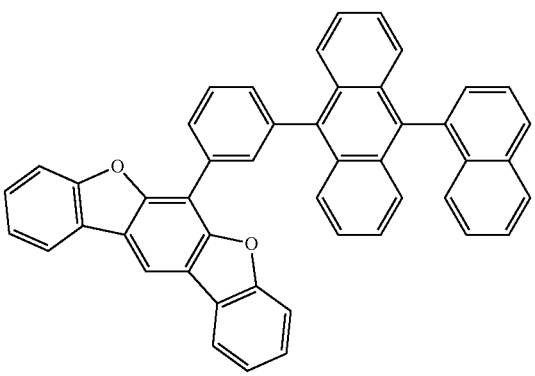
H82
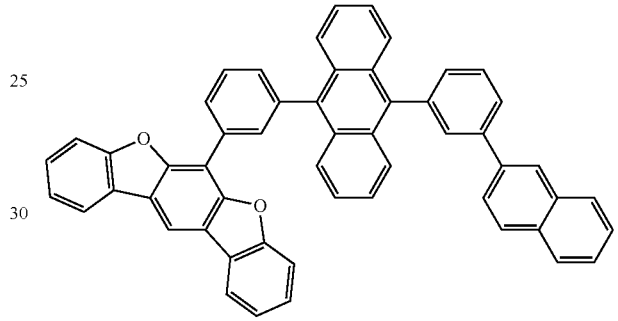
H83
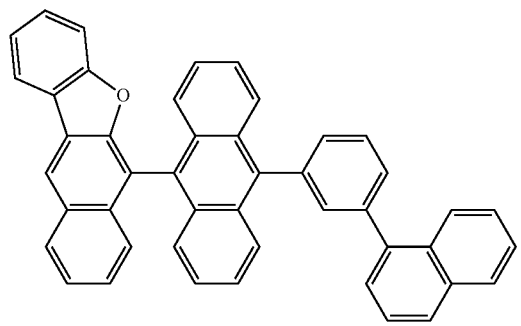
H84

H85
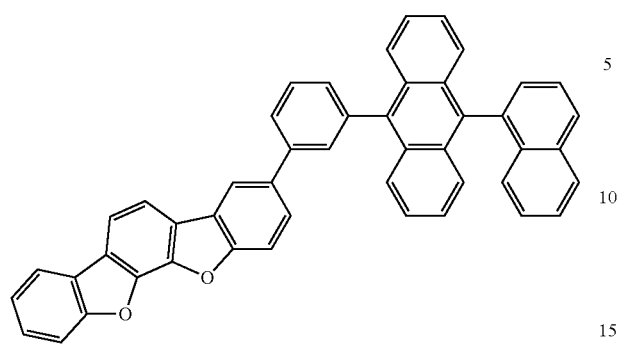
H86
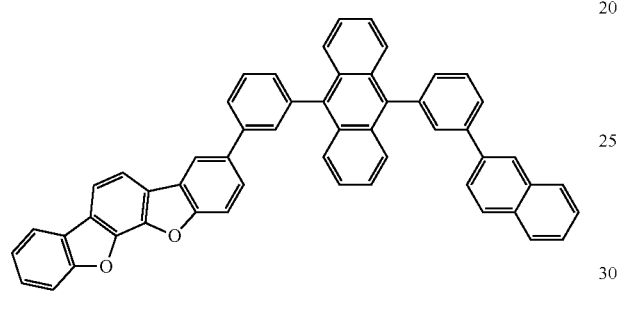
H87
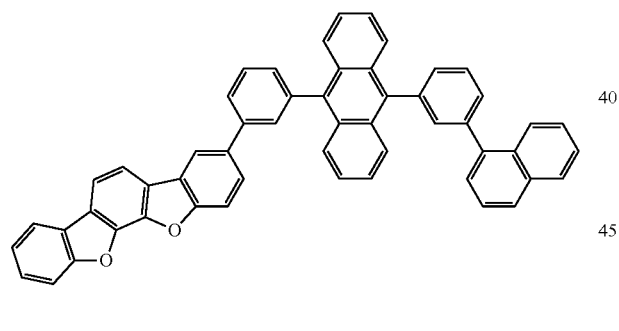
H88
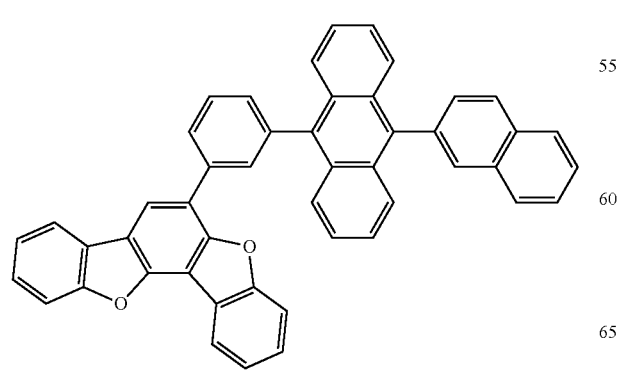
H89
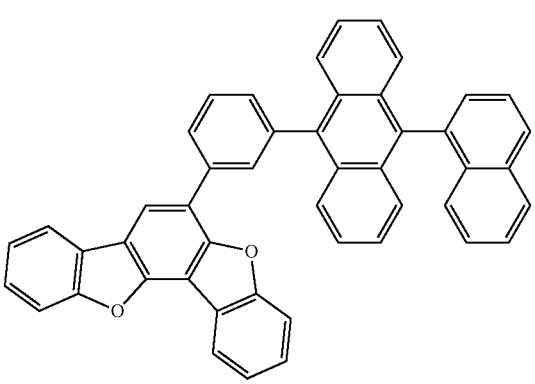
H90
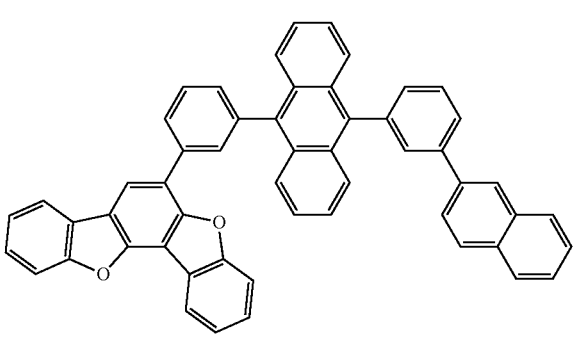
H91
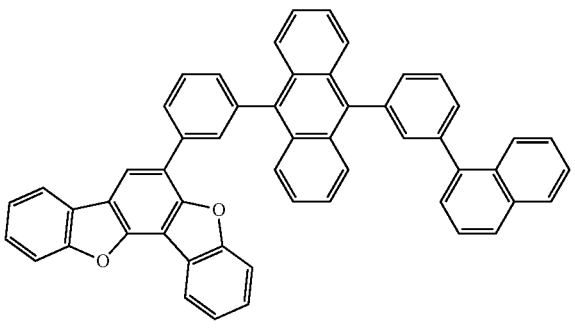
H92
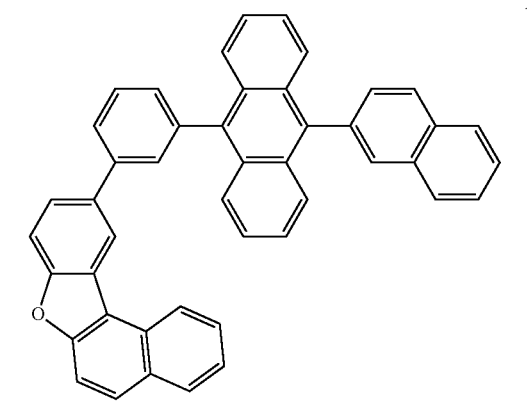

H93
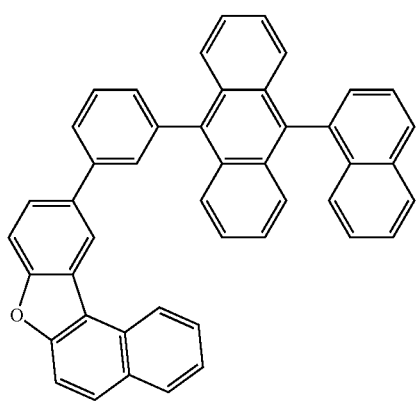
H97
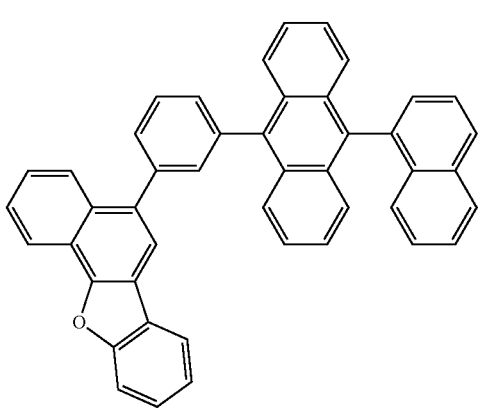
H94
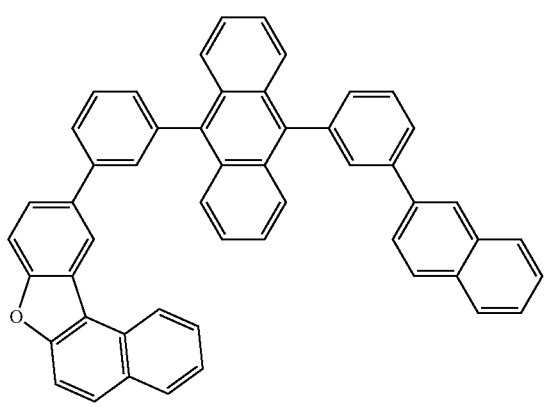
H98
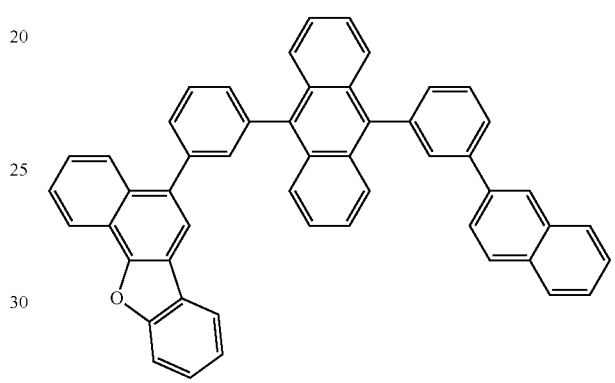
H95
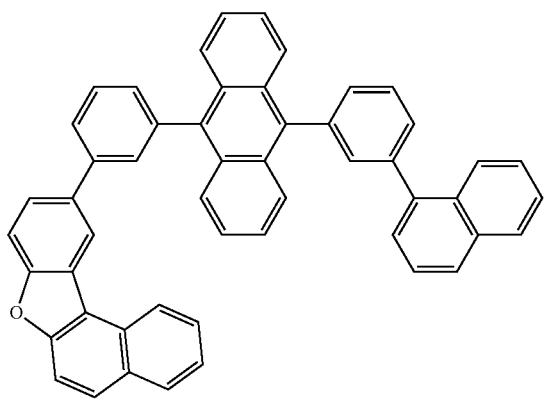
H99
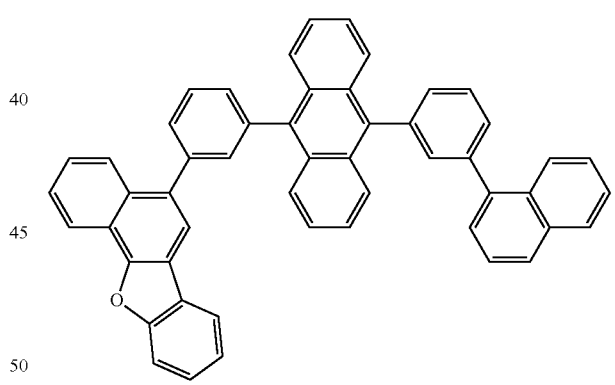
H96
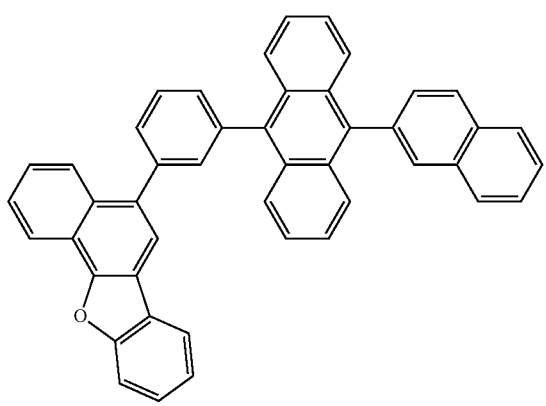
H100
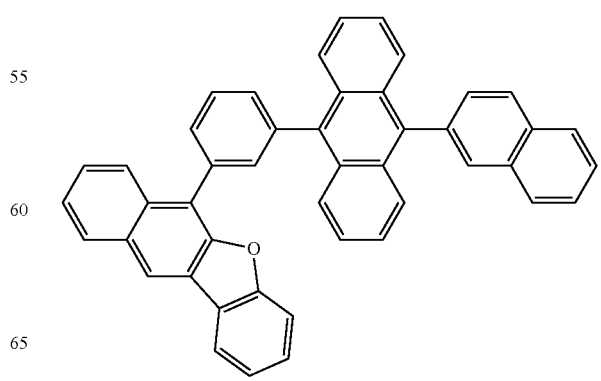

H101
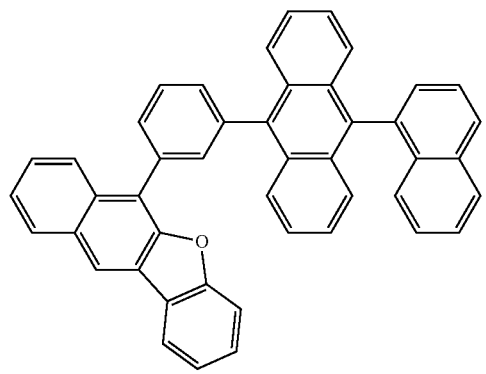
H102
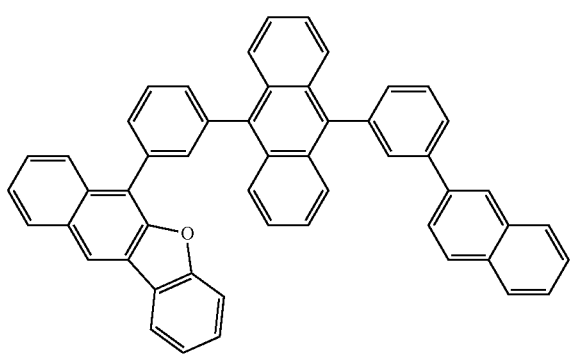
H103
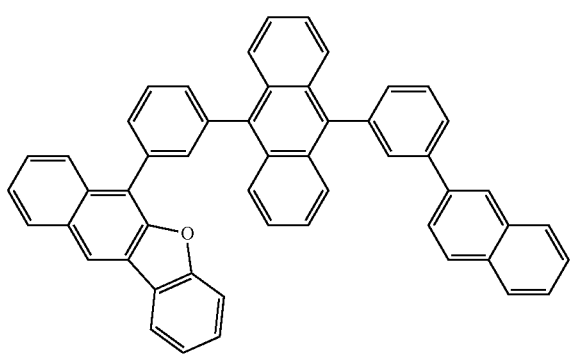
H104
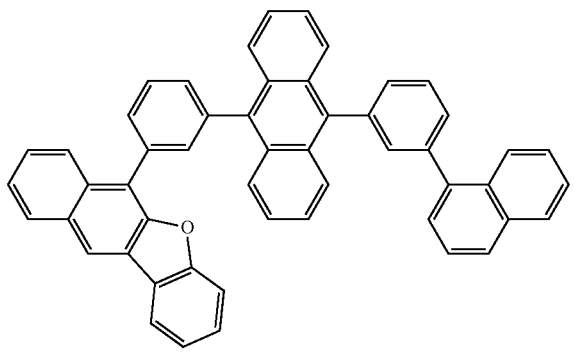
H105
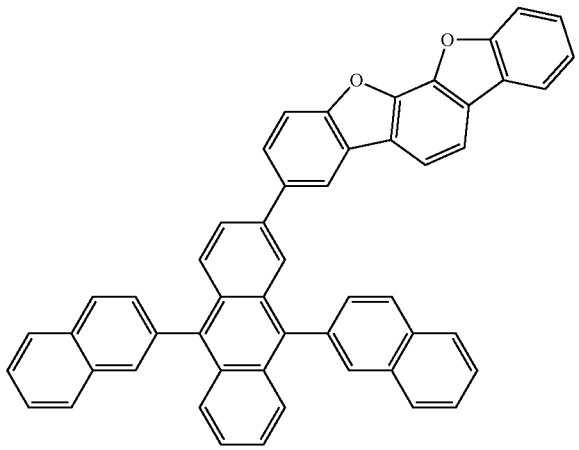
H106
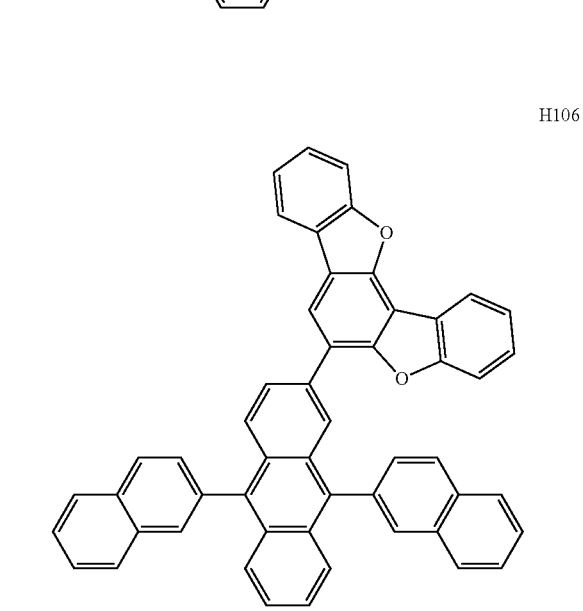
H107
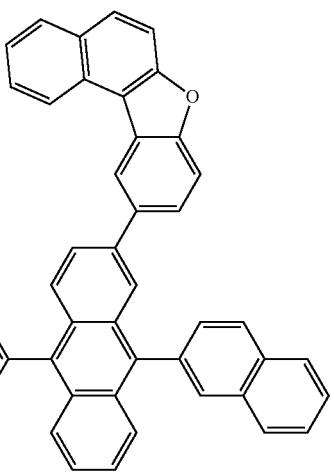

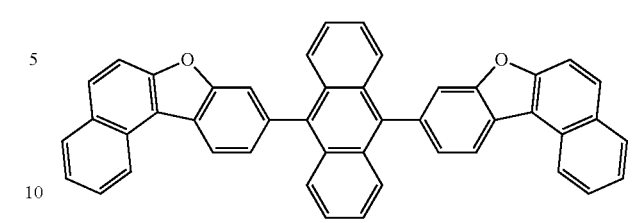
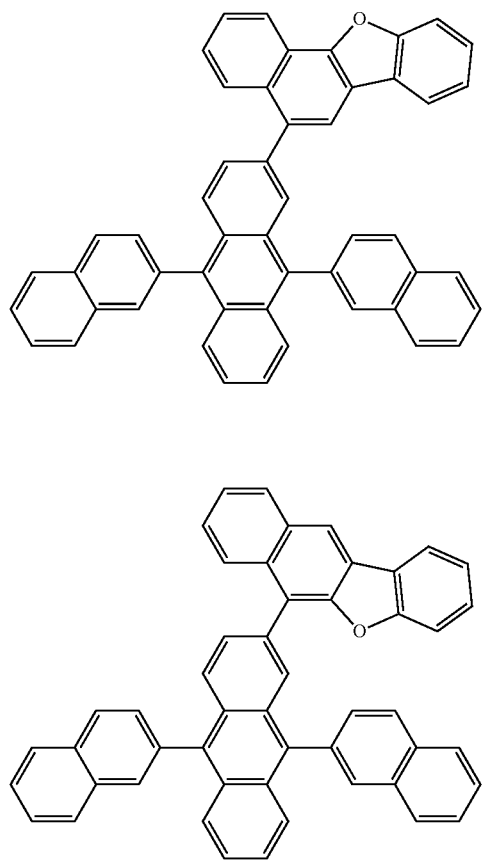
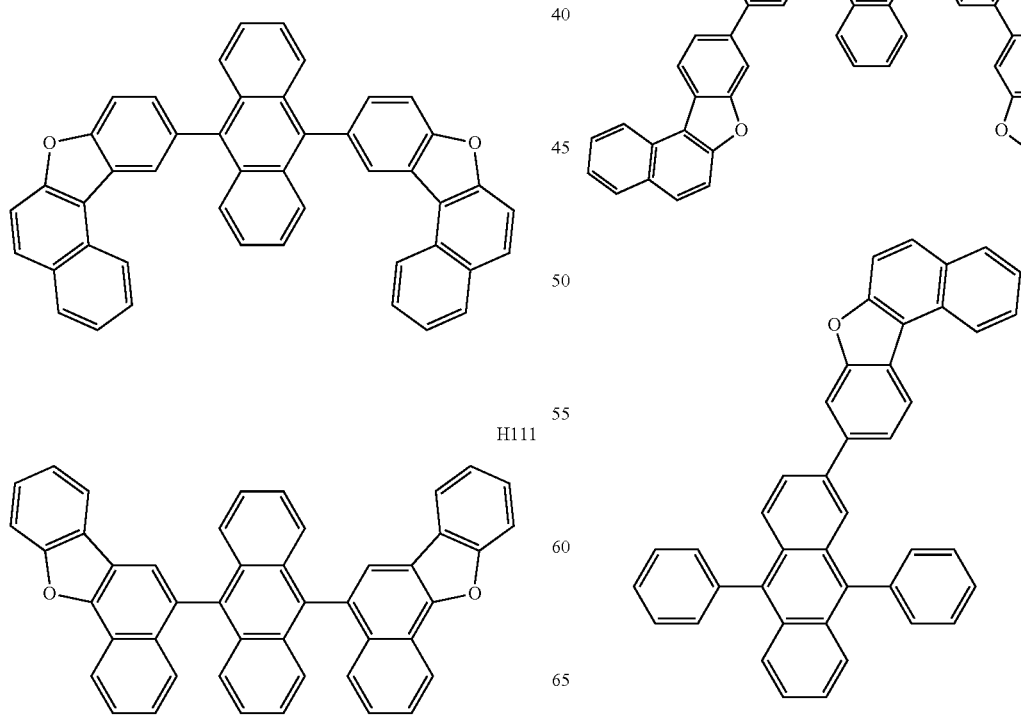

-continued
H117
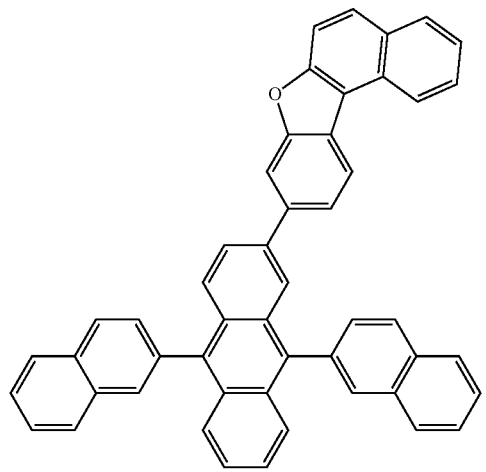
H118
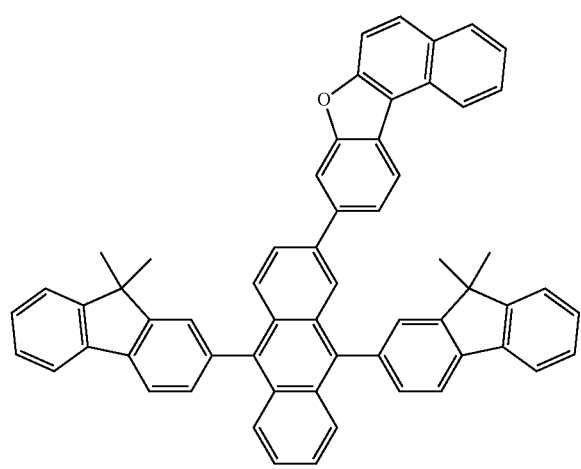
H119
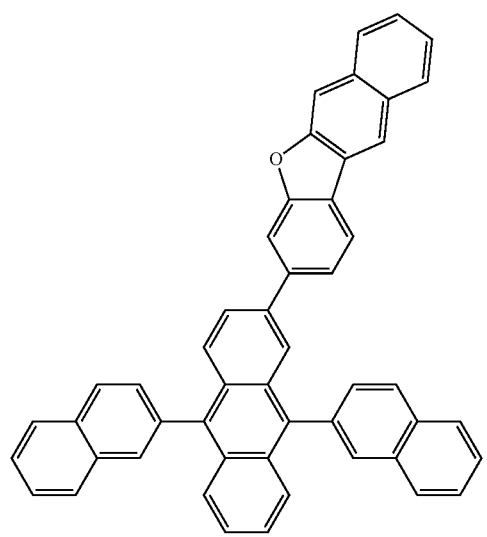
-continued
H120
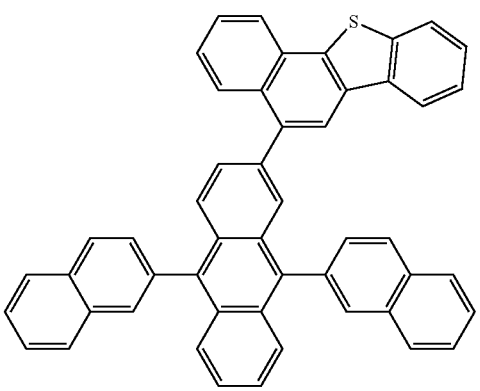
H121
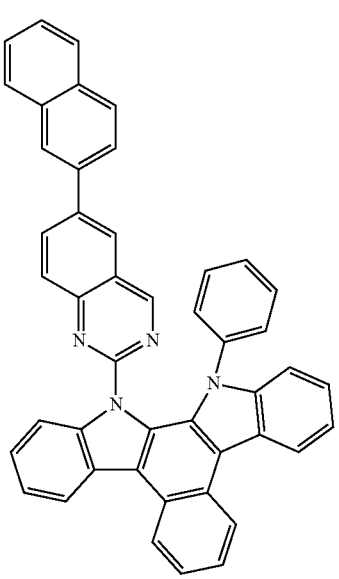
H122
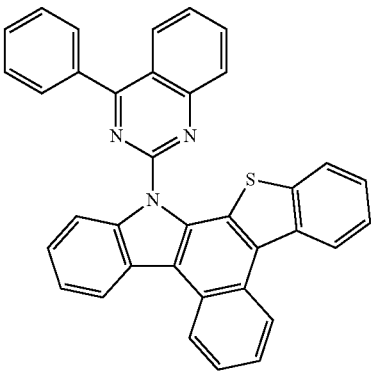

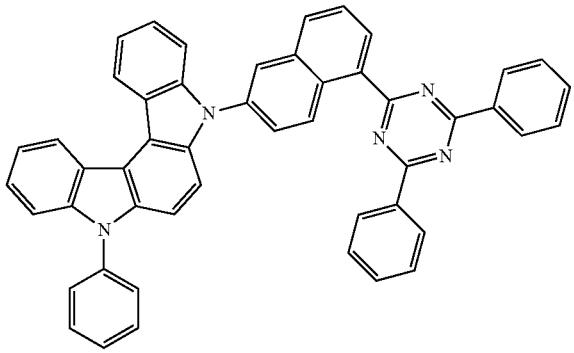

H123

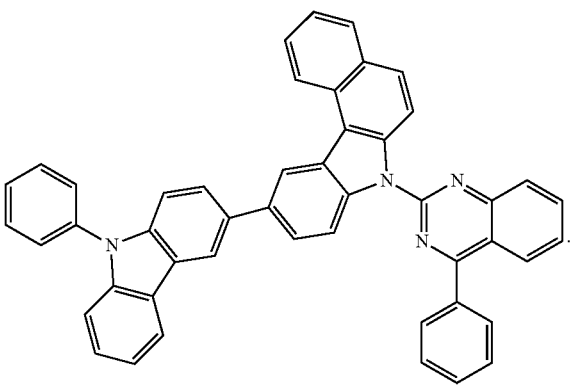

H124

Phosphorescent Dopant

The phosphorescent dopant may include at least one transition metal as a central metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral.

In some exemplary embodiments, the phosphorescent dopant may include an organometallic complex represented by Formula 401:

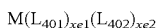

$M(L_{401})_{xc1}(L_{402})_{xc2}$　　Formula 401

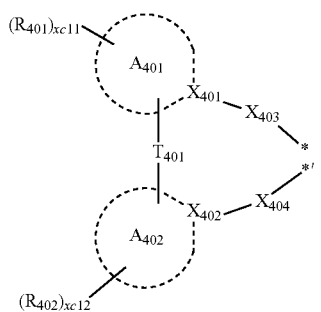

Formula 402 wherein, in Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', *=C($Q_{411}$)-*', or *=C=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be understood by referring to the description of $Q_1$ provided herein, xc11 and xc12 may each independently be an integer from 0 to 10, and

* and *' in Formula 402 each indicate a binding site to M in Formula 401.

In one or more exemplary embodiments, in Formula 402, i) $X_{401}$ may be nitrogen, and $X_{402}$ may be carbon, or ii) $X_{401}$ and $X_{402}$ may both be nitrogen.

In one or more exemplary embodiments, when xc1 in Formula 402 is 2 or greater, two ring $A_{401}$ (s) of at least two $L_{401}$ (s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each be understood by referring to the description of $T_{401}$ provided herein.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group).

The phosphorescent dopant may be, for example, one of Compounds PD1 to
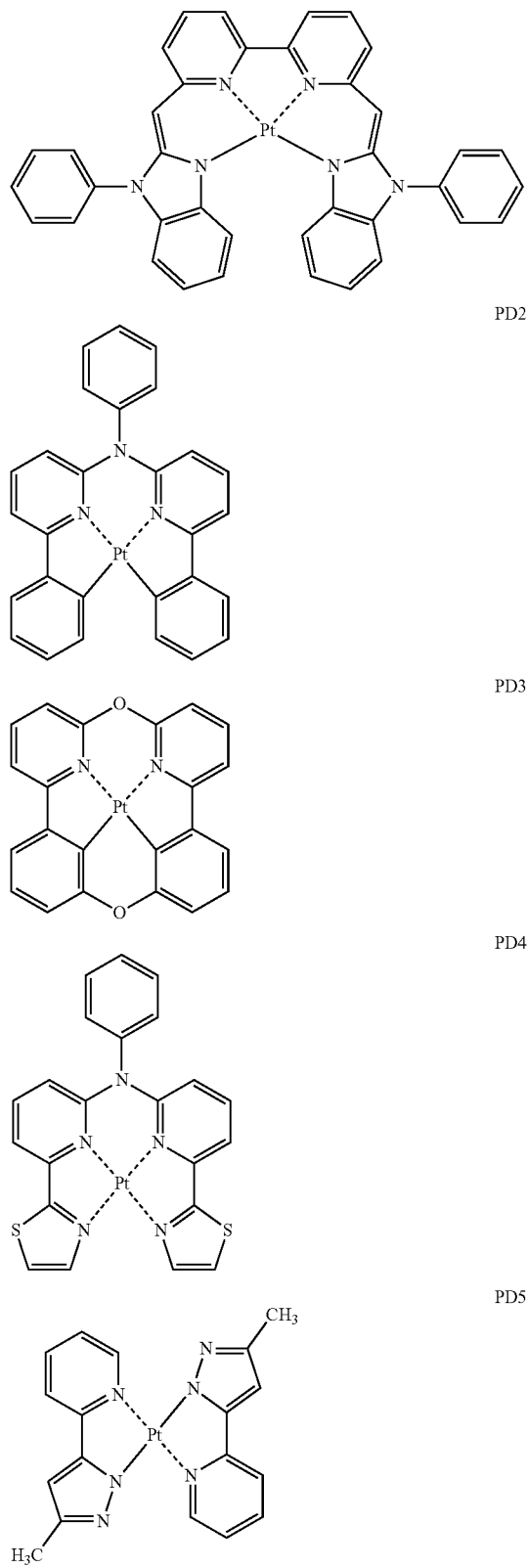
PD1
PD2
PD3
PD4
PD5
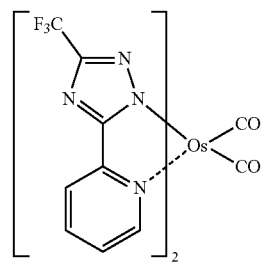
PD6
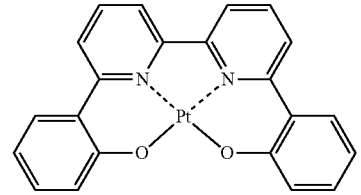
PD7
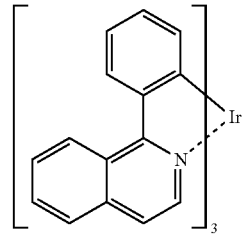
PD8
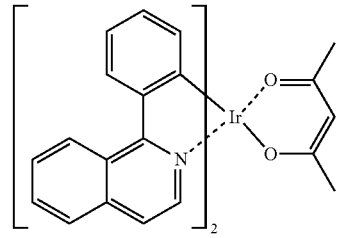
PD9
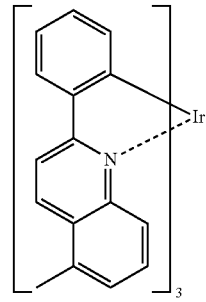
PD10
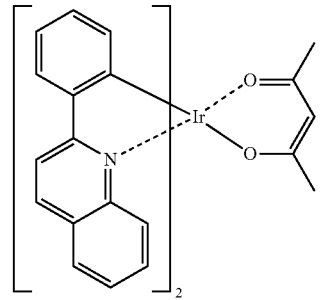
PD11

PD12 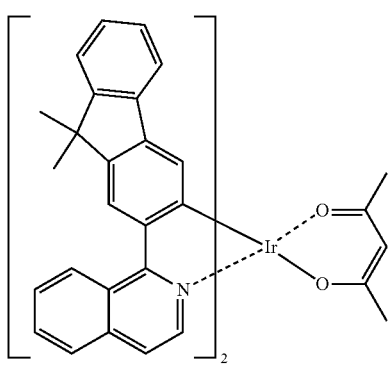
PD13 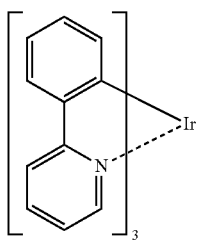
PD14 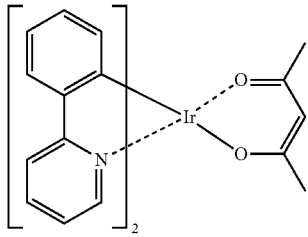
PD15 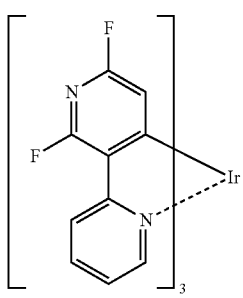
PD16 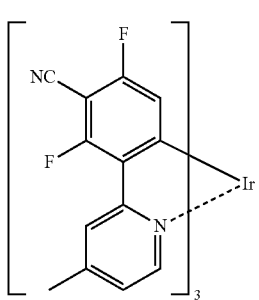
PD17 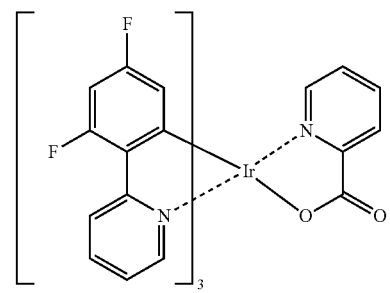
PD18 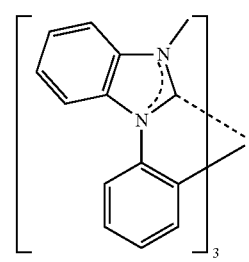
PD19 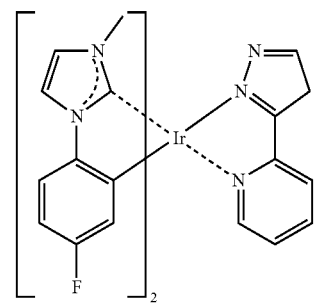
PD20 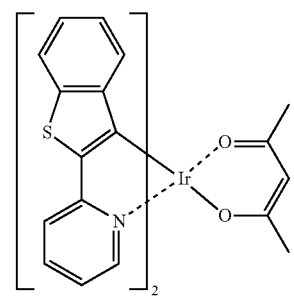
PD21 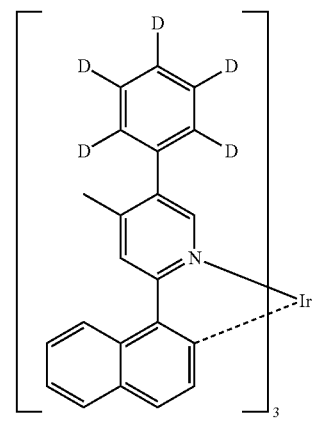

-continued

PD22

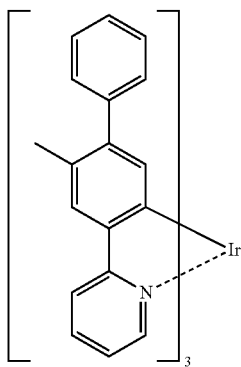

PD23

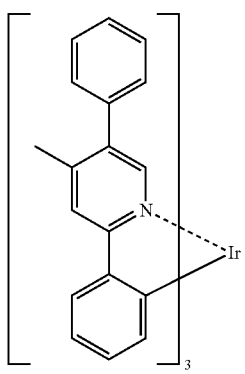

PD24

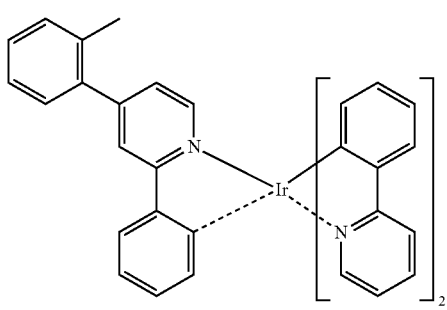

PD25

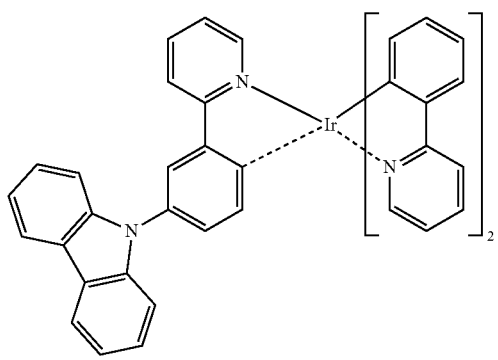

Fluorescent Dopant

The fluorescent dopant may include an amine group-containing compound, a styryl group-containing compound, or any combination thereof.

In some exemplary embodiments, the fluorescent dopant may include a compound represented by Formula 501:

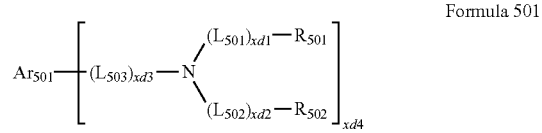

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some exemplary embodiments, in Formula 501, $Ar_{501}$ may include a condensed ring group (e.g., an anthracene group, a chrysene group, or a pyrene group) in which at least three monocyclic groups are condensed.

In some exemplary embodiments, xd4 in Formula 501 may be 2.

In some exemplary embodiments, the fluorescent dopant may include one of Compounds FD1 to FD36, 4,4'-bis(2,2-diphenylethenyl)-1,1'-biphenyl (DPVBi), 4,4'-Bis[4-(di-p-tolylamino)styryl]biphenyl (DPAVBi), or any combination thereof:

FD1

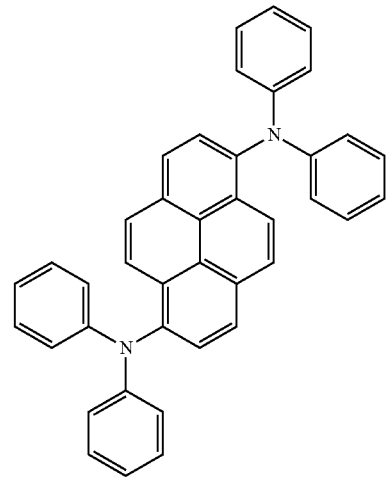

FD2
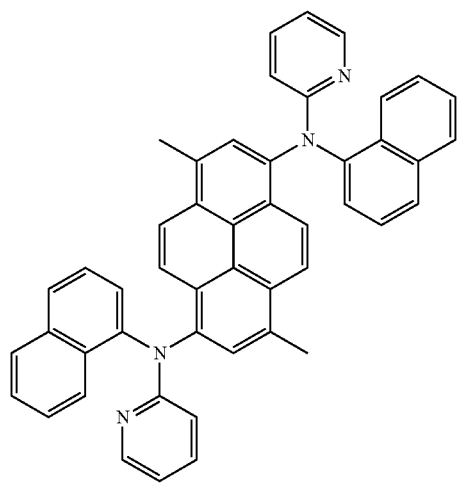
FD3
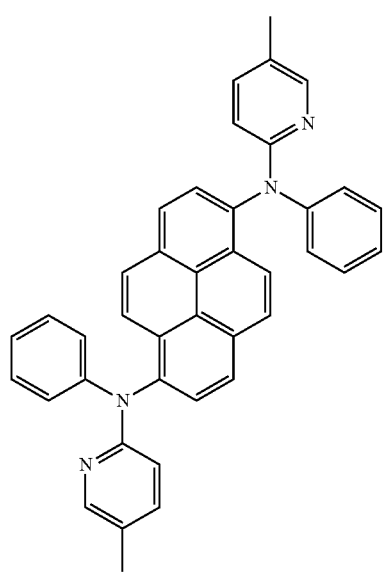
FD4
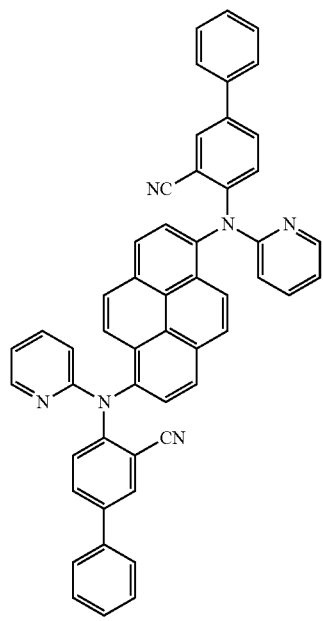
FD5
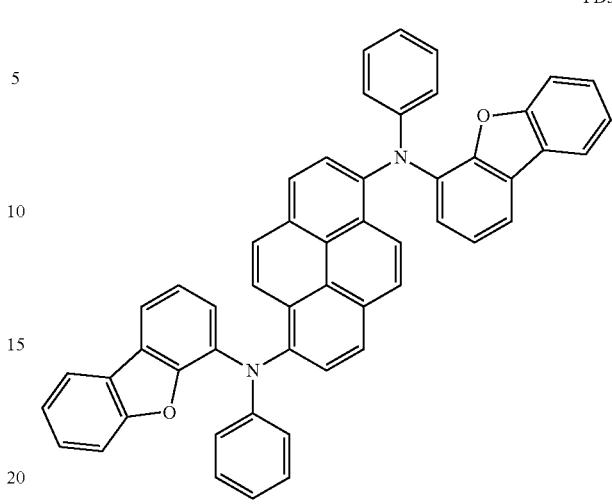
FD6
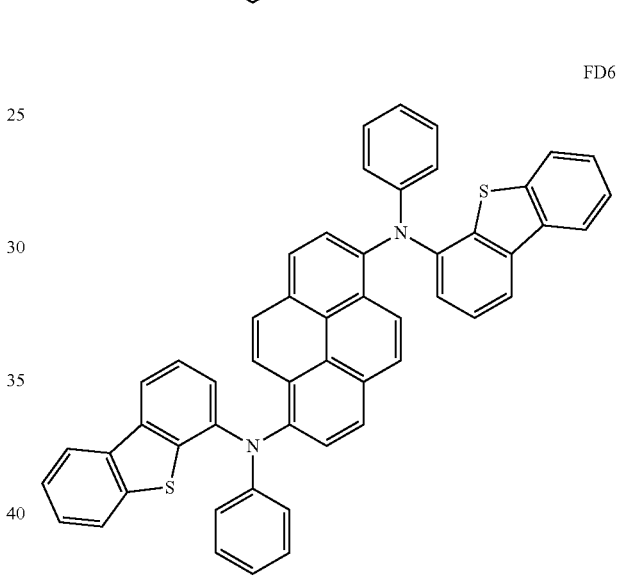
FD7
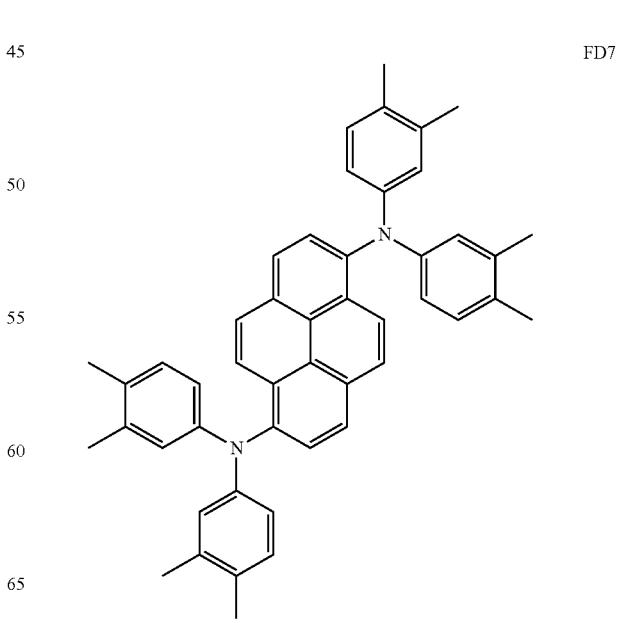

FD8
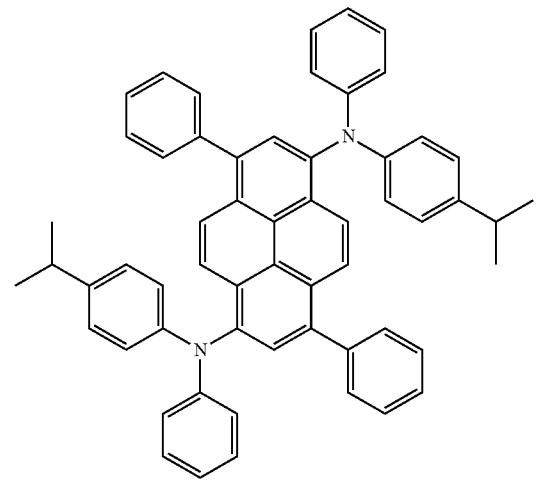
FD9
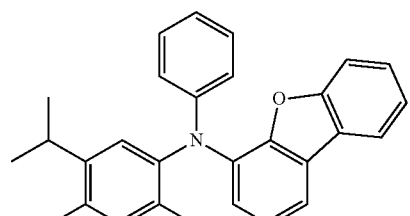
FD10
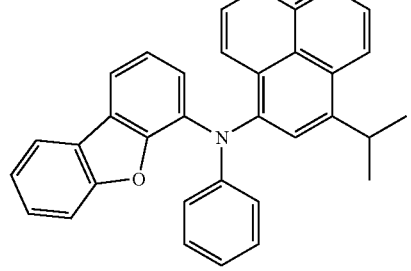
FD11
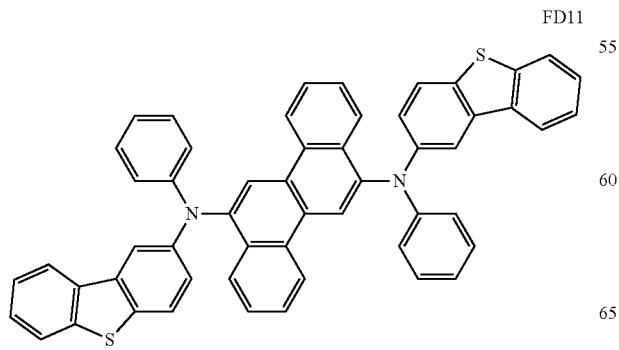
FD12
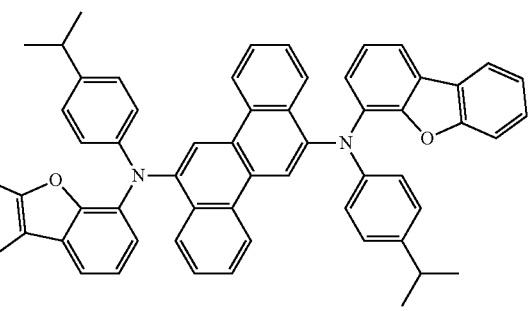
FD13
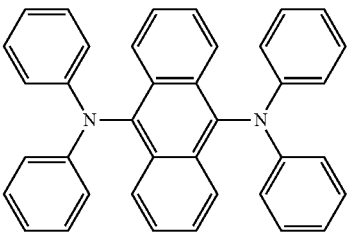
FD14
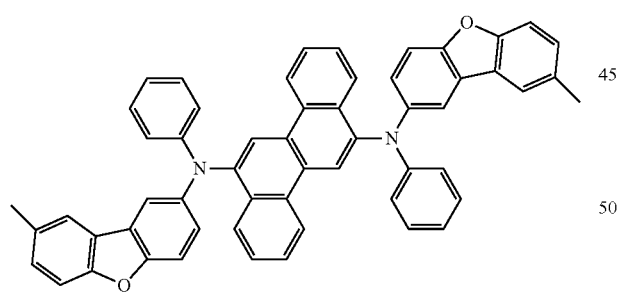
FD15
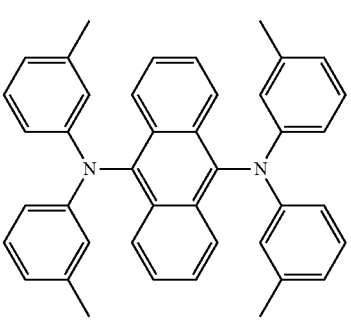
FD16

-continued
FD17
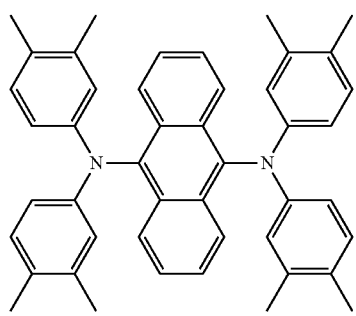
FD18
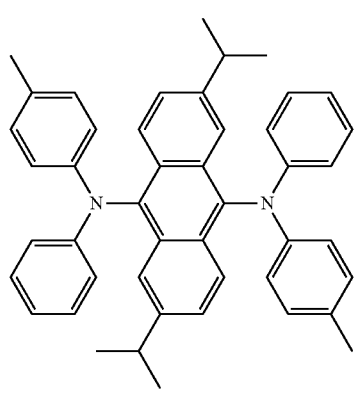
FD19
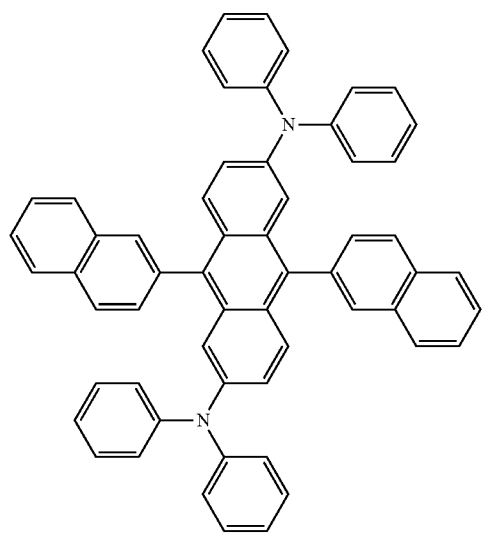
FD20
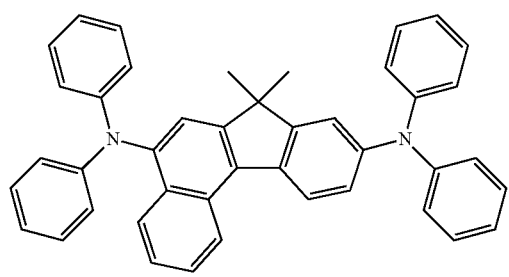
FD21
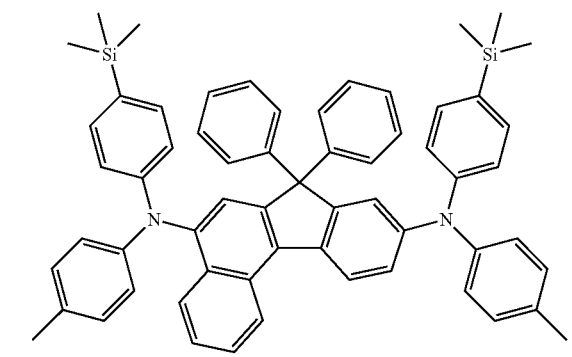
FD22
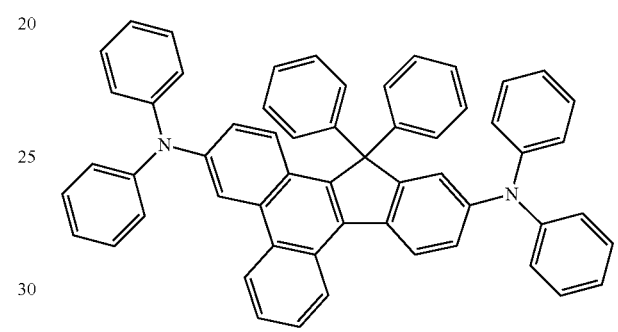
FD23
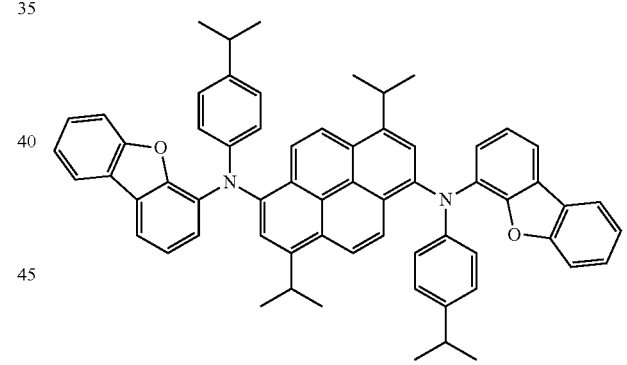
FD24
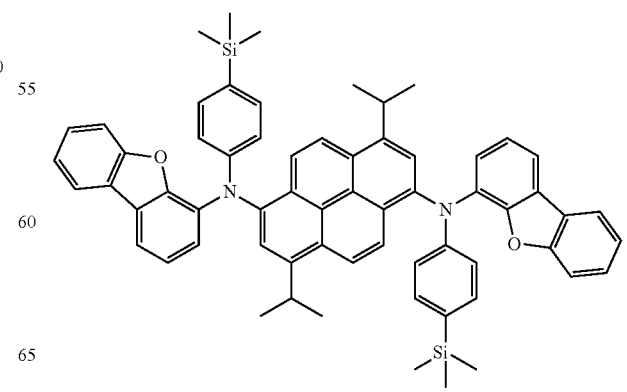

FD25
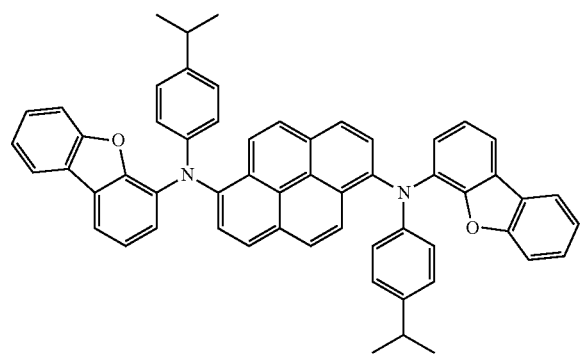
FD26
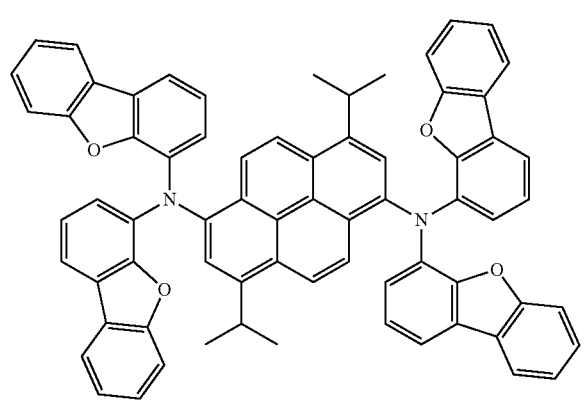
FD27
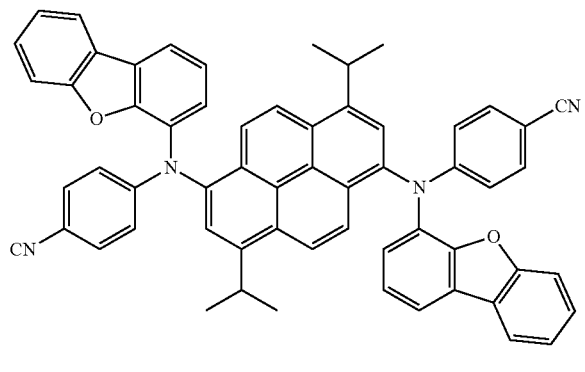
FD28
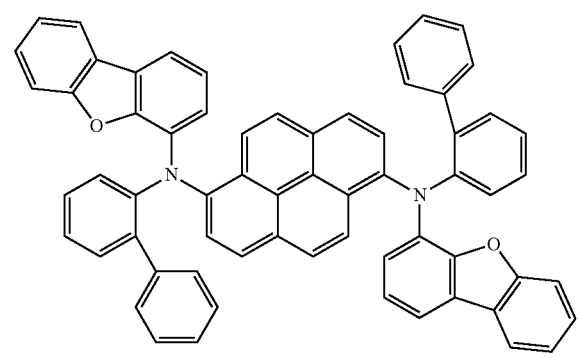
FD29
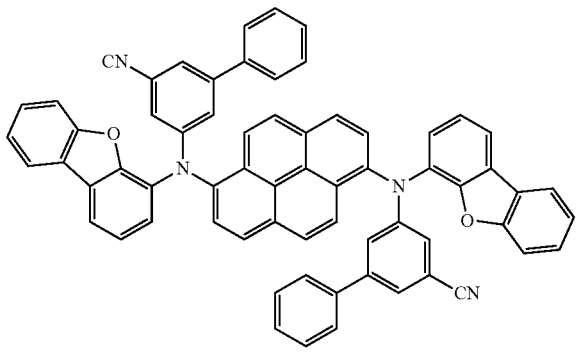
FD30
FD31
FD32
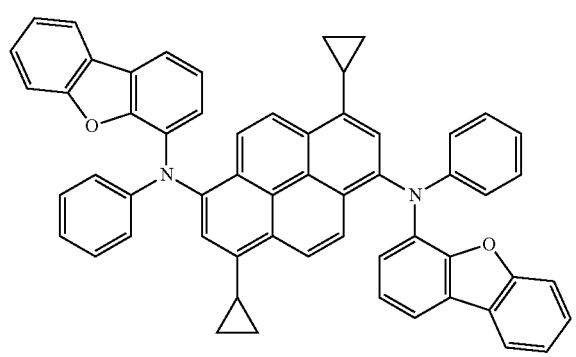

FD33

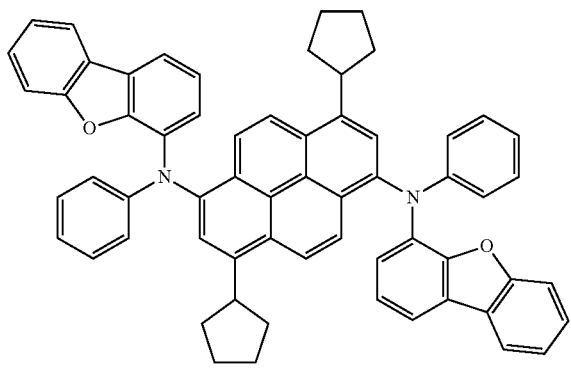

FD34

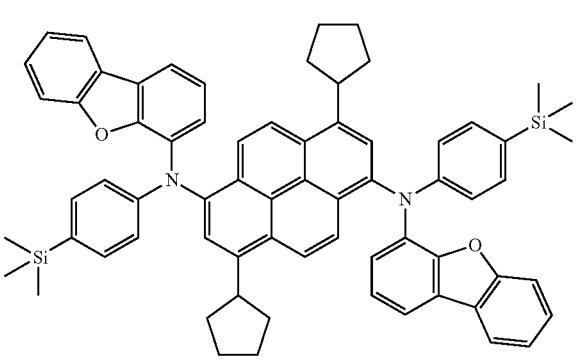

FD35

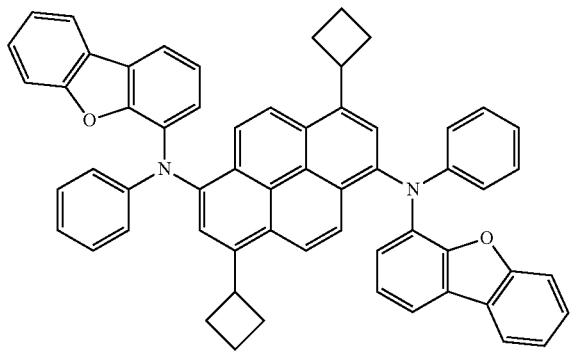

FD36

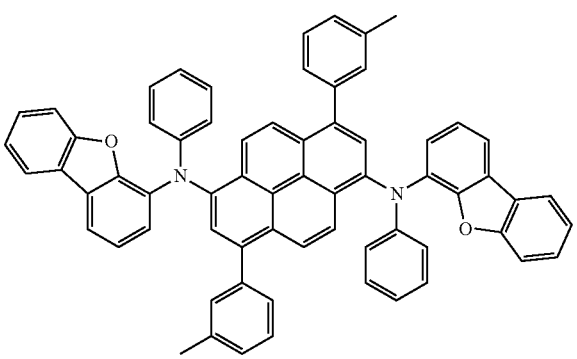

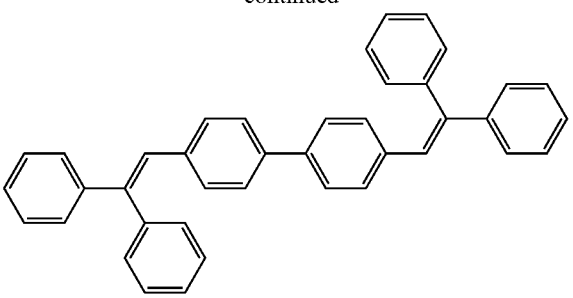

DPVBi

DPAVBi

Delayed Fluorescent Material

The emission layer may include a delayed fluorescent material. The delayed fluorescent material described herein may be any suitable compound that may emit delayed fluorescence according to a delayed fluorescence emission mechanism. The delayed fluorescent material included in the emission layer may serve as a host or a dopant, depending on types of other materials included in the emission layer.

In some exemplary embodiments, a difference between a triplet energy level (eV) of the delayed fluorescent material and a singlet energy level (eV) of the delayed fluorescent material may be about 0 eV or greater and about 0.5 eV or smaller. When the difference between a triplet energy level (eV) of the delayed fluorescent material and a singlet energy level (eV) of the delayed fluorescent material is within this range, up-conversion from a triplet state to a singlet state in the delayed fluorescent material may be effectively occurred, thus improving luminescence efficiency and the like of the light-emitting device 10.

In some exemplary embodiments, the delayed fluorescent material may include: i) a material including at least one electron donor (e.g., a π electron-rich $C_3$-$C_{60}$ cyclic group such as a carbazole group and the like) and at least one electron acceptor (e.g., a sulfoxide group, a cyano group, a π electron-deficient nitrogen-containing $C_1$-$C_{60}$ cyclic group, and the like), ii) a material including a $C_8$-$C_{60}$ polycyclic group including at least two cyclic groups condensed to each other and sharing boron (B), and the like.

Examples of the delayed fluorescent material may include at least one of Compounds DF1 to DF9:
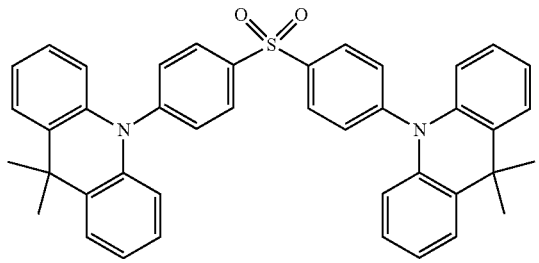
DF1(DMAC-DPS)
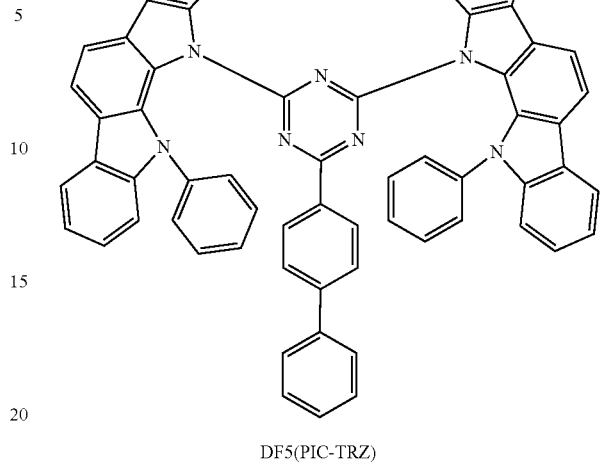
DF5(PIC-TRZ)
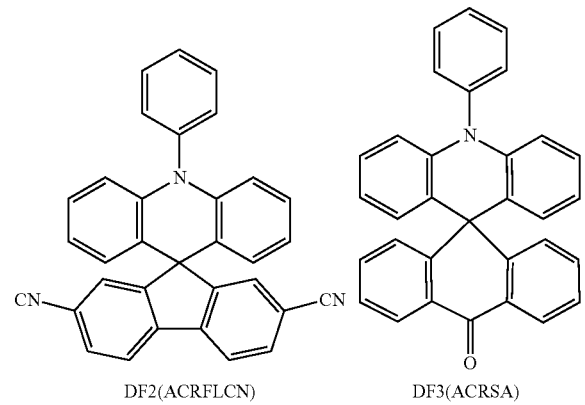
DF2(ACRFLCN)  DF3(ACRSA)
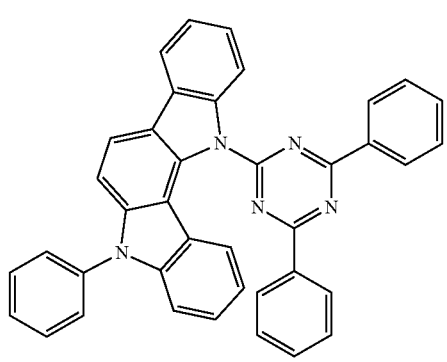
DF6(PIC-TRZ2)
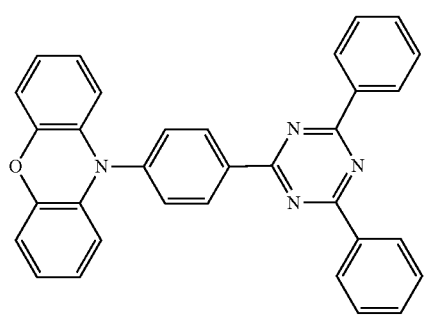
DF7(PXZ-TRZ)
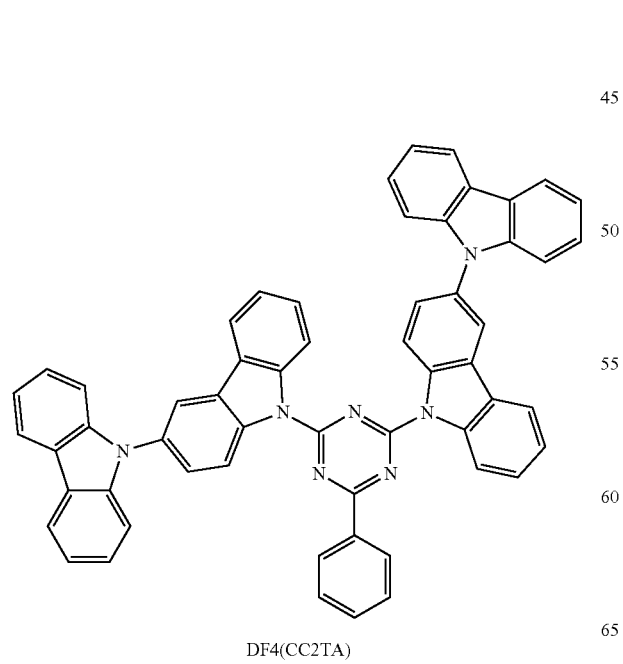
DF4(CC2TA)
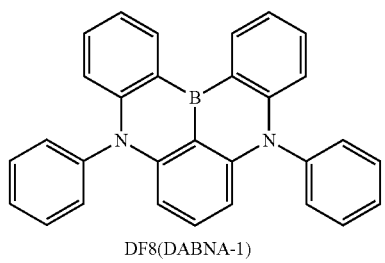
DF8(DABNA-1)

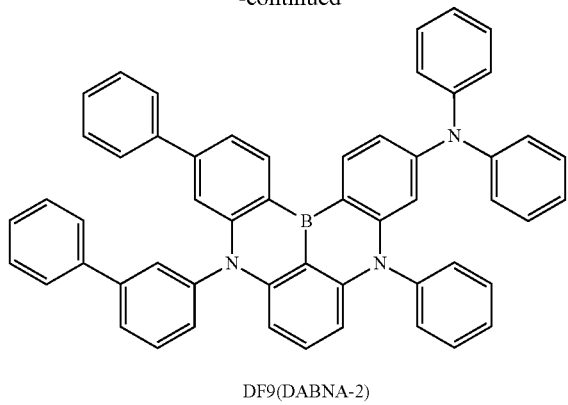

DF9(DABNA-2)

Quantum Dot

The emission layer may include quantum dots. The diameter of the quantum dot may be, for example, in a range of about 1 nm to about 10 nm. Quantum dots may be synthesized by a wet chemical process, an organic metal chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier than the vapor deposition process such as the metal organic chemical vapor deposition (MOCVD) or the molecular beam epitaxy (MBE) process. Further, the growth of quantum dot particles may be controlled with a lower manufacturing cost.

The quantum dot may include a III-VI group semiconductor compound; a II-VI group semiconductor compound; a III-V group semiconductor compound; a III-VI group semiconductor compound; a I, III, and VI group semiconductor compound; a IV-VI group semiconductor compound; a IV group element or compound; or any combination thereof.

Examples of the III-VI group semiconductor compound may include a binary compound such as $In_2S_3$; a ternary compound such as $AgInS$, $AgInS_2$, $CuInS$, or $CuInS_2$; or any combination thereof.

Examples of the II-VI group semiconductor compound may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the III-V group semiconductor compound may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound such as GaAlNAs, GaAlNP, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In some exemplary embodiments, the III-V group semiconductor compound may further include a II group element. Examples of the III-V group semiconductor compound further including the II group element may include InZnP, InGaZnP, InAlZnP, and the like.

Examples of the III-VI group semiconductor compound may include a binary compound such as GaS, GaSe, $Ga_2Se_3$, GaTe, InS, InSe, $In_2Se_3$, InTe, and the like; a ternary compound such as $InGaS_3$, $InGaSe_3$, and the like; or any combination thereof. Examples of the I, III, and VI semiconductor compound may include a ternary compound such as $AgInS$, $AgInS_2$, $CuInS$, $CuInS_2$, $CuGaO_2$, $AgGaO_2$, $AgAlO_2$, or any combination thereof. Examples of the IV-VI group semiconductor compound may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof.

The IV group element or compound may be a single element compound such as Si or Ge; a binary compound such as SiC or SiGe; or any combination thereof. Individual elements included in the multi-element compound, such as a binary compound, a ternary compound, and a quaternary compound, may be present in a particle thereof at a uniform or non-uniform concentration.

The quantum dot may have a single structure in which the concentration of each element included in the quantum dot is uniform or a core-shell double structure. In some exemplary embodiments, materials included in the core may be different from materials included in the shell.

The shell of the quantum dot may serve as a protective layer for preventing chemical denaturation of the core to maintain semiconductor characteristics and/or as a charging layer for imparting electrophoretic characteristics to the quantum dot. The shell may be monolayer or multilayer. An interface between a core and a shell may have a concentration gradient where a concentration of elements present in the shell decreases toward the center.

Examples of the shell of the quantum dot include metal or nonmetal oxide, a semiconductor compound, or a combination thereof. Examples of the metal oxide or the nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; and any combination thereof. Example of the semiconductor compound may include a III-VI group semiconductor compound; a II-VI group semiconductor compound; a III-V group semiconductor compound; a III-VI group semiconductor compound; a I, III, and VI group semiconductor compound; a IV-VI group semiconductor compound; or any combination thereof. In some exemplary embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength of about 45 nm or less, about 40 nm or less, or about 30 nm or less. When the FWHM of the quantum dot is within this range, color purity or color reproducibility may be improved. In addition, since light emitted through the quantum dot is emitted in all directions, an optical viewing angle may be improved.

In addition, the quantum dot may be specifically, a generally spherical shape, a generally pyramidal shape, a generally multi-armed shape, or a generally cubic nanoparticle shape, and a generally nanotube shaped, a generally nanowire shaped, a generally nanofiber shaped, or a nanoplate shaped particle.

By adjusting the size of the quantum dot, the energy band gap may also be adjusted, thereby obtaining light of various wavelengths in the quantum dot emission layer. By using quantum dots of various sizes, a light-emitting device that may emit light of various wavelengths may be realized. In some exemplary embodiments, the size of the quantum dot may be selected such that the quantum dot may emit red, green, and/or blue light. In addition, the size of the quantum dot may be selected such that the quantum dot may emit white light by combining various light of colors.

Electron Transport Region in Interlayer 130

The electron transport region may have i) a single-layered structure consisting of a single layer consisting of a single material, ii) a single-layered structure consisting of a single layer including a plurality of different materials, or iii) a multi-layered structure having a plurality of layers including a plurality of different materials. The electron transport region may include a buffer layer, a hole blocking layer, an electron control layer, an electron transport layer, or an electron injection layer.

In some exemplary embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order. The electron transport region (e.g., a buffer layer, a hole blocking layer, an electron control layer, or an electron transport layer in the electron transport region) may include a metal-free compound including at least one π electron-deficient nitrogen-containing $C_1$-$C_{60}$ cyclic group.

In some exemplary embodiments, the electron transport region may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may each independently be a R electron-deficient nitrogen-containing $C_1$-$C_{60}$ cyclic group unsubstituted or substituted with at least one $R_{10a}$.

In some exemplary embodiments, when xe1 1 in Formula 601 is 2 or greater, at least two $Ar_{601}$ (s) may be bound via a single bond. In some exemplary embodiments, in Formula 601, $Ar_{601}$ may be a substituted or unsubstituted anthracene group.

In some exemplary embodiments, the electron transport region may include a compound represented by Formula 601-1:

Formula 601-1

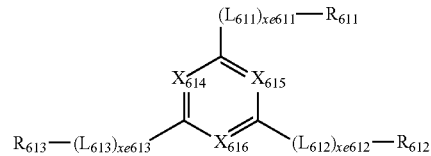

wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{616}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In some exemplary embodiments, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris-(8-hydroxyquinoline)aluminum (Alq$_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof:

ET1

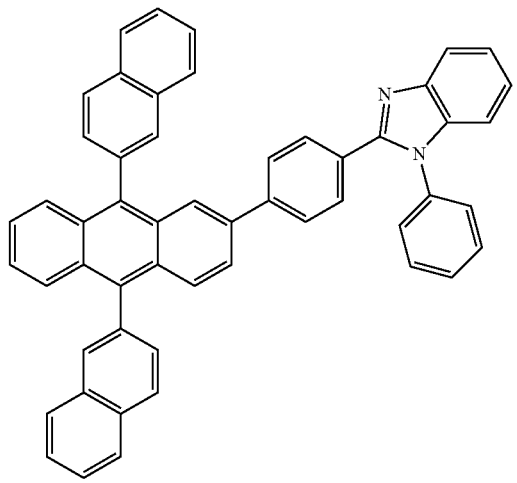

ET2
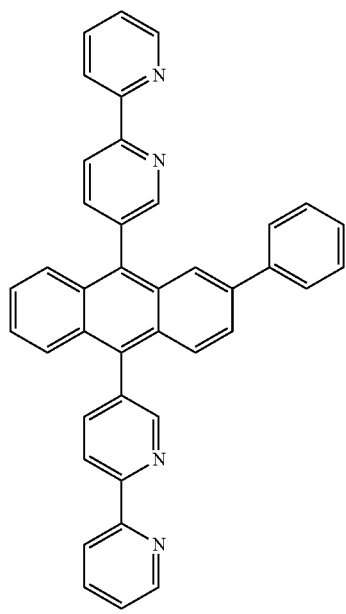
ET3
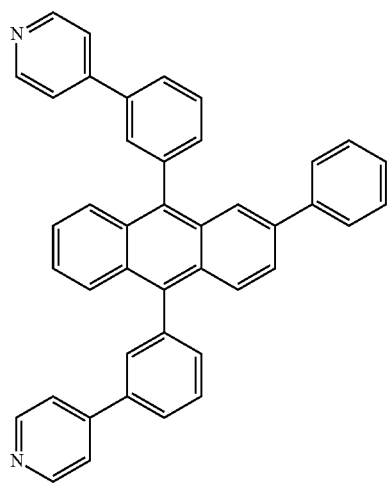
ET4
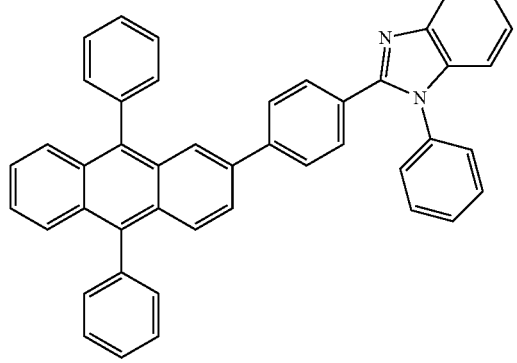
ET5
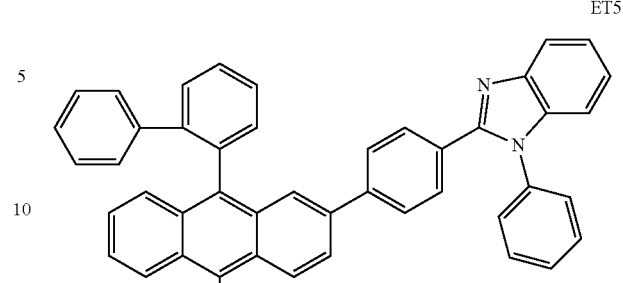
ET6
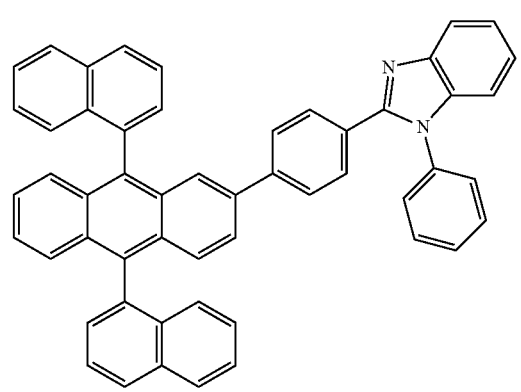
ET7
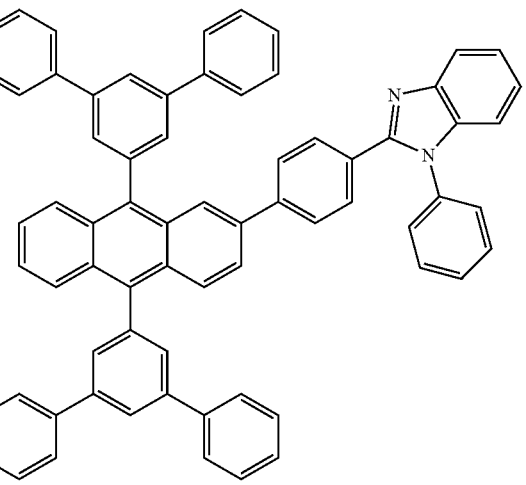

ET8
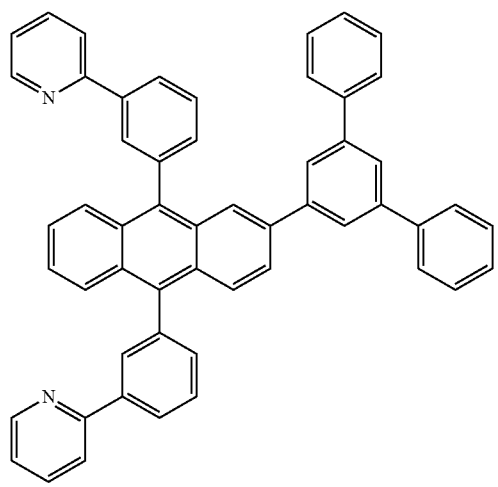
ET9
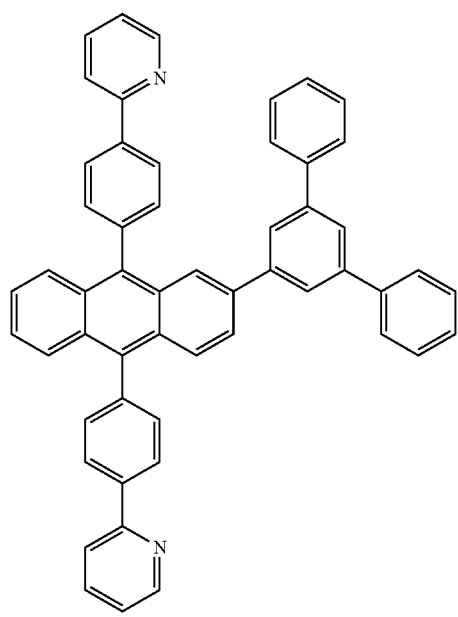
ET10
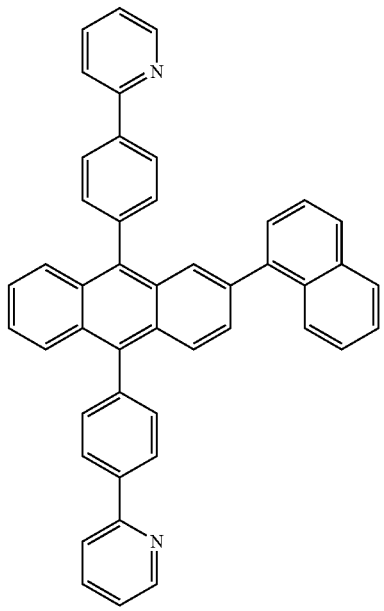
ET11
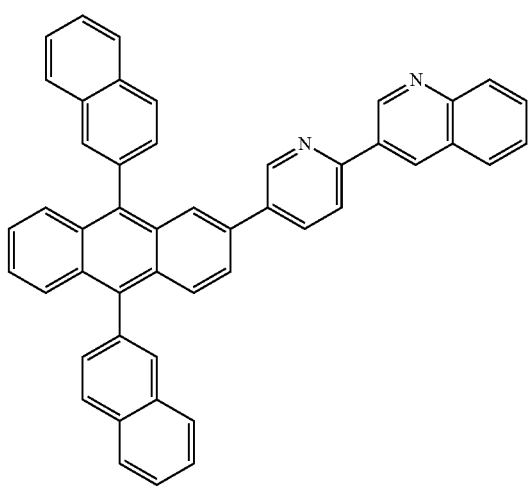
ET12
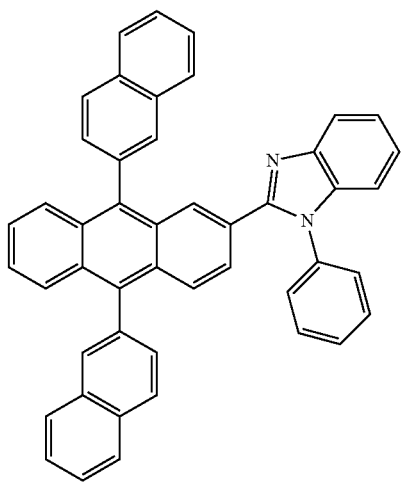

ET13
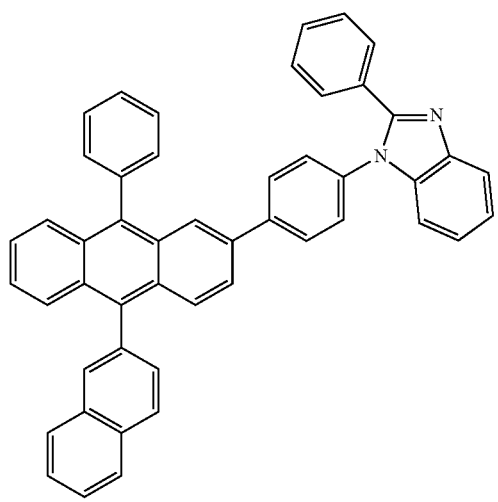
ET14
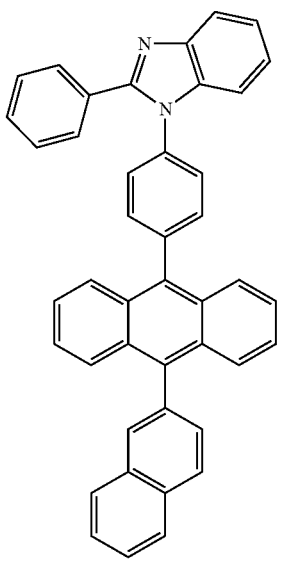
ET15
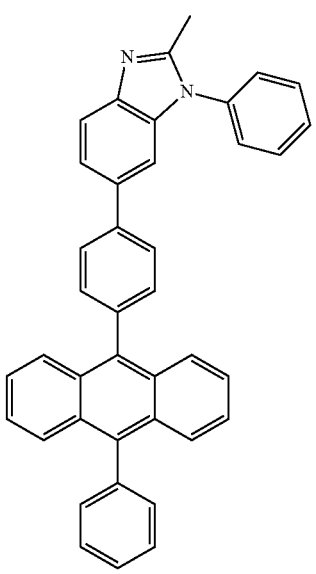
ET16
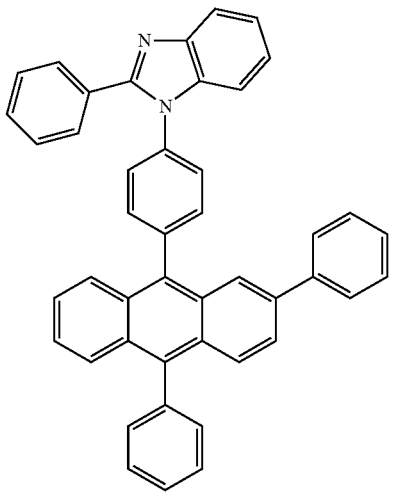
ET17
ET18

ET19
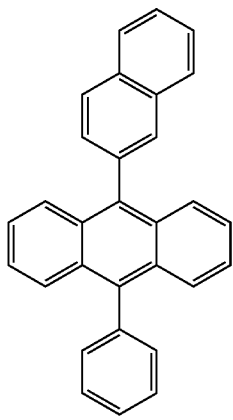
ET20
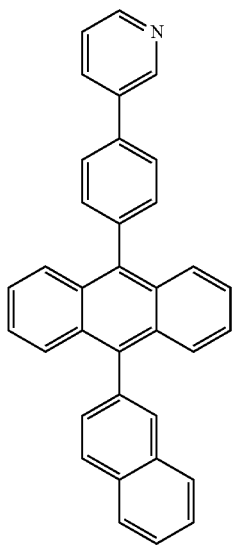
ET21
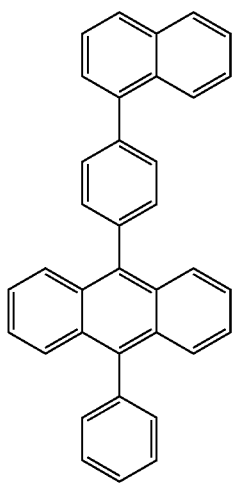
ET22
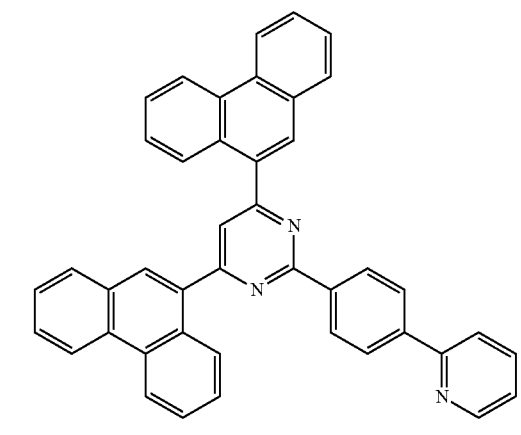
ET23
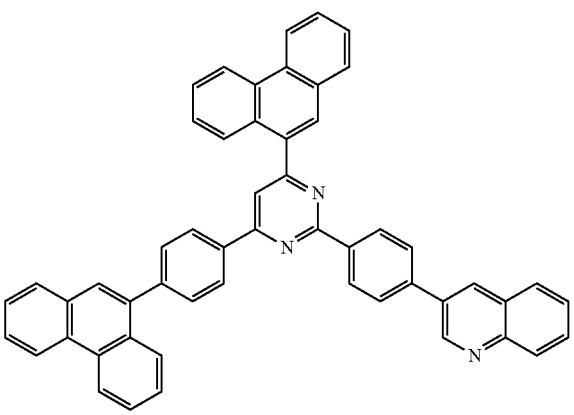
ET24
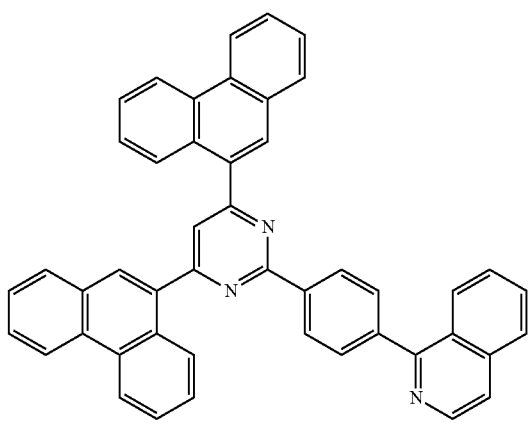

ET25
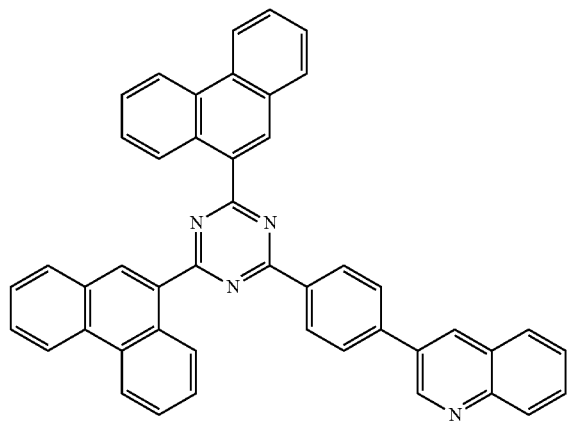
ET26
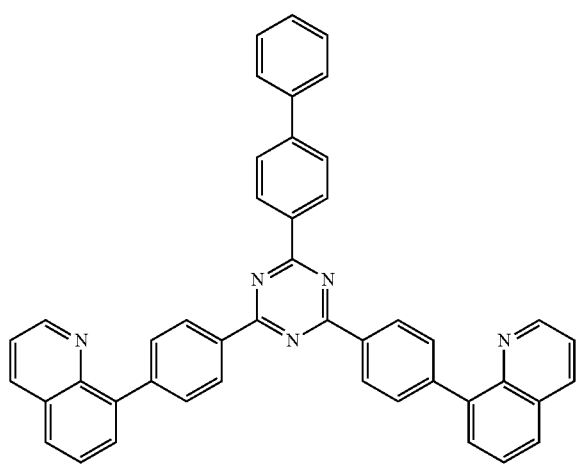
ET27
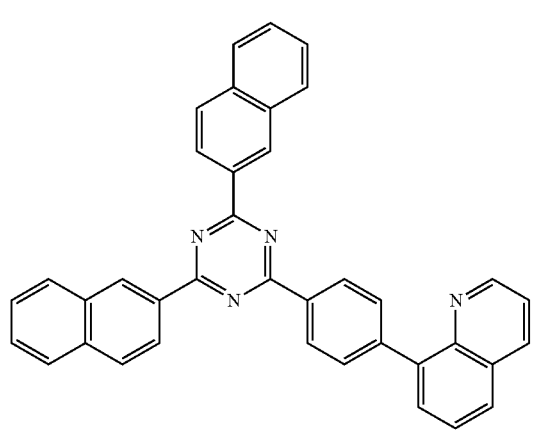
ET28
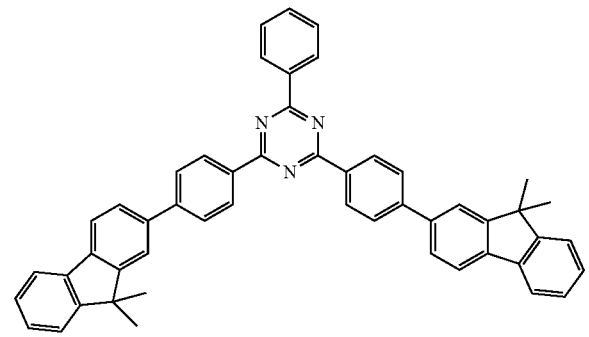
ET29
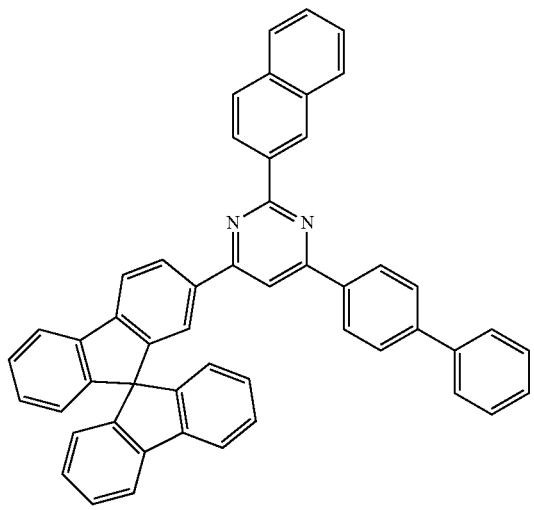
ET30
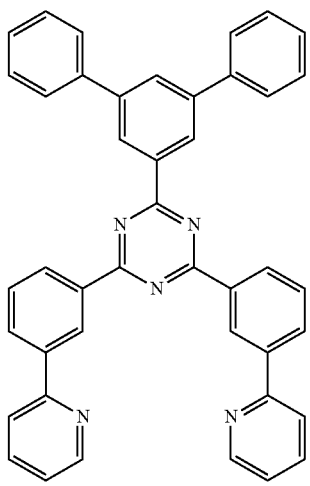

ET31
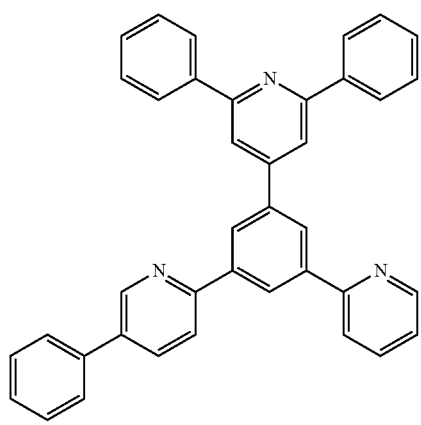
ET32
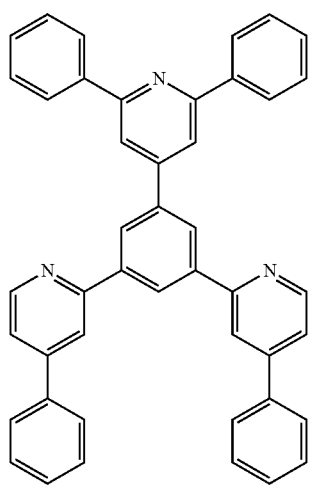
ET33
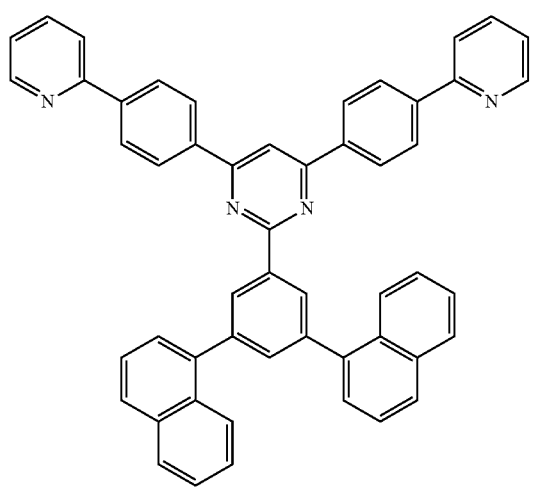
ET34
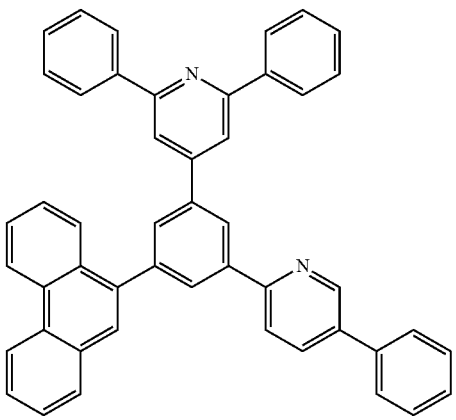
ET35
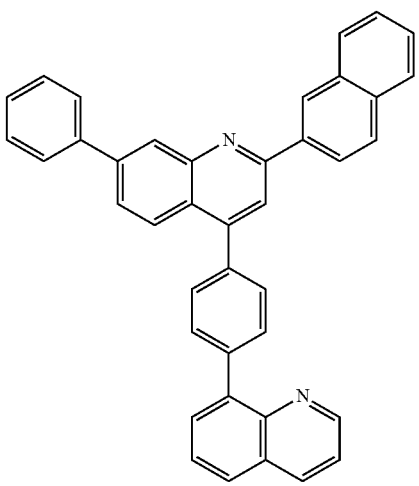
ET36
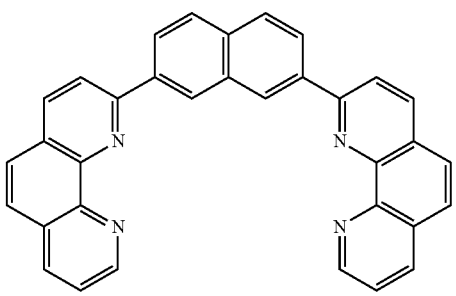
ET37
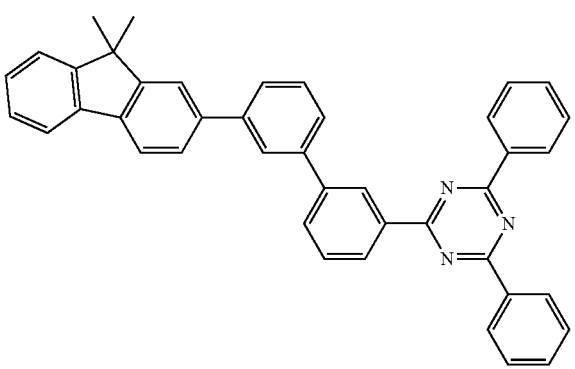

ET38
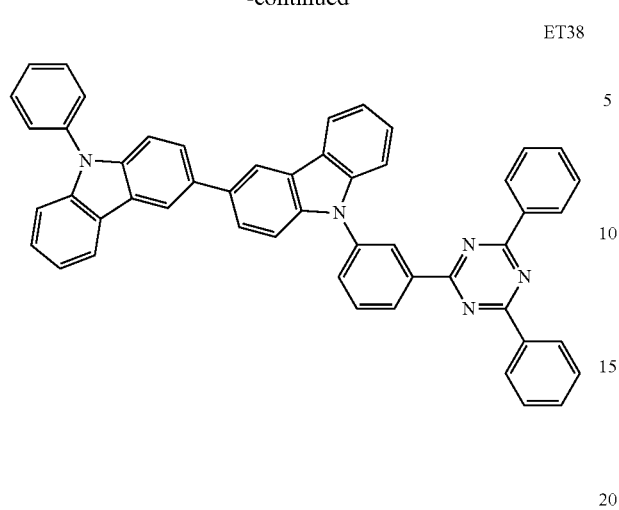
ET41
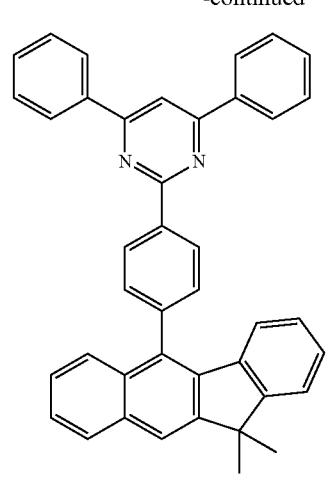
ET39
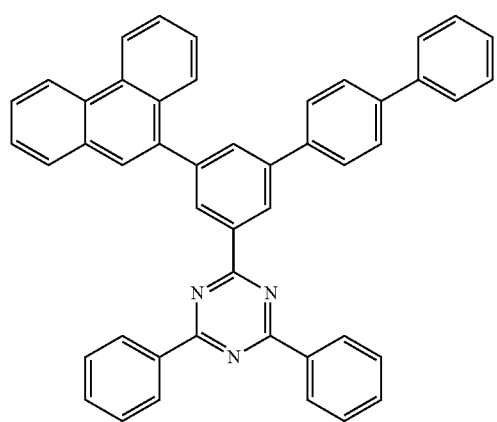
ET42
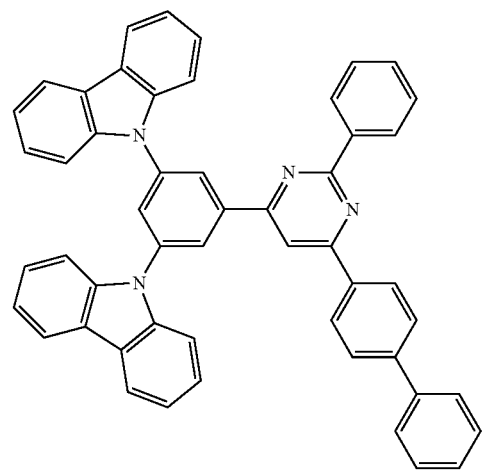
ET40
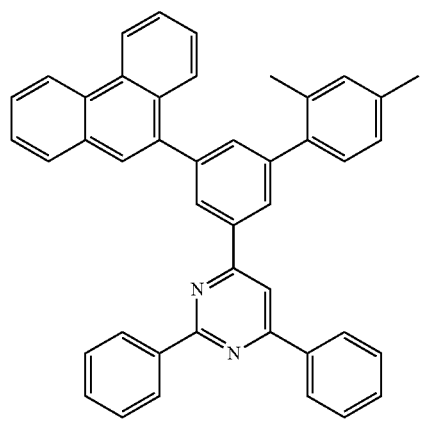
ET43
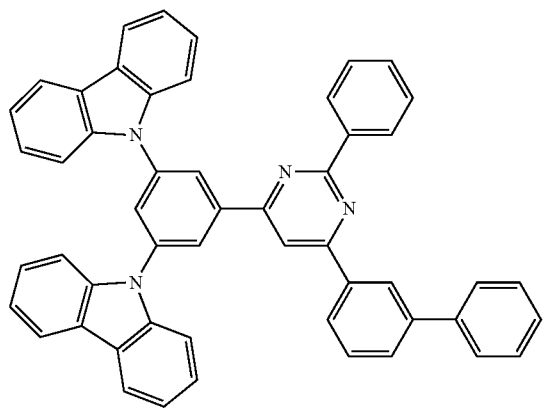

-continued

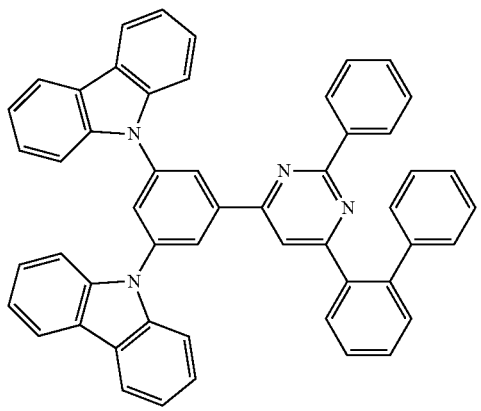
ET44

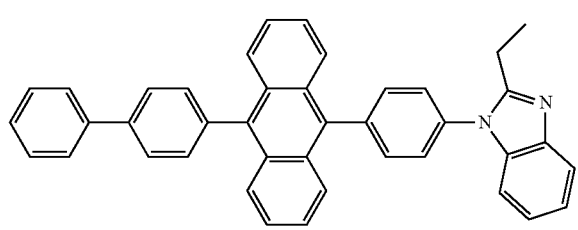
ET45

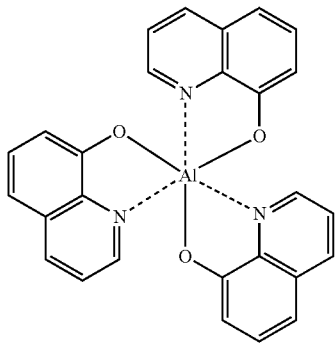
Alq3

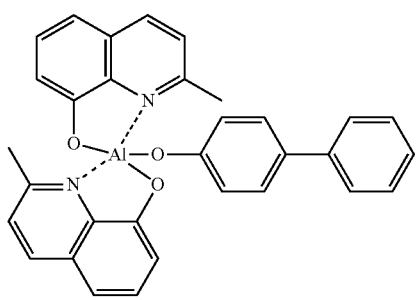
BAlq

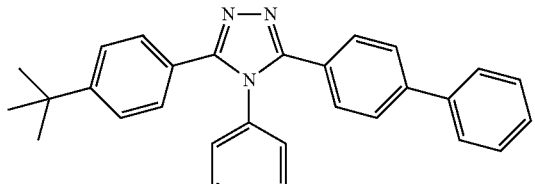
TAZ

-continued

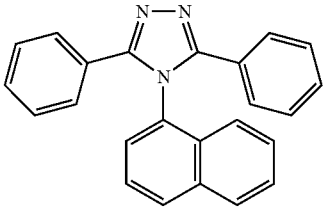
NTAZ

The thickness of the electron transport region may be in a range of about 160 Å to about 5,000 Å, and in some exemplary embodiments, about 100 Å to about 4,000 Å. When the electron transport region includes a buffer layer, a hole blocking layer, an electron control layer, an electron transport layer, or any combination thereof, the thicknesses of the buffer layer, the hole blocking layer, or the electron control layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport layer are each within these ranges, excellent electron transport characteristics may be obtained without a substantial increase in driving voltage.

The electron transport region (for example, the electron transport layer in the electron transport region) may further include, in addition to the materials described above, a metal-containing material. The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (lithium quinolate (LiQ)) or Compound ET-D2:

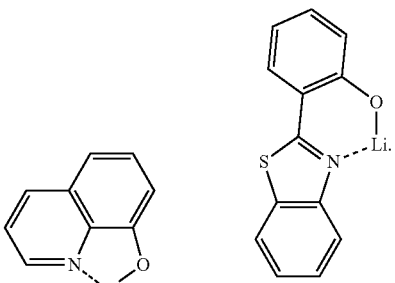
ET-D1          ET-D2

The electron transport region may include an electron injection layer that facilitates injection of electrons from the second electrode 150. The electron injection layer may be in direct contact with the second electrode 150.

The electron injection layer may have i) a single-layered structure consisting of a single layer consisting of a single material, ii) a single-layered structure consisting of a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof. The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodines), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal compounds, such as BaO, SrO, CaO, $BaxSr_{1-x}O$ (wherein x is a real number that satisfying 0<x<1), or $BaxCa_{1-x}O$ (wherein x is a real number that satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some exemplary embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may include: i) one of ions of the alkali metal, alkaline earth metal, and rare earth metal described above and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxydiaphenyloxadiazole, hydroxydiphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some exemplary embodiments, the electron injection layer may further include an organic material (e.g., a compound represented by Formula 601).

In some exemplary embodiments, the electron injection layer may consist of i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some exemplary embodiments, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be in a range of about 1 Å to about 100 Å, and in some exemplary embodiments, about 3 Å to about 90 Å. When the thickness of the electron injection layer is within any of these ranges, excellent electron injection characteristics may be obtained without a substantial increase in driving voltage.

Second Electrode 150

The second electrode 150 may be on the interlayer 130. In some exemplary embodiments, the second electrode 150 may be a cathode that is an electron injection electrode. In this exemplary embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), an ITO, an IZO, or any combination thereof. The second electrode 150 may be a transmissive electrode, a semi-transmissive electrode, or a reflective electrode. The second electrode 150 may have a single-layered structure, or a multi-layered structure including two or more layers.

Capping Layer

A first capping layer may be located outside the first electrode 110, and/or a second capping layer may be located outside the second electrode 150. In some exemplary embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving luminescence efficiency of the light-emitting device 10. The first capping layer and the second capping layer may each include a material having a refractive index of about 1.6 or higher (at 589 nm). The first capping layer and the second capping layer may each independently be a capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In some exemplary embodiments, at least one of the first capping layer and the second capping layer may each independently include an amine group-containing compound.

In some exemplary embodiments, at least one of the first capping layer and the second capping layer may each independently include the compound represented by Formula 201, the compound represented by Formula 202, or any combination thereof. In one or more exemplary embodiments, at least one of the first capping layer and the second capping layer may each independently include one of Compounds HT28 to HT33, one of Compounds CP1 to CP6, β-NPB, or any combination thereof:

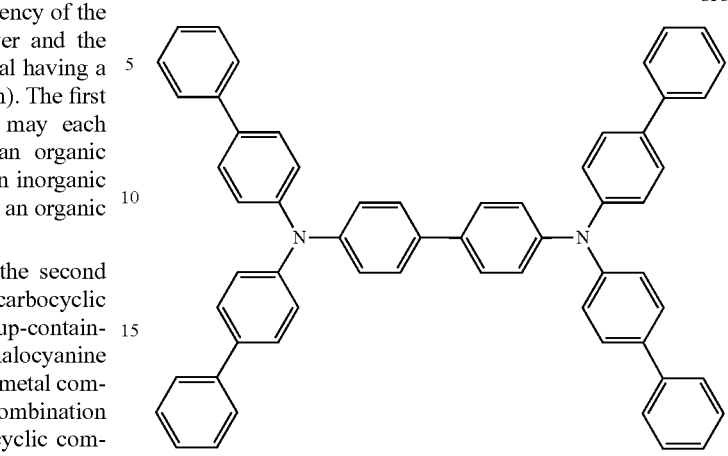

CP3

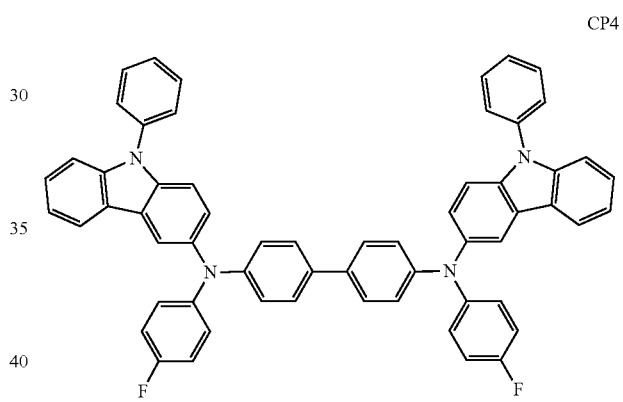

CP4

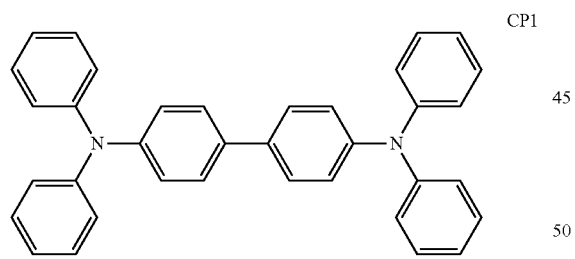

CP1

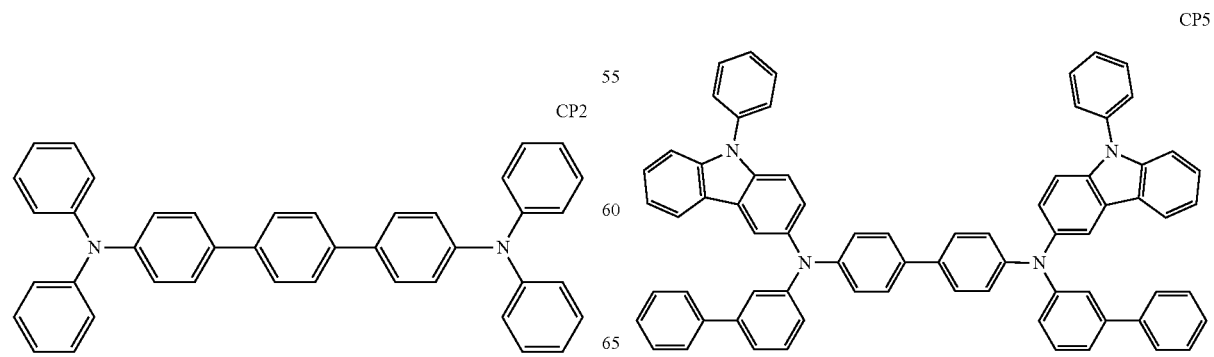

CP2

CP5

CP6

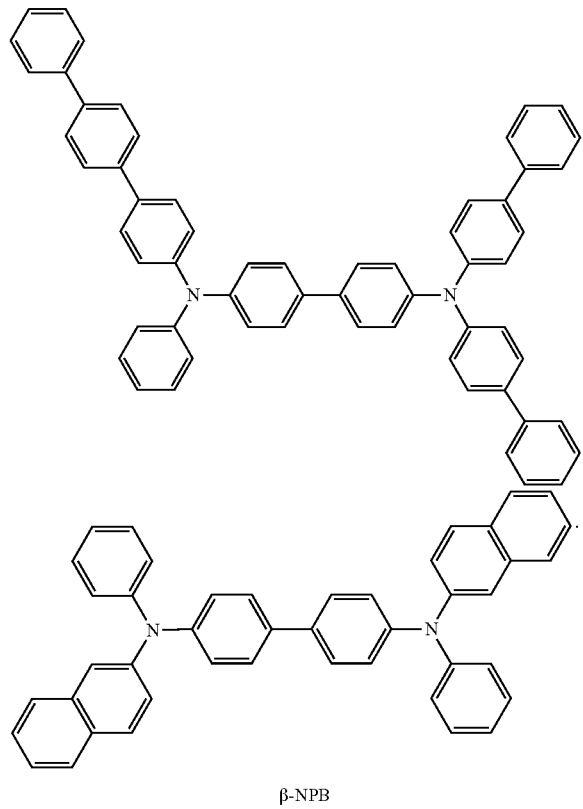

β-NPB

Electronic Apparatus

The light-emitting device may be included in various electronic apparatuses. In some exemplary embodiments, an electronic apparatus including the light-emitting device may be an emission apparatus or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In some exemplary embodiments, the color-conversion layer may include a quantum dot. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be located between the plurality of sub-pixel areas to define each sub-pixel area. The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area emitting first color light; a second area emitting second color light; and/or a third area emitting third color light, and the first color light, the second color light, and/or the third color light may have different maximum emission wavelengths. In some exemplary embodiments, the first color light may be red light, the second color light may be green light, and the third color light may be blue light. In some exemplary embodiments, the plurality of color filter areas (or the plurality of color-conversion areas) may each include a quantum dot. In some exemplary embodiments, the first area may include a red quantum dot, the second area may include a green quantum dot, and the third area may not include a quantum dot. The quantum dot may be understood by referring to the description of the quantum dot provided herein. The first area, the second area, and/or the third area may each further include an emitter.

In some exemplary embodiments, the light-emitting device may emit first light, the first area may absorb the first light to emit 1-1 color light, the second area may absorb the first light to emit 2-1 color light, and the third area may absorb the first light to emit 3-1 color light. In this exemplary embodiment, the 1-1 color light, the 2-1 color light, and the 3-1 color light may each have a different maximum emission wavelength. In some exemplary embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an activation layer, wherein one of the source electrode and the drain electrode may be electrically connected to one of the first electrode and the second electrode of the light-emitting device. The thin-film transistor may further include a gate electrode, a gate insulating film, or the like. The activation layer may include a crystalline silicon, an amorphous silicon, an organic semiconductor, and an oxide semiconductor.

The electronic apparatus may further include a sealing portion for sealing the light-emitting device. The sealing portion may be located between the color filter and/or the color-conversion layer and the light-emitting device. The sealing portion may allow light to pass to the outside from the light-emitting device and prevent the air and moisture to permeate to the light-emitting device at the same time. The sealing portion may be a sealing substrate including a transparent glass or a plastic substrate. The sealing portion may be a thin-film encapsulating layer including at least one of an organic layer and/or an inorganic layer. When the sealing portion is a thin film encapsulating layer, the electronic apparatus may be flexible.

In addition to the color filter and/or the color-conversion layer, various functional layers may be disposed on the sealing portion depending on the use of an electronic apparatus. Examples of the functional layer may include a touch screen layer, a polarization layer, or the like. The touch screen layer may be a resistive touch screen layer, a capacitive touch screen layer, or an infrared beam touch screen layer. The authentication apparatus may be, for example, a biometric authentication apparatus that identifies an individual according biometric information (e.g., a fingertip, a pupil, or the like). The authentication apparatus may further include a biometric information collecting unit, in addition to the light-emitting device described above.

The electronic apparatus may be applicable to or take the form of various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector, and the like.

Figure 2:
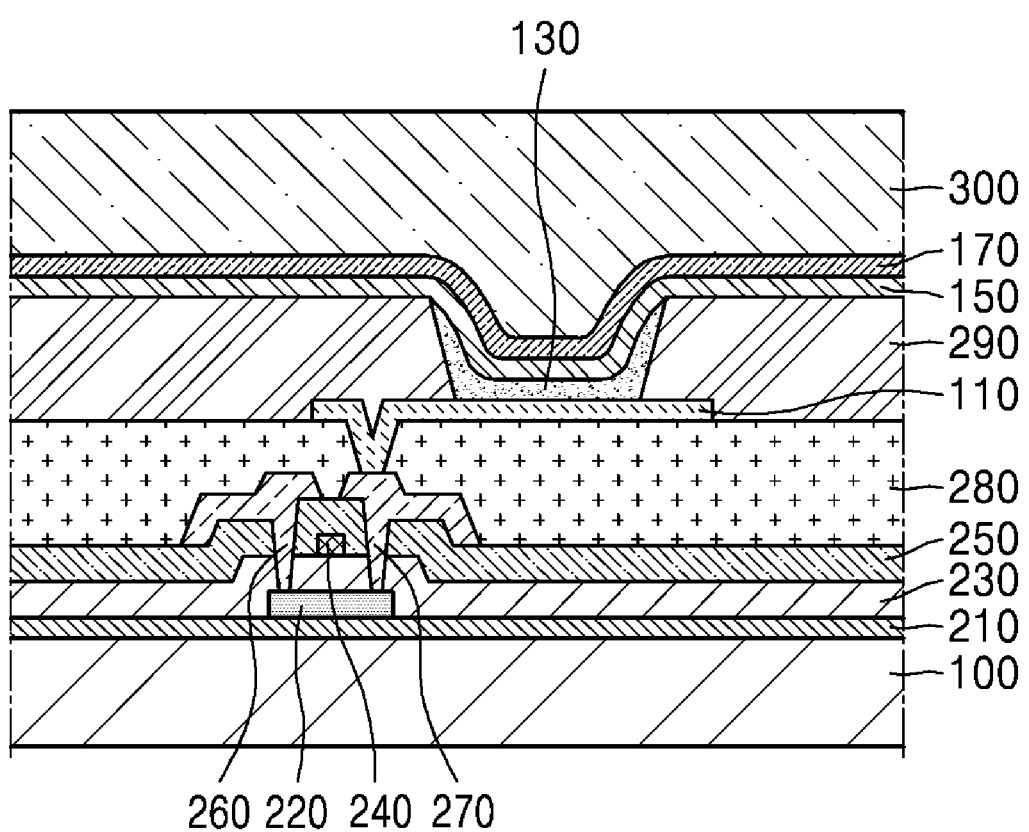
FIG. 2 is a schematic cross-sectional view of an exemplary embodiment of a light-emitting apparatus constructed according to principles of the invention.
Figure 3:
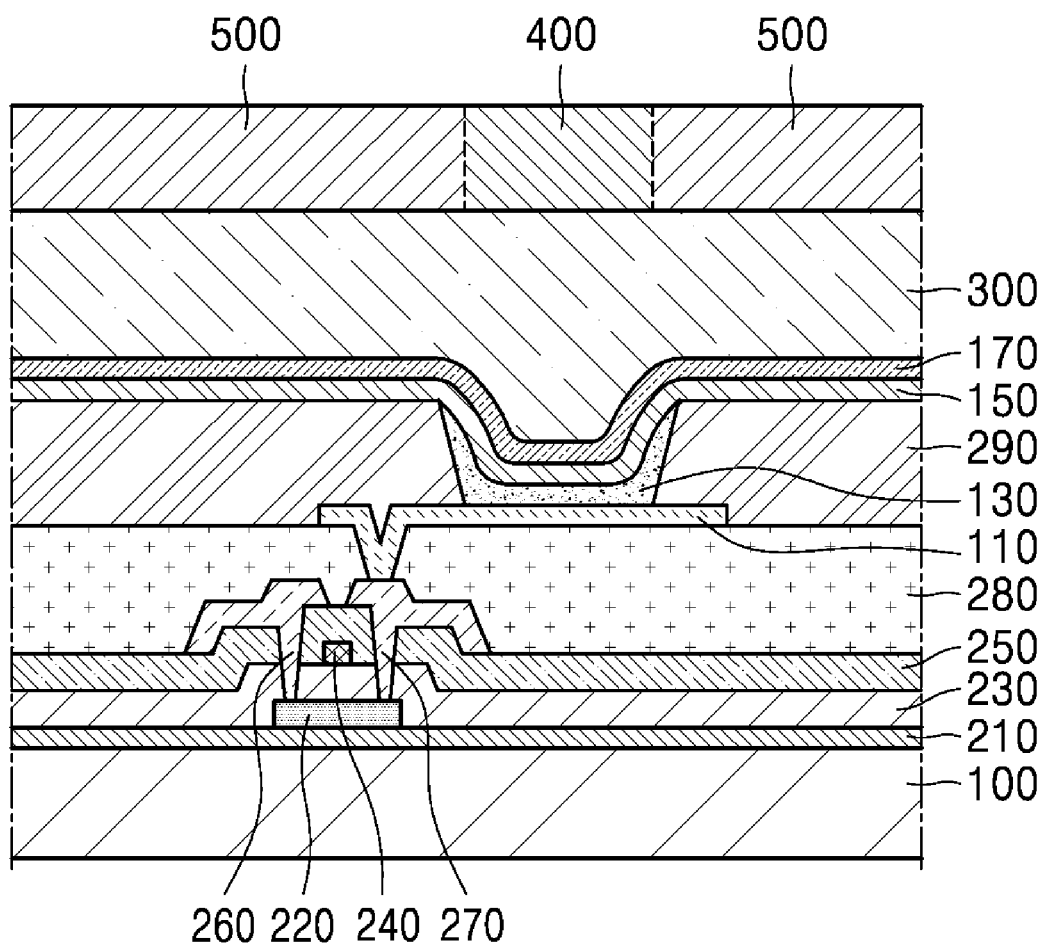
FIG. 3 is a schematic cross-sectional view of another exemplary embodiment of a light-emitting apparatus constructed according to principles of the invention to another exemplary embodiment.

Descriptions of FIGS. 2 and 3

FIG. 2 is a schematic cross-sectional view of an exemplary embodiment of a light-emitting apparatus constructed according to principles of the invention.

An emission apparatus in FIG. 2 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and provide a generally flat surface on the substrate 100.

A thin-film transistor may be on the buffer layer 210. The thin-film transistor may include an active or activation layer 220, a gate electrode 240, a source electrode 260, and a drain electrode 270. The active layer 220 may include an inorganic semiconductor such as a silicon or a polysilicon, an organic semiconductor, or an oxide semiconductor and include a source area, a drain area and a channel area. A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween. The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150. The first electrode 110 may be on the passivation layer 280. The passivation layer 280 may not fully cover the drain electrode 270 and expose a specific area of the drain electrode 270, and the first electrode 110 may be disposed to connect to the exposed drain electrode 270.

A pixel-defining film 290 may be on the first electrode 110. The pixel-defining film 290 may expose a specific area of the first electrode 110, and the interlayer 130 may be formed in the exposed area. The pixel-defining film 290 may be a polyimide or a polyacryl organic film. Some higher layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture or oxygen. The encapsulation unit 300 may include: an inorganic film including a silicon nitride ($SiN_x$), a silicon oxide ($SiO_x$), an indium tin oxide, an indium zinc oxide, or any combination thereof, an organic film including a polyethylene terephthalate, a polyethylene naphthalate, a polycarbonate, a polyimide, a polyethylene sulfonate, a polyoxy methylene, a poly aryllate, a hexamethyl disiloxane, an acrylic resin (e.g., a polymethyl methacrylate, a polyacrylic acid, and the like), an epoxy resin (e.g., an aliphatic glycidyl ether (AGE) and the like), or any combination thereof, or a combination of the inorganic film and the organic film.

FIG. 3 is a schematic cross-sectional view of another exemplary embodiment of a light-emitting apparatus constructed according to principles of the invention to another exemplary embodiment.

The emission apparatus shown in FIG. 3 may be substantially identical to the emission apparatus shown in FIG. 2, except that a light-shielding pattern 500 and a functional area 400 are additionally located on the encapsulation unit 300, so descriptions of like components will be omitted to avoid redundancy. The functional area 400 may be i) a color filter area, ii) a color-conversion area, iii) a combination of a color filter area and a color-conversion area, and the like. In some exemplary embodiments, the light-emitting device shown in FIG. 3 included in the emission apparatus may be a tandem light-emitting device.

Manufacturing Method

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

General Definitions of Terms

The term "interlayer" as used herein refers to a single layer and/or a plurality of all layers located between a first electrode and a second electrode in a light-emitting device.

The term "quantum dot" as used herein refers to a crystal of a semiconductor compound and may include any suitable material capable of emitting emission wavelengths of various lengths according to the size of the crystal.

The term "$C_3$-$C_{60}$ carbocyclic group" as used herein refers to a cyclic group consisting of carbon atoms only and having 3 to 60 carbon atoms. The term "$C_1$-$C_{60}$ heterocyclic group" as used herein refers to a cyclic group having 1 to 60 carbon atoms in addition to a heteroatom other than carbon atoms. The $C_3$-$C_{60}$ carbocyclic group and the $C_1$-$C_{60}$ heterocyclic group may each be a monocyclic group consisting of one ring or a polycyclic group in which at least two rings are fused. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "R electron-deficient nitrogen-containing $C_1$-$C_{60}$ cyclic group" as used herein refers to a heterocyclic group having 1 to 60 carbon atoms and *—N=*' as a ring-forming moiety.

In some exemplary embodiments,

- the $C_3$-$C_{60}$ carbocyclic group may be i) a T1 group or ii) a group in which at least two T1 groups are fused (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group),
- the $C_1$-$C_{60}$ heterocyclic group may be i) a T2 group, ii) a group in which at least two T2 groups are fused, or iii) a group in which at least one T2 group is fused with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like),
- the π electron-rich $C_3$-$C_{60}$ cyclic group may be i) a T1 group, ii) a fused group in which at least two T1 groups are fused, iii) a T3 group, iv) a fused group in which at least two T3 groups are fused, or v) a fused group in which at least one T3 group is fused with at least one T1 group (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and
- the π electron-deficient nitrogen-containing $C_1$-$C_{60}$ cyclic group may be i) a T4 group, ii) a group in which at least twos T4 groups are fused, iii) a group in which at least one T4 group is fused with at least one T1 group, iv) a group in which at least one T4 group is fused with at least one T3 group, or v) a group in which at least one T4 group, at least one T1 group, and at least one T3 group are fused (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like),
- wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group,
- the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group fused with any suitable cyclic group, a monovalent group, or a polyvalent group (e.g., a divalent group, a trivalent group, a quadvalent group, or the like), depending on the structure of the formula to which the term is applied. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group. Examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_1$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_6$-$C_{60}$ aryl group" as used herein refers to a monovalent group having a carbocyclic aromatic system having 6 to 6 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic fused polycyclic group" as used herein refers to a monovalent group that has two or more rings fused and only carbon atoms as ring forming atoms (e.g., 8 to 60 carbon atoms), wherein the entire molecular structure is non-aromatic. Examples of the monovalent non-aromatic fused polycyclic group include an indenyl group, a fluorenyl group, a spiro-bifluorenyl group, a benzofluorenyl group, an indenophenanthrenyl group, and an indenoanthracenyl group. The term "divalent non-aromatic fused polycyclic group" as used herein refers to a divalent group having a structure corresponding to the monovalent non-aromatic fused polycyclic group.

The term "monovalent non-aromatic fused heteropolycyclic group" as used herein refers to a monovalent group that has two or more fused rings and at least one heteroatom other than carbon atoms (e.g., 1 to 60 carbon atoms), as a ring-forming atom, wherein the entire molecular structure is non-aromatic. Examples of the monovalent non-aromatic fused heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to the monovalent non-aromatic fused heteropolycyclic group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "$R_{10a}$" as used herein may be:
  deuterium (-D), —F, —Cl, —Br, —I, a hydroxyl group, a cyano group, or a nitro group;
  a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
  a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
  —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include O, S, N, P, Si, B, Ge, Se, or any combination thereof.

"Ph" used herein represents a phenyl group, "Me" used herein represents a methyl group, "Et" used herein represents an ethyl group, "ter-Bu" or "Bu$^t$" used herein represents a tert-butyl group, and "OMe" used herein represents a methoxy group.

The term "biphenyl group" as used herein refers to a phenyl group substituted with at least one phenyl group. The "biphenyl group" belongs to "a substituted phenyl group" having a "$C_6$-$C_{60}$ aryl group" as a substituent.

The term "terphenyl group" as used herein refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula.

As used herein, the term "atom" may mean an element or its corresponding radical bonded to one or more other atoms.

The terms "hydrogen" and "deuterium" refer to their respective atoms and corresponding radicals, and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

Hereinafter, compounds and a light-emitting device according to one or more exemplary embodiments will be described in more detail with reference to Synthesis Examples and Examples. The terminology "B was used instead of A" used in describing Synthesis Examples means that an amount of B used was identical to an amount of A used in terms of molar equivalents.

EXAMPLES

Synthesis Example 1 (Compound 3)

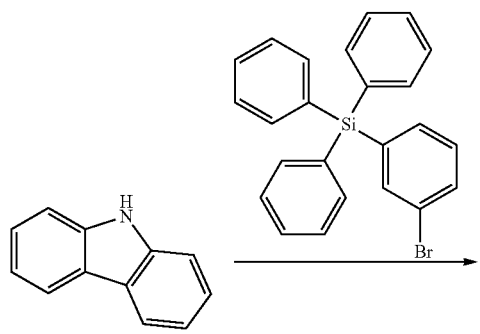

Chemical Formula: $C_{38}H_{27}NSi$
Exact Mass: 501.19
3-1

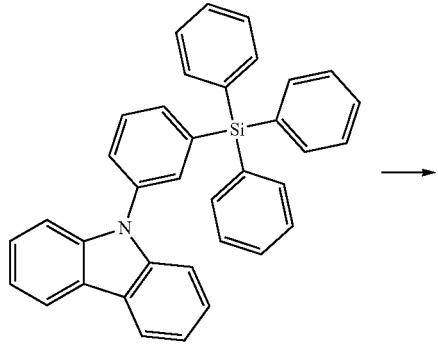

Chemical Formula: $C_{12}H_9N$
Exact Mass: 167.07

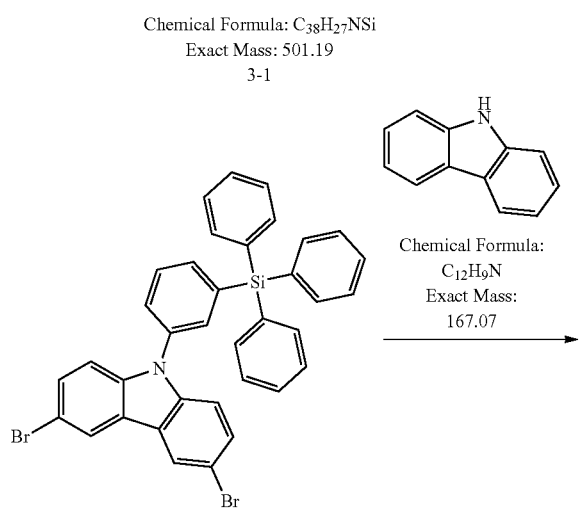

Chemical Formula: $C_{36}H_{25}Br_2NSi$
Exact Mass: 657.01
3-2

-continued

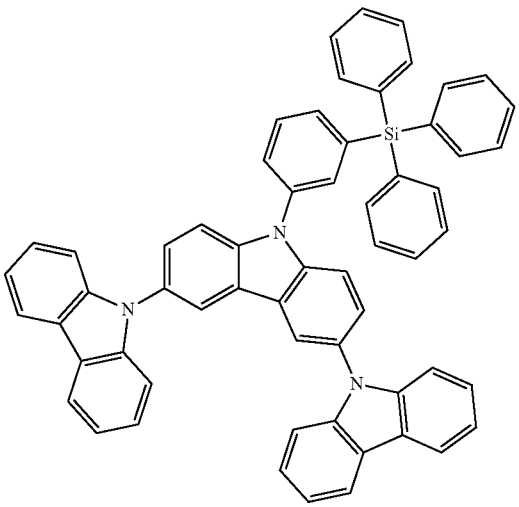

Chemical Formula: $C_{60}H_{41}N_3Si$
Exact Mass: 831.31
3

Synthesis of Intermediate 3-1

1 mole eq. of carbazole and 1 mole eq. of (3-bromophenyl)triphenylsilane were reacted with 0.04 mole eq. of tris(dibenzylideneacetone)dipalladium(0) ($Pd_2(dba)_3$), 0.08 mole eq. of tri-tert-butylphosphine ($P(tBu)_3$), and 1.5 mole eq. of sodium tert-butoxide (NaOtBu) to obtain Intermediate 3-1. Intermediate 3-1 was identified by liquid chromatography-mass spectrometry (LC-MS).

$C_{36}H_{27}NSi$ $M^{+1}$: 502.21

Synthesis of Intermediate 3-2

1 mole eq. of Intermediate 3-1 and 2 mole eq. of N-bromosuccinimide were reacted together in a dimethyl formamide (DMF) solvent to obtain Intermediate 3-2. Intermediate 3-2 was identified by LC-MS.

$C_{36}H_{25}Br_2NSi$ $M^{+1}$: 658.02

Synthesis of Compound 3

3.1 grams (g) of Intermediate 3-2 and 1.73 g of carbazole were added to a reaction vessel, and 0.17 g of $Pd_2(dba)_3$, 0.1 milliliters (mL) of $P(tBu_3)$ (50 wt % in xylene), 3 g of NaOtBu, and 50 mL of toluene were added dropwise thereto. Then the reaction temperature was raised to 120° C. and refluxed for 12 hours. An organic layer was extracted from the resulting mixture using ethyl acetate and dried using magnesium sulfate, and the solvent was evaporated to obtain residue. The residue was subjected to silica gel column chromatography for separation and purification to thereby obtain 2.7 g of Compound 3 (yield: 71 percent (%)). The results of LC-MS and $^1$H-nuclear magnetic resonance (NMR) on Compound 3 are shown in Table 1.

Synthesis Example 2 (Compound 4)

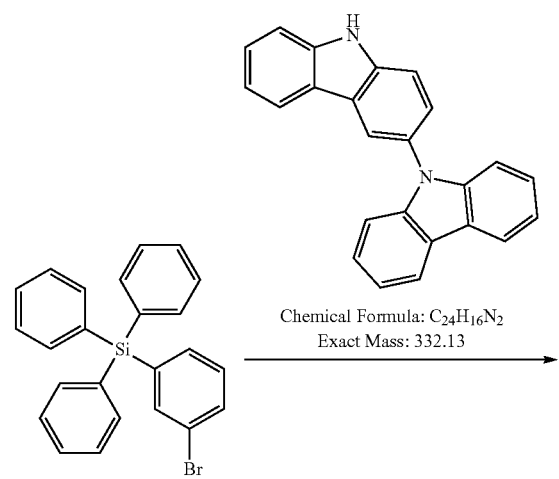

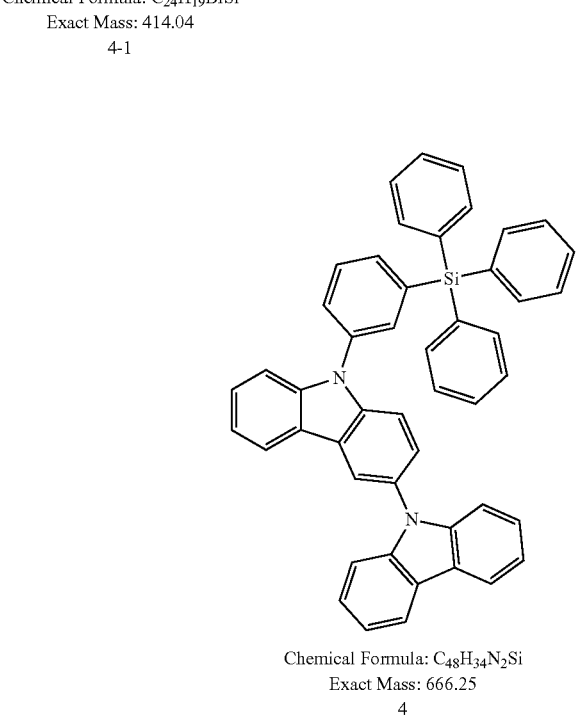

2.9 g of (3-bromophenyl)triphenylsilane and 2.8 g of 9H-3,9'-bicarbazole were added to a reaction vessel, and 0.3 g of $Pd_2(dba)_3$, 0.12 mL of $P(tBu_3)$ (50 wt % in xylene), 1.2 g of NaOtBu, and 50 mL of toluene were added dropwise thereto. Then the reaction temperature was raised to 120° C. and refluxed for 12 hours. An organic layer was extracted from the resulting mixture using ethyl acetate and dried using magnesium sulfate, and the solvent was evaporated to obtain residue. The residue was subjected to silica gel column chromatography for separation and purification to thereby obtain 2.3 g of Compound 4 (yield: 49%). The results of LC-MS and $^1$H-NMR on Compound 4 are shown in Table 1.

Synthesis Example 3 (Compound 6)

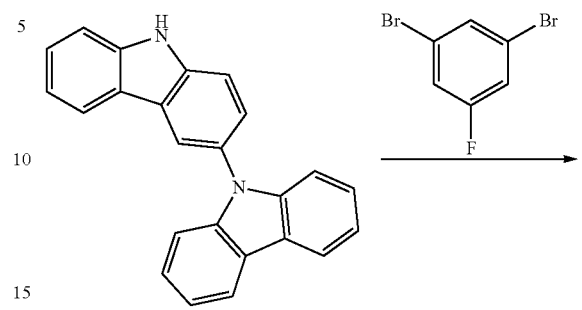

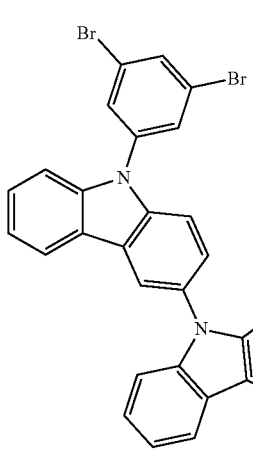

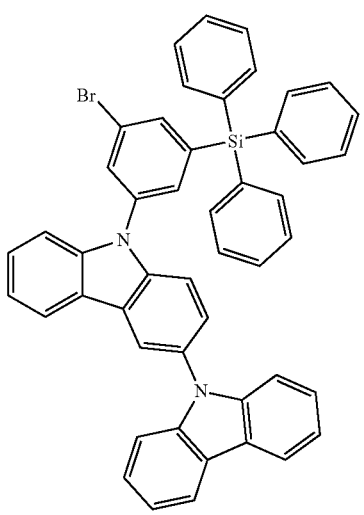

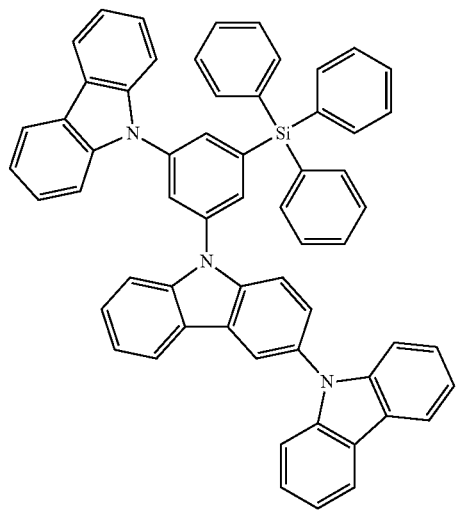

Chemical Formula: C$_{60}$H$_{41}$N$_3$Si
Exact Mass: 831.31

6

Intermediate 6-1 was obtained by reacting 1 mole eq. of 9H-3,9'-bicarbazole and 1 mole eq. of 1,3-dibromo-5-fluorobenzene with 2 mole eq. of potassium phosphate (K$_3$PO$_4$) in a DMF. Intermediate 6-1 was identified by LC-MS.

C$_{30}$H$_{18}$Br$_2$N$_2$ M$^{+1}$: 564.92

Synthesis of Intermediate 6-2

1 mole eq. of Intermediate 6-1 was mixed with tetrahydrofuran (THF), reacted with 1 mole eq. of n-butyllithium (nBuLi) at a temperature of −78° C., and reacted with 1 mole eq. of chlorotriphenylsilane to thereby obtain Intermediate 6-2. Intermediate 6-2 was identified by LC-MS.

C$_{48}$H$_{33}$BrN$_2$Si M$^{+1}$: 745.14

Synthesis of Compound 6

4.1 g of Intermediate 6-2 and 1.1 g of carbazole were added to a reaction vessel, and 0.25 g of Pd$_2$(dba)$_3$, 0.1 mL of P(tBu$_3$) (50 wt % in xylene), 1 g of NaOtBu, and 30 mL of toluene were added dropwise thereto. Then the reaction temperature was raised to 120° C. and refluxed for 12 hours. An organic layer was extracted from the resulting mixture using ethyl acetate and dried using magnesium sulfate, and the solvent was evaporated to obtain residue. The residue was subjected to silica gel column chromatography for separation and purification to thereby obtain 2.4 g of Compound 6 (yield: 53%). The results of LC-MS and $^1$H-NMR on Compound 6 are shown in Table 1.

Synthesis Example 4 (Compound 7)

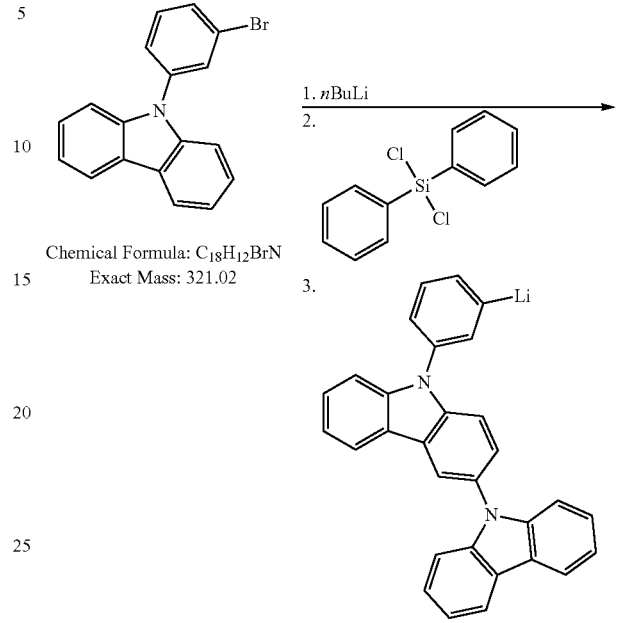

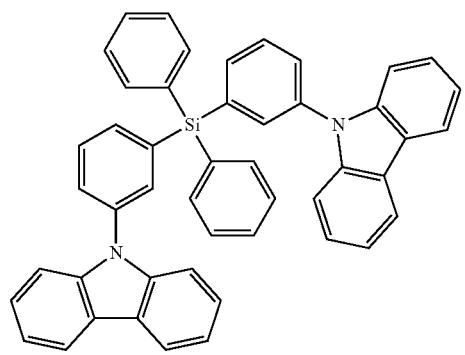

Chemical Formula: C$_{60}$H$_{41}$N$_3$Si
Exact Mass: 831.31

7

2.8 g of 9-(3-bromophenyl)-9H-carbazole was mixed with 30 mL of ether, and 3.5 mL of nBuLi (2.5 M in n-hexane) was added dropwise thereto at a temperature of 0° C. for 1 hour. The resulting mixture was slowly added dropwise to a mixture of 2.2 g of dichlorodiphenylsilane and 15 mL of ether, and the reaction mixture was cooled to a temperature of −78° C. 4.2 g of 9-(3-bromophenyl)-9H-3,9'-bicarbazole and THF were mixed in a separate round-bottom flask (RBF), and the reaction mixture was cooled to a temperature of −78° C. Then, 3.5 mL of nBuLi (2.5 M in n-hexane) was added dropwise thereto for 1 hour. The obtained mixture was slowly added dropwise to the reaction mixture. 30 minutes after, the temperature of the reaction mixture was slowly raised to room temperature and stirred overnight. Subsequently, the reaction was terminated by using water, an organic layer was extracted using ethyl acetate and dried using magnesium sulfate, and the solvent was evaporated to obtain residue. The residue was subjected to silica gel column chromatography for separation and purification to thereby obtain 2.1 g of Compound 7 (yield: 29%). The results of LC-MS and ¹H-NMR on Compound 7 are shown in Table 1.
Synthesis Example 5 (Compound 9)
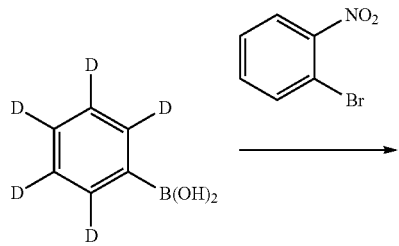
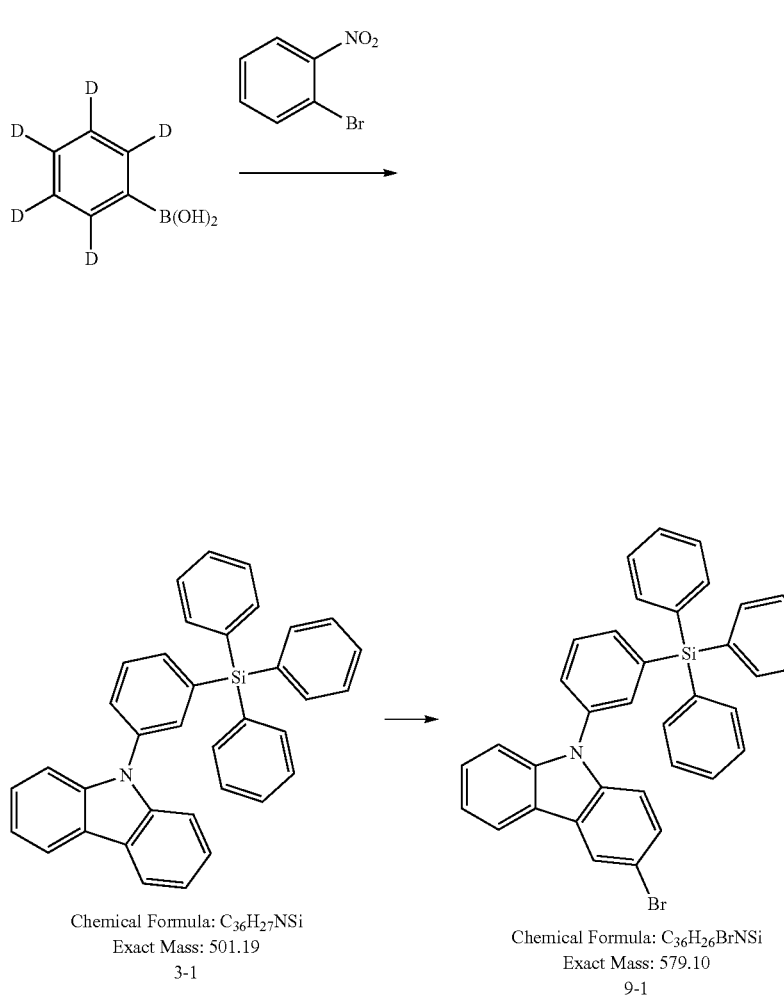
Chemical Formula: C₃₆H₂₇NSi
Exact Mass: 501.19
3-1
Chemical Formula: C₃₆H₂₆BrNSi
Exact Mass: 579.10
9-1
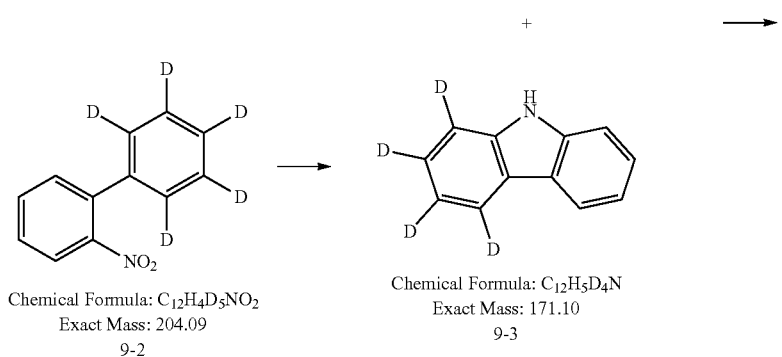
Chemical Formula: C₁₂H₄D₅NO₂
Exact Mass: 204.09
9-2
Chemical Formula: C₁₂H₅D₄N
Exact Mass: 171.10
9-3

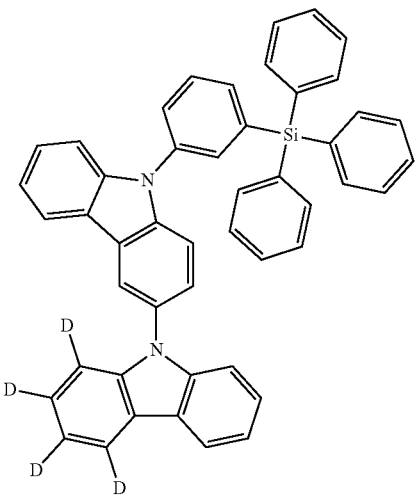

Chemical Formula: $C_{48}H_{30}D_4N_2Si$
Exact Mass: 670.27

9

Synthesis of Intermediate 9-1

1 mole eq. of Intermediate 3-1 and 0.95 mole eq. of N-bromosuccinimide were reacted together in a DMF solvent to obtain Intermediate 9-1. Intermediate 9-1 was identified by LC-MS.

$C_{36}H_{26}BrNSi$ $M^{+1}$: 580.21

Synthesis of Intermediate 9-2

1.2 mole eq. of phenylboronic acid-d5 and 1 mole eq. of 2-bromonitrobenzene were reacted in the presence of 0.04 mole eq. of palladium-tetrakis(triphenylphosphine) (Pd(PPh$_3$)$_4$) and 2.5 mole eq. of potassium carbonate (K$_2$CO$_3$) to obtain Intermediate 9-2. Intermediate 9-2 was identified by LC-MS.

$C_{12}H_4D_5NO_2$ $M^{+1}$: 205.11

Synthesis of Intermediate 9-3

1 mole eq. of Intermediate 9-2 and 2.5 mole eq. of triphenylphosphine were reacted together in a 1,2-dichlorobenzene solvent to obtain Intermediate 9-3. Intermediate 9-3 was identified by LC-MS.

$C_{12}H_5D_4N$ $M^{+1}$: 172.11

Synthesis of Compound 9

5.1 g of Intermediate 9-1 and 1.8 g of Intermediate 9-3 were added to a reaction vessel, and 0.4 g of Pd$_2$(dba)$_3$, 0.14 mL of P(tBu$_3$) (50 wt % in xylene), 1.52 g of NaOtBu, and 60 mL of toluene were added dropwise thereto. Then the reaction temperature was raised to 120° C. and refluxed for 12 hours. An organic layer was extracted from the resulting mixture using ethyl acetate and dried using magnesium sulfate, and the solvent was evaporated to obtain residue. The residue was subjected to silica gel column chromatography for separation and purification to thereby obtain 4.2 g of Compound 9 (yield: 71%). The results of LC-MS and $^1$H-NMR on Compound 9 are shown in Table 1.

Synthesis Example 6 (Compound 10)

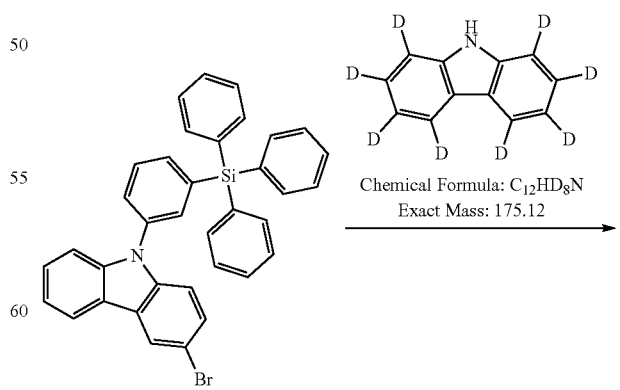

Chemical Formula: $C_{36}H_{26}BrNSi$
Exact Mass: 579.10

9-1

Chemical Formula: $C_{12}HD_8N$
Exact Mass: 175.12

-continued

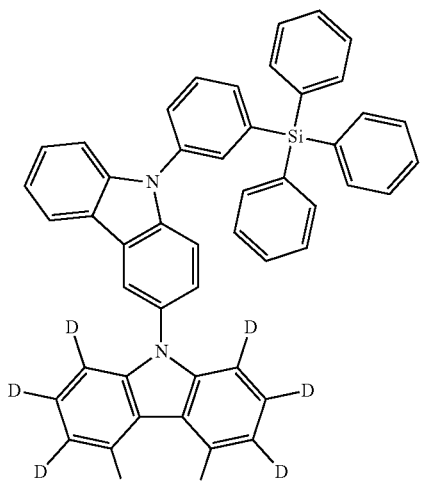

Chemical Formula: C₄₈H₂₆D₈N₂Si
Exact Mass: 674.30
10

3.7 g of Intermediate 9-1 and 1.3 g of carbazole-d8 were added to a reaction vessel, and 0.29 g of Pd₂(dba)₃, 0.14 mL of P(tBu₃) (50 wt % in xylene), 1.1 g of NaOtBu, and 40 mL of toluene were added dropwise thereto. Then the reaction temperature was raised to 120° C. and refluxed for 12 hours. An organic layer was extracted from the resulting mixture using ethyl acetate and dried using magnesium sulfate, and the solvent was evaporated to obtain residue. The residue was subjected to silica gel column chromatography for separation and purification to thereby obtain 3.1 g of Compound 10 (yield: 73%). The results of LC-MS and $^1$H-NMR on Compound 10 are shown in Table 1.

Synthesis Example 7 (Compound 11)

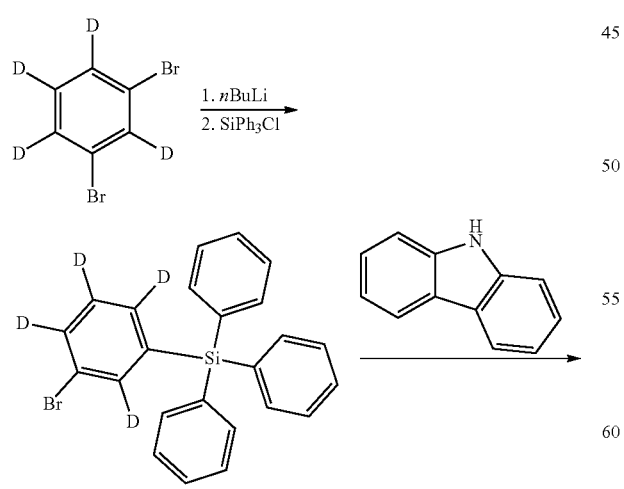

Chemical Formula: C₂₄H₁₅D₄BrSi
Exact Mass: 418.07
11-1

-continued

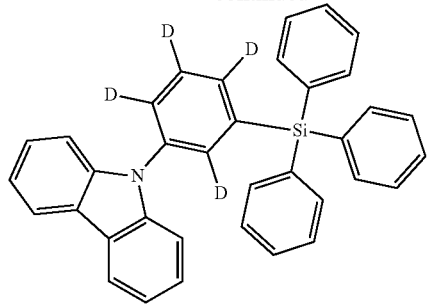

Chemical Formula: C₃₆H₂₃D₄NSi
Exact Mass: 505.22
11-2

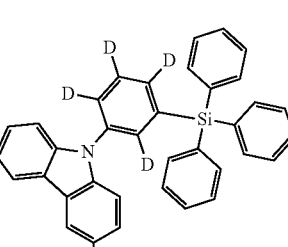

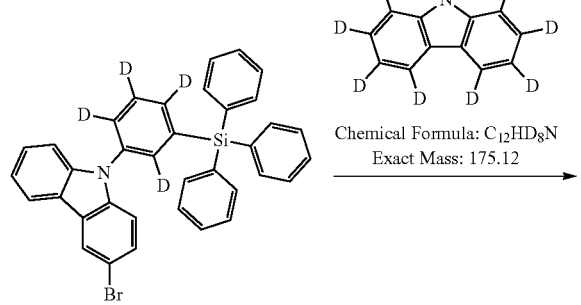

Chemical Formula: C₁₂HD₈N
Exact Mass: 175.12

Chemical Formula: C₃₆H₂₂D₄BrNSi
Exact Mass: 583.13
11-3

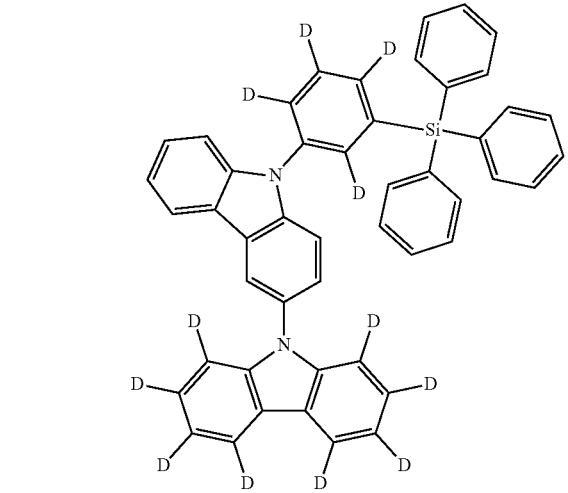

Chemical Formula: C₄₈H₂₂D₁₂N₂Si
Exact Mass: 678.32
11

Synthesis of Intermediate 11-1

1 mole eq. of 1,3-dibromobenzene-d4 was reacted with 1 mole eq. of nBuLi at a temperature of −78° C. and then with 1 mole eq. of chlorotriphenylsilane to thereby obtain Intermediate 11-1. Intermediate 11-1 was identified by LC-MS. C₂₄H₁₅D₄BrSi M⁺¹: 419.06

Synthesis of Intermediate 11-2

1 mole eq. of Intermediate 11-1 and 1 mole eq. of carbazole were reacted with 0.04 mole eq. of Pd₂(dba)₃, 0.08 mole eq. of P(tBu)₃, and 1.5 mole eq. of NaOtBu to obtain Intermediate 11-2. Intermediate 11-2 was identified by LC-MS.

C₃₆H₂₃D₄NSi M⁺¹: 506.21

Synthesis of Intermediate 11-3

1 mole eq. of Intermediate 11-2 and 0.95 mole eq. of N-bromosuccinimide were reacted together in a DMF solvent to obtain Intermediate 11-3. Intermediate 11-3 was identified by LC-MS.

C₃₆H₂₂D₄BrNSi M⁺¹: 584.16

Synthesis of Compound 11

2.4 g of Intermediate 11-3 and 0.86 g of carbazole-d8 were added to a reaction vessel, and 0.19 g of Pd₂(dba)₃, 0.1 mL of P(tBu₃) (50 wt % in xylene), 0.72 g of NaOtBu, and 30 mL of toluene were added dropwise thereto. Then the reaction temperature was raised to 120° C. and refluxed for 12 hours. An organic layer was extracted from the resulting mixture using ethyl acetate and dried using magnesium sulfate, and the solvent was evaporated to obtain residue. The residue was subjected to silica gel column chromatography for separation and purification to thereby obtain 1.8 g of Compound 11 (yield: 66%). The results of LC-MS and ¹H-NMR on Compound 11 are shown in Table 1.

Synthesis Example 8 (Compound 17)

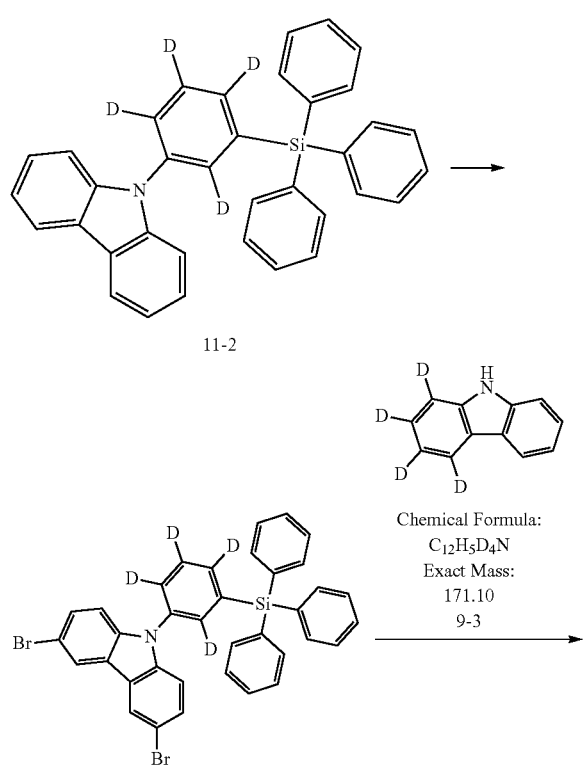

11-2

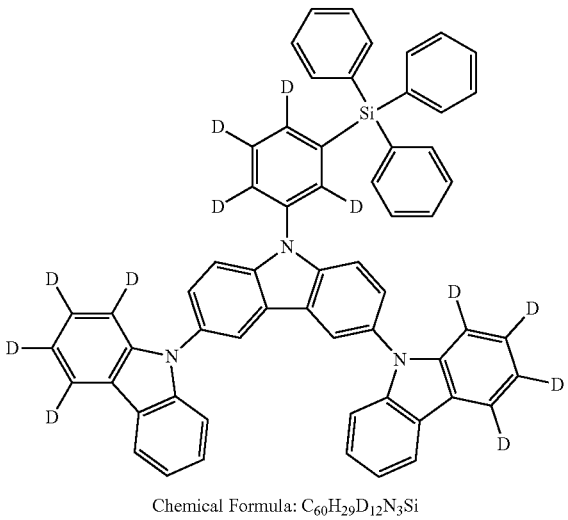

Chemical Formula: C₆₀H₂₉D₁₂N₃Si
Exact Mass: 843.38

17

Synthesis of Intermediate 17-1

1 mole eq. of Intermediate 11-2 and 2 mole eq. of N-bromosuccinimide were reacted together in a DMF solvent to obtain Intermediate 17-1. Intermediate 17-1 was identified by LC-MS.

C₃₆H₂₁D₄Br₂NSi M⁺¹: 662.11

Synthesis of Compound 17

4.1 g of Intermediate 17-1 and 1.3 g of Intermediate 9-3 were added to a reaction vessel, and 0.29 g of Pd₂(dba)₃, 0.1 mL of P(tBu₃) (50 wt % in xylene), 3.9 g of NaOtBu, and 50 mL of toluene were added dropwise thereto. Then the reaction temperature was raised to 120° C. and refluxed for 12 hours. An organic layer was extracted from the resulting mixture using ethyl acetate and dried using magnesium sulfate, and the solvent was evaporated to obtain residue. The residue was subjected to silica gel column chromatography for separation and purification to thereby obtain 2.6 g of Compound 17 (yield: 49%). The results of LC-MS and ¹H-NMR on Compound 17 are shown in Table 1.

Compounds synthesized in Synthesis Examples 1 to 8 were identified by ¹H nuclear magnetic resonance (NMR) and mass spectroscopy/fast atom bombardment (MS/FAB). The results thereof are shown in Table 1.

Methods of synthesizing compounds other than compounds shown in Table 1 may be easily understood to those skilled in the art by referring to the synthesis schemes and raw materials described above.

TABLE 1

| Compound No | $^1$H NMR (CDCl$_3$, 400 MHz) | MS/FAB found | calc. |
|---|---|---|---|
| 3 | 8.20 (d) 4H, 7.68-7.64 (m) 5H, 7.59 (d) 1H, 7.55 (t) 1H, 7.47-7.35 (m) 20H, 7.31 (d) 2H, 7.19 (t) 4H, 7.15 t (4H) | 832.29 | 831.31 |
| 4 | 8.54 (d) 1H, 8.18 (d) 2H, 7.68-7.64 (m) 2H, 7.59 (d) 1H, 7.56 (t) 1H, 7.43-7.51 (m) 2H, 7.45-7.35 (m) 18H, 7.2-7.19 (m) 5H, 7.16 (t) 1H, 7.10 (t) 1H | 667.27 | 666.25 |
| 6 | 8.57-8.53 (m) 3H, 8.18 (d) 2H, 7.68 (s) 1H, 7.54-7.35 (m) 3H, 7.46-7.33 (m) 18H, 7.21-7.15 (m) 8H, 7.13-7.10 (m) 3H | 832.33 | 831.31 |
| 7 | 8.56-8.52 (m) 3H, 8.18 (d) 2H, 7.68-7.64 (m) 3H, 7.61-7.52 (m) 8H, 7.47-7.37 (m) 14H, 7.21-7.15 (m) 8H, 7.13-7.11 (m) 3H | 832.29 | 831.31 |
| 9 | 8.56 (d) 1H, 8.18 (d) 1H, 7.68-7.51 (m) 4H, 7.46-7.37 (m) 17H, 7.21-7.15 (m) 4H, 7.10 (t) 1H | 671.26 | 670.27 |
| 10 | 8.56 (d) 1H, 7.68-7.64 (m) 4H, 7.45-7.35 (m) 16H, 7.21 (d) 1H, 7.15-7.10 (m) 2H | 675.29 | 674.30 |
| 11 | 8.54 (d) 1H, 7.68-7.64 (m) 2H, 7.55-7.51 (m) 2H, 7.45-7.35 (m) 15H, 7.21 (d) 1H, 7.15 (t) 1H, 7.10 (t) 1H | 679.34 | 678.32 |
| 17 | 8.18 (d) 2H, 8.68-7.64 (m) 5H, 7.61 (d) 1H, 7.55 (t) 1H, 7.47-7.36 (m) 18H, 7.32 (d) 2H, 7.21 (t) 2H, 7.19 (t) 2H | 844.39 | 843.38 |

Evaluation Example 1

The compounds shown in Table 2 were subjected to quantum chemistry computation by using a quantum chemistry computational program Gaussian 09 (available from Gaussian, Inc., of Wallingford, CT). Thus, the triplet (T$_1$) energy level and the HOMO energy level of the compounds were measured. The results thereof are shown in Table 2. In a ground state, structure optimization was performed at a degree of hybrid density functional B3LYP basis set, and 6-31G* (defined for the atoms H through Zn) is a valence double-zeta polarized basis set (d,p) function was used.

TABLE 2

| Compound No. | T$_1$ energy level (eV) | HOMO energy level (eV) |
|---|---|---|
| 3 | 3.10 | −5.08 |
| 4 | 3.11 | −5.12 |
| 6 | 3.09 | −5.11 |
| 7 | 3.11 | −5.10 |
| 9 | 3.11 | −5.09 |
| 10 | 3.11 | −5.10 |
| 11 | 3.11 | −5.10 |
| 17 | 3.10 | −5.09 |
| A1 | 2.78 | −5.11 |
| A2 | 2.72 | −4.90 |
| B1 | 3.10 | −5.33 |
| B2 | 3.11 | −5.32 |
| C1 | 2.75 | −4.92 |
| D1 | 2.81 | −5.11 |

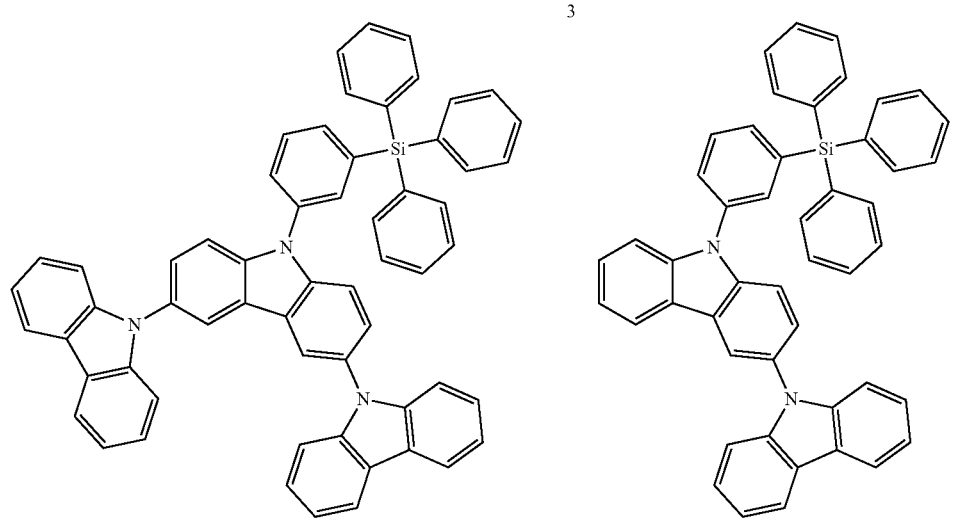

-continued
6
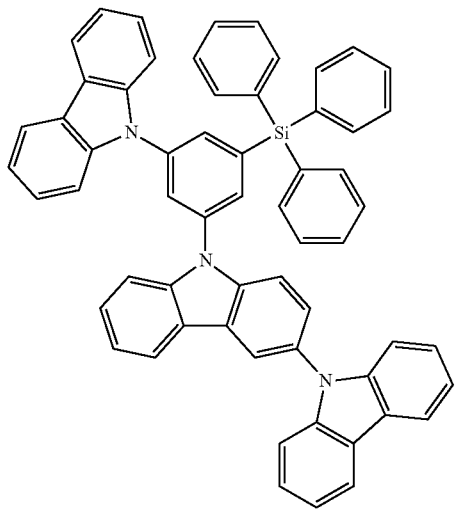
7
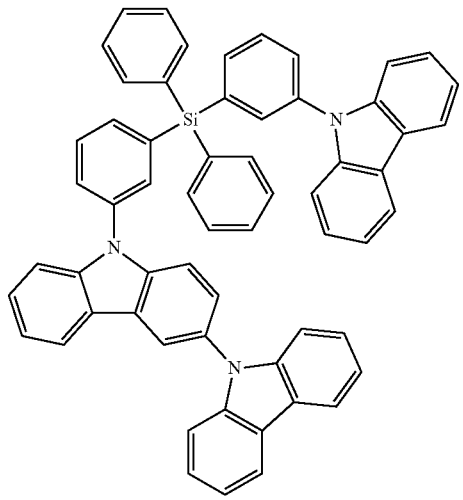
9
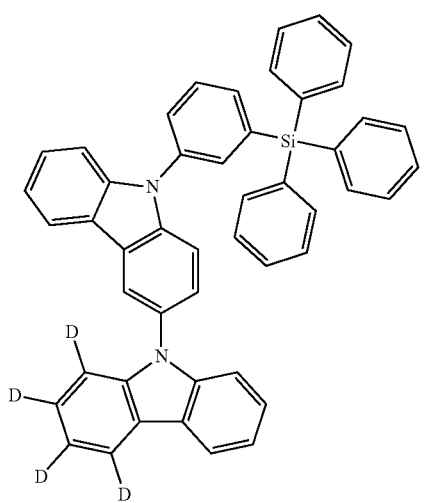
10
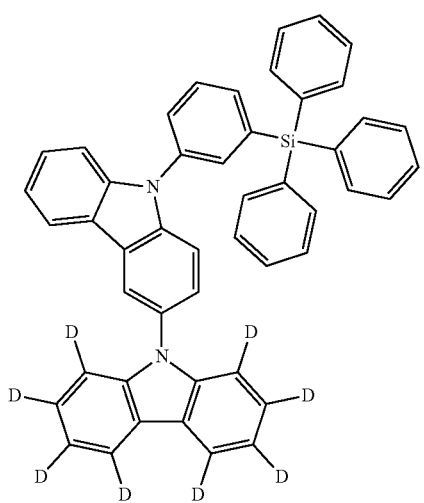
11
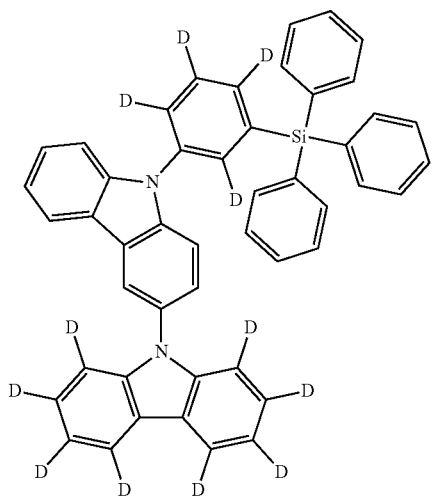
17
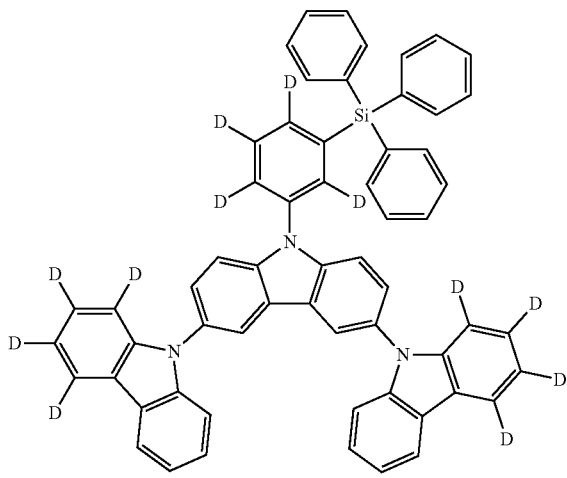

-continued
A1
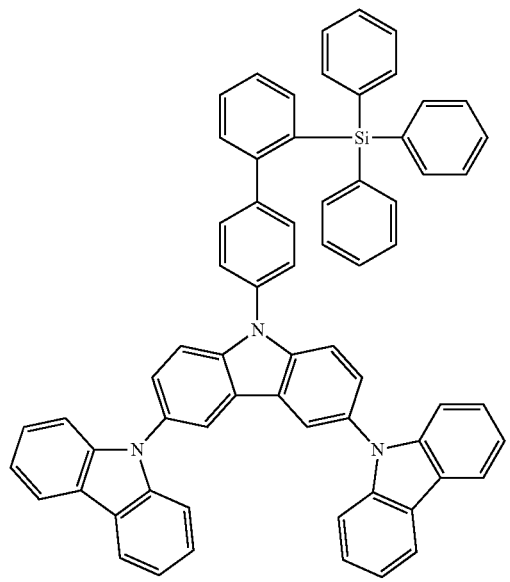
A2
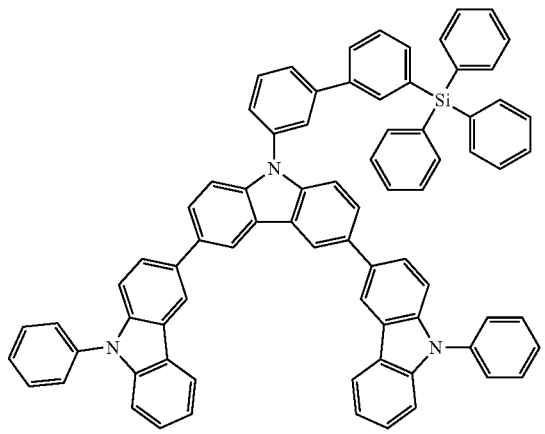
B1
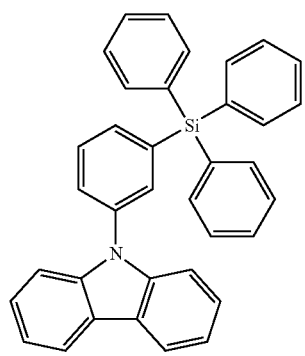
B2
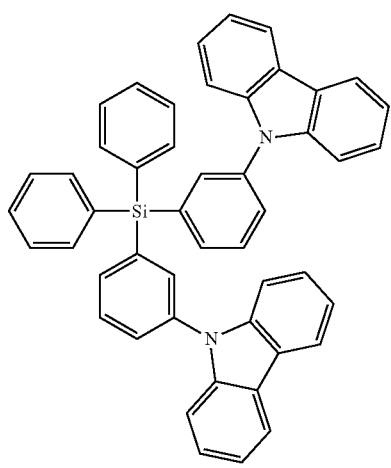
C1
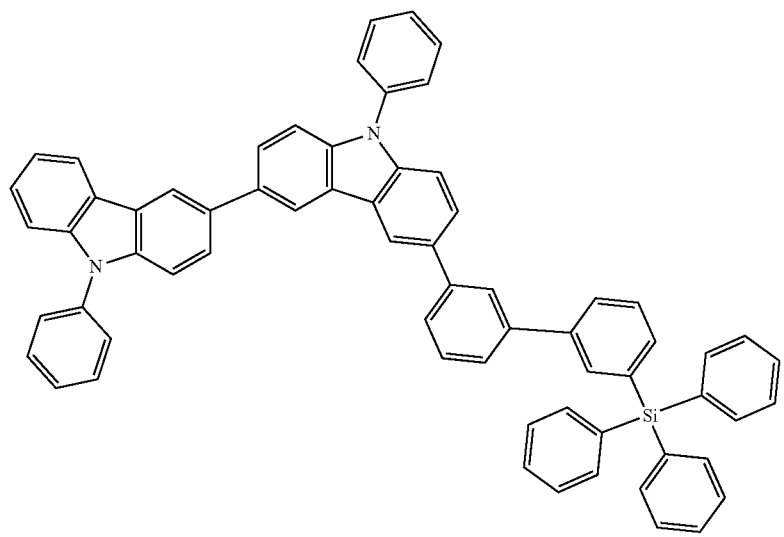

-continued

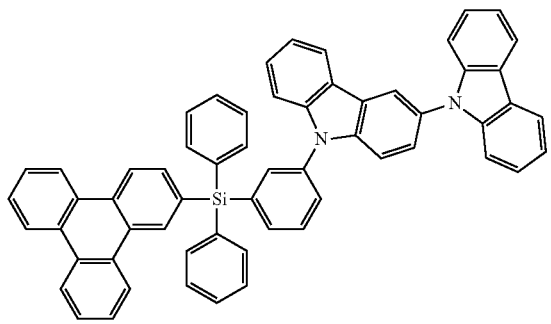

D1

Referring to the results of Table 2, Compounds 3, 4, 6, 7, 9, 10, 11, and 17 were significantly and unexpectedly found to have 1) a high triplet energy level, as compared with Compounds A1, A2, C1, and D1 and 2) a high HOMO energy level (i.e., a small absolute value of HOMO energy level), as compared with Compounds B 1 and B2.

Example 1

A glass substrate, on which an ITO electrode (anode) having a thickness of 1,200 Å was deposited, was cut to a size of 50 millimeters (mm)×50 mm×0.7 mm, sonicated in isopropyl alcohol and pure water for 5 minutes each, and cleaned by exposure to ultraviolet rays and ozone for 30 minutes. Subsequently, the glass substrate was mounted on a vacuum-deposition apparatus.

N,N'-di(1-naphthyl)-N,N'-diphenylbenzidine (NPB) was vacuum-deposited on the ITO electrode to form a hole injection layer having a thickness of 300 Å. mCP was then vacuum-deposited on the hole injection layer to form a hole transport layer having a thickness of 200 Å.

Subsequently, Compound 3 (as a host) and Ir(pmp)$_3$ (as a dopant) were co-deposited on the hole transport layer at a weight ratio of 92:8 to form an emission layer having a thickness of 250 Å.

Then, 3-(4-biphenylyl)-4-phenyl-5-tert-butylphenyl-1,2,4-triazole (TAZ) was vacuum-deposited on the emission layer to form an electron transport layer having a thickness of 200 Å, lithium fluoride (LiF) was vacuum-deposited on the electron transport layer to form an electron injection layer having a thickness of 10 Å, and Al was vacuum-deposited on the electron injection layer to form a cathode having a thickness of 100 Å, thereby completing the manufacture of an organic light-emitting device.

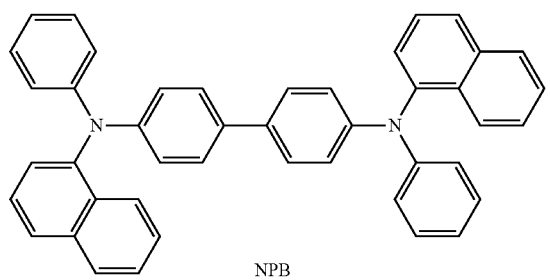

NPB

-continued

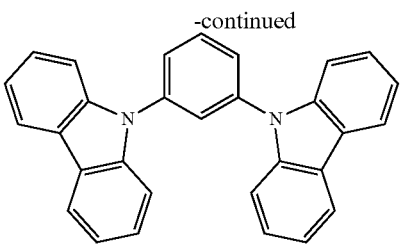

mCP

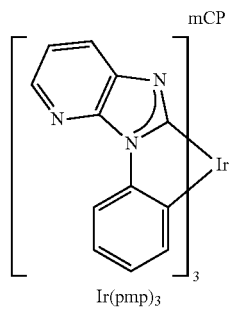

Ir(pmp)$_3$

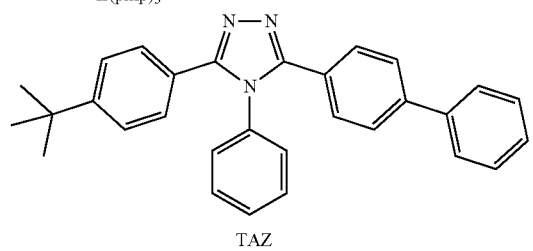

TAZ

Examples 2 to 8 and Comparative Examples A1, A2, B1, B2, C1, and D1

Organic light-emitting devices were manufactured in substantially the same manner as in Example 1, except that the compounds shown in Table 3 were used instead of Compound 3 as a host.

Evaluation Example 2

The driving voltage (V) and the maximum external quantum efficiency (EQE$_{MAX}$, %) of the organic light-emitting devices manufactured in Examples 1 to 8 and Comparative Examples A1, A2, B1, B2, C1, and D1 at a current density of 10 mA/cm$^2$ were measured. The results thereof are shown in Table 3. The driving voltage and the current density were measured using a source-measure unit sold under the trade designation Keithley Instrument, 2400 series of by Tektronix, Inc., of Beaverton, Oregon. The maximum external quantum efficiency of the organic light-emitting devices were measured using sold under the trade designation Hammamastu Absolute PL Quantum Yield Measurement System C9920-2-12 of Hamamatsu Photonics Inc. of Hamamatsu-city, Japan. In evaluation of the maximum external quantum yield, luminance/current density was measured using a luminance meter sold under the trade designation PR650 from Konica Minolta, Inc. of Tokyo, Japan with calibration of wavelength sensitivity, and the maximum external quantum yield was calculated on the assumption of the angular luminance distribution (Lambertian) assuming a complete diffusion reflecting surface.

TABLE 3

| | Host Compound No. | Dopant | Driving voltage (V) | Current density (mA/cm$^2$) | Maximum external quantum efficiency (EQE$_{MAX}$) (%) | Emission color |
|---|---|---|---|---|---|---|
| Example 1 | 3 | Ir(pmp)$_3$ | 4.1 | 10 | 21.5 | Blue |
| Example 2 | 4 | Ir(pmp)$_3$ | 4.5 | 10 | 22.1 | Blue |

TABLE 3-continued

| | Host Compound No. | Dopant | Driving voltage (V) | Current density (mA/cm$^2$) | Maximum external quantum efficiency (EQE$_{MAX}$) (%) | Emission color |
|---|---|---|---|---|---|---|
| Example 3 | 6 | Ir(pmp)$_3$ | 4.3 | 10 | 21.2 | Blue |
| Example 4 | 7 | Ir(pmp)$_3$ | 4.2 | 10 | 23.2 | Blue |
| Example 5 | 9 | Ir(pmp)$_3$ | 4.1 | 10 | 22.4 | Blue |
| Example 6 | 10 | Ir(pmp)$_3$ | 4.2 | 10 | 23.7 | Blue |
| Example 7 | 11 | Ir(pmp)$_3$ | 4.1 | 10 | 21.3 | Blue |
| Example 8 | 17 | Ir(pmp)$_3$ | 4.2 | 10 | 22.9 | Blue |
| Comparative Example A1 | A1 | Ir(pmp)$_3$ | 4.4 | 10 | 13.5 | Blue |
| Comparative Example A2 | A2 | Ir(pmp)$_3$ | 3.8 | 10 | 10.1 | Blue |
| Comparative Example B1 | B1 | Ir(pmp)$_3$ | 5.2 | 10 | 20.1 | Blue |
| Comparative Example B2 | B2 | Ir(pmp)$_3$ | 5.1 | 10 | 20.8 | Blue |
| Comparative Example C1 | C1 | Ir(pmp)$_3$ | 3.9 | 10 | 11.8 | Blue |
| Comparative Example D1 | D1 | Ir(pmp)$_3$ | 4.4 | 10 | 15.9 | Blue |

3

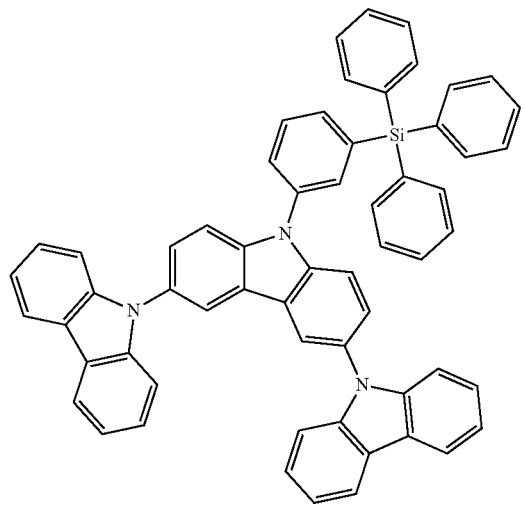

4

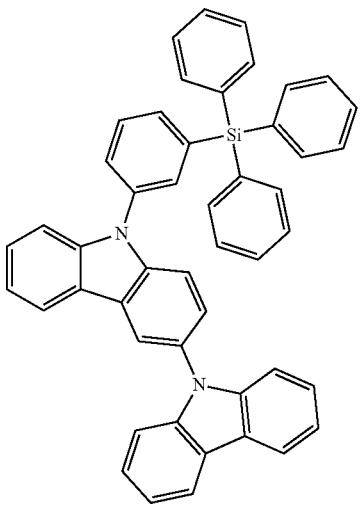

6

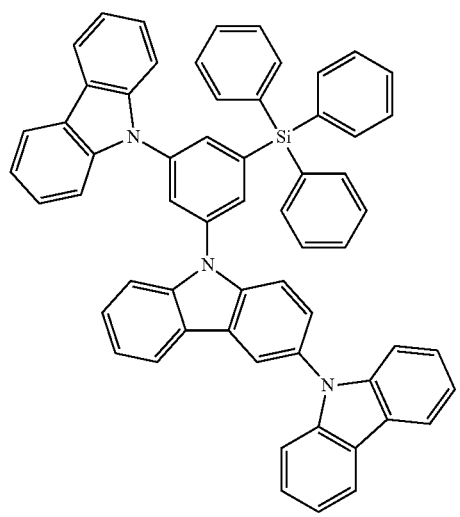

7

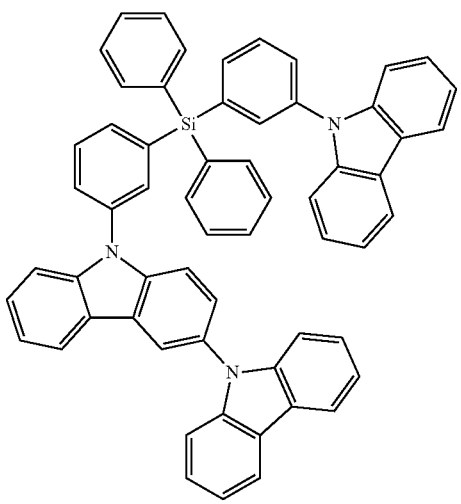

-continued
9
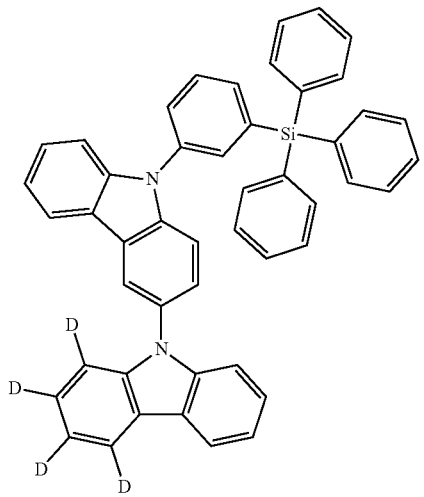
10
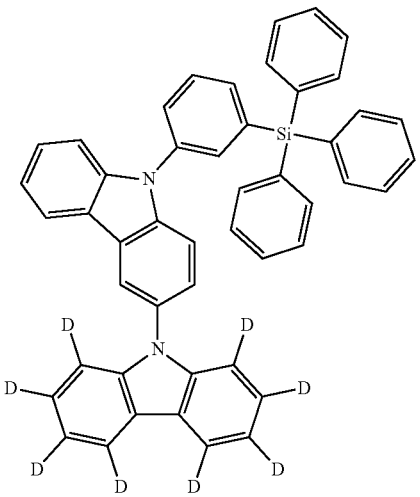
11
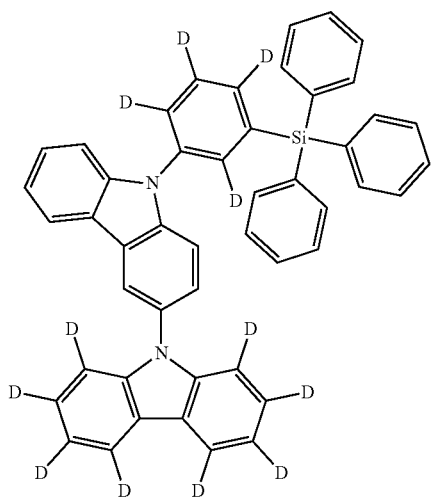
17
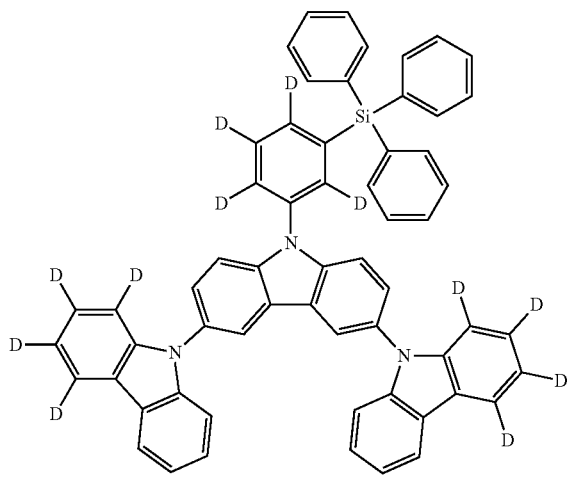
A1
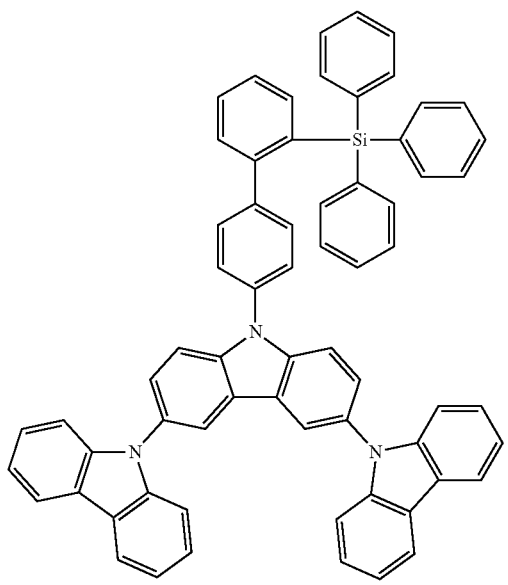
A2
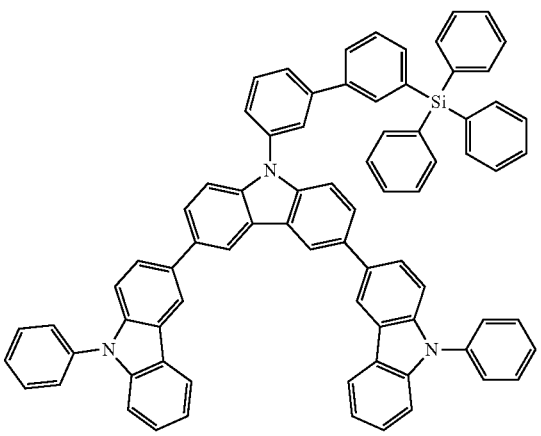

-continued

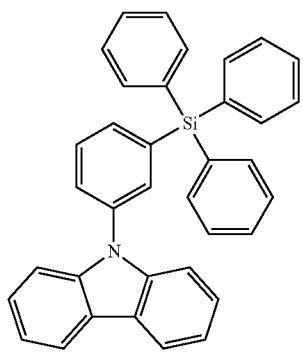
B1

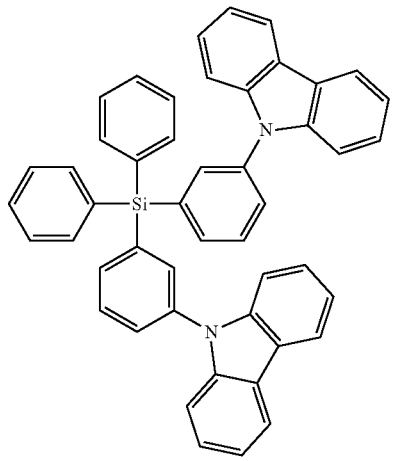
B2

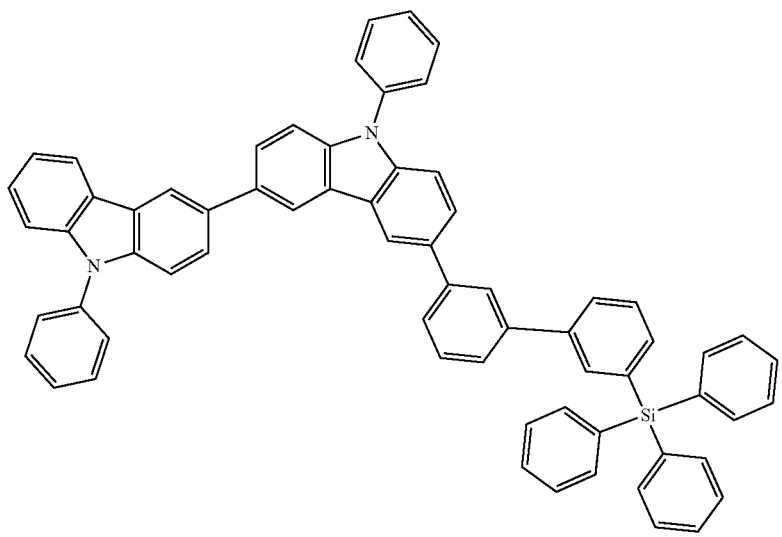
C1

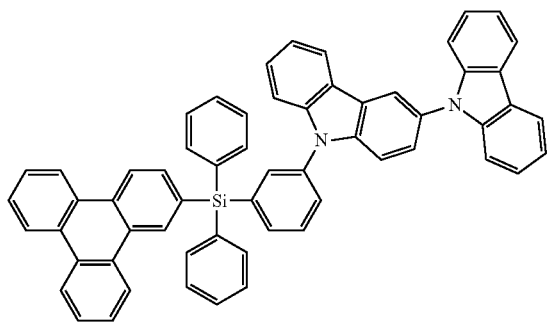
D1

Referring to the results of Table 3, the organic light-emitting devices of Examples 1 to 8 were significantly and unexpectedly found to have a low driving voltage and a high maximum external quantum efficiency, as compared with the organic light-emitting devices of Comparative Examples A1, A2, B1, B2, C1, and D1.

As apparent from the foregoing description, the heterocyclic compound represented by Formula 1 was found to have a relatively high triplet energy level and a relatively high HOMO energy level.

Use of heterocyclic compounds made according to the principles and exemplary embodiments of the invention in a light-emitting device and an electronic apparatus including the light-emitting device simultaneously have a low driving voltage and a high luminescence efficiency.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A heterocyclic compound represented by Formula 1:

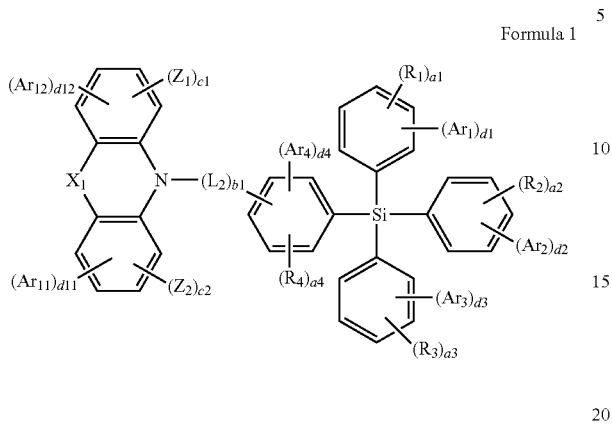

Formula 1 wherein, a group represented by

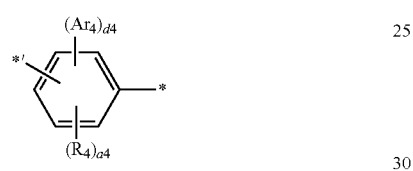

in Formula 1 is a group represented by one of Formulae 7-2 to 7-13:

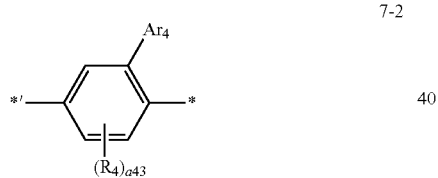

7-2

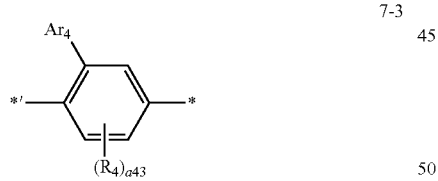

7-3

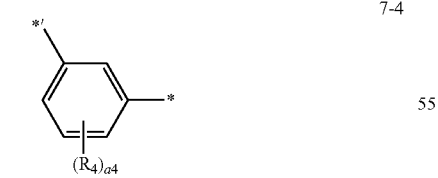

7-4

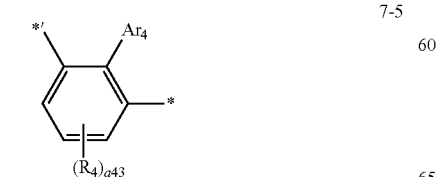

7-5

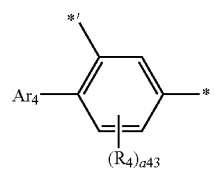

7-6

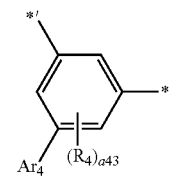

7-7

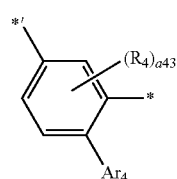

7-8

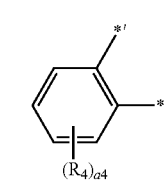

7-9

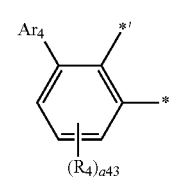

7-10

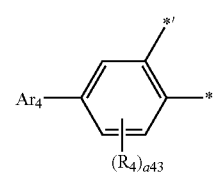

7-11

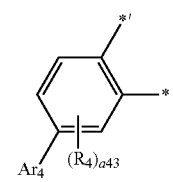

7-12

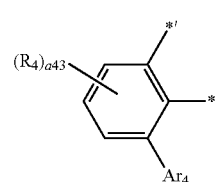

7-13 wherein, in Formulae 7-2 to 7-13, $Ar_4$, $R_4$, and a4 have, independently from one another, the same meanings as described hereinafter, a43 is an integer from 0 to 3, * indicates a binding site to an adjacent silicon atom in Formula 1, and *' indicates a binding site to $L_1$ in Formula 1, $Ar_1$ to $Ar_4$, and $Ar_{12}$ in Formula are each, independently from one another, a group represented by Formula 2 or a group represented by Formula 3, and $Ar_{11}$ in Formula 1 is a group represented by Formula 2,

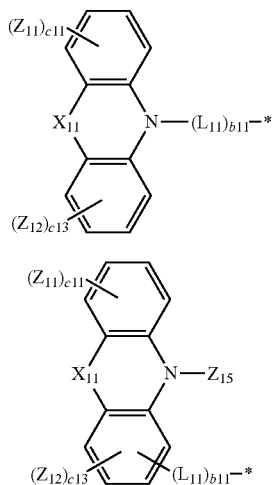

2

3 d1, d2, and d3 in Formula 1 are each, independently from one another, an integer from 0 to 5;
d11 in Formula 1 1;
d12 in Formula 1 is 0 or 1;
$L_1$ in Formula 1 is a single bond or a group represented by Formula 4;
$L_{11}$ in Formulae 2 and 3 is a single bond, a group represented by Formula 4, or a group represented by Formula 5

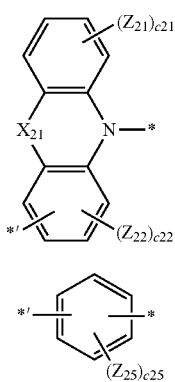

4

5 b1 and b11 in Formulae 1 to 3 are each, independently from one another, an integer from 1 to 5;
$X_1$ in Formula 1 is a single bond, O, S, $C(Z_3)(Z_4)$, or $Si(Z_3)(Z_4)$;
$X_{11}$ in Formulae 2 and 3 is a single bond, O, S, $C(Z_{13})(Z_{14})$, or $Si(Z_{13})(Z_{14})$;
$X_{21}$ in Formula 4 is a single bond, O, S, $C(Z_{23})(Z_{24})$, or $Si(Z_{23})(Z_{24})$;
$R_1$ to $R_4$ in Formula 1 are each, independently from one another:
hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each, independently from one another, substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a fluorenyl group, a carbazolyl group, or a dibenzosilolyl group, each, independently from one another, unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a fluorenyl group, a carbazolyl group, a dibenzosilolyl group, or any combination thereof; or
—$Si(Q_1)(Q_2)(Q_3)$,
$Z_1$ to $Z_4$, $Z_{11}$ to $Z_{15}$, and $Z_{21}$ to $Z_{25}$ in Formulae 1 to 5 are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$;
a1 to a3 in Formula 1 are each, independently from one another, an integer from 0 to 5;
a4, c1, c11, c13, c21, and c25 in Formulae 1 to 5 are each, independently from one another, an integer from 0 to 4;
c2, c12, and c22 in Formulae 1, 3, and 4 are each, independently from one another, an integer from 0 to 3;
* in Formulae 2 and 4 indicates a binding site to an adjacent carbon atom, and * and *' in Formulae 3 to 5 each indicate a binding site to an adjacent atom; and
$R_{10a}$ is:
-D, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_1$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each, independently from one another, hydrogen; deuterium; —F; —Cl; —Br; —I; a hydroxyl group; a cyano group; a nitro group; or a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The heterocyclic compound of claim 1, wherein d1, d2, and d3 in Formula 1 are each 0.

3. The heterocyclic compound of claim 1, wherein d1, d2, and d3 in Formula 1 are each, independently from one another, 0 or 1, and the sum of d1, d2, and d3 is 1 or 2.

4. The heterocyclic compound of claim 1, wherein $Z_1$ to $Z_4$, $Z_{11}$ to $Z_{15}$, and $Z_{21}$ to $Z_{25}$ in Formulae 1 to 5 are each, independently from one another:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each, independently from one another, substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a fluorenyl group, a carbazolyl group, a dibenzofuranyl group, a dibenzothiophenyl group, or a dibenzosilolyl group, each, independently from one another, unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a fluorenyl group, a carbazolyl group, a dibenzofuranyl group, a dibenzothiophenyl group, a dibenzosilolyl group, or any combination thereof; or —Si($Q_1$)($Q_2$)($Q_3$) wherein $Q_1$, $Q_2$, and $Q_3$ have, independently from one another, the same meanings as in claim 1.

5. The heterocyclic compound of claim 1, wherein a group represented by

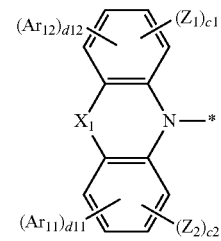

in Formula 1 is a group represented by one of Formulae 6-1 to 6-14:

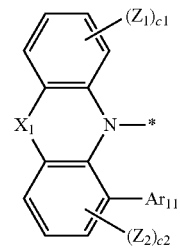

6-1

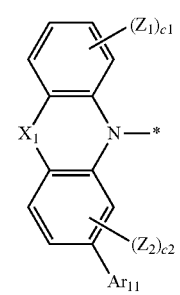

6-2

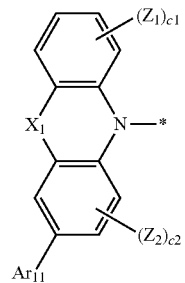

6-3

6-4
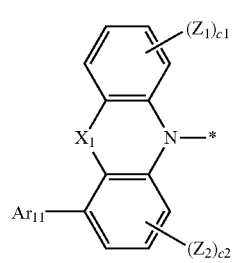
6-5
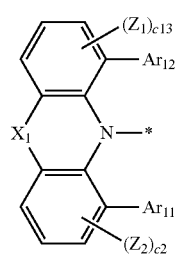
6-6
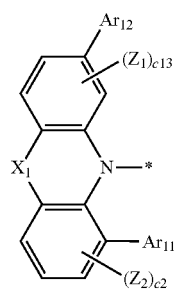
6-7
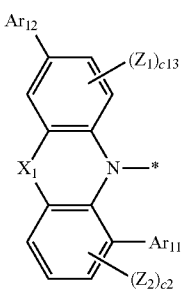
6-8
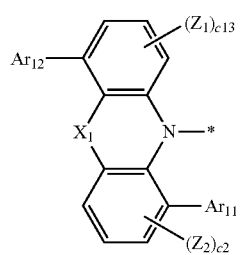
6-9
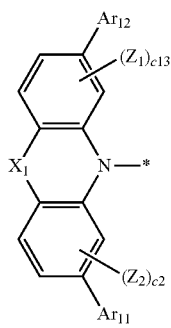
6-10
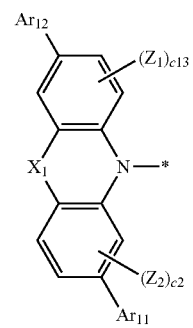
6-11
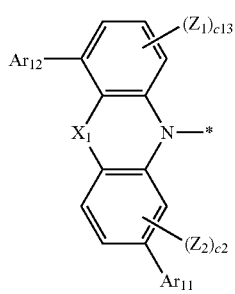
6-12
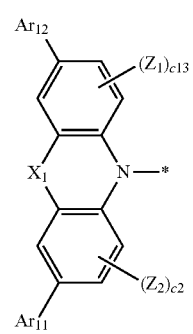
6-13
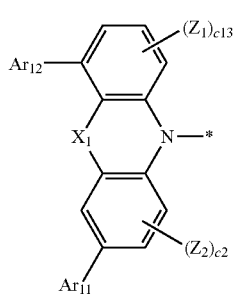

-continued 6-14

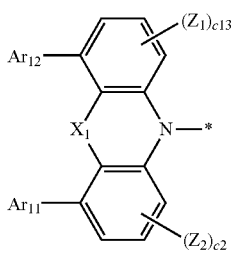

wherein, in Formulae 6-1 to 6-14, $Ar_{11}$, $Ar_{12}$, $X_1$, $Z_1$, $Z_2$, c1, and c2 have, independently from one another, the same meanings as in claim 1, c13 is an integer from 0 to 3, and * indicates a binding site to $L_1$ in Formula 1.

6. The heterocyclic compound of claim 1, wherein a group represented by

in Formula 1 is a group represented by one of Formulae 8-1 to 8-4:

8-1

8-2

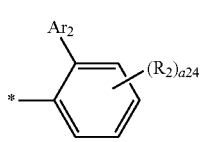

8-3

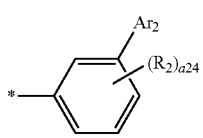

8-4

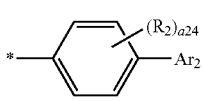

wherein, in Formulae 8-1 to 8-4, $Ar_2$, $R_2$, and a2 have, independently from one another, the same meanings as in claim 1, a24 is an integer from 0 to 4, and * indicates a binding site to an adjacent silicon atom in Formula 1.

7. The heterocyclic compound of claim 1, wherein a group represented by Formula 4 comprises one or more groups represented by Formulae 4-1 to 4-4:

4-1

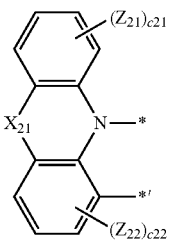

4-2

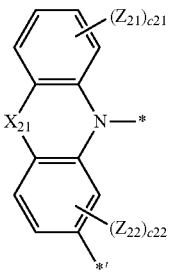

4-3

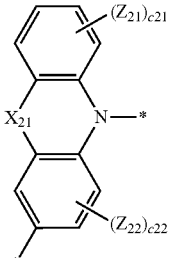

4-4

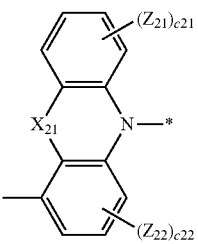

wherein, in Formulae 4-1 to 4-4, $X_{21}$, $Z_{21}$, $Z_{22}$, c21, and c22 have, independently from one another, the same meanings as in claim 1, * indicates a binding site to an adjacent carbon atom, and *' indicates a binding site to an adjacent atom.

8. The heterocyclic compound of claim 1, wherein a group represented by Formula 5 comprises one or more groups represented by Formulae 5-1 to 5-3:

5-1

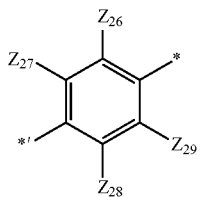

5-2
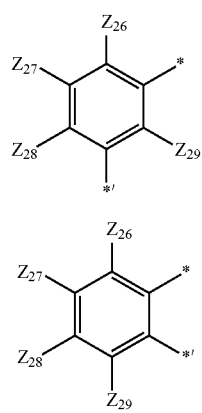
5-3
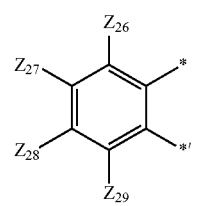
wherein in Formulae 5-1 to 5-3, $Z_{26}$ to $Z_{29}$ have, independently from one another, the same meanings as $Z_{25}$ as in claim 1, and * and *' each indicate a binding site to an adjacent atom.
9. A heterocyclic compound selected from one of Compounds 1, 3 to 39 and 42 to 62:
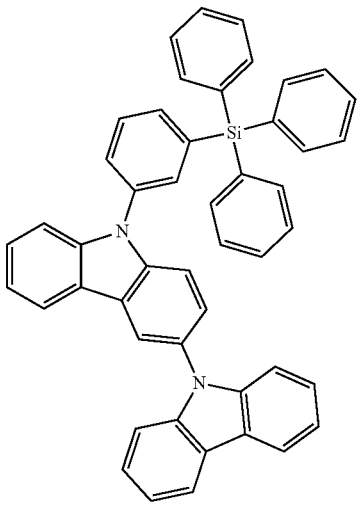
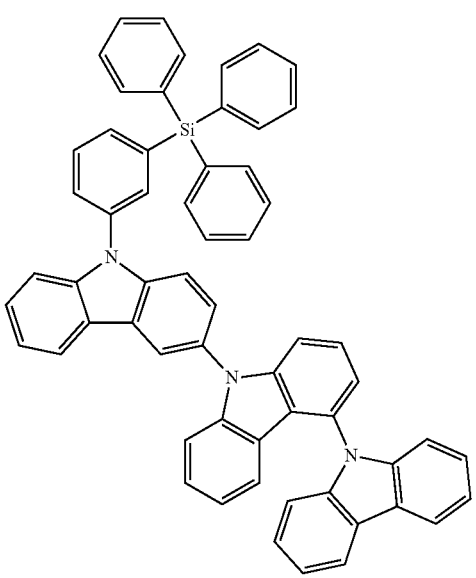
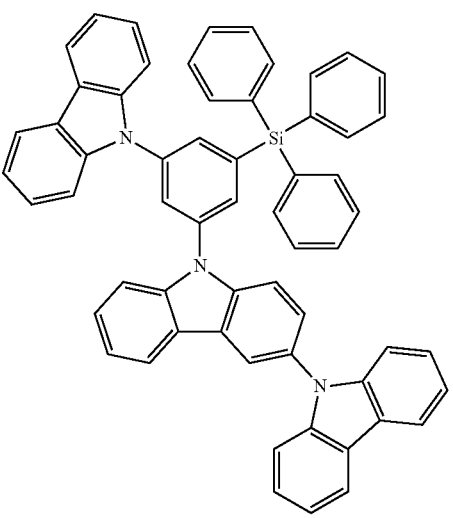

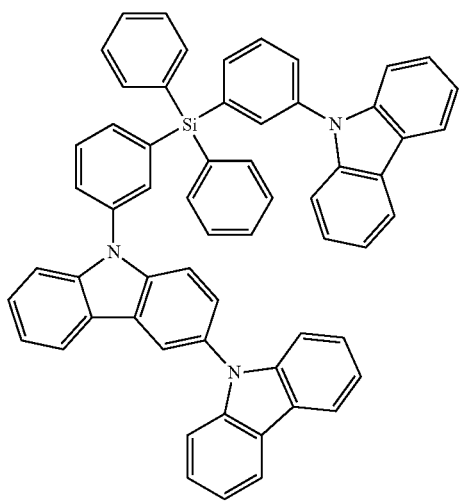
7
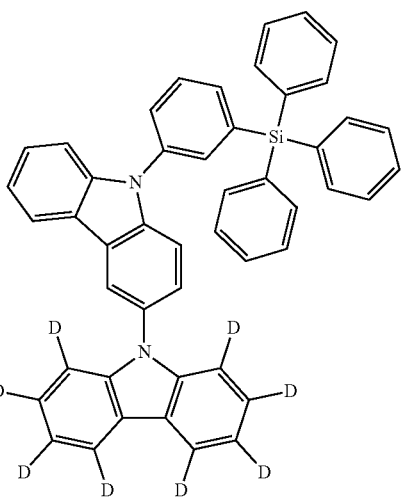
10
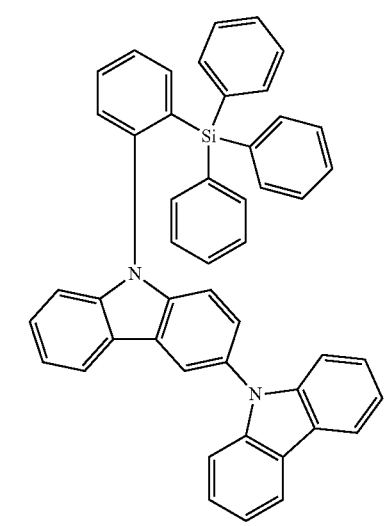
8
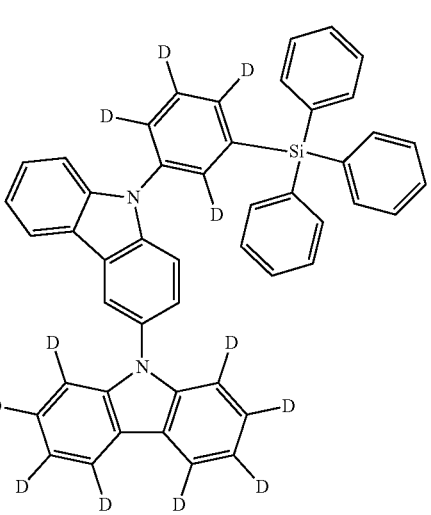
11
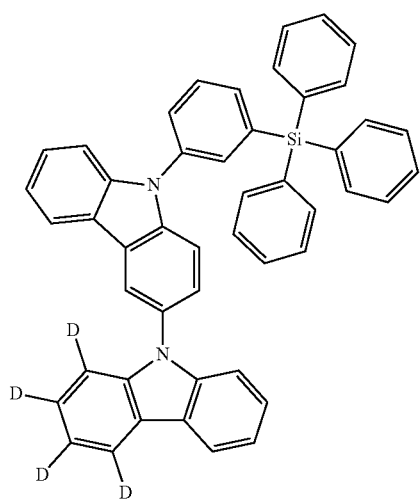
9
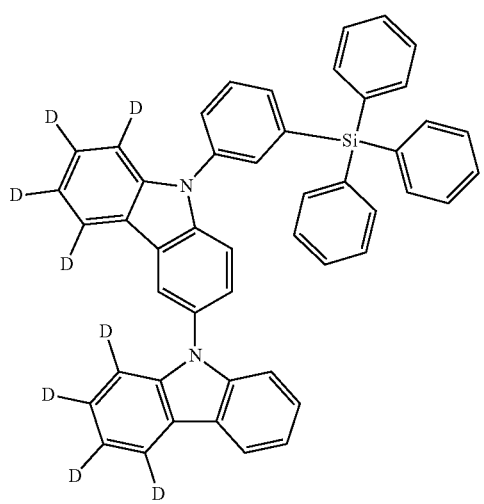
12

201
-continued
13
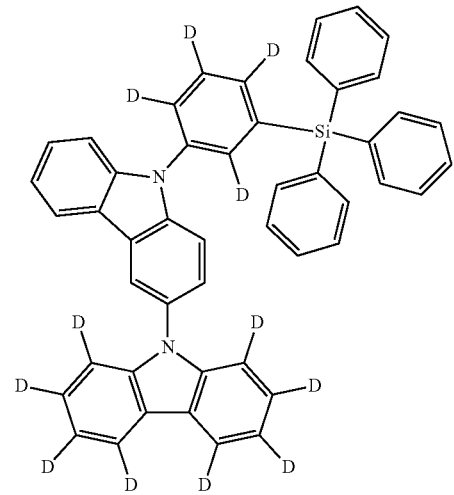
14
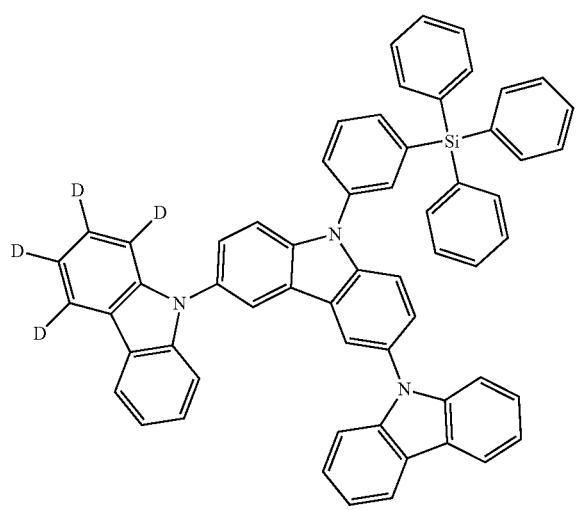
15
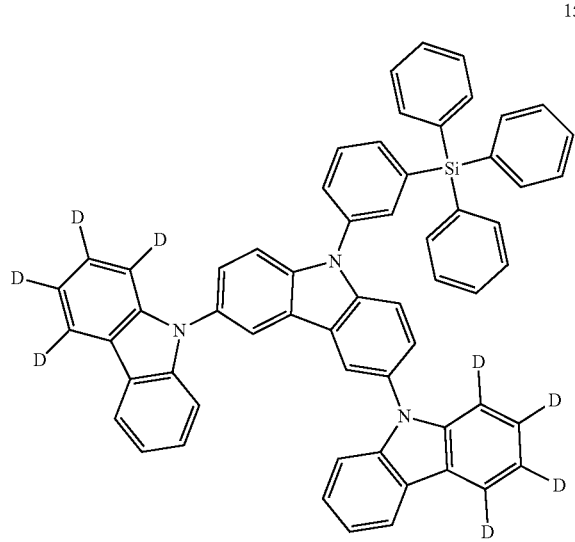
202
-continued
16
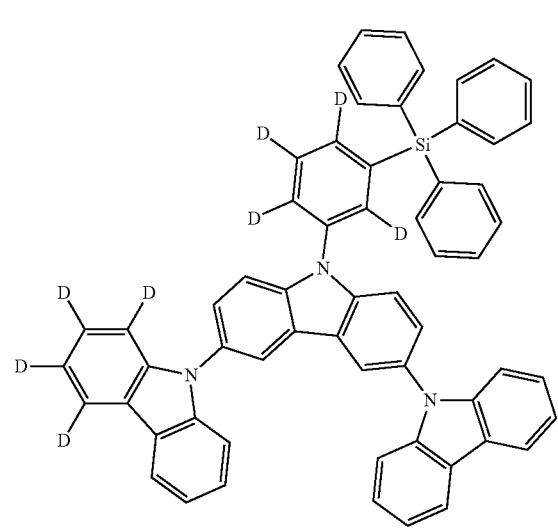
17
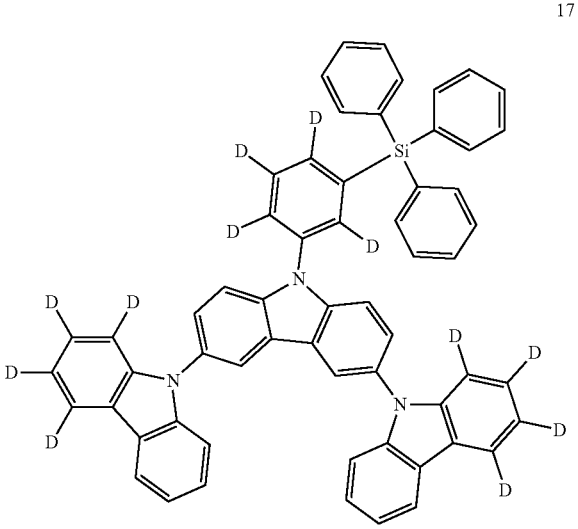
18
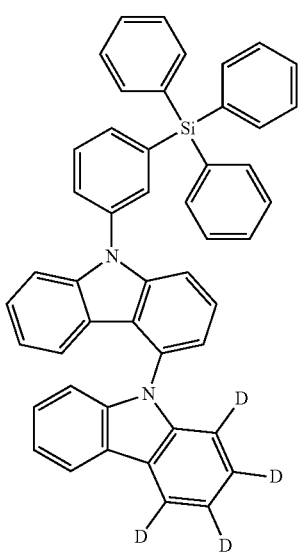

19
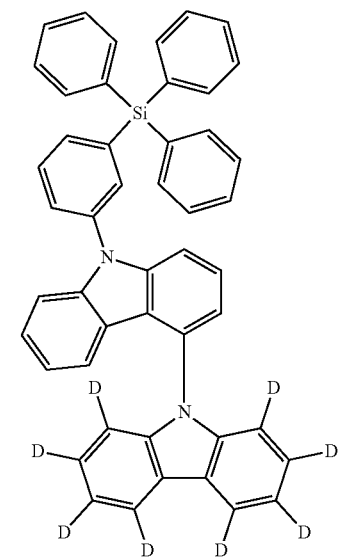
20
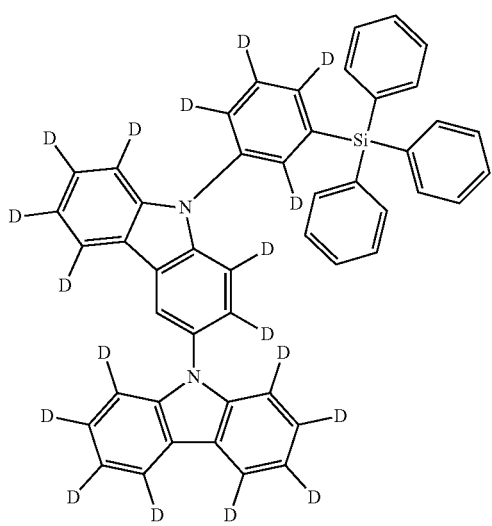
21
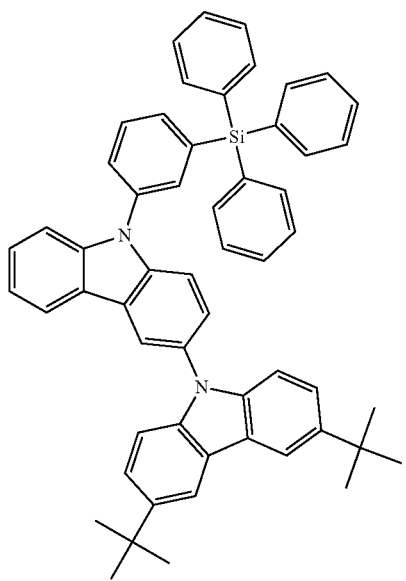
22
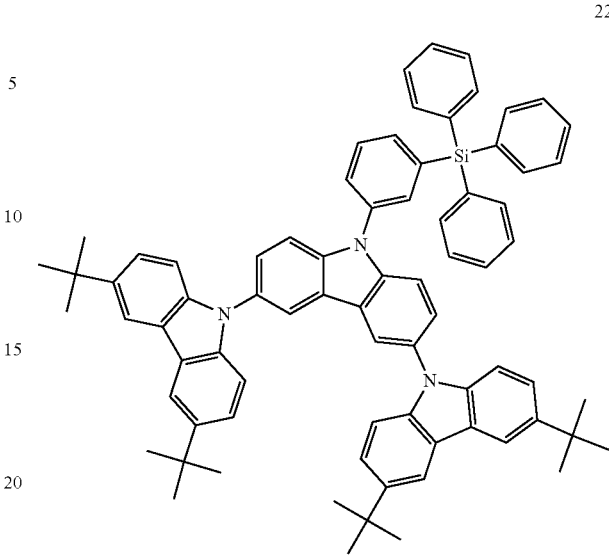
23
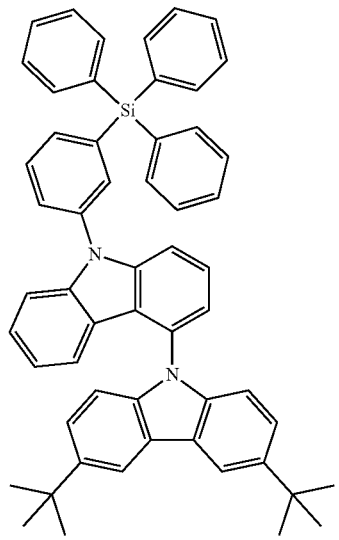

-continued
24
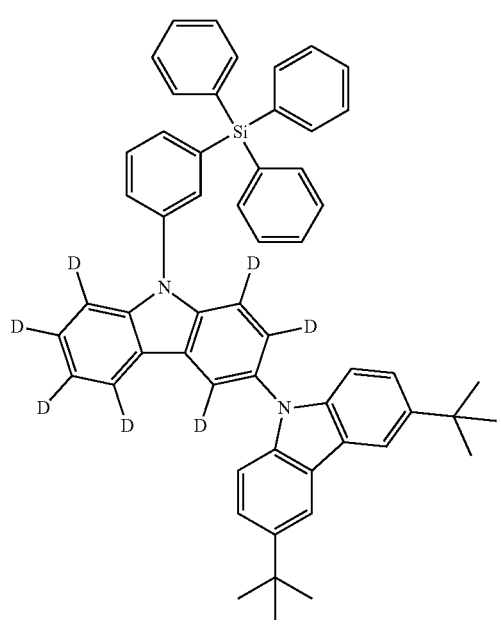
26
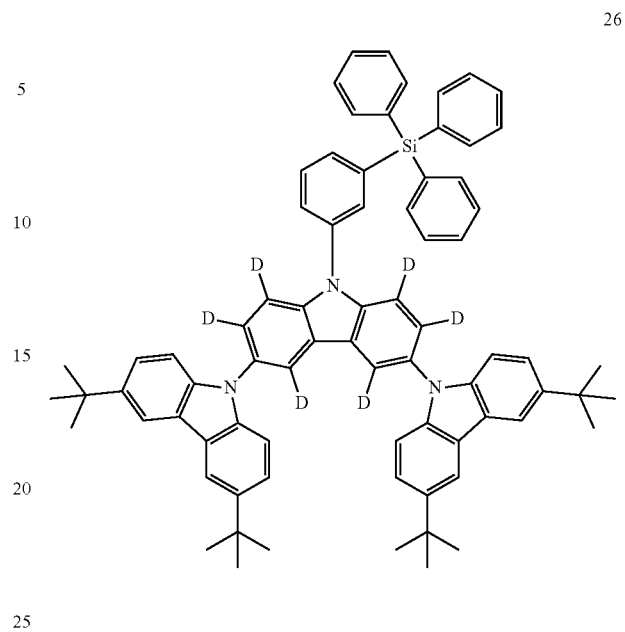
27
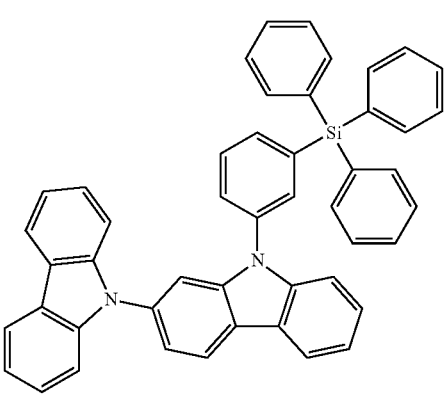
25
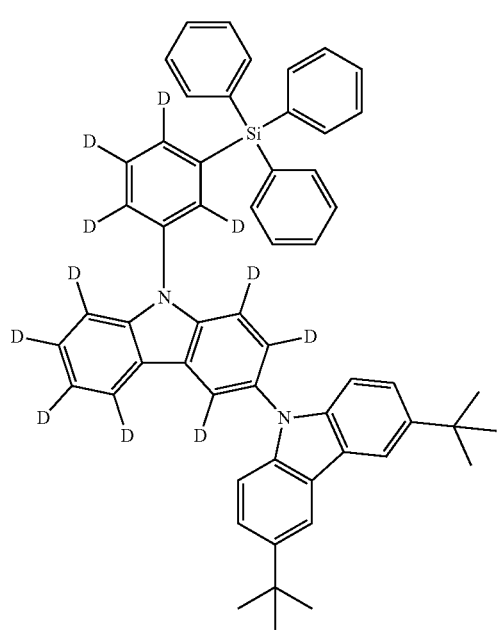
28
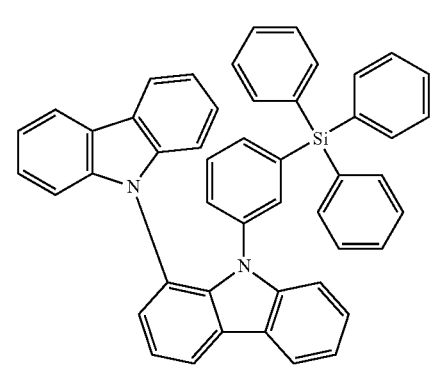

29
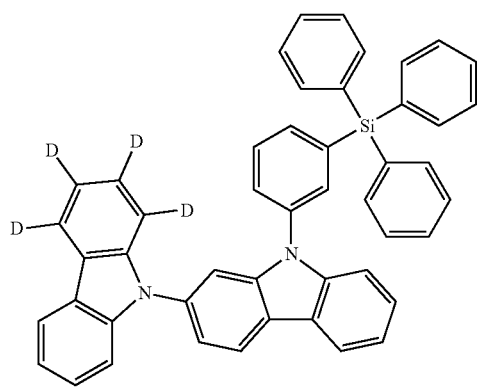
30
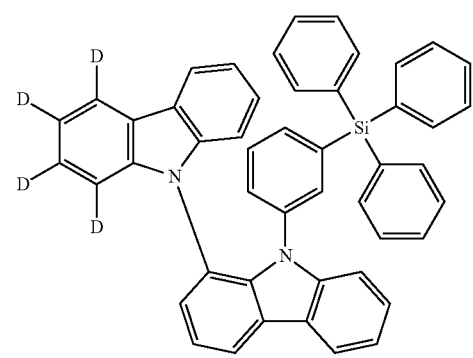
31
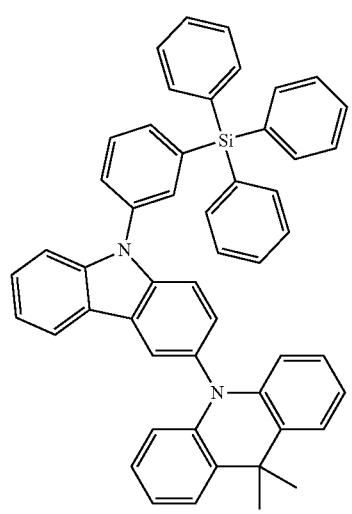
32
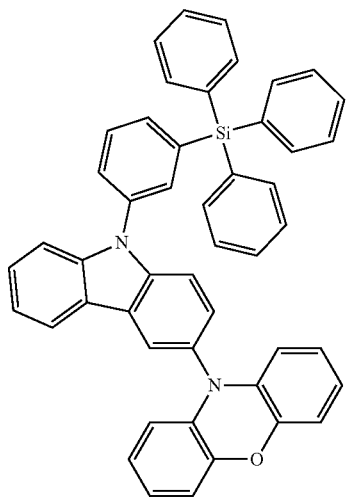
33
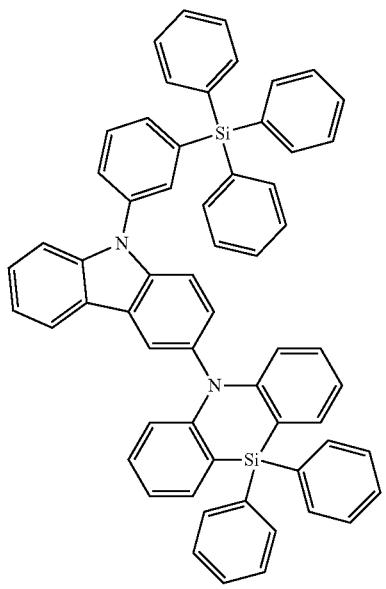
34
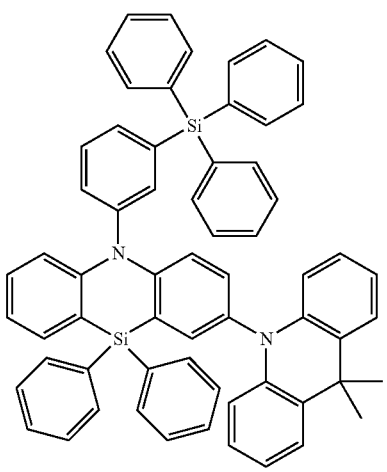

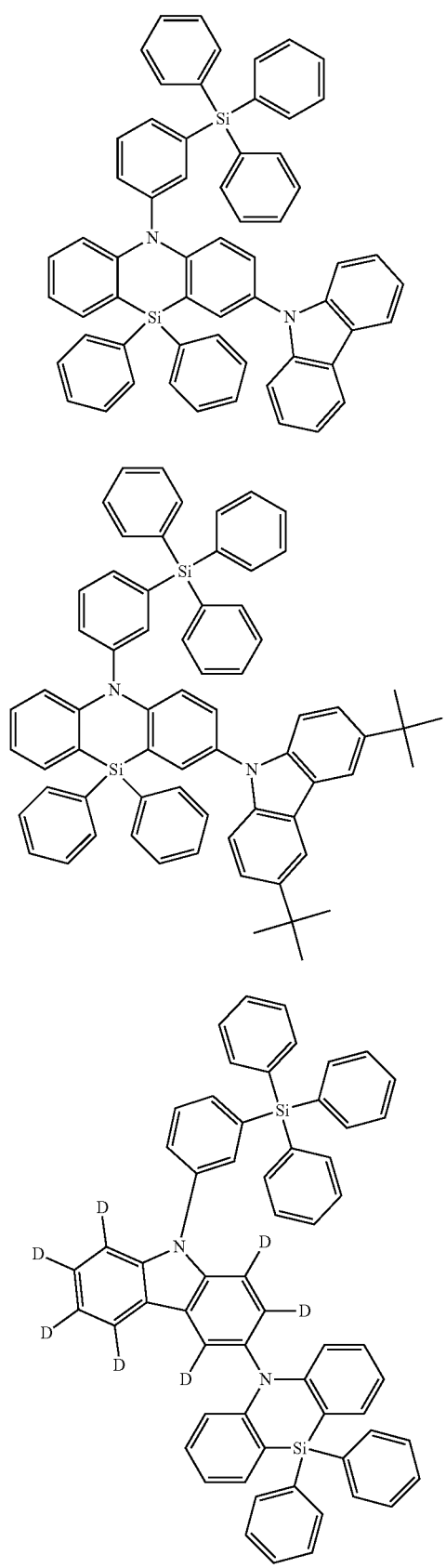

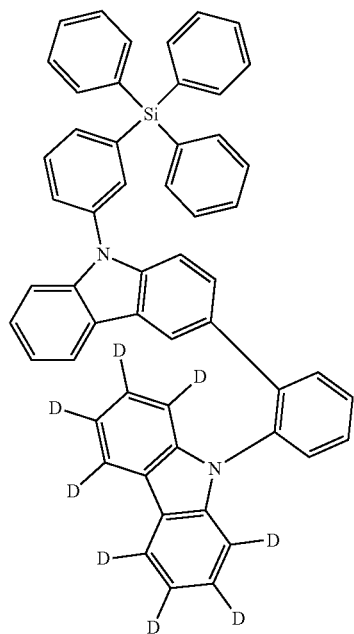
42
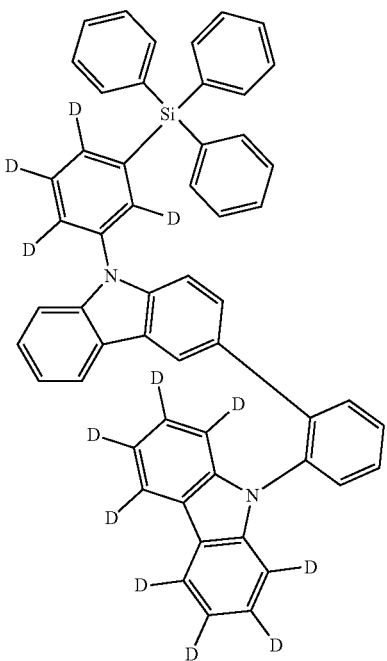
44
43
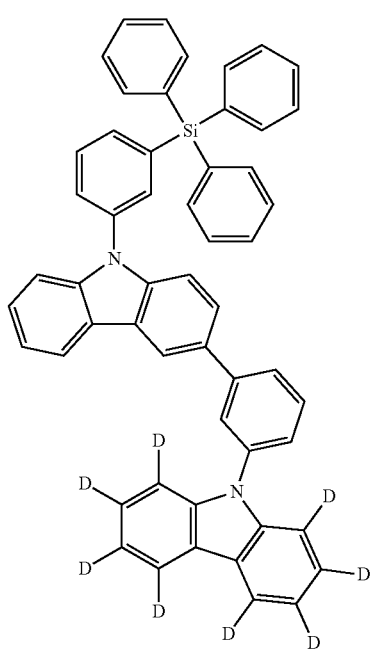
45
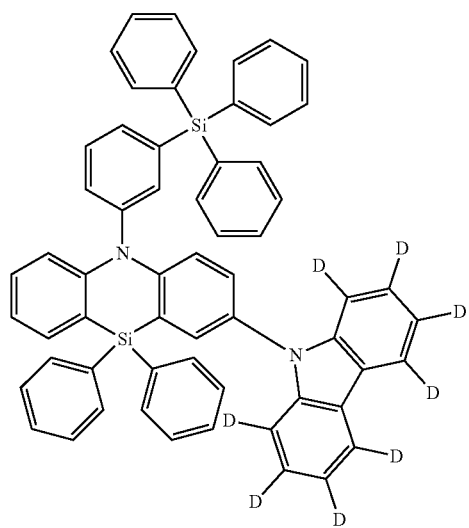

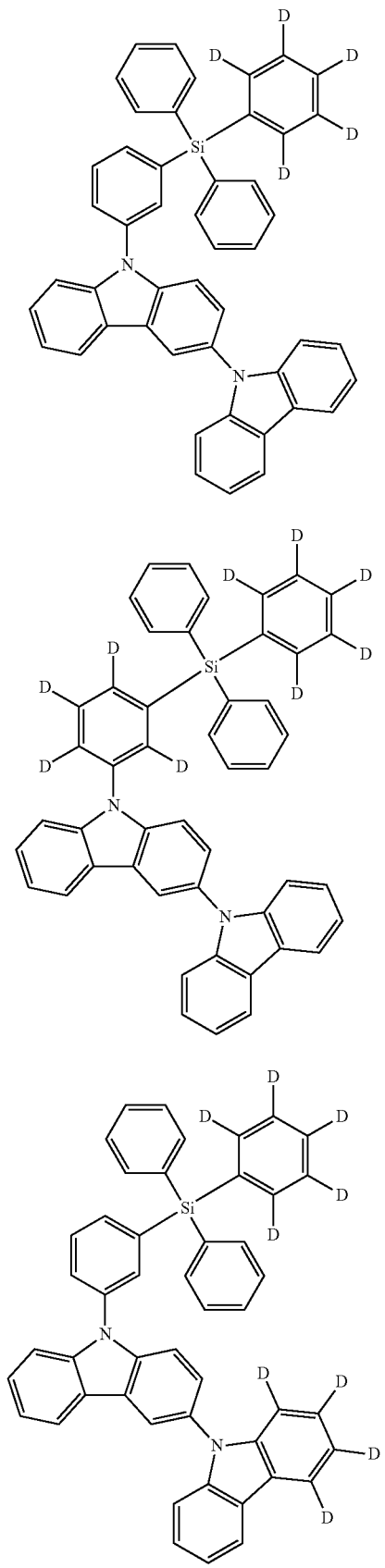

51
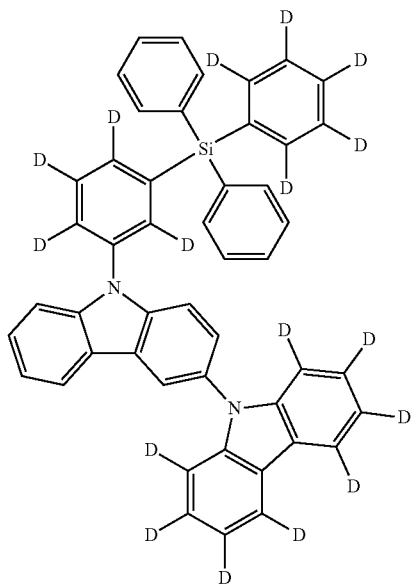
52
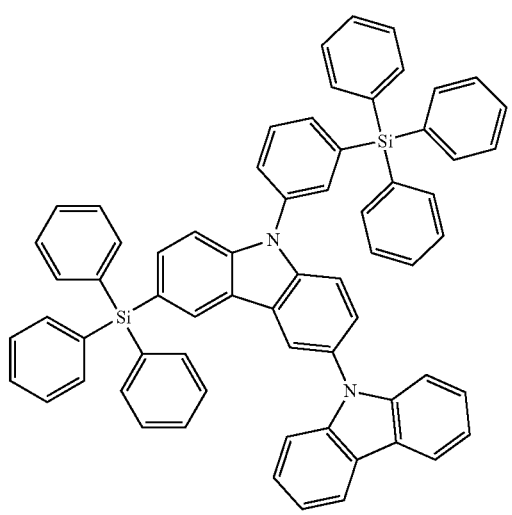
53
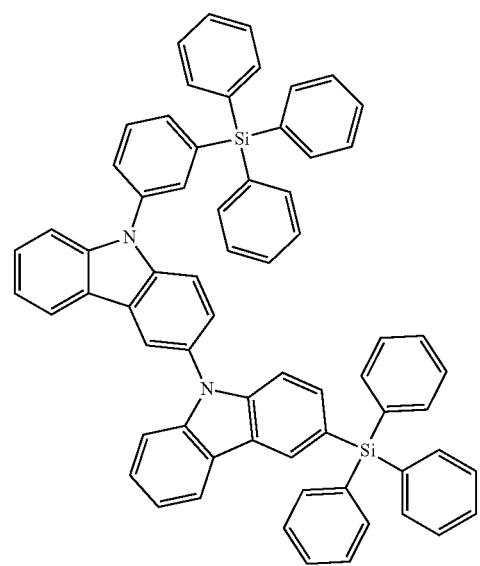
54
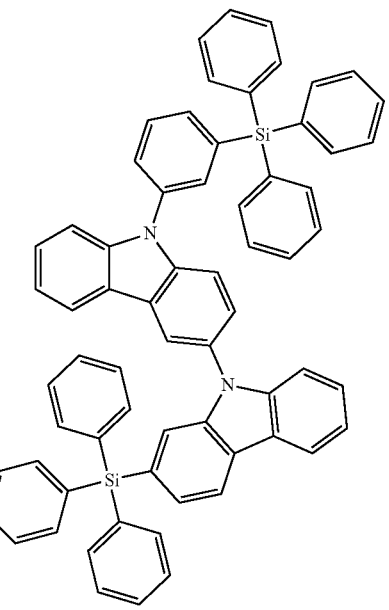
55
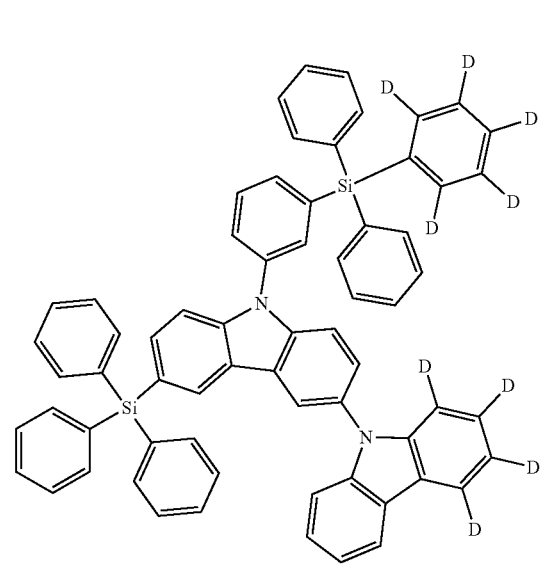

-continued
56
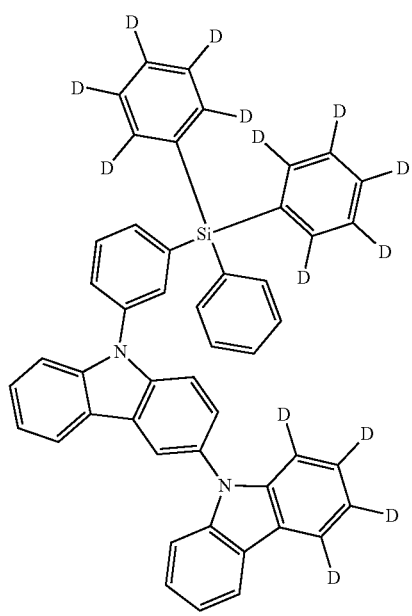
57
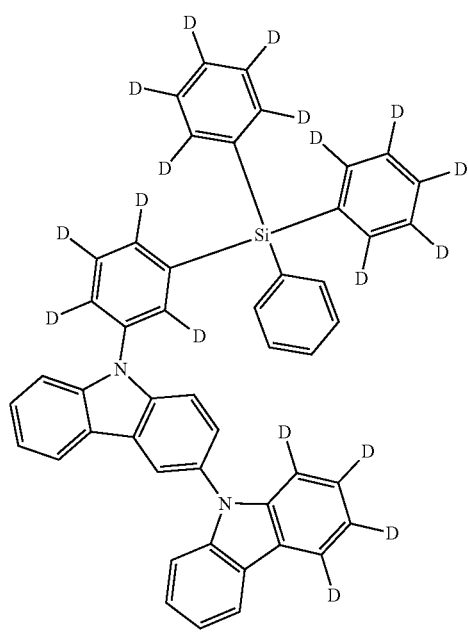
-continued
58
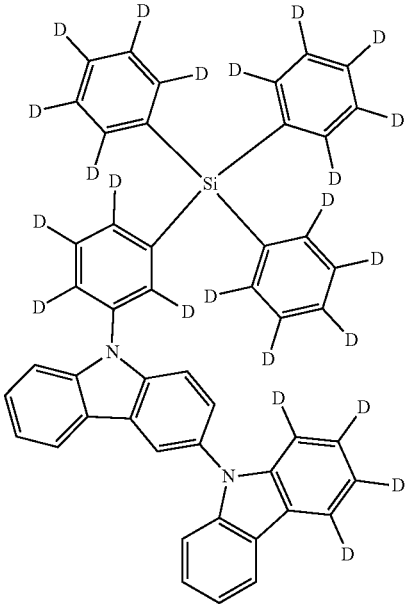
59
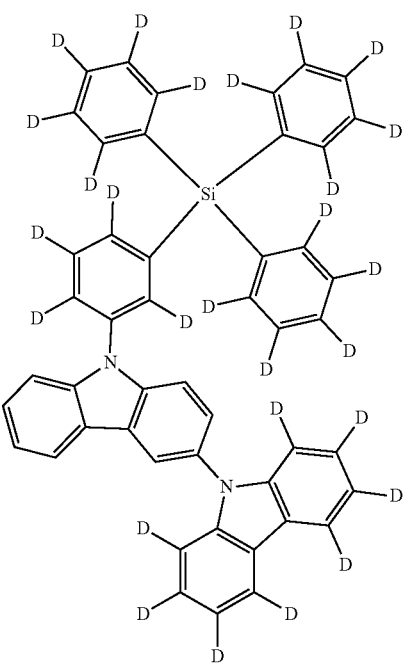

219
-continued

60
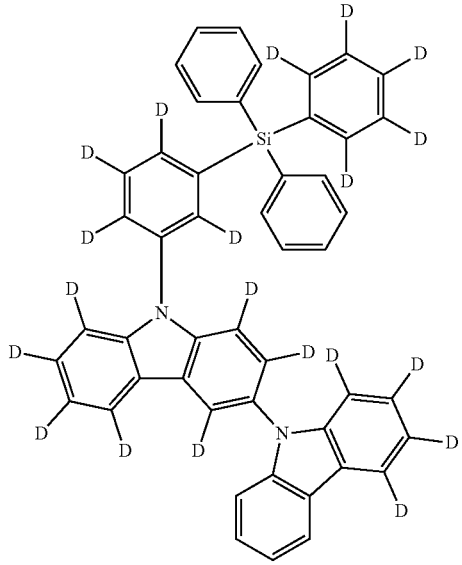

61
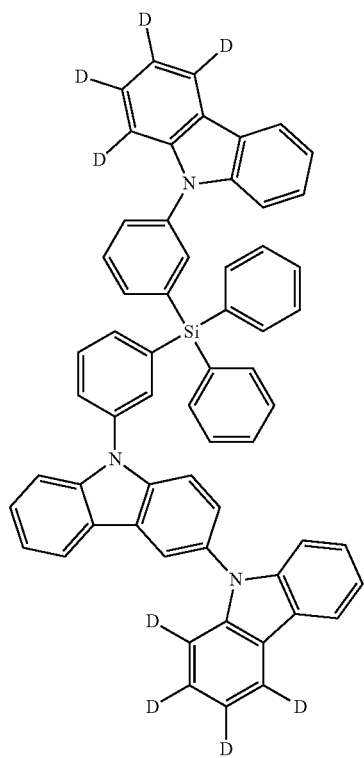

220
-continued

62
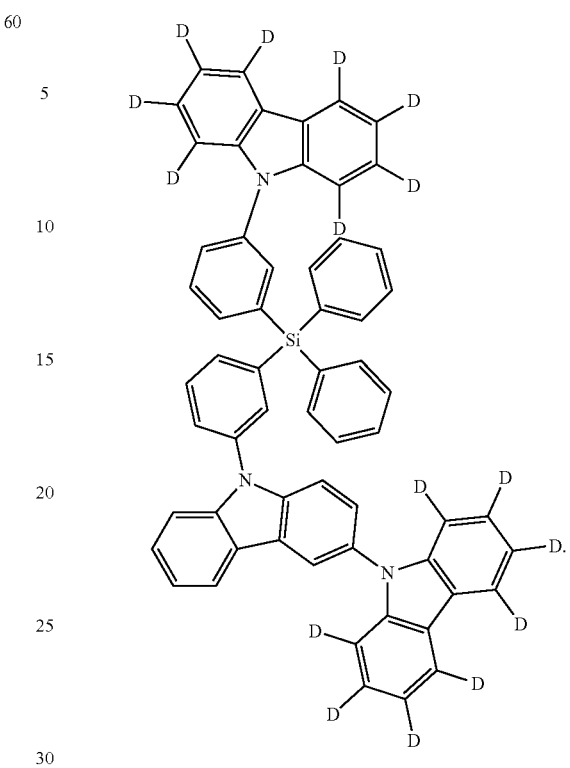

10. A light-emitting device comprising:
a first electrode;
a second electrode facing the first electrode;
an interlayer disposed between the first electrode and the second electrode and comprising an emission layer; and the heterocyclic compound of claim 1.

11. The light-emitting device of claim 10, wherein the emission layer in the interlayer comprises the heterocyclic compound.

12. The light-emitting device of claim 11, wherein the emission layer comprises a dopant and a host, and the host comprises the heterocyclic compound.

13. The light-emitting device of claim 12, wherein the dopant is configured to emit a blue light.

14. The light-emitting device of claim 12, wherein
the dopant comprises a transition metal and a ligand(s) in a number represented by m;
m is an integer from 1 to 6;
the ligands in number of m are identical to or different from one another;
at least one of the ligands is bound to the transition metal via a carbon-transition metal bond; and
the carbon-transition metal bond is a coordinate bond.

15. An electronic apparatus comprises the light-emitting device of claim 10.

16. The electronic apparatus of claim 15, further comprising a thin-film transistor, wherein the thin-film transistor comprises a source electrode and a drain electrode, and the first electrode of the light-emitting device is electrically connected to at least one of the source electrode and the drain electrode of the thin-film transistor.

* * * * *